United States Patent [19]

Swoboda

[11] Patent Number: 5,621,651
[45] Date of Patent: Apr. 15, 1997

[54] EMULATION DEVICES, SYSTEMS AND METHODS WITH DISTRIBUTED CONTROL OF TEST INTERFACES IN CLOCK DOMAINS

[75] Inventor: Gary L. Swoboda, Sugar Land, Tex.

[73] Assignee: Texas Instruments Incorporated, Dallas, Tex.

[21] Appl. No.: 643,703

[22] Filed: May 6, 1996

Related U.S. Application Data

[63] Continuation of Ser. No. 209,127, Mar. 9, 1994, abandoned.

[51] Int. Cl.$^6$ .............................. G06F 17/00; G06F 11/00
[52] U.S. Cl. ............................ 364/489; 364/488
[58] Field of Search ..................... 364/488, 489, 364/490, 491; 371/22.3, 22.5, 27; 395/500

[56] References Cited

U.S. PATENT DOCUMENTS 4,633,417  12/1986  Wilburn et al. ..................... 364/578
4,901,259   2/1990  Watkins ............................. 364/578
5,126,966   6/1992  Hafeman et al. .................... 364/578
5,307,285   4/1994  Storandt et al. .................... 364/489
5,329,471   7/1994  Swoboda et al. .................... 364/578
5,331,571   7/1994  Aronoff et al. ..................... 364/490
5,388,060   2/1995  Adams, Jr. et al. .................. 364/578
5,461,573  10/1995  Chakradhar et al. .................. 364/489
5,479,355  12/1995  Hyduke ............................. 364/488

FOREIGN PATENT DOCUMENTS

0411904A2   2/1991   European Pat. Off. .

Primary Examiner—Vincent N. Trans
Attorney, Agent, or Firm—Scott B. Stahl; Leo N. Heiting; Richard L. Donaldson

[57] ABSTRACT

An emulation device (11) distributes common control information (8801) to each of a plurality of clock domains (1213, 1215, 1217) into which the emulation device is partitioned, and also provides the clock domains with individualized clock control (8905, 8907, 8913).

12 Claims, 75 Drawing Sheets

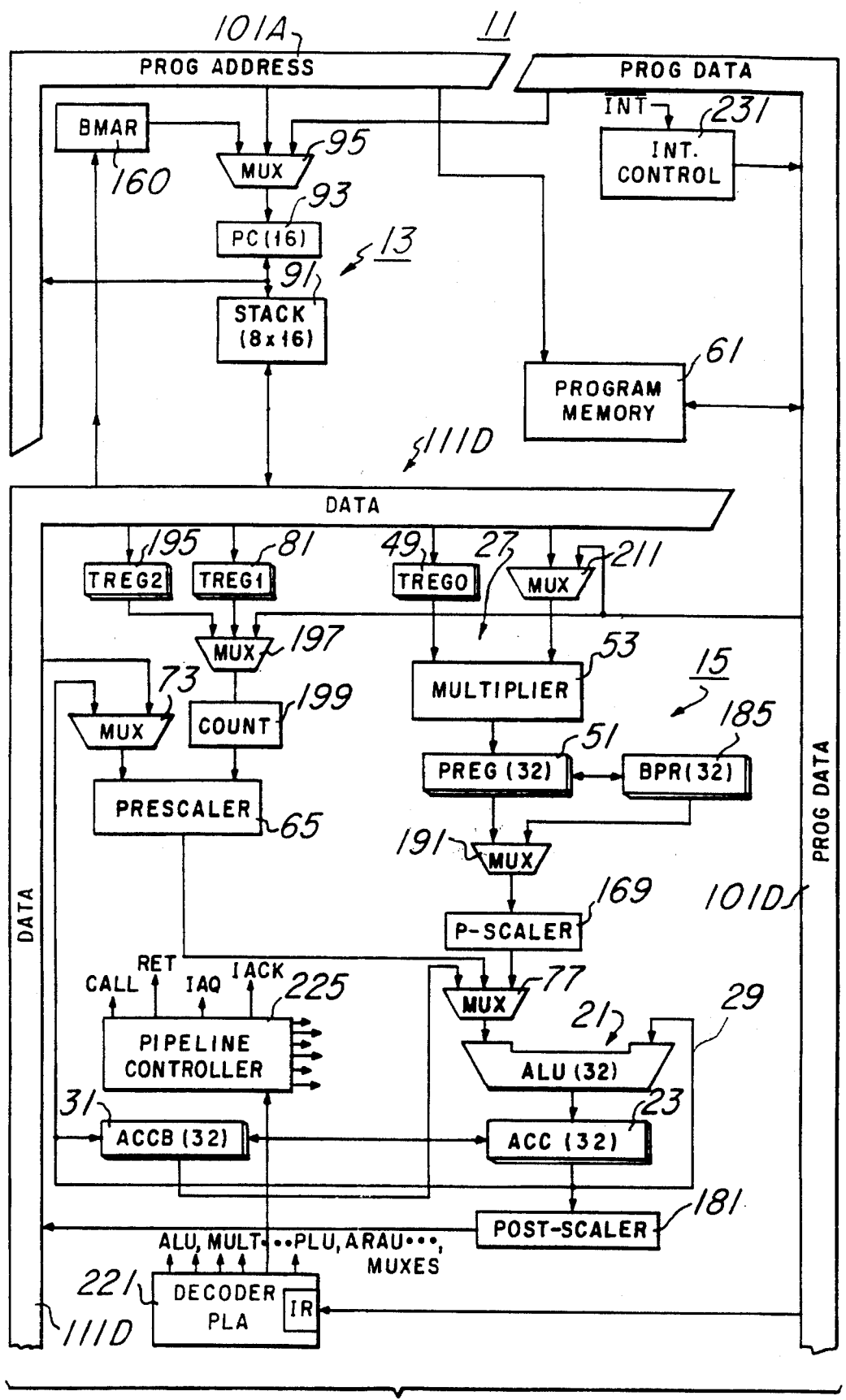
Fig. 1a  JOIN FIG.1b

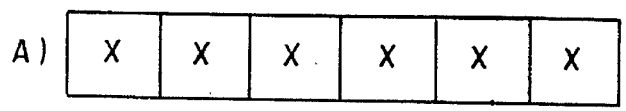
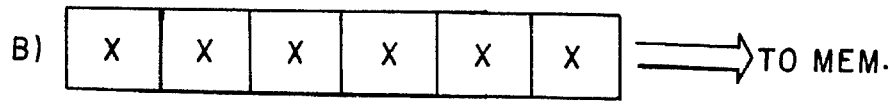
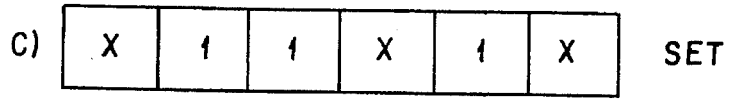
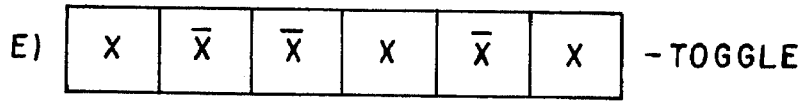
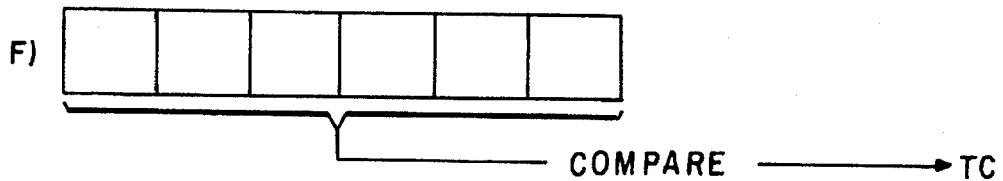
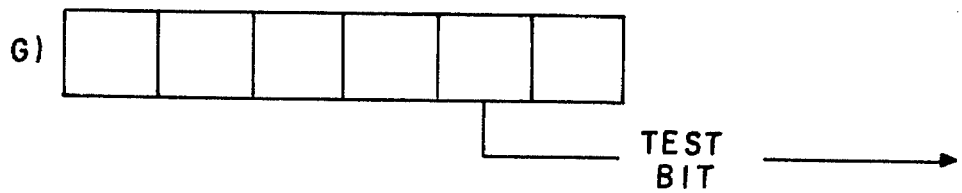
Fig. 19

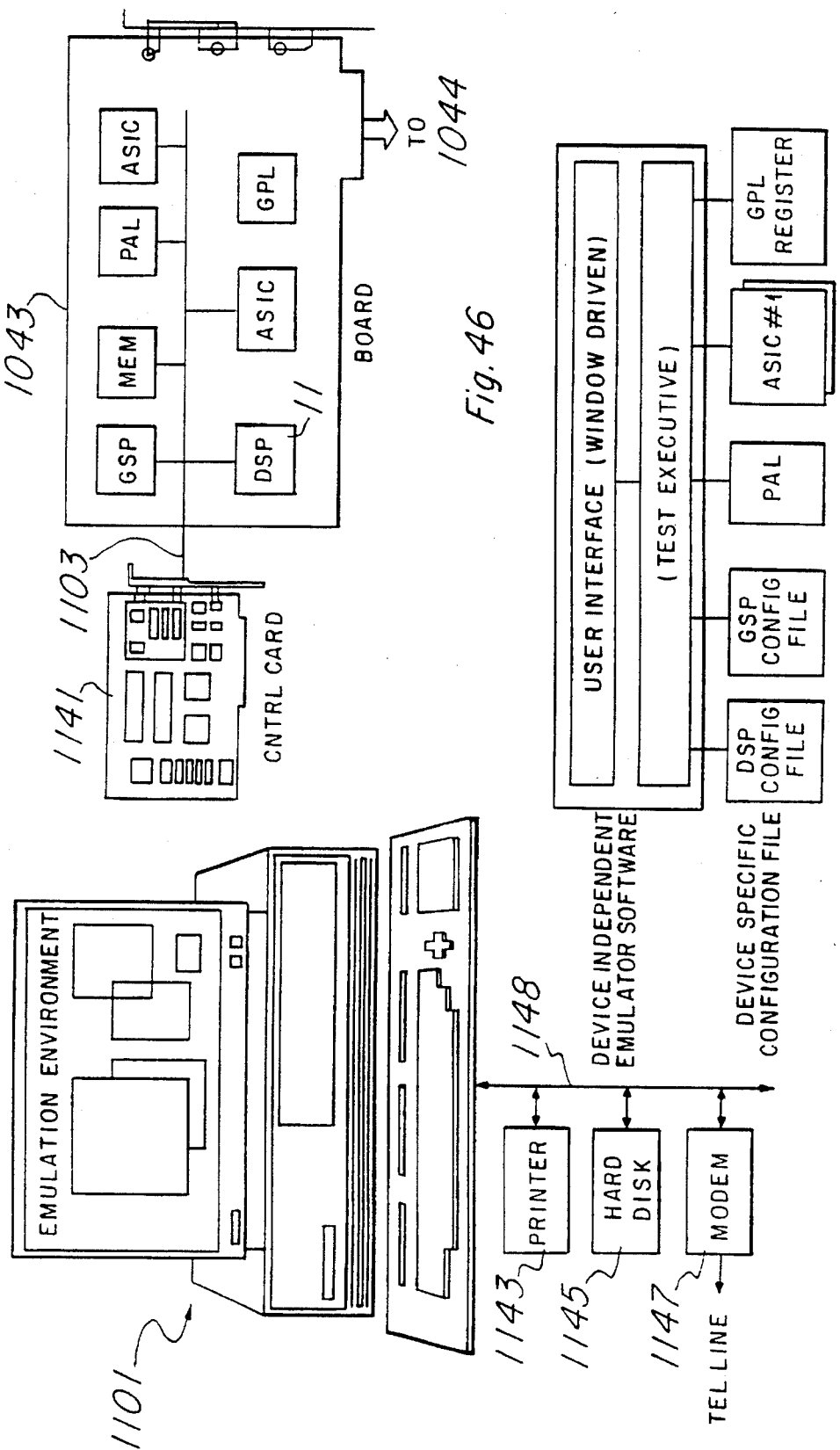

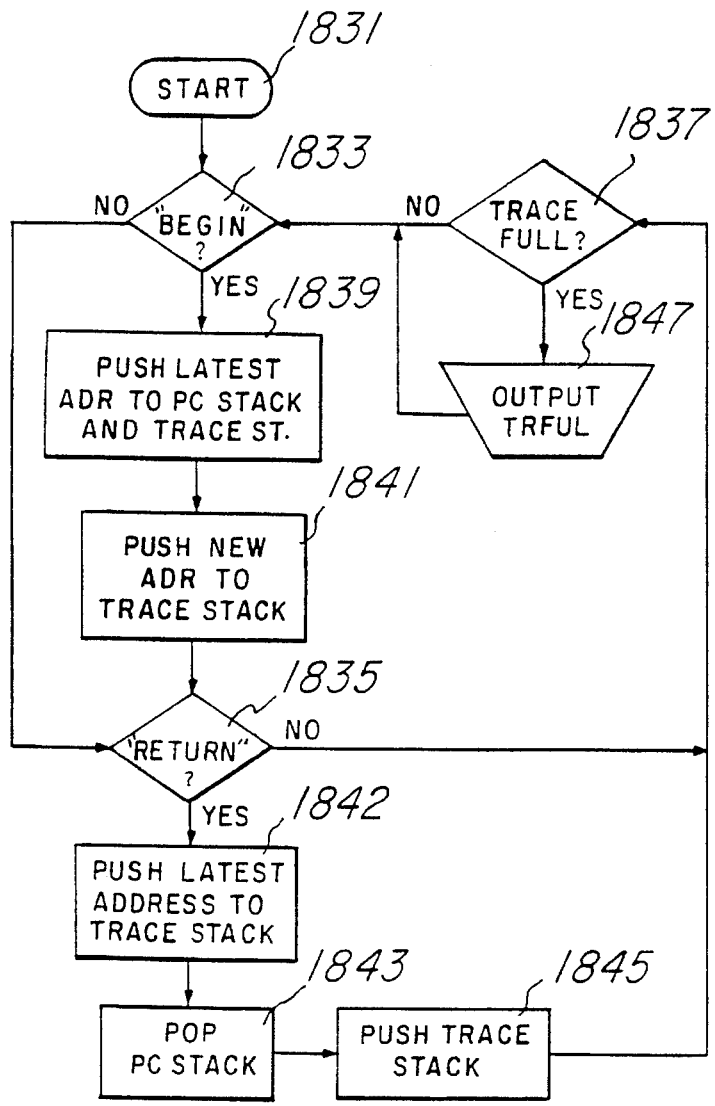
Fig. 73
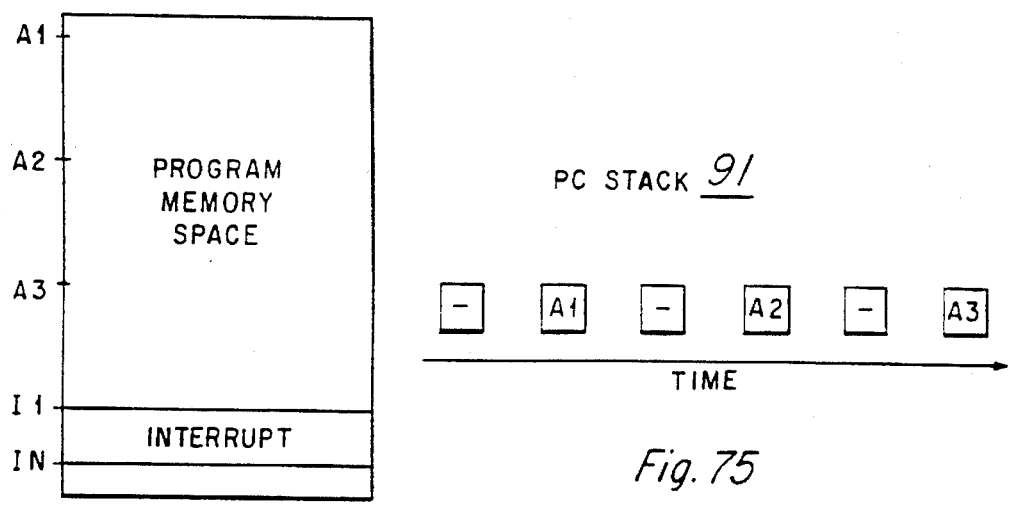
Fig. 74
Fig. 75 ered system design phase. The emulation
EMULATION DEVICES, SYSTEMS AND METHODS WITH DISTRIBUTED CONTROL OF TEST INTERFACES IN CLOCK DOMAINS This application is a Continuation, of application Ser. No. 08/209,127, filed Mar 9, 1994, now abandoned.

NOTICE

© Copyright 1989 Texas Instruments Incorporated. A portion of the disclosure of this patent document contains material which is subject to copyright protection. The copyright owner has no objection to the facsimile reproduction by anyone of the patent disclosure, as it appears in the U.S. Patent and Trademark Office records, but otherwise reserves all copyright rights whatsoever.

CROSS REFERENCE TO RELATED DOCUMENTS

The related coassigned patent documents listed below are hereby incorporated herein by reference.

| Docket No. | PTO Reference | Effective Filing Date |
| --- | --- | --- |
| TI-12033 | Patent No. 4 860 290 | 06/02/1987 |
| TI-12451 | Patent No. 5 109 494 | 12/31/1987 |
| TI-12543 | Patent No. 5 101 498 | 12/31/1987 |
| TI-14083 | Ser. No. 08/001 915 | 05/04/1989 |
| TI-14147 | Ser. No. 07/918 902 | 05/04/1989 |
| TI-14079 | Ser. No. 07/347 605 | 05/04/1989 |
| TI-14080 | Patent No. 5 072 418 | 05/04/1989 |
| TI-14081 | Patent No. 5 142 677 | 05/04/1989 |
| TI-14082 | Patent No. 5 155 812 | 05/04/1989 |
| TI-14145 | Ser. No. 07/967 942 | 05/04/1989 |
| TI-14141 | Ser. No. 07/846 459 | 07/31/1989 |
| TI-14142 | Ser. No. 07/832 661 | 07/31/1989 |
| TI-14143 | Ser. No. 07/827 549 | 07/31/1989 |
| TI-14282 | Ser. No. 07/949 757 | 07/31/1989 |
| TI-14308 | Ser. No. 07/979 396 | 07/31/1989 |
| TI-12016 | Ser. No. 08/108 775 | 09/07/1988 |
| TI-13371 | Ser. No. 08/087 020 | 09/07/1988 |
| TI-13363 | Patent No. 5 084 874 | 09/07/1988 |
| TI-12015 | Patent No. 4 872 169 | 03/06/1987 |
| TI-12698 | Ser. No. 07/440 454 * | 09/04/1987 |
| TI-14312 | Patent No. 5 237 672 | 07/28/1989 |
| TI-14315 | Ser. No. 07/387 569 * | 07/28/1989 |
| TI-14316 | Ser. No. 07/387 455 * | 07/28/1989 |
| TI-14320 | Ser. No. 07/386 850 * | 07/28/1989 |
| TI-13495 | Patent No. 5 233 690 | 07/28/1989 |
| TI-11398 | Patent No. 5 140 687 | 12/31/1986 |
| TI-15445 | Unknown | Concurrently herewith |
| TI-19085 | Unknown | Concurrently herewith |

* = abandoned---.

FIELD OF THE INVENTION

This invention relates to electronic data processing and emulation, simulation, and testability devices and systems, and methods of their manufacture and operation.

BACKGROUND OF THE INVENTION

Advanced wafer lithography and surface-mount packaging technology are integrating increasingly complex functions at both the silicon and printed circuit board level of electronic design. In this regard, it is recognized that diminished physical access is an unfortunate consequence of denser designs and shrinking interconnect pitch. Designed-in testability is needed, so that the finished product is still both controllable and observable during test and debug. Any manufacturing defect is preferably detectable during final test before a product is shipped. This basic necessity is difficult to achieve for complex designs without taking testability into account in the logic design phase, so that automatic test equipment can test the product.

In addition to testing for functionality and for manufacturing defects, application software development requires a similar level of simulation, observability and controllability in the system or sub-system design phase. The emulation phase of design should ensure that an IC (integrated circuit), or set of ICs, functions correctly in the end equipment or application when linked with the software programs.

With the increasing use of ICs in the automotive industry, telecommunications, defense systems, and life support systems, thorough testing and extensive real-time debug becomes a critical need.

Functional testing, wherein a designer is responsible for generating test vectors that are intended to ensure conformance to specification, still remains a widely used test methodology. For very large systems this method proves inadequate in providing a high level of detectable fault coverage. Automatically generated test patterns would be desirable for full testability, and controllability and observability are key goals that span the full hierarchy of test (from the system level to the transistor level).

Another problem in large designs is the long time and substantial expense involved. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation approach, a large of subsequent design time is expended on test pattern creation and grading.

Even if a significant investment were made to design a module to be reusable and to fully create and grade its test patterns, subsequent use of module may bury it in application specific logic, and make its access difficult or impossible. Consequently, it is desirable to avoid this pitfall.

The advances in IC design, for example, are accompanied by decreased internal visibility and control, reduced fault coverage and reduced ability to toggle states, more test development and verification problems, increased complexity of design simulation and continually increasing cost of CAD (computer aided design) tools. In the board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment even into the 7-figure range, and tighter tolerances.

SUMMARY OF THE INVENTION

Among the objects of the present invention are to provide improved emulation, simulation and testability architectures and methods which provide visibility and control without physical probing or special test fixtures; to provide improved emulation, simulation and testability architectures and methods which are applicable to critical components of system designs to support test and integration of both hardware and software; to provide improved emulation, simulation and testability architectures and methods that are a viable alternative to high capital-cost test equipment and systems to provide improved emulation, simulation and testability architectures and methods which integrate access to sophisticated operations in hardware emulation, fault emulation, simulation and built-in test; to provide improved emulation, simulation and testability architectures and methods which apply hardware and software visibility and control to reduce application development time and thus reduce the user manufacturer's time-to-market on new products; and to provide improved emulation, simulation and testability architectures and methods to leverage hierarchical partitioning and automatically generate reusable tests for related chips and systems.

In one aspect of the invention, an emulation device distributes common control information to each of a plurality of clock domains into which the emulation device is partitioned, and also provides the clock domains with individualized clock control.

BRIEF DESCRIPTION OF THE DRAWINGS

The invention is best understood by reference to the detailed description which follows, read in conjunction with the referenced drawings, wherein:

FIGS. 1–43 are described by reference to incorporated U.S. Pat. No. 5,072,418;

FIG. 45 is a partially pictorial, partially block diagram of a system configuration for emulation, simulation, testability and attached processor data processing, communications I/O and peripheral access;

FIG. 46 is a diagram of a software configuration for a host computer of FIG. 45;

FIG. 73 is a process flow diagram of operations of the trace stack and a program counter stack of FIG. 68A;

FIG. 74 is an address map of a processor device;

FIG. 75 is a time-series diagram of the contents of the program counter stack and not the trace stack;

Corresponding numerals and other corresponding symbols refer to corresponding parts in the various drawing figures except where the context indicates otherwise.

DETAILED DESCRIPTION

Figure 1B:
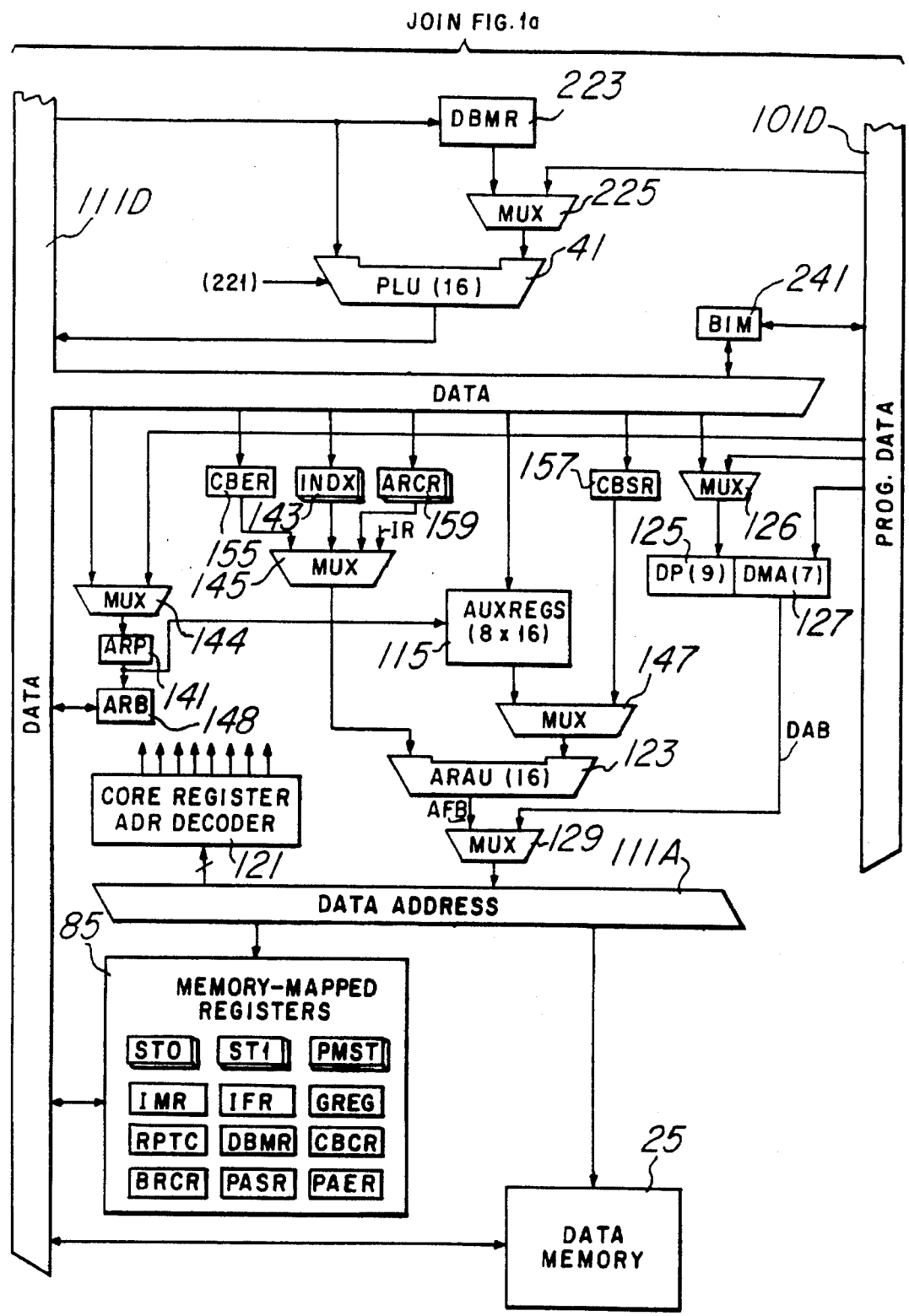
Figure 2:
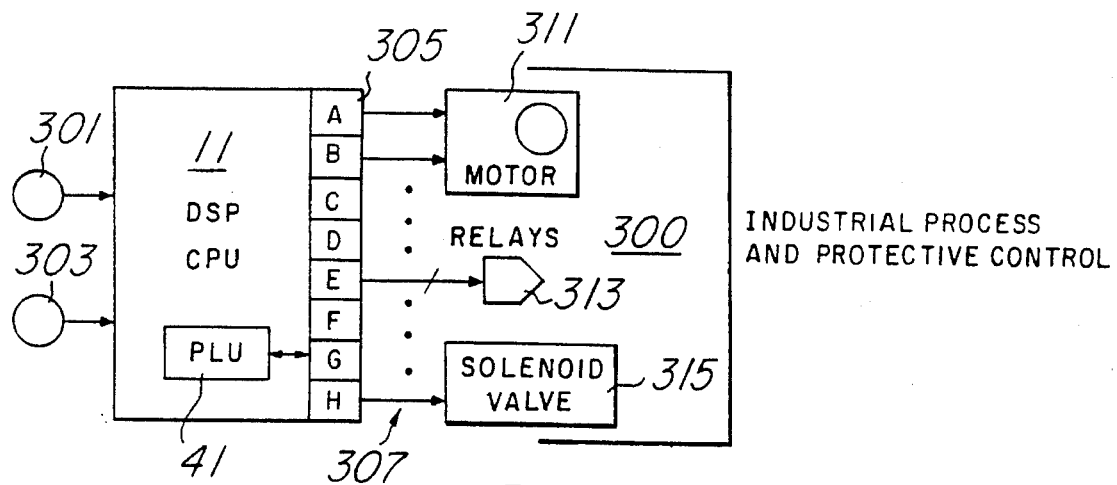
Figure 3:
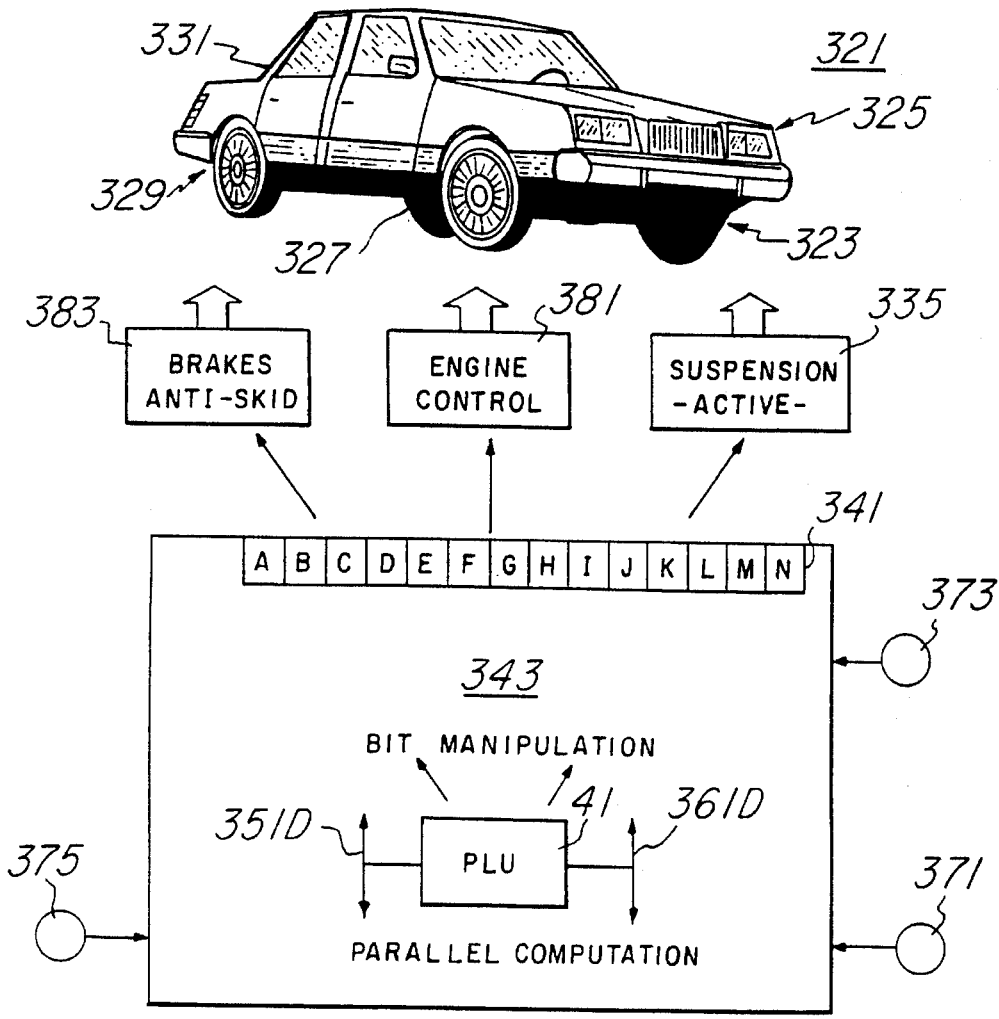
Figure 4:
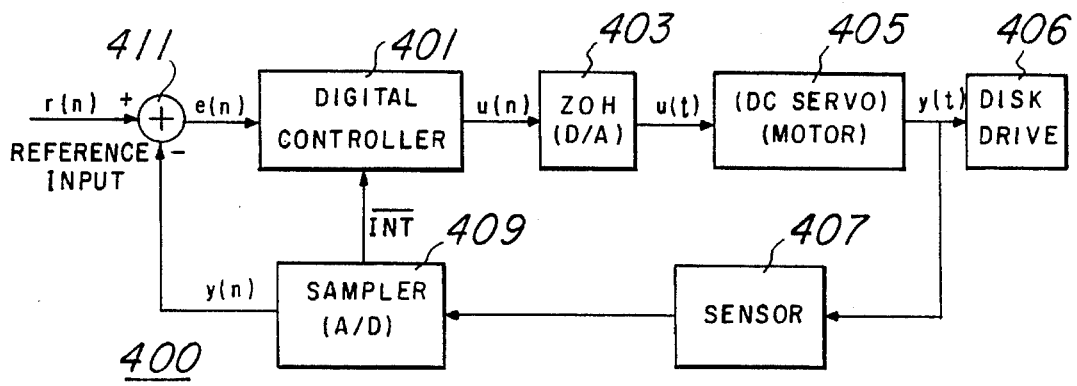
Figure 5:
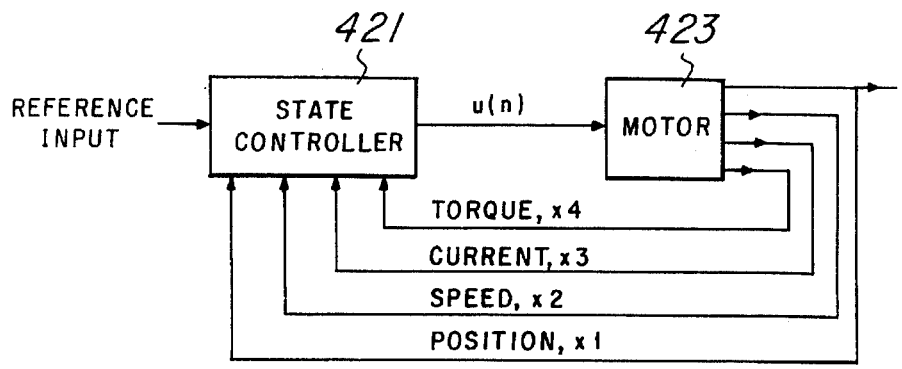
Figure 6:
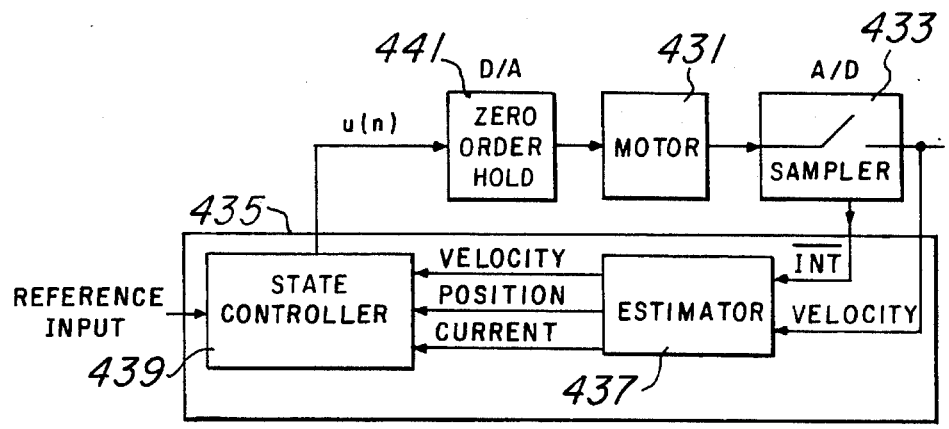
Figure 7:
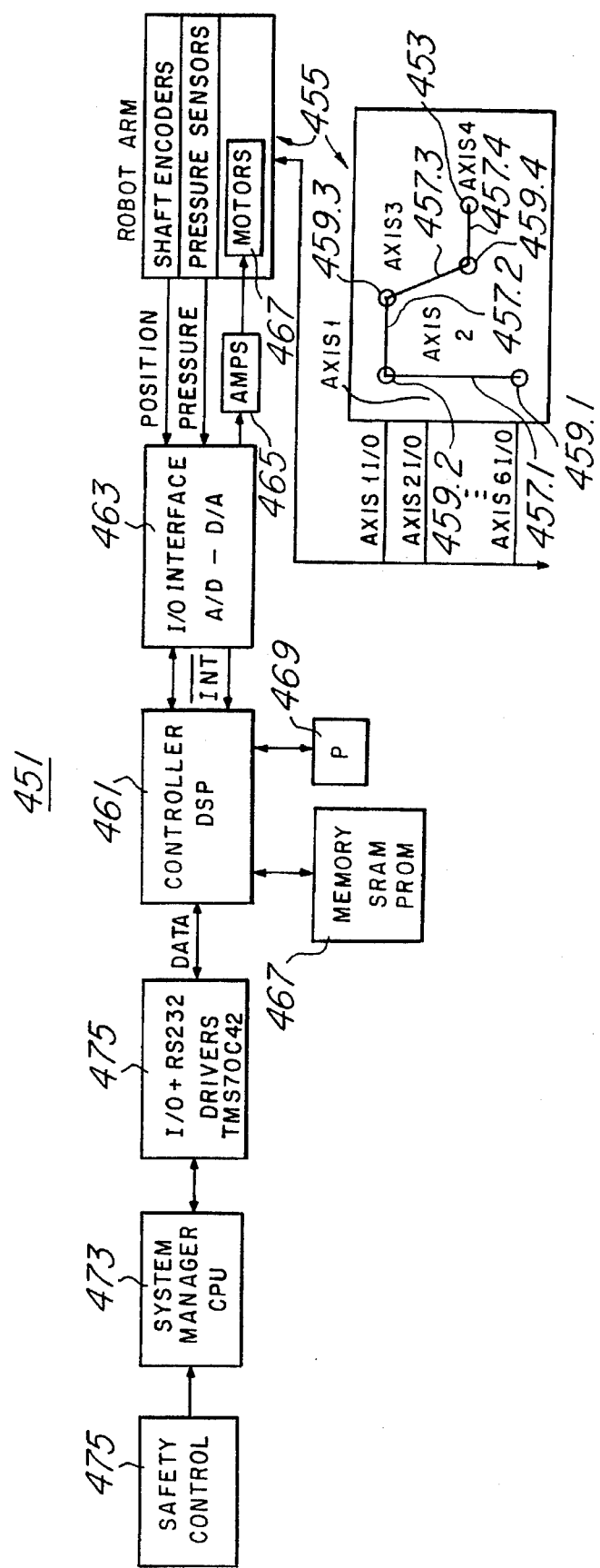
Figure 8:
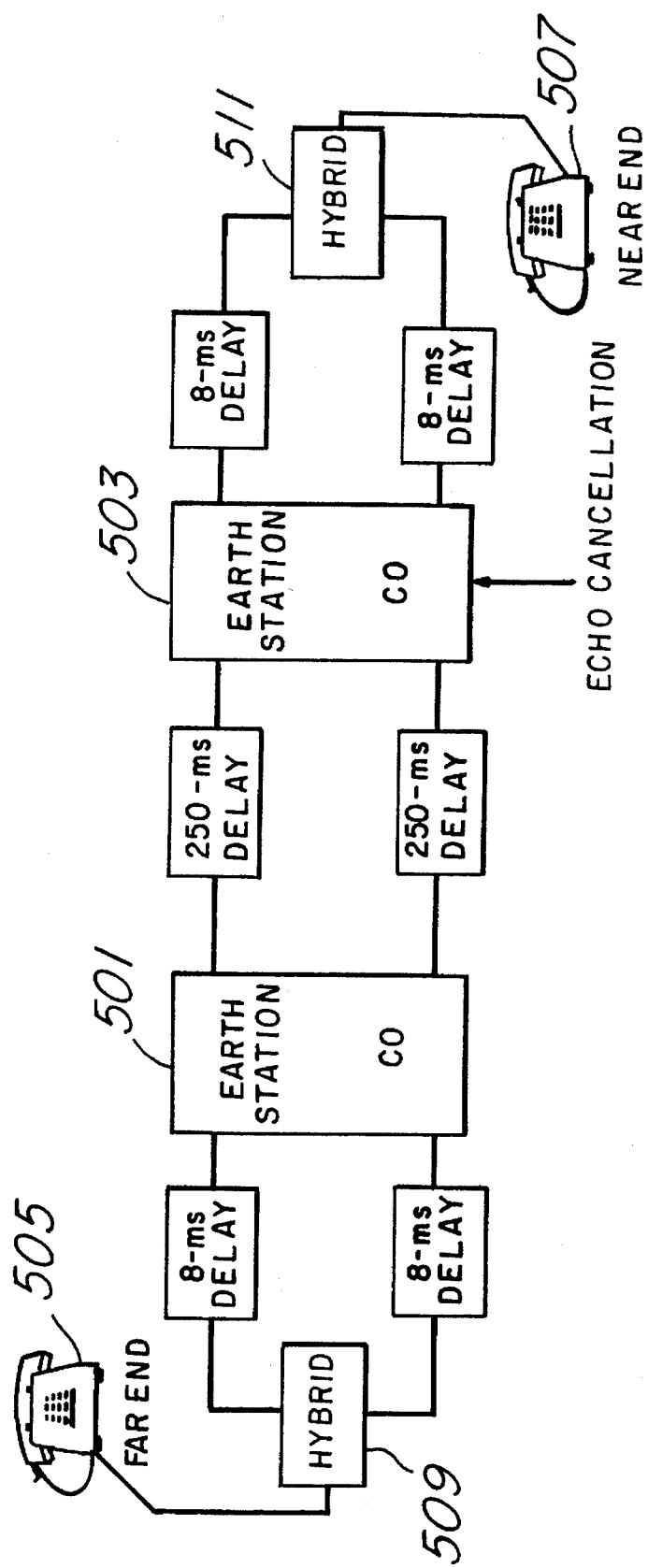
Figure 9:
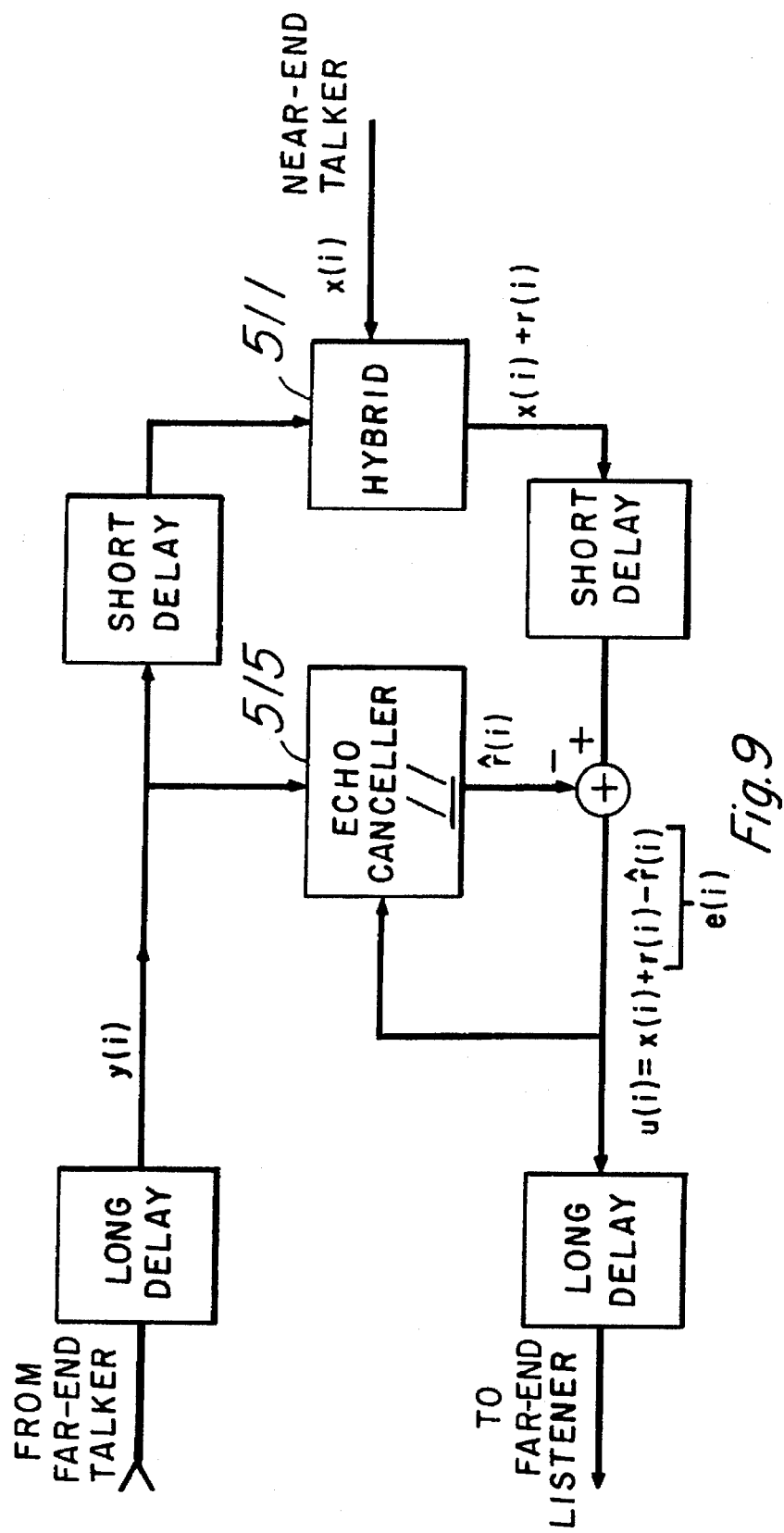
Figure 10:
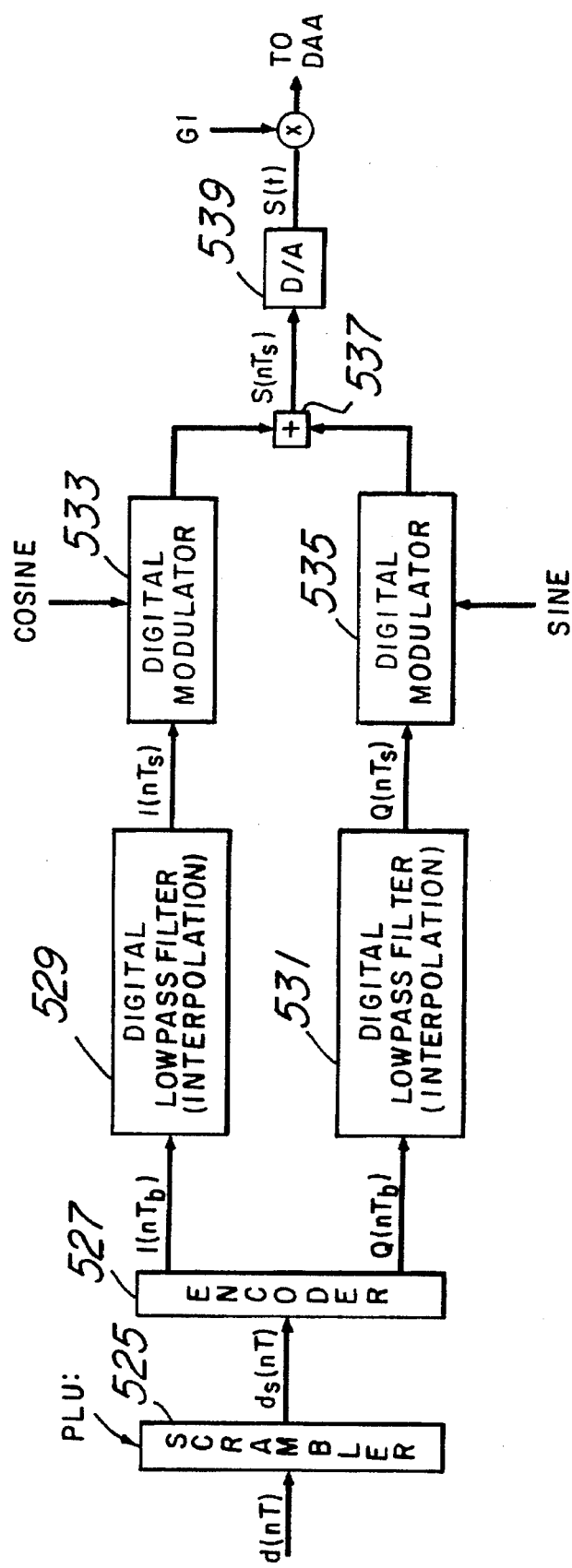
Figure 11:
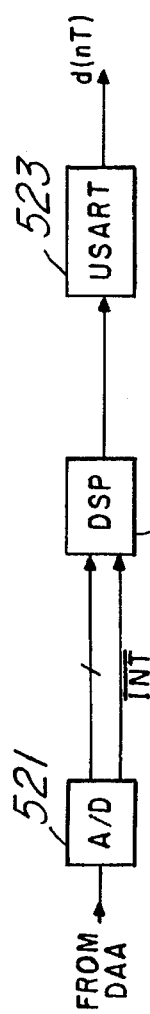
Figure 12:
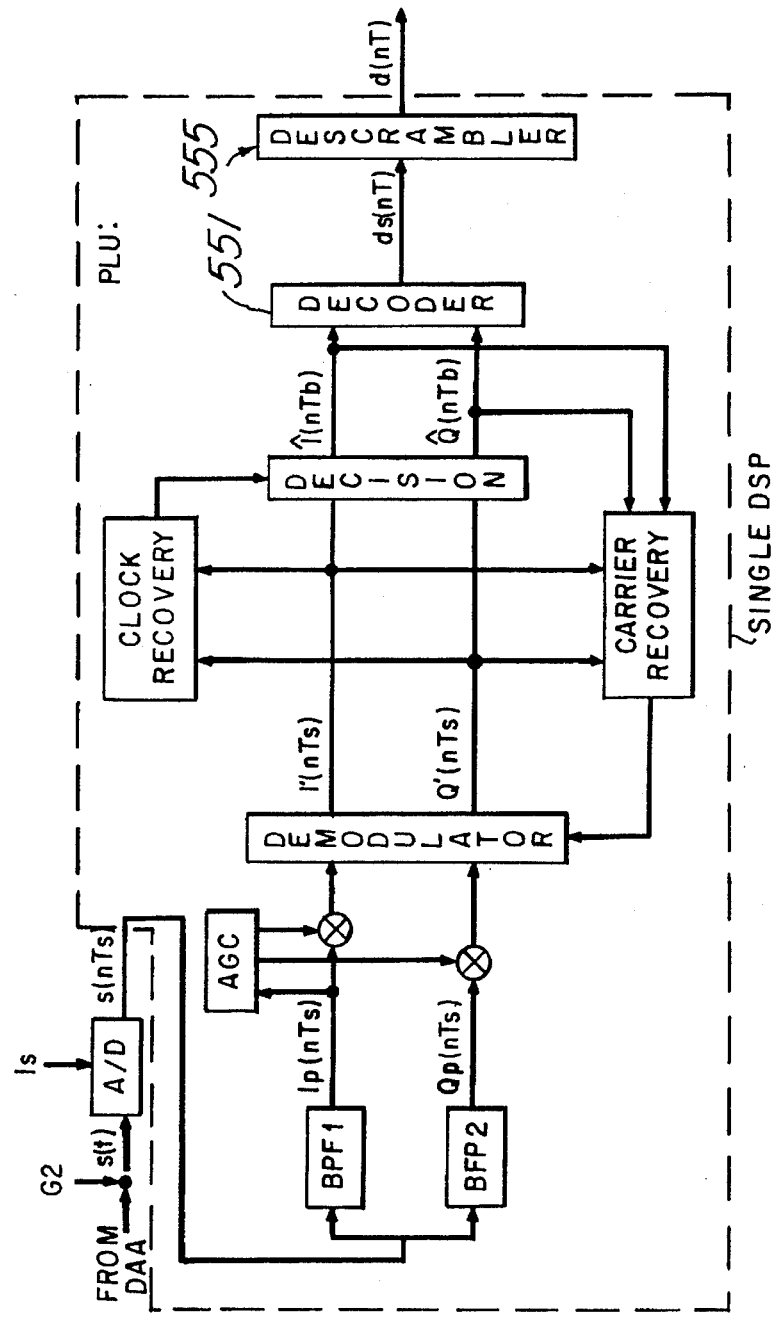
Figure 13:
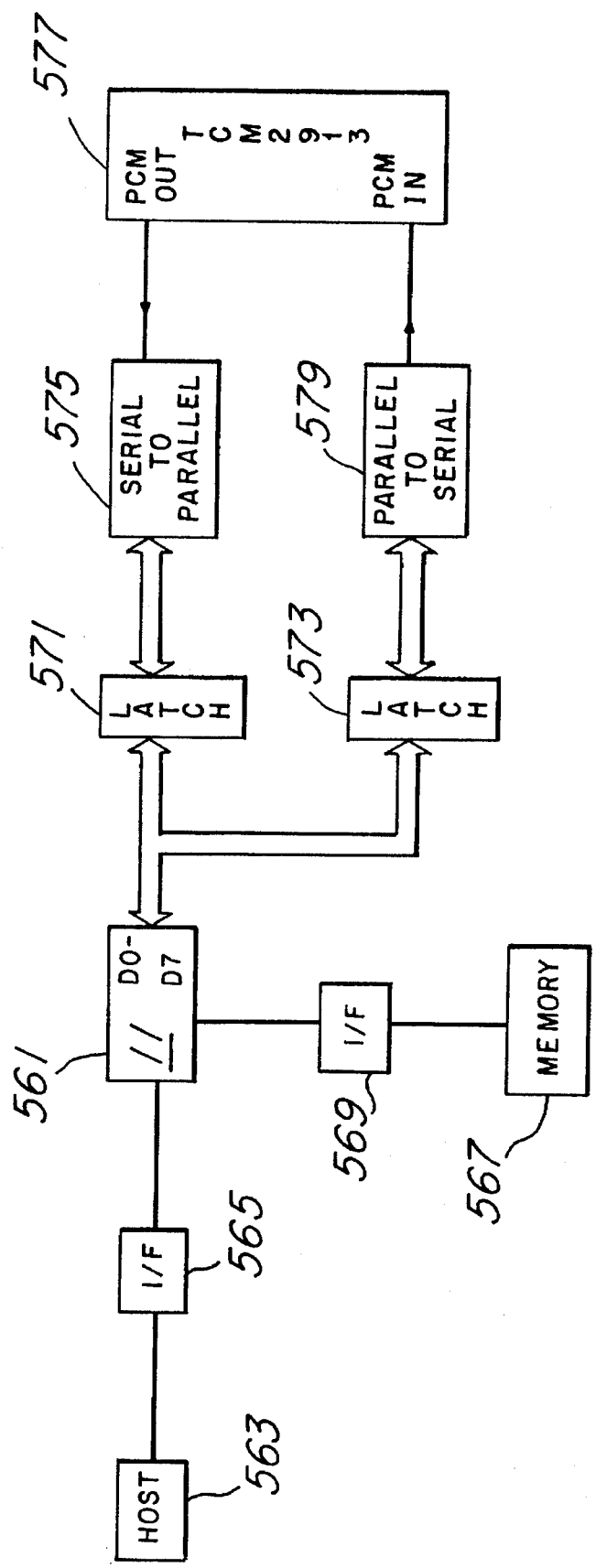
Figure 14:
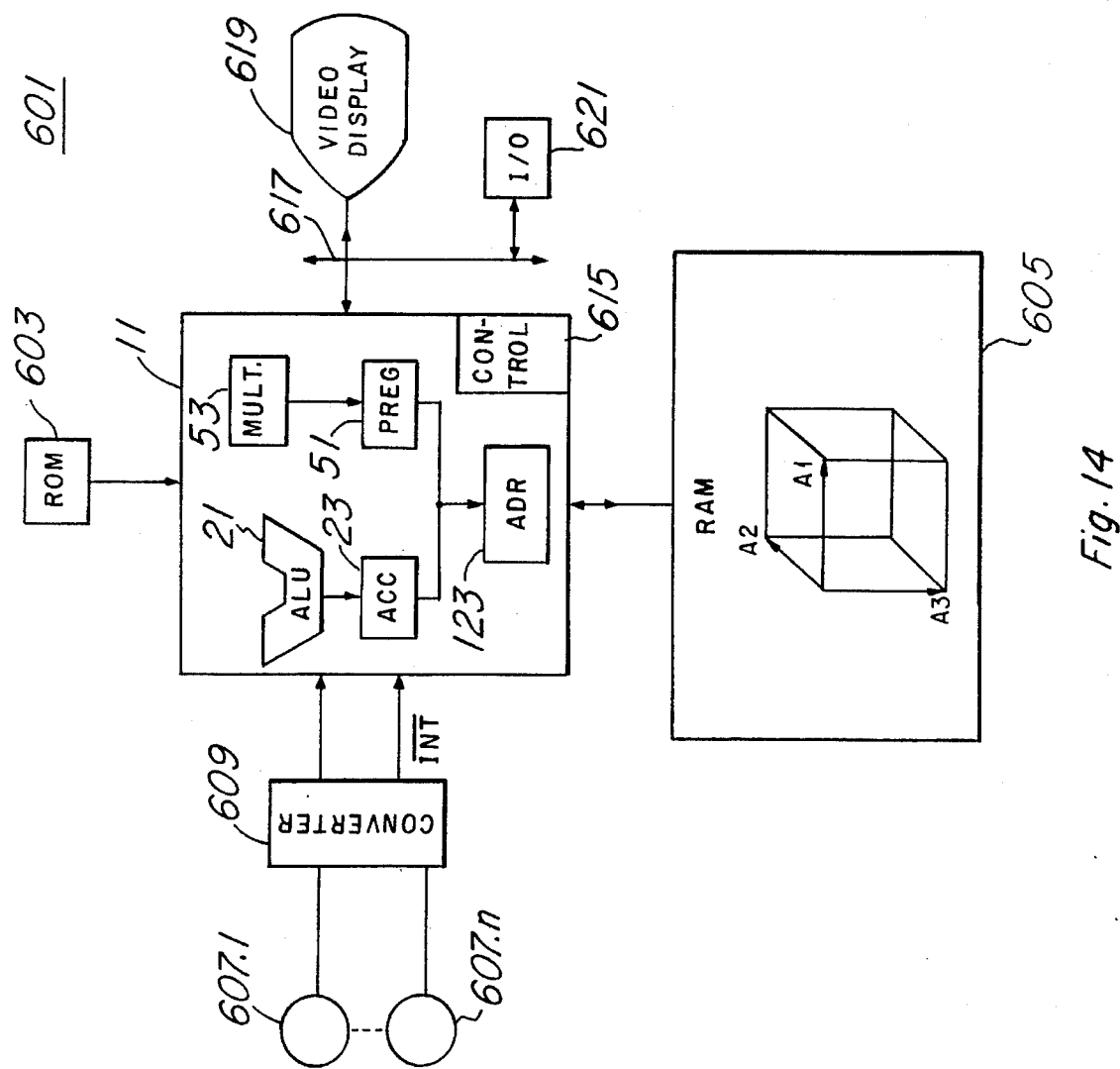
Figure 15:
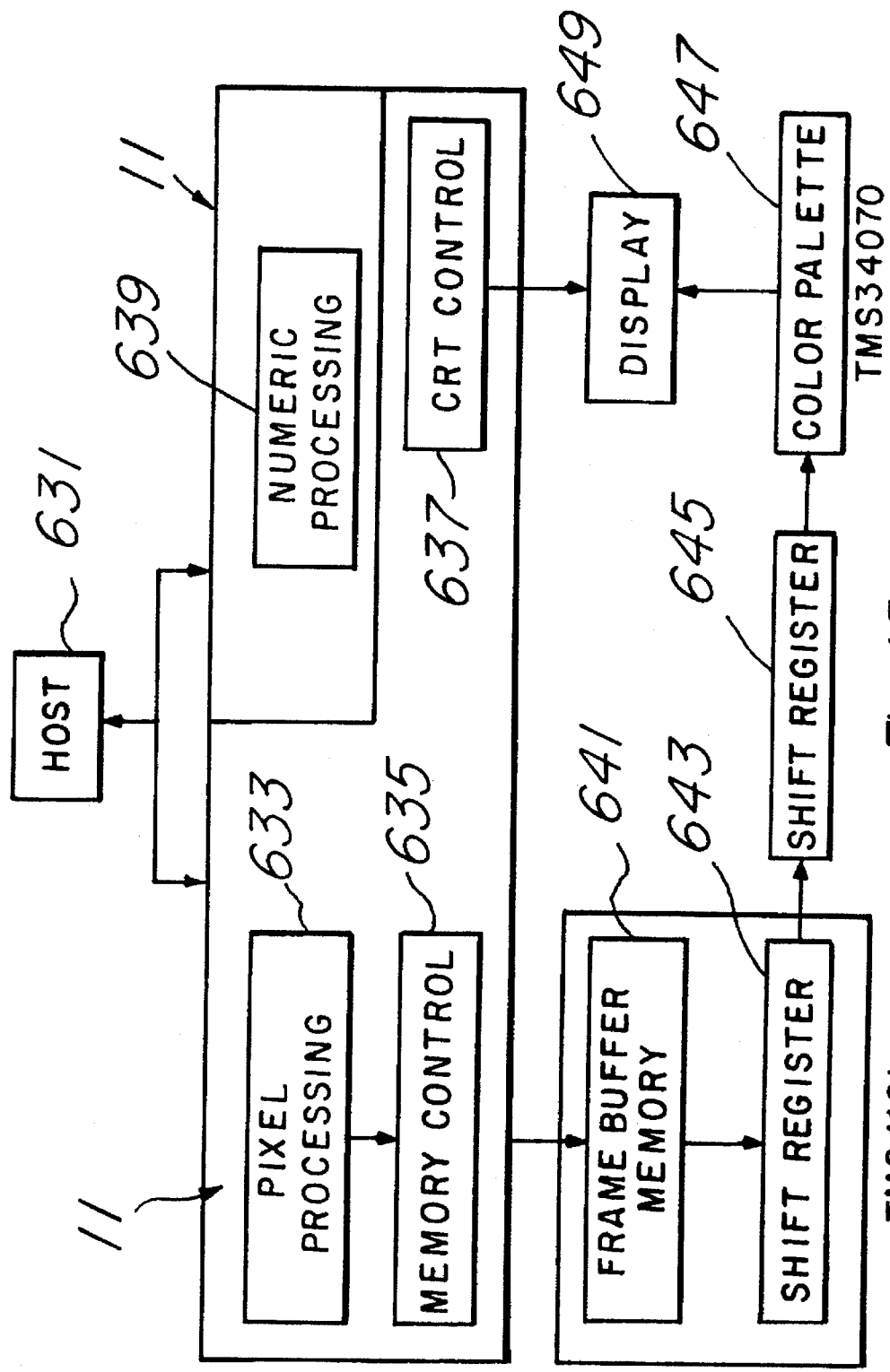
Figure 16:
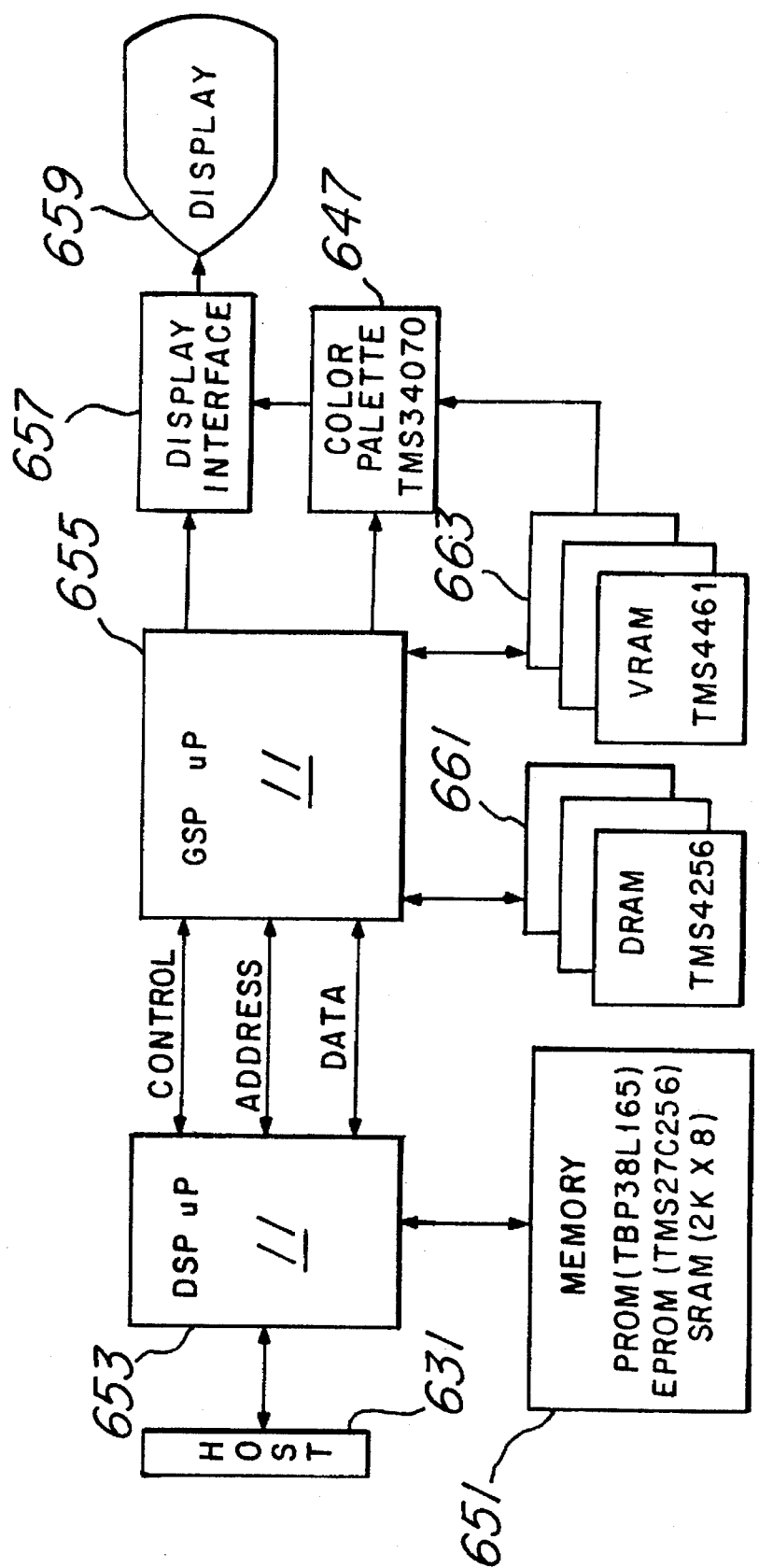
Figure 17:
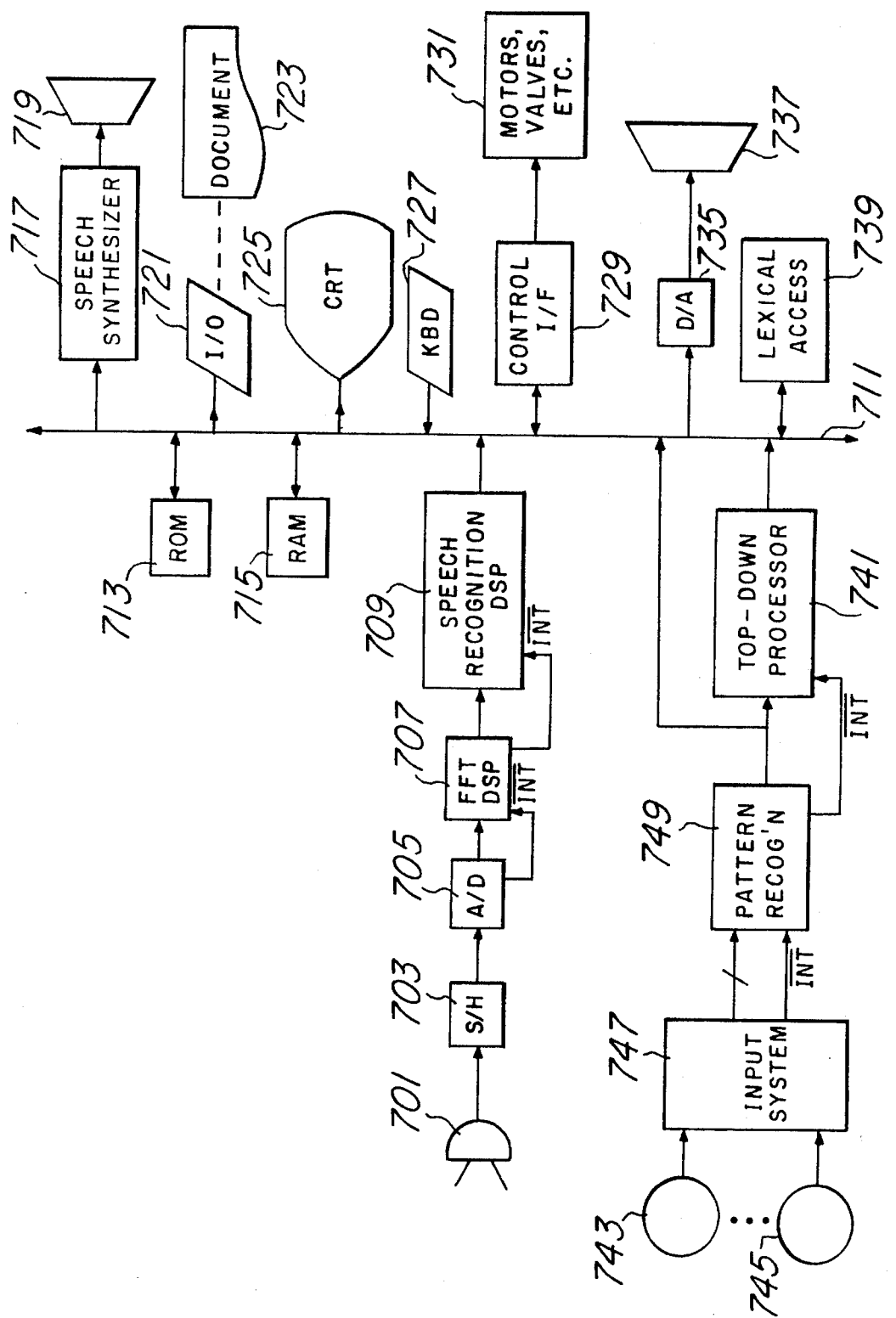
Figure 18:
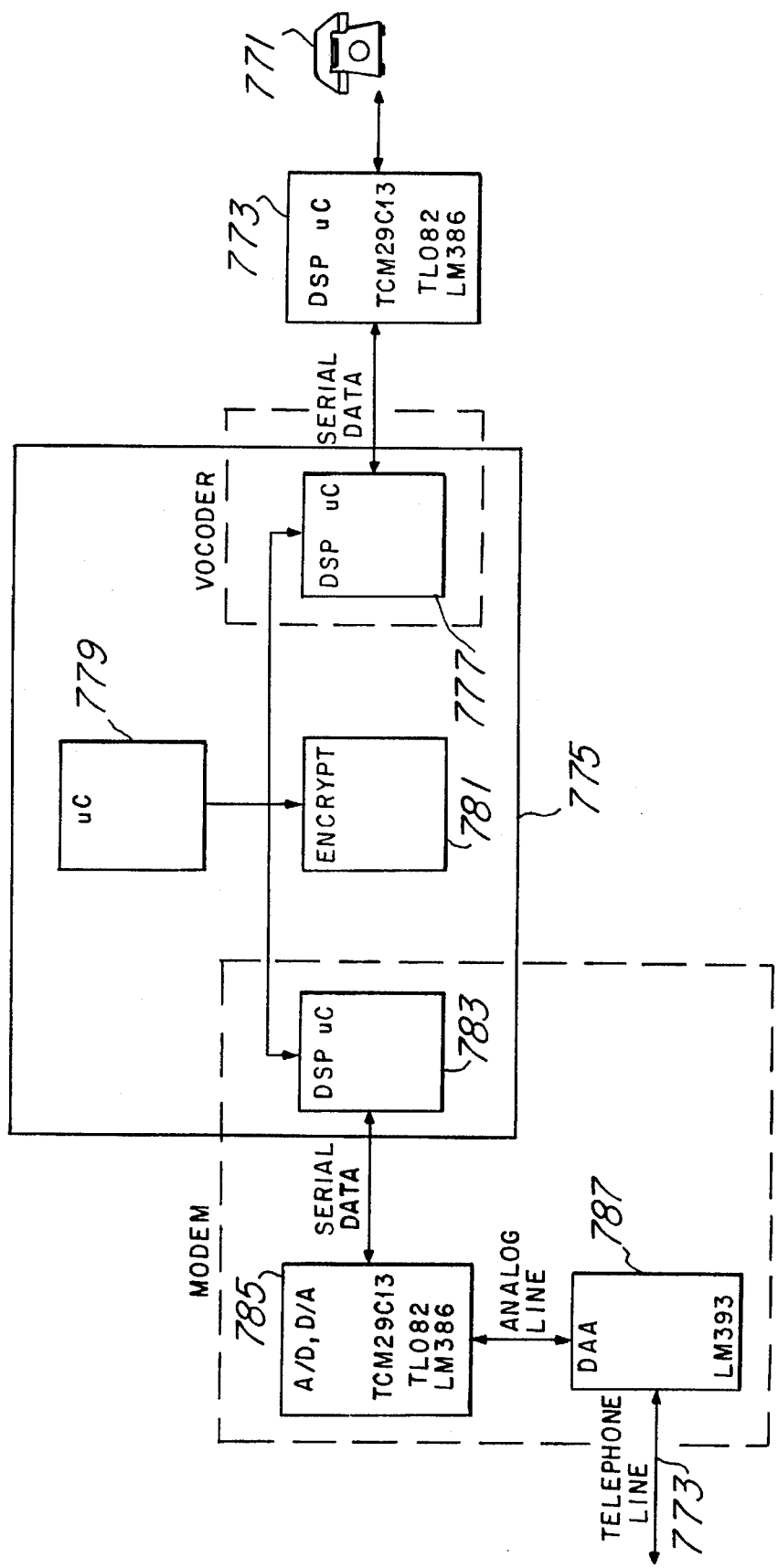
Figure 20:
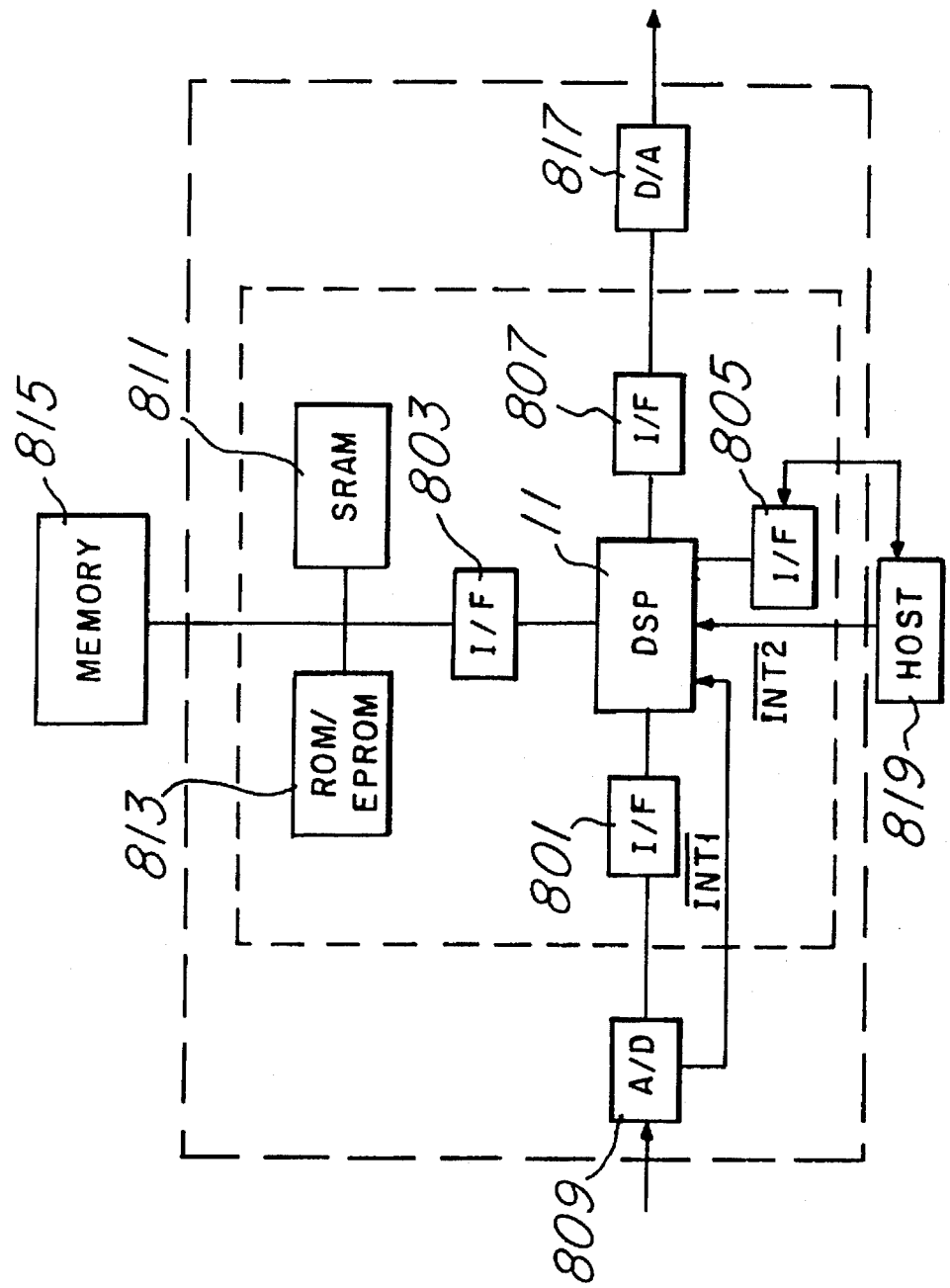
Figure 21:
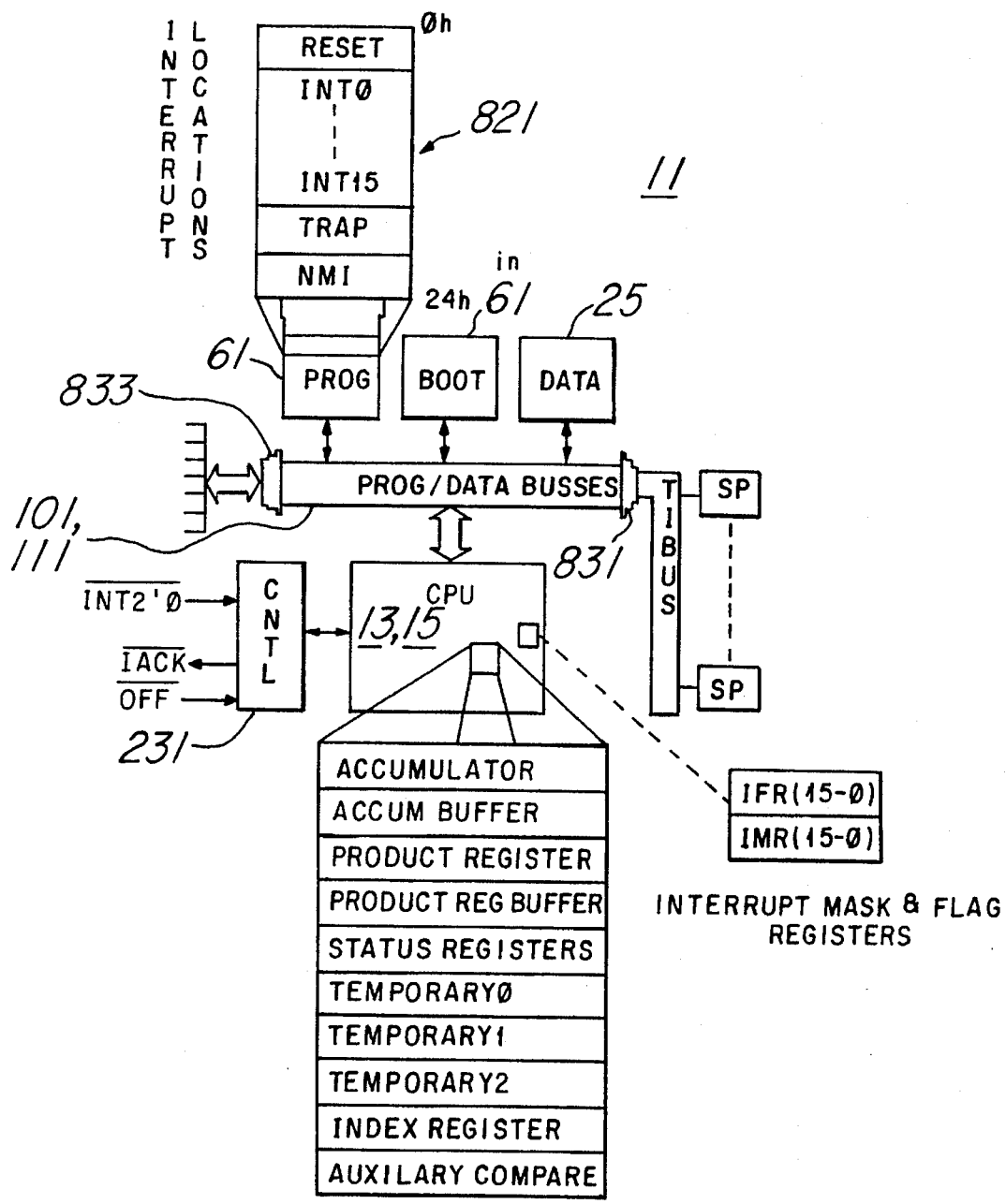
Figure 22:
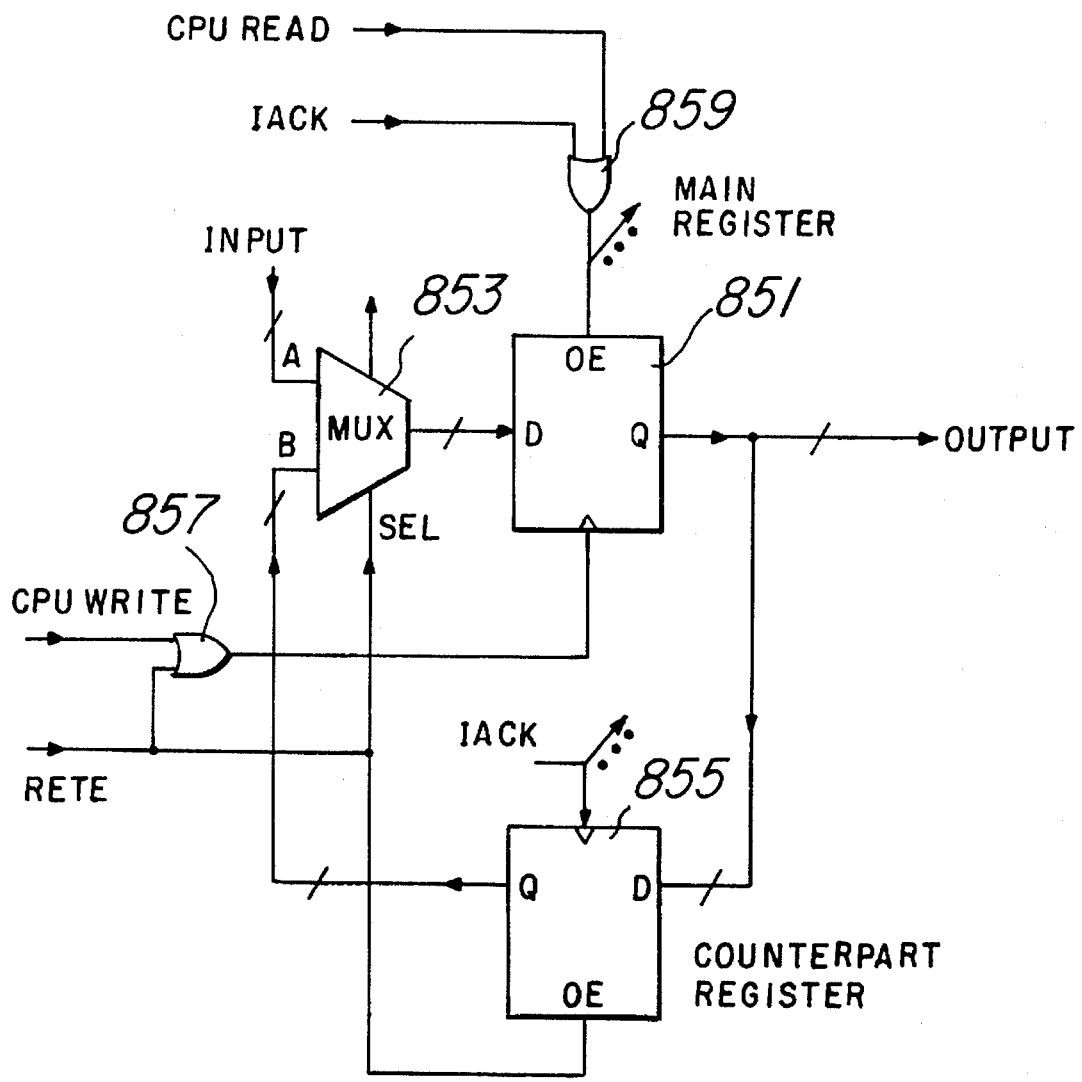
Figure 23:
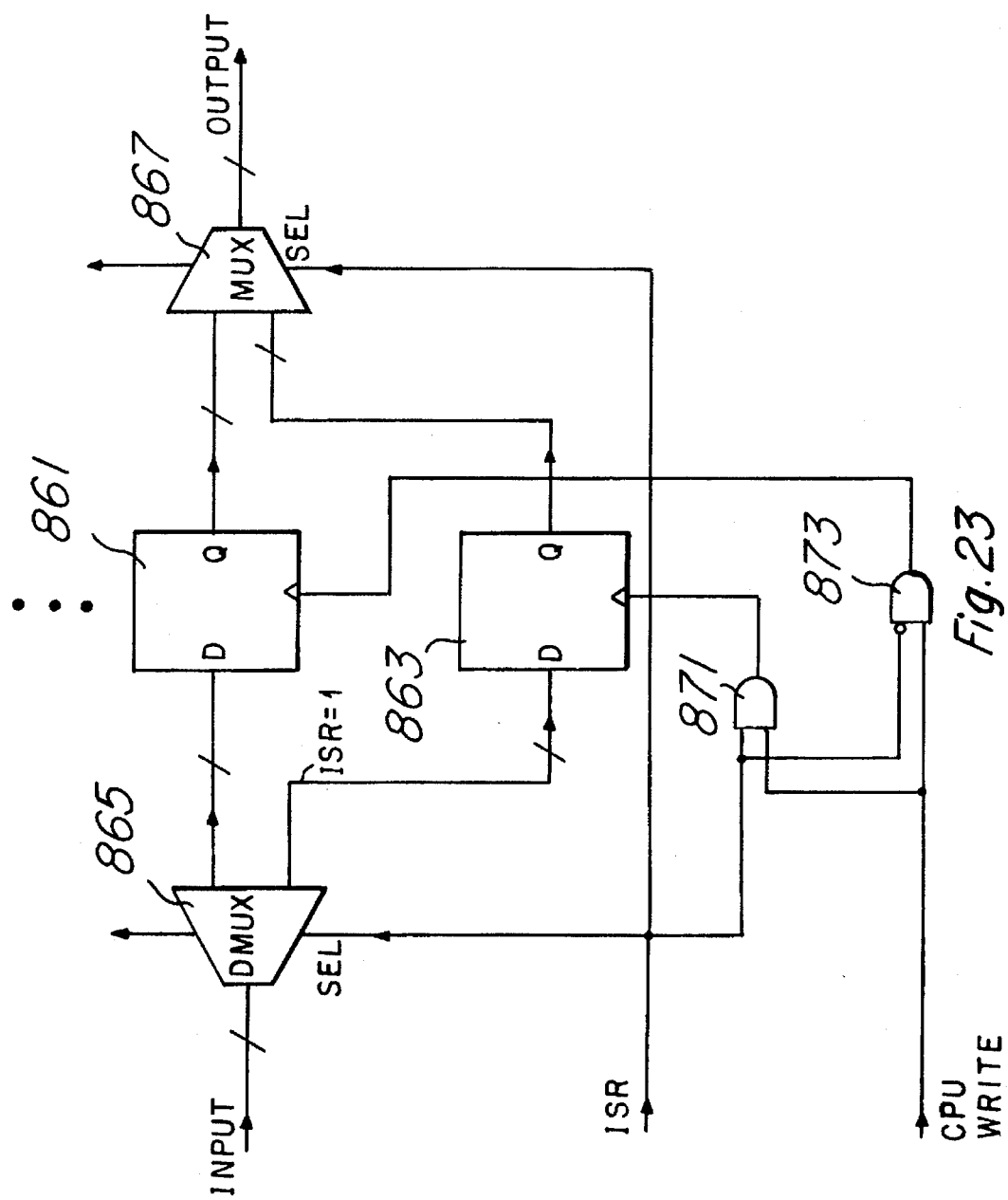
Figure 24:
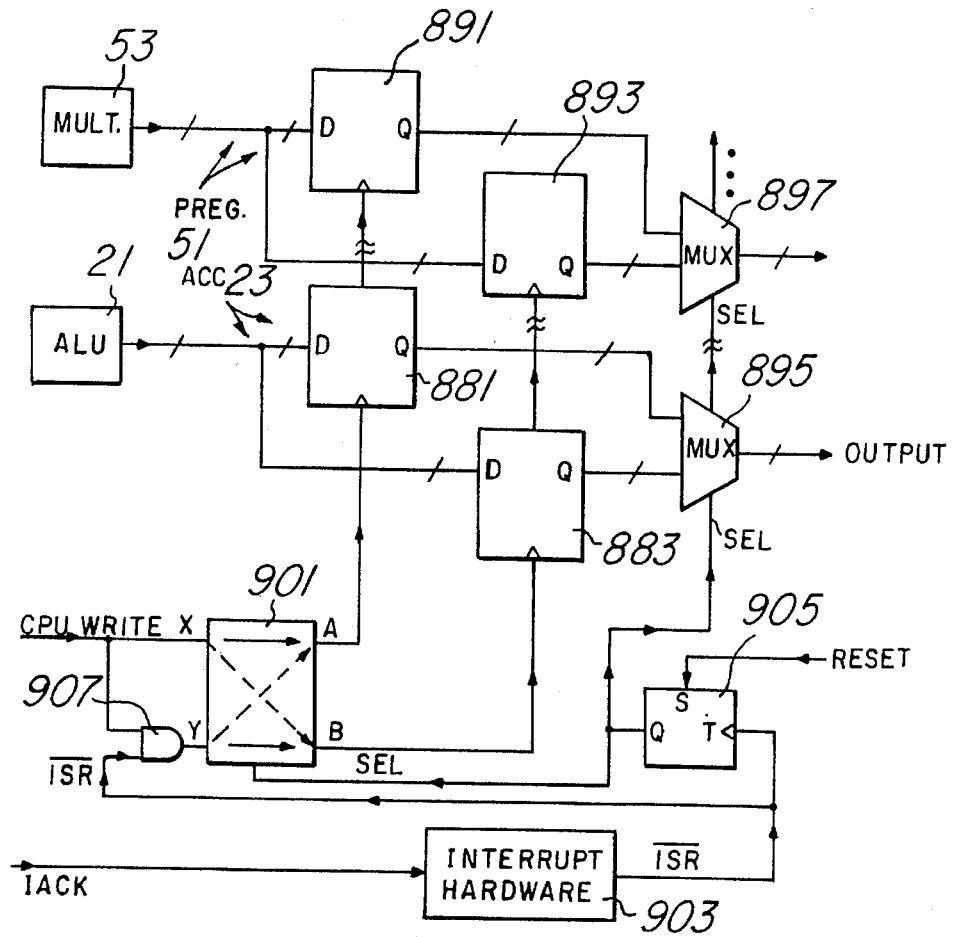
Figure 25:
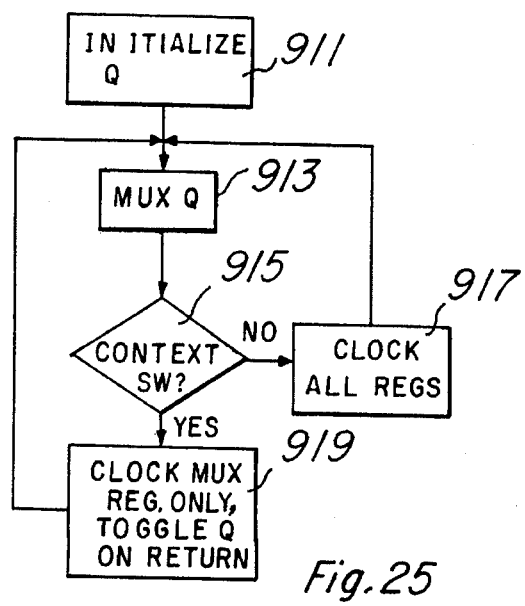
Figure 26:
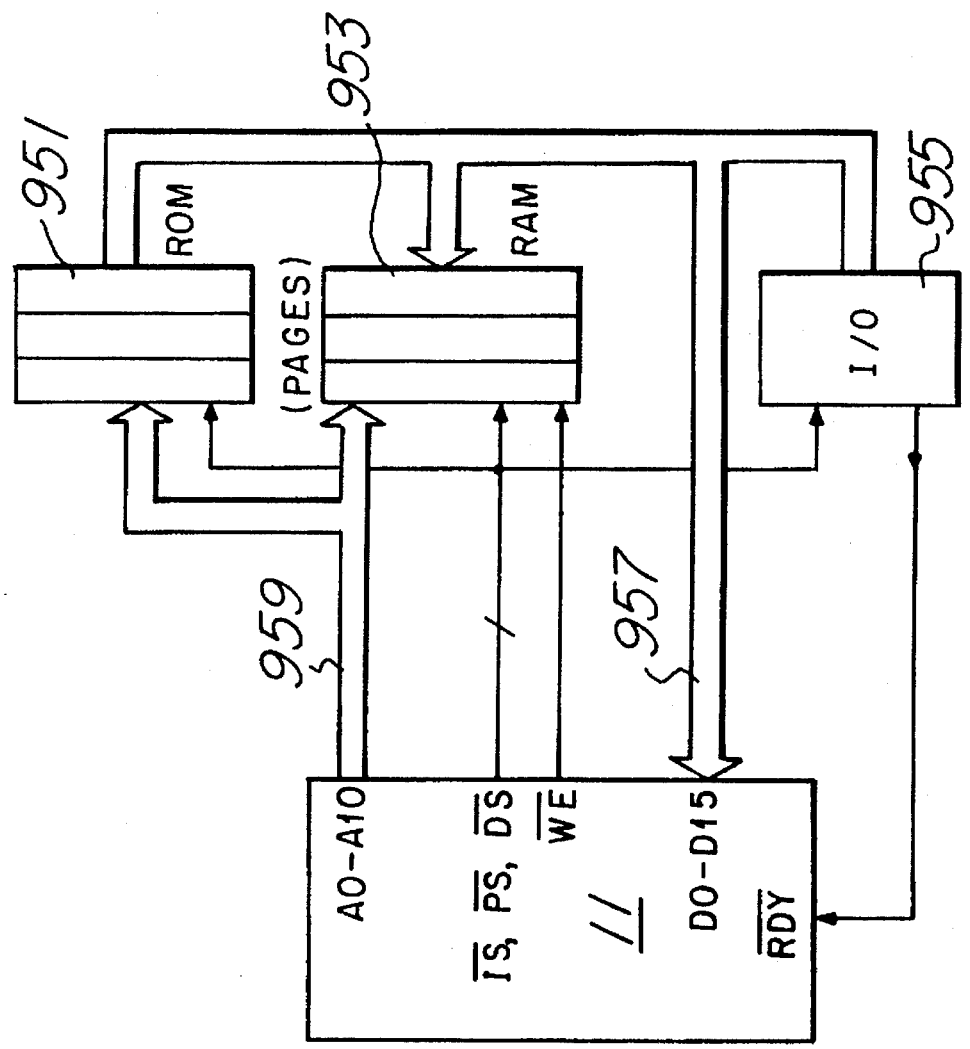
Figure 27:
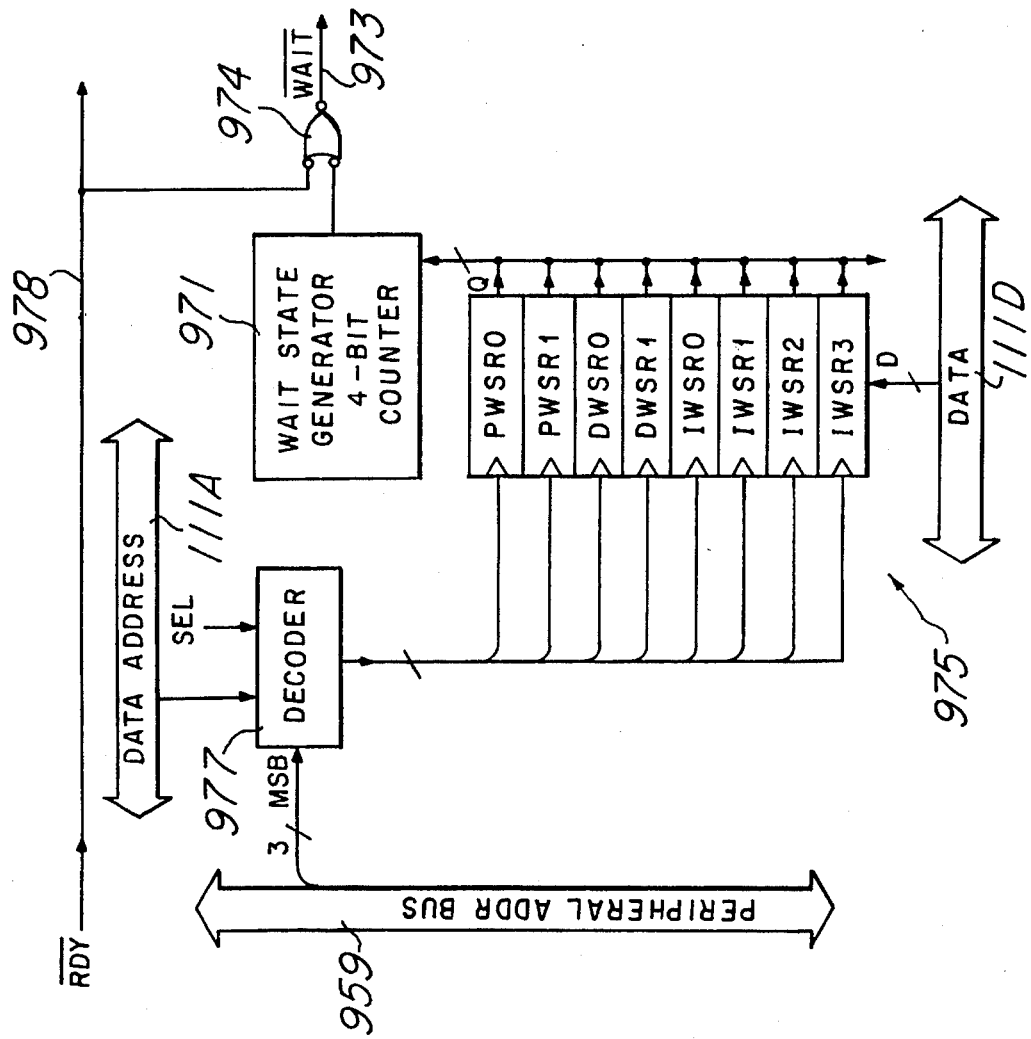
Figure 28:
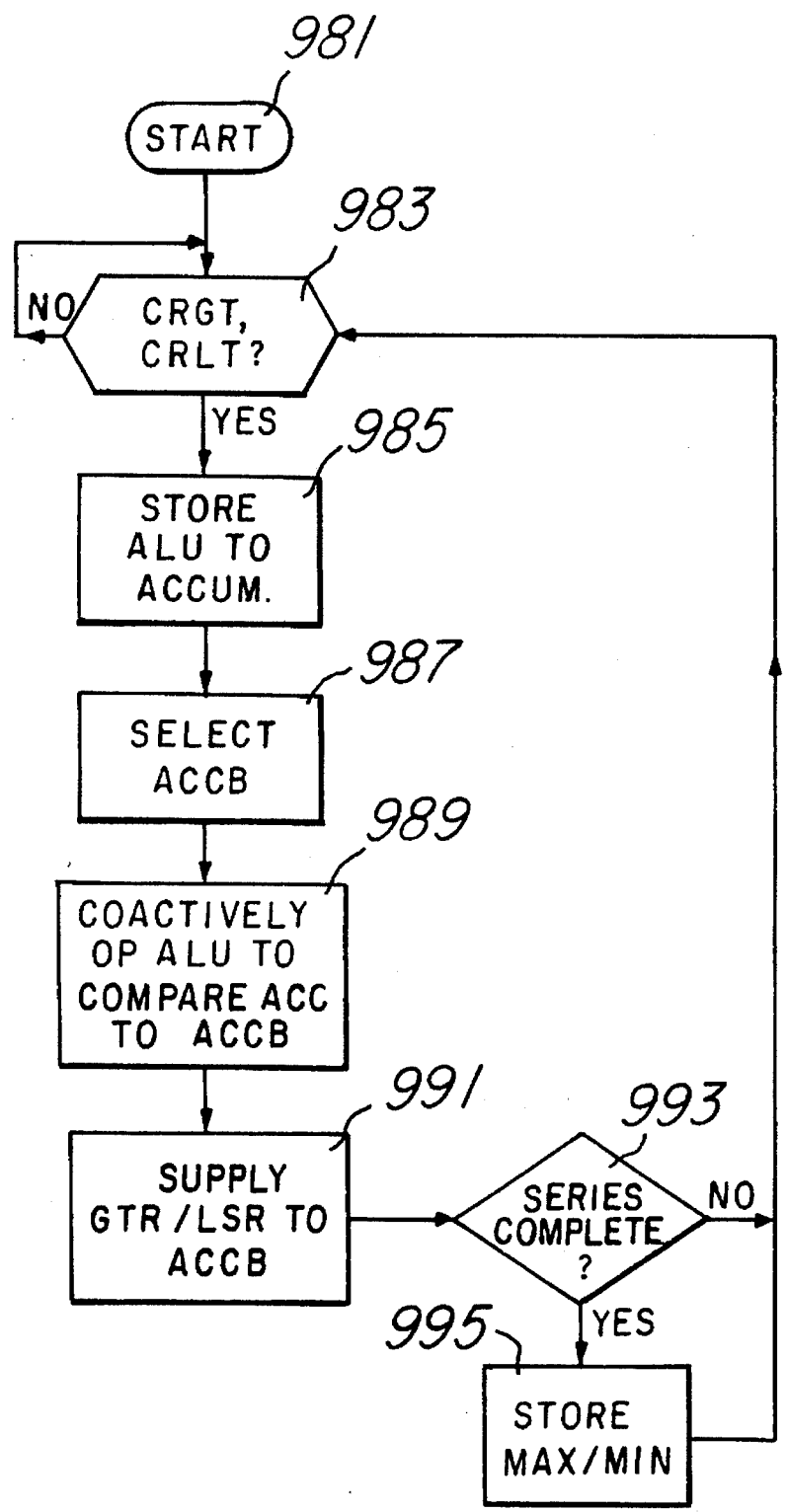
Figure 29:
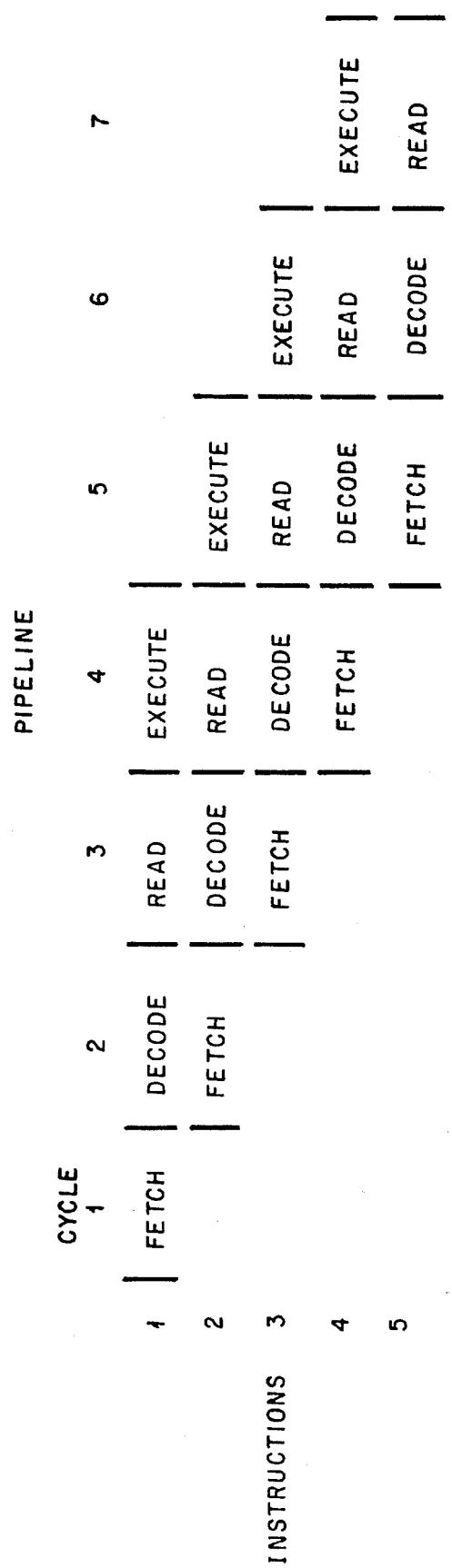
Figure 30:
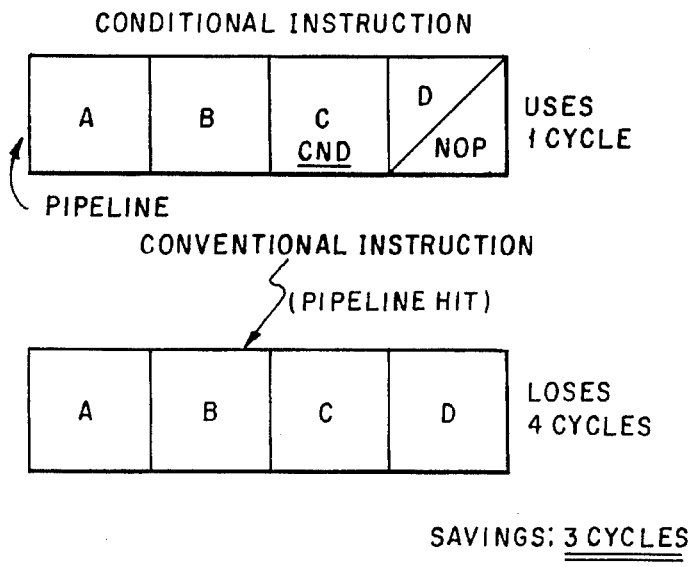
Figure 31:
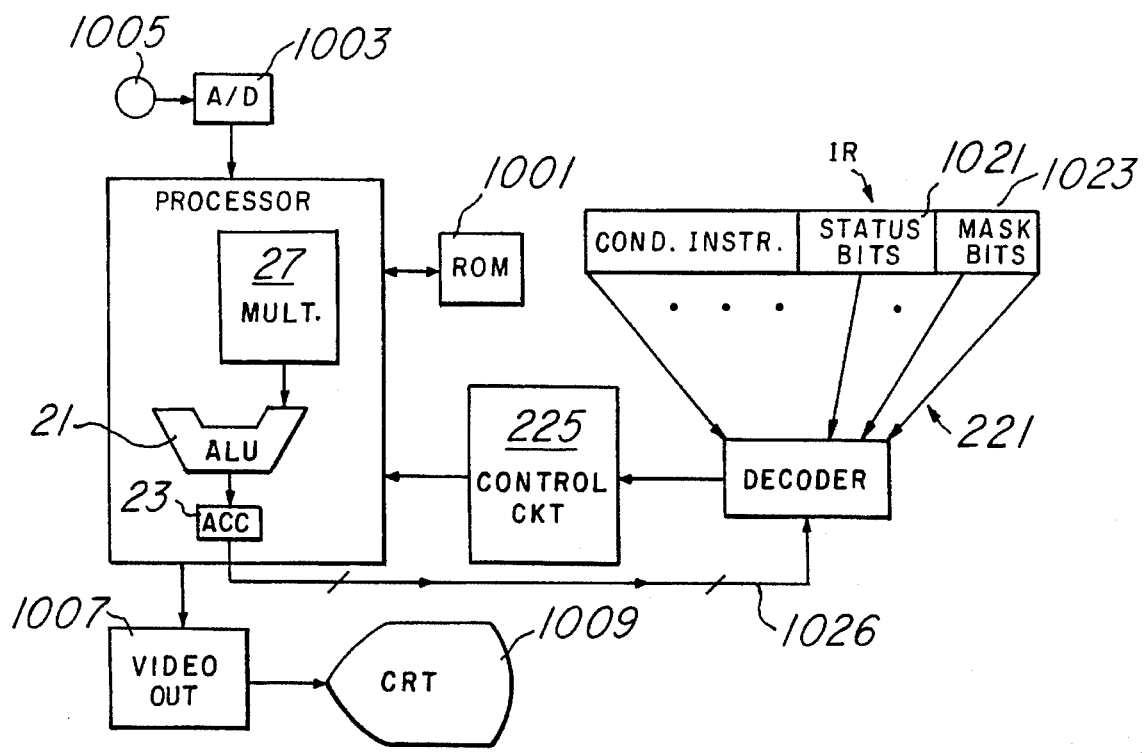
Figure 33:
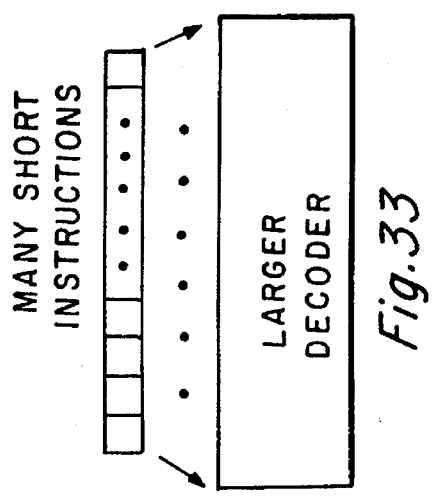
Figure 32:
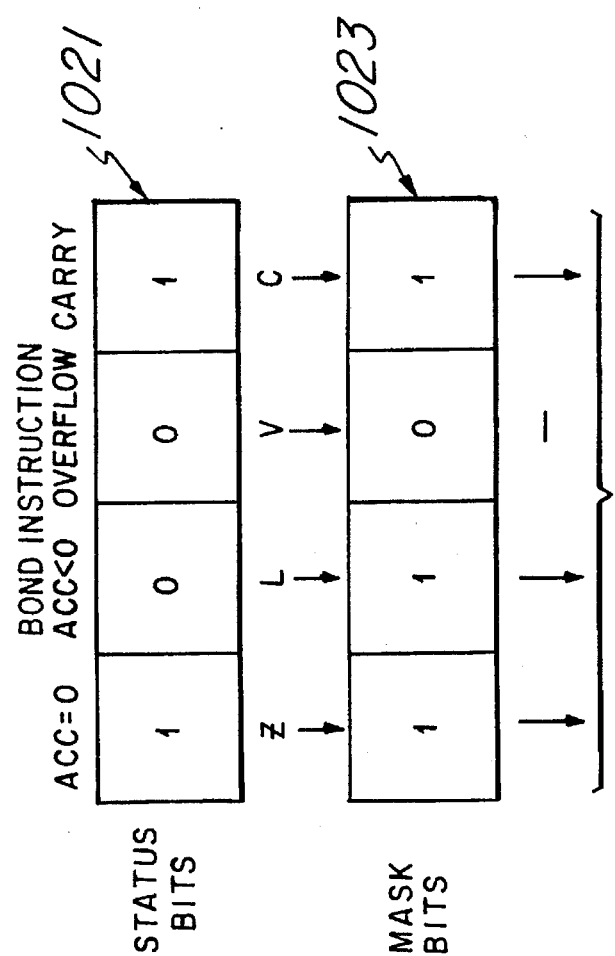
Figure 34:
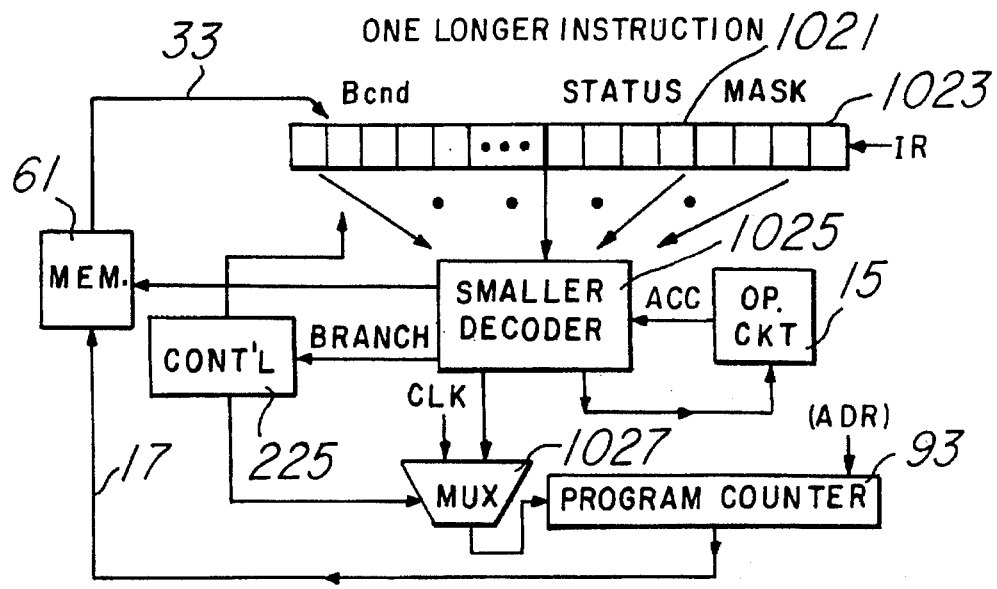
Figure 35:
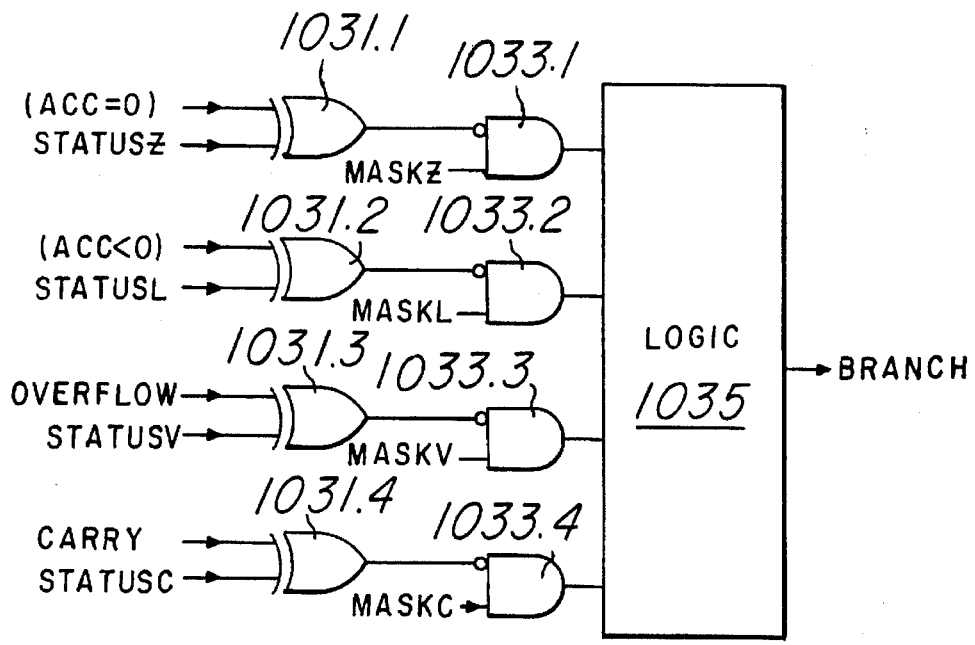
Figure 36:
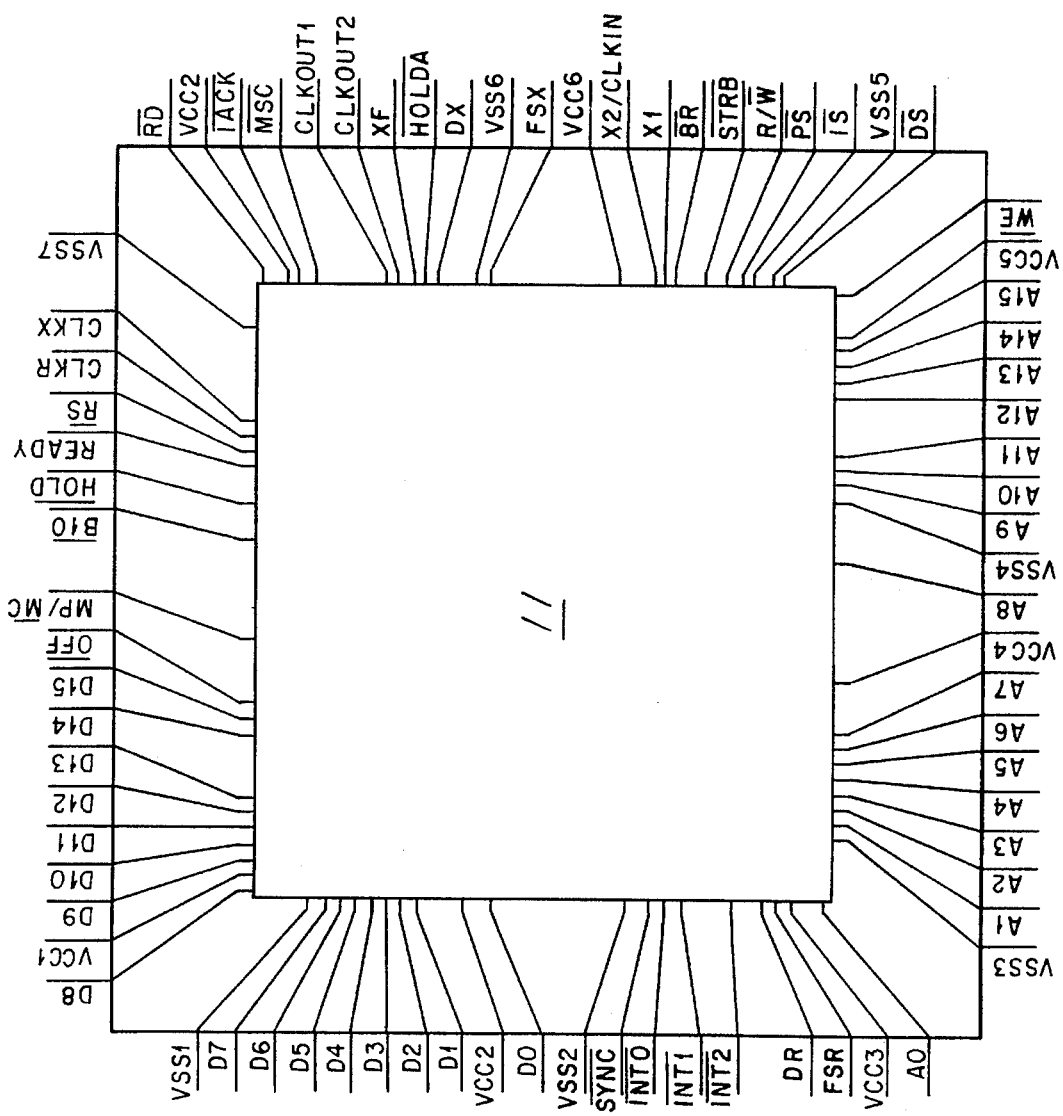
Figure 37:
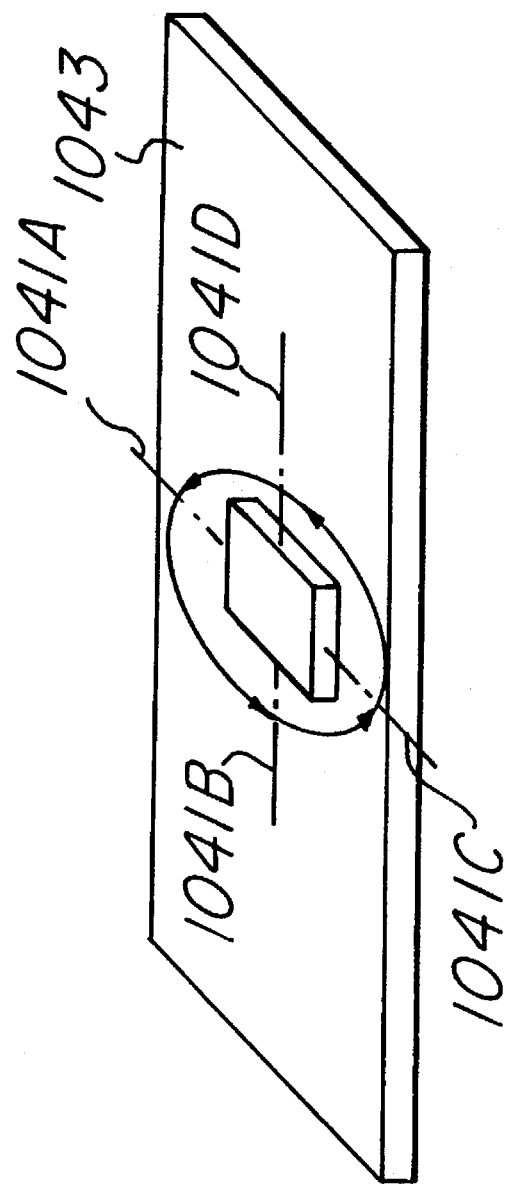
Figure 38:
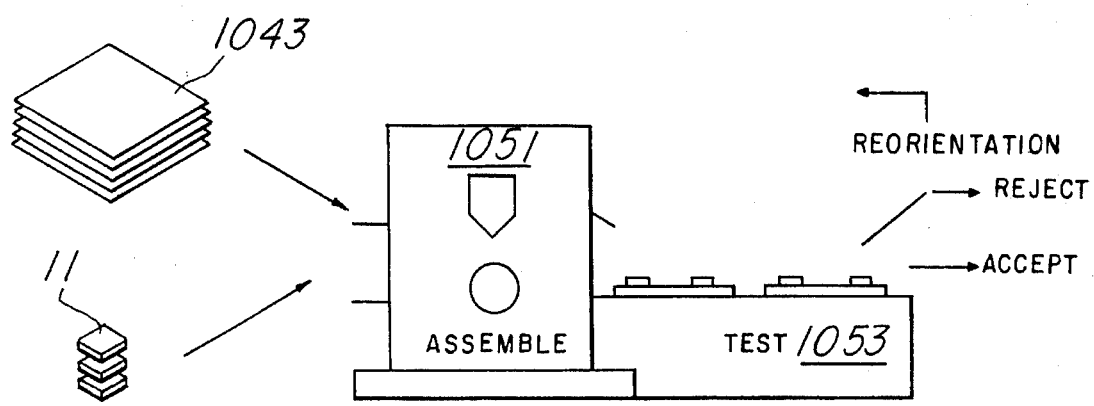
Figure 39:
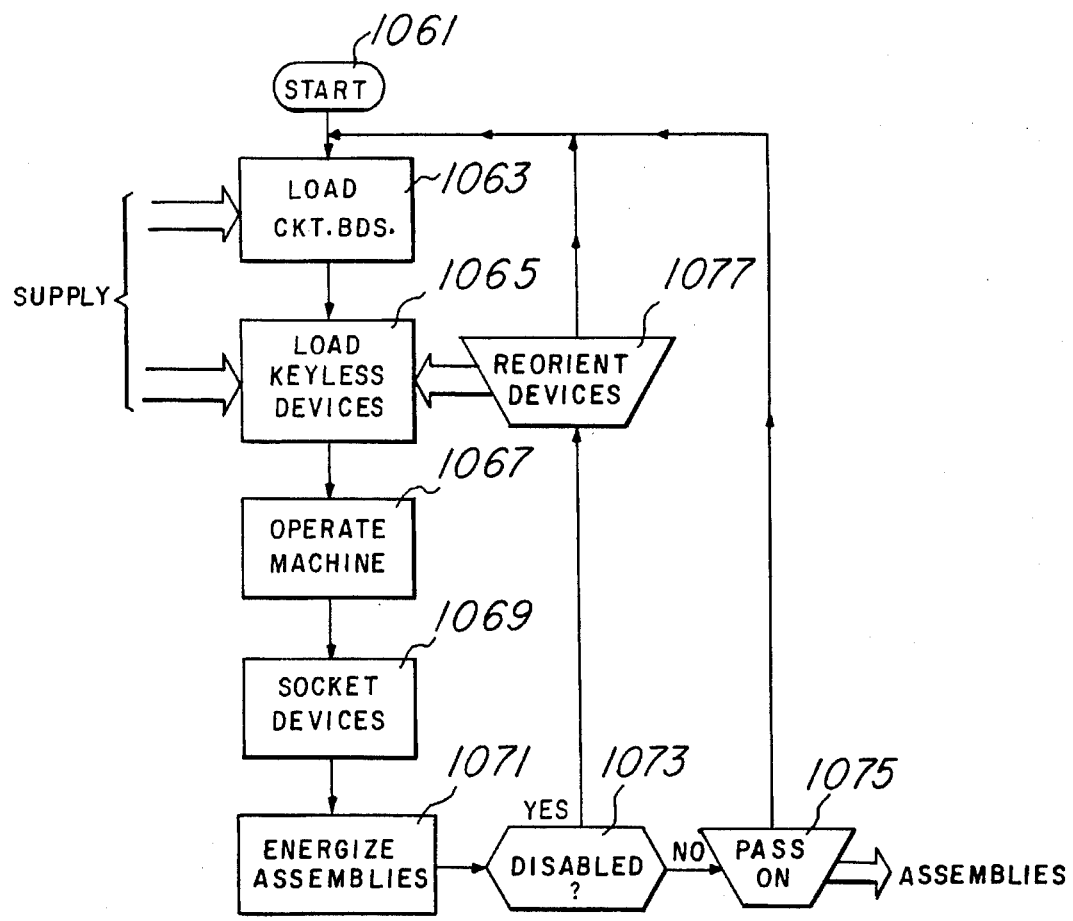
Figure 40:
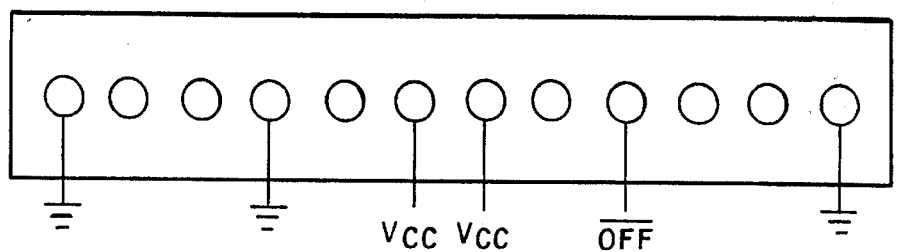
Figure 41:
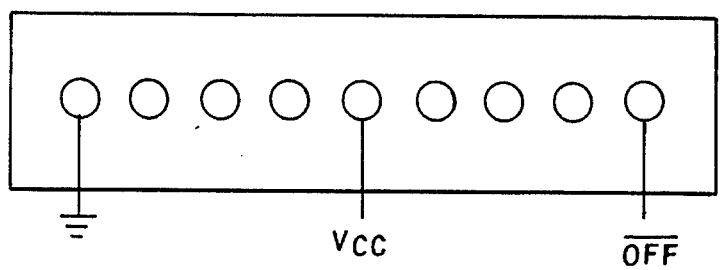
Figure 42:
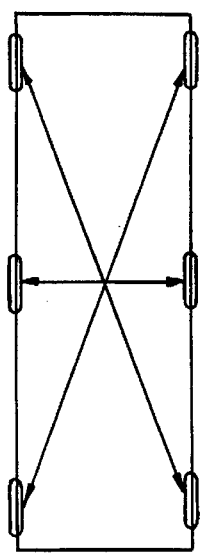
Figure 43:
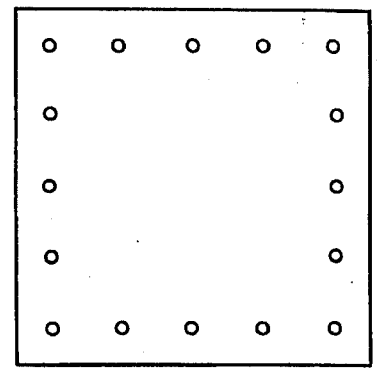

Various inventive electronic architectures, devices, systems and methods are described extensively in the detailed description of FIGS. 1–43, which description is incorporated from U.S. Pat. No. 5072418.

A device 11, described in U.S. Pat. No. 5,072,418 and further described herein, is adapted for sophisticated interfacing with development tools illustrated in FIG. 44. Hardware design tools include an extended development system 1101 interfaced by a serial line 1103 to a circuit board 1043 holding device 11. The circuit board 1043 is, in this example, provided in an application host computer 1044. Also provided in the development tools are an evaluation module 1111 connected to an analog interface board AIB 1113.

A software development system SWDS provides for user entry of source code 1121 in the C computer language which source code then is compiled by a C compiler 1123 into code 1125.

C compiler 1123 is an optimizing compiler fully implementing the standard Kernighan and Ritchie C language, for instance. The compiler 1123 accepts programs written in C and produces assembly language source code, which is then converted into object code by the assembler 1127. This high-level language compiler 1123 allows time-critical routines written in assembly language to be called from within the C program. Conversely, assembly routines may call C functions. The output of the compiler is suitably edited before assembly and link to further optimize the performance of the code. The compiler 1123 supports the insertion of assembly language code into C source code, so that the relative proportions of high-level and assembly language code are tailored according to the needs of a given application.

The code 1125 is assembled by an assembler 1127 into relocatable object code. A linker 1129 produces non-relocatable machine code or linked object code which is then downloaded into the device 11 through the development system.

Assembler 1127 and linker 1129 comprise a software development tool that converts assembly language files into executable object code. Key features are macro capabilities and library functions, conditional assembly, relocatable modules, complete error diagnostics, and symbol table and cross reference. Four programs address specific software development needs, discussed next.

The assembler 1127 translates assembly language source files into machine language object files. Source files contain instructions, assembler directives and macro directives. Assembler directives are used to control various aspects of the assembly process, such as the source listing format, data alignment and section content.

The linker 1129 combines object files into a single executable object module. As the linker creates an executable module, it performs relocation and resolves external references. The linker accepts relocatable object files created by the assembler as input. It also accepts archive library members and output modules created by a previous linker run. Linker directives allow combining or binding of file sections or symbols to addresses and defining or redefining global symbols.

An archiver allows collection of a group of files into a single archive file. For example, several macros are suitably collected into a macro library. The assembler searches through the library and uses the members that are called as macros by the source code 1125. The archiver also suitably collects a group of object files into an object library such as files that resolve external references during linking.

An object format converter converts an object file into any one of several EPROM programmer formats, such as TI-TAG format. The converted file is then downloaded to an EPROM programmer so that the EPROM code so established is then executed on the device 11 target chip in system 1043.

Simulator 1131 executes a software program that simulates operation of the target chip for cost-effective software development and program verification in non-realtime. The simulator simulates the entire target chip instruction set and simulates the key peripheral features including DMA, timers and serial port when the target chip includes them. Command entry is accepted from either menu-driven keystrokes (menu mode) or from a batch file (line mode). Help menus are provided for all screen modes. Its standard interface can be user customized. Simulation parameters are quickly stored/retrieved from files to facilitate preparation for individual sessions. Reverse assembly allows editing and reassembly of source statements. Memory is displayed as hexadecimal 32 bit values and assembled source code, separately or at the same time.

Simulator 1131 execution modes include 1) single/multiple instruction count, 2) single/multiple cycle count, 3) Until Condition Is Met, 4) While Condition Exists, 5) For Set Loop Count and 6) Unrestricted Run with Halt by Key Input. Trace expressions are readily defined. In trace execution, display choices include 1) designated expression values, 2) cache registers, and 3) instruction pipeline for easy optimization of code. Breakpoint conditions include Address Read, Address Write, Address Read or Write, Address Execute, and Expression Valid. Simulator 1131 simulates cache utilization and does cycle counting. For example, in cycle counting the number of clock cycles in single step mode or run mode are displayed. External memory is suitably configured with wait states for accurate cycle counting.

Simulator 1131 accepts object code produced by the assembler 1127 and linker 1129. Input and output files are suitable associated with the port addresses of the I/O instructions to simulate I/O devices connected to the processor. Before starting program execution, any breakpoints are set and the trace format defined.

During program execution on simulator 1131, the internal registers and memory of the simulated target chip are modified as each instruction is interpreted the simulator 1131. Execution is suspended when a breakpoint or error is encountered or when execution is halted. When program execution is suspended, the internal registers and both program and data memories can be inspected and modified. A trace memory is also displayable. A record of the simulation session can be maintained in a journal file so that it can be re-executed to regain the same machine state during another simulation session.

The simulator 1131 allows verification and monitoring of the state of the target chip without the requirements of hardware. Simulation speed is on the order of hundreds or thousands of instructions per second depending on the operating system and hardware selected for simulator 1131. A state-accurate simulation might be as slow as 1–2 instructions per second. Emulation at the higher real-time functional clock rate is performed by development system 1101 instead of simulator 1131.

Simulator 1131 provides for complete computer simulation not only of the device 11, but also its peripherals on the board 1043 through file I/O for example.

Extended development system 1101 provides full-speed, in-circuit emulation for system design and for hardware and software debug on widely available personal computer systems. The development tools provide technological support from system concept to prototype. The development system elements provide ease of use and offer the designer the tools needed to significantly reduce application system development time and cost to put designs into production faster.

FIG. 45 illustrates in even more detail the emulation environment provided by the extended development system 1101. A controller card 1141 compatible with IEEE JTAG standards is included in the emulation host computer 1101. This controller card 1141 communicates by serial line 1103 to PC board 1043 and DSP device 11 of FIG. 45. System 1043 has Texas Instruments Scope (™) testability meshed with Texas Instruments MPSD (Modular Port Scan Design) emulation for a complete solution from development, through manufacture, and including field test. The inventive approaches are applicable in digital signal processors (DSP), graphics signal processors (GSP), memories (MEM), programmable array logic (PAL), application specific integrated circuits (ASIC), and general purpose logic (GPL) general purpose Micro Computers and Micro processors, and any device requiring test or code development.

Host computer 1101 of FIG. 45 has peripherals including a printer 1143, hard disk 1145, and telecommunications modem 1147 connected to a telephone line for uploading to a remote mainframe in field test and other procedures. The peripheral capabilities of bus 1148 of host computer 1101 are not only available for emulation, but also provide access by application system 1043 to these peripherals along serial line 1103. Host computer 1101 thus is not only available to the system 1043 as an emulation host but also as an attached processor itself and as a port for communications I/O and to other peripheral capabilities temporarily needed by system 1043 but ordinarily unavailable to system 1043.

FIG. 46 illustrates an emulation and simulation software configuration for computer 1101 wherein device independent emulator software has a window driven user interface and a test executive program.

Device specific configuration files for each of the devices on board 1043 are provided. For example, there is a DSP configuration file, a GSP (graphic signal processor) configuration, a programmable array logic (PAL) file, an ASIC file and a GPL register file.

The emulation hardware and software of FIGS. 45 and 46 provide a user-friendly, personal-computer or work station-based development system which provides all the features necessary to perform full-speed in-circuit emulation with target chips on board 1043. One example of DSP 11 is a Texas Instruments 320 series digital signal processor. An exemplary graphics signal processor (GSP) is the Texas Instruments 34020 GSP. The DSP and GSP are provided with inventive emulation circuitry more fully described hereinbelow.

The emulator comprised of FIG. 45 host computer 1101 with controller card 1141 and software of FIG. 46 allows the user to perform software and hardware development, and to integrate the software and hardware with the target system. An important emulation interface provides control and access to every memory location and register of the target chip and extend the device architecture as an attached processor.

Emulator controller card 1141 provides full-speed execution and monitoring of each target chip such as device 11 in the user's target system 1043 via a multi-pin target connector. In one embodiment, thirty software and hardware breakpoints, software and hardware trace and timing, and single-step execution are provided. The emulator has capability to load, inspect, and modify all device 11 registers. Program data and program memory can be uploaded or downloaded. The user interface of host computer 1101 for emulation purposes is a windowed user interface designed to be identical to the windowed user interface of simulator 1131 for the corresponding target chip. The emulator 1101 is portable and reconnectable for multiprocessing. Emulator 1101 provides a benchmark of execution time clock cycles in realtime.

Full-speed execution and monitoring of the target system is suitably controlled via a multi-wire interface or scan path in the multi-pin target connector. The scan path controls the target chip in the system 1043, providing access to all the registers as well as associated internal and external memory.

Program execution takes place on the target chip (e.g. 11) in the target system 1043. Accordingly, there are no timing differences during emulation, as might occur without the in-circuit emulation provided by this preferred embodiment. Heretofore, emulation may have involved sending signals over a cable to emulate the target chip 11 in its absence. Advantageously, the present embodiment is a non-intrusive system that utilizes chip 11 itself, and avoids cable length and transmission problems. Loading problems on signals are avoided, and artificial memory limitations are obviated. Emulation performance coincides with specifications for the emulated target chip itself.

Software breakpoints allow program execution to be halted at a specified instruction address. Hardware breakpoints are also advantageously operative on-chip. When a given breakpoint is reached, the program either halts execution to permit user observation of memory and status registers, or the breakpoint is included in a more complex condition, which when satisfied results in an appropriate stop mode being executed. At this point, the status of the target chip or system is available for display by the user with as little as a single command.

Software trace and hardware program counter trace permit the user to view the state of target chip 11 when a breakpoint is reached. This information is suitably saved on command in a file for future analysis. Software timing allows the user to track clock cycles between breakpoints for benchmarking time critical code.

Single-step execution gives the user the ability to step through the program one instruction at a time. After each instruction, the status of the registers and CPU are displayed. This provides greater flexibility during software debug and helps reduce development time.

Object code is downloaded on command to any valid program memory location or data memory location via the interface. Downloading a 1K-byte object program illustratively takes on the order of 100 milliseconds. By inspecting and modifying the registers while single-stepping through a program, the user can examine and modify program code or parameters.

A windowed user interface for emulator 1101 is suitably made identical to that of simulator 1131, affording a straightforward migration from simulator-based development to emulator-based development. The user-friendly screen displays the program code in mnemonics and equivalent hexadecimal code. Windowed displays are suitably provided for extended precision registers, the CPU status and memory locations.

A first screen option is a primary screen that includes a command line displayed at top of screen, functions of special-function keys, and four status windows which are individually accessed using the F1 key of commercially available keyboards. The windows include a source code window, an auxiliary display window, a CPU status window, and an extended precision registers window. The contents of the windows are made accessible for user inspection and modification.

Commands are entered in a MENU mode or a LINE mode. In the MENU mode, a menu at the top of the screen permits the user to view every option available while entering a single command. Further menus are then displayed until the entire command has been entered. The LINE mode allows user to enter an entire command expression. A summary of commands is provided in Appendix I.

Emulator card 1141 of FIG. 45 suitably occupies slots in an IBM PC-XT/AT computer when the latter is used as host computer 1101. The card 1141 is detached and transferred to another PC (personal computer of equivalent functionality) as needed, affording emulator portability. For simulation, a memory map for the controller card 1141, which may include EPROM (erasable programmable read only memory), SRAM (static random access memory), DRAM (dynamic random access memory), and on-chip memory and peripherals, can be configured by the designer to reflect the actual environment of the target system 1043, including wait states and access privileges. In this way, card 1141 and host computer 1101 simulate peripherals which are as yet absent from board 1043 in a particular development context.

In one embodiment, multiprocessing applications are emulated by extending line 1103 between each of several application boards from one to the next, maintaining realtime emulation and preserving the information on each target chip.

The development system 1141 operates in two modes: emulation mode and algorithm development and verification mode. In the algorithm verification mode, the target chip 11 debugs its software at full speed before the target system is complete. To accomplish this, code is downloaded into the memory on the board 1043 and executed at full speed via the interface on an application board used in place of the incomplete target system. A suitable application board includes a DSP 11, 16K×32 bits of full-speed (zero wait states) SRAM on a primary bus, two selectable banks of 8K×32 bits full speed (zero wait state) SRAM on an expansion bus, and 512K×32 bits DRAM. With ample SRAM, the user has realtime emulation capabilities and memory storage flexibility for a variety of algorithms. Zero wait state capability in SRAM allows memory read/write in realtime.

For algorithim development and code verification the system can single step and run until breakpoint is reached. Algorithim verification runs data through the algorithim and verifies its function. Burst exection, I/O and other functions are available.

Page mode DRAM improves bulk storage performance. Three types of DRAM cycles are used on one example of an application board. These are single-word read, single-word write and page-mode read which respectively have wait states of four, two, and one wait state per access. Page mode read cycles are automatically evoked when device 11 performs two or more back-to-back read cycles on the same memory page (256 words). Utilizing page-mode results in a decrease in wait states when accessing on application board 1043 DRAM on application board 1043.

In FIG. 45 both test and development support system access to the application system resource is via a serial scan bus master or scan interface on controller card 1141, and described later hereinbelow. Sophisticated emulation and simulation functions are built out of primitives. Primitives are sets of bits that define control operations (like commands or instructions) available through controller card 1141.

Figure 47:
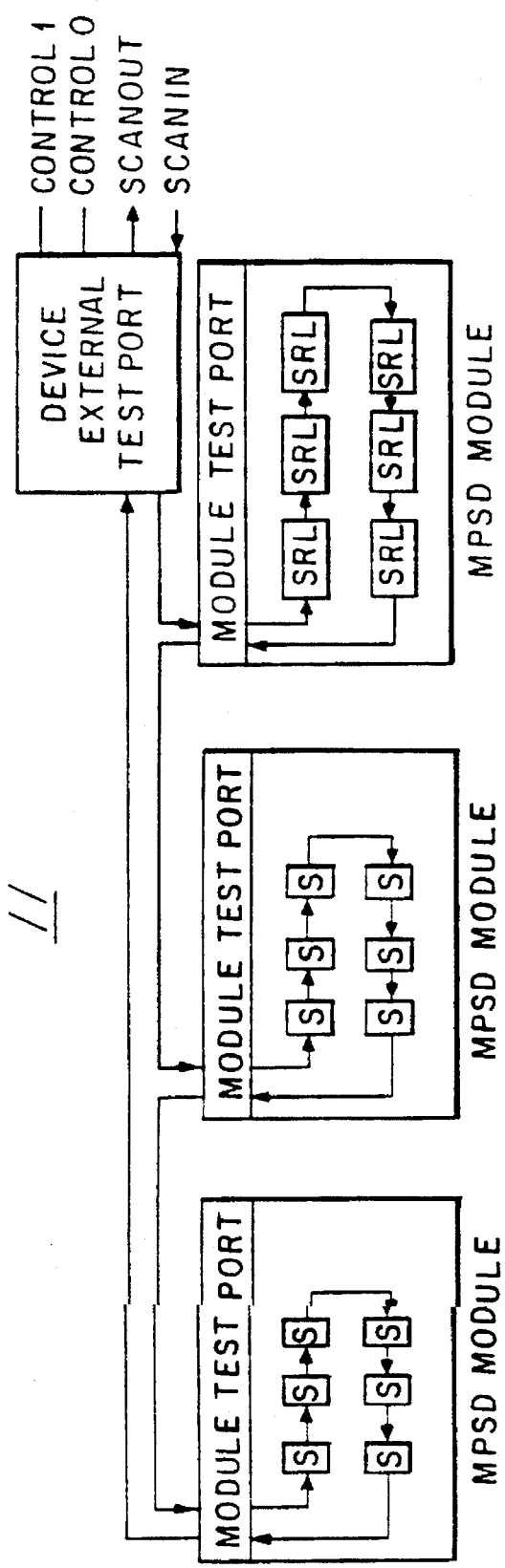
FIG. 47 is a block diagram of a modular port scan (MPSD) arrangement.

The functionality of the device 11 can be accessed by each of two illustrative inventive serial implementations. A first implementation is Texas Instruments Modular Port Scan Design (MPSD) as shown in FIG. 47 and disclosed in coassigned application Ser. No. 057,078 (TI-12033) filed Jun. 2, 1987 and incorporated herein by reference. Shift register latches (SRLs) designated "S" are distributed through the device 11 like a string of beads on a serial scan path respective to each module to provide access to all important registers.

Figure 48:
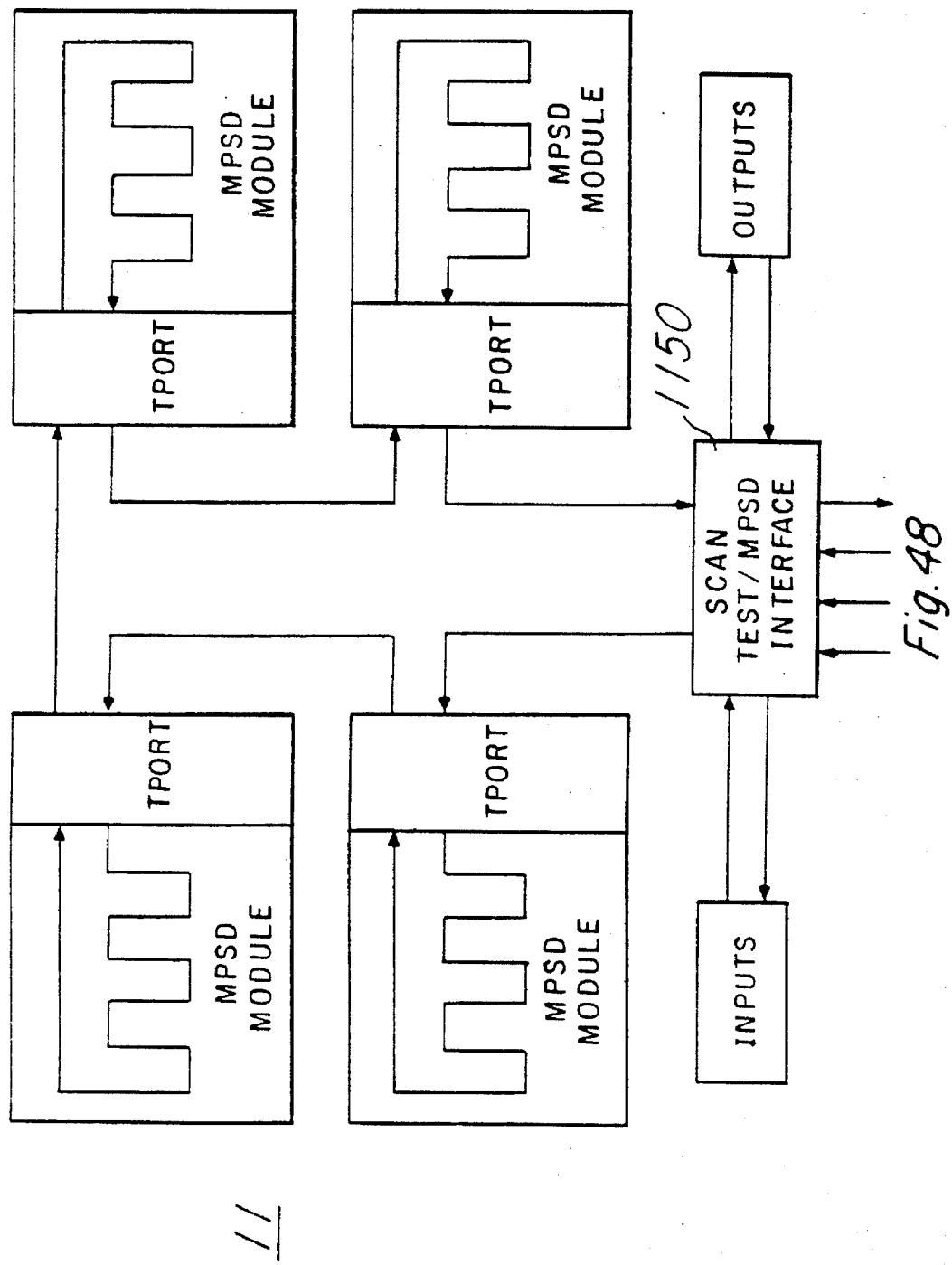
FIG. 48 is a block diagram of a scan test/MPSD configuration.

In FIG. 48, a second approach uses a SCOPE transmission medium combined with MPSD technology in a SCOPE interface 1150.

Figure 49:
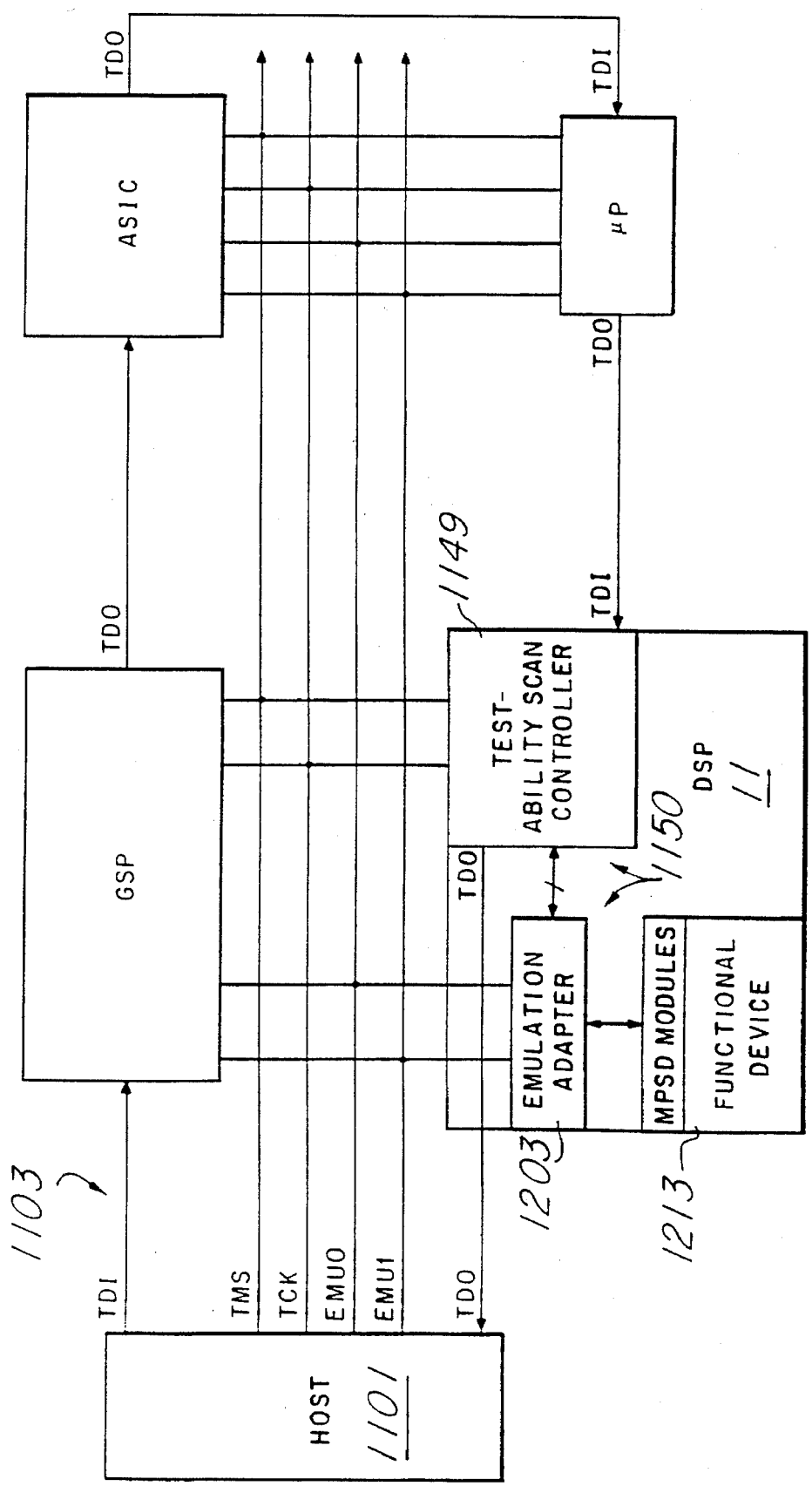
FIG. 49 is a block diagram of an integrated approach to test and emulation circuitry.

In FIG. 49 device 11 has an on-chip JTAG interface 1149 as described herein. The scan interface is connected to line 1103 of FIG. 45 and has inputs for test clock TCK, mode select TMS, and test data input TDI (scan in), as well as a test data output TDO (scan out). A special emulation adapter 1203 is connected between the scan interface 1149 and MPSD modules of the functional circuitry 1213 of device 11. Emulation adapter 1203 in different forms involves hardwired state machine circuitry, assembly language, or microcoded state machine embodiments.

The characteristics of some implementations when used in support of emulation are shown in Table I:

TABLE I

|  | MPSD | SCOPE | SCOPE/MPSD |
|---|---|---|---|
| Industry Standard Communication | No | Yes | Yes |
| Max Clock Period | Depends | Unlimited | Unlimited |
| Functional Clock Independence | No | Yes | Yes |
| Boundary Scan Support | No | Yes | Yes |
| Silicon Efficiency | Yes | No | Yes |
| Most Emulation Capability | No | Yes | Yes |
| Number of Extra Pins | Four | Six | Six |

The implementation SCOPE/MPSD capitalizes on the strengths of MPSD and SCOPE individually to create a hybrid emulation technology.

Figure 50:
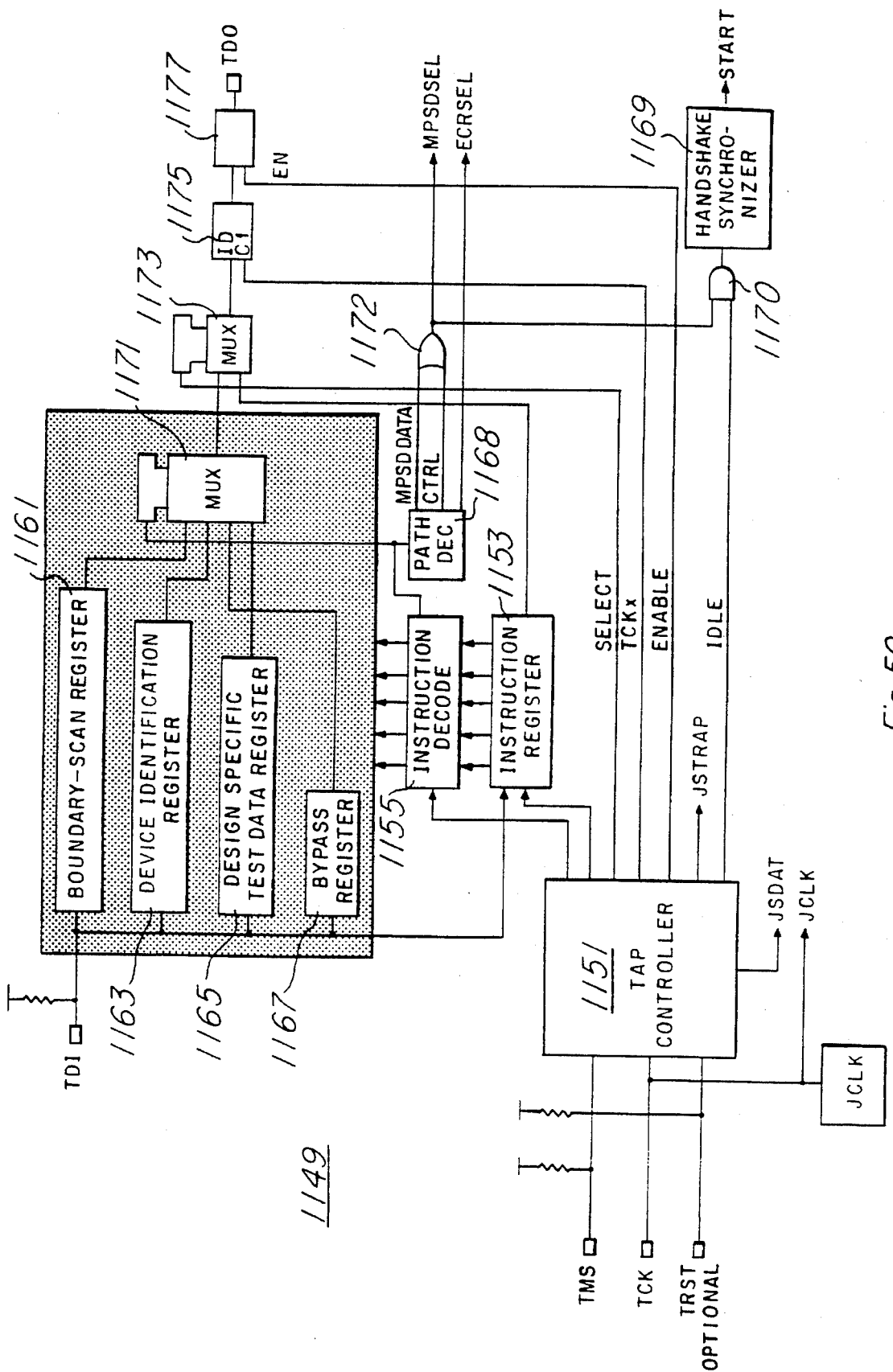
FIG. 50 is a partially block, partially schematic diagram of a scan testability interface.

FIG. 50 shows a block diagram of improved SCOPE hardware which is provided on each of the chips such as device 11 on PC board 1043. Four pins TDI, TMS, TCK and TDO communicate with the system. TMS and TCK communicate with a tap controller 1151 which is connected to an instruction register 1153 and an instruction decoding circuit 1155.

Test access port (TAP) controller 1151 is in turn coupled to instruction register (IR) 1153 and a first multiplexer 1173. The instruction register can receive serial scan signals from the TDI line and output serially to MUX 1173. MUX 1173 is under control of the TAP and can select the output signal from the instruction register or from another MUX 1171.

The instruction register also controls a bypass register (BR) 1167 and one or more boundary scan registers (BSR) 1161. The bypass register receives the TDI signal and outputs it to MUX 1171. MUX 1171 is under control of the instruction register 1153. Based on the instruction loaded into the instruction register, MUX 1171 outputs its input from the bypass register or its input from one or more BSRs, or internal device register scan. Each boundary scan register is controlled via the test access port and the instruction register.

The boundary scan arrangement operates in a normal mode or a test mode. During the normal mode, input data entering terminals of IC logic passes through the boundary scan register, into the IC logic and out to the normal output terminals without any change due to the BSR. During the test mode, normal input data is interrupted, and test input data is captured, shifted, and updated within the boundary scan register. The boundary scan register includes two memories, a first memory for receiving and shifting data from the TDI line and a second memory for holding output data. The second memory is selectively operable to transfer data from the first memory to the second memory.

Generally, in FIG. 50, serial information is down loaded from emulation computer 1101 via the SCOPE controller card 1141 through pin TDI and enters any one of a number of shift registers, including a boundary scan register 1161, a device identification register 1163 and design specific test data registers 1165. A bypass register 1167 is also provided. These shift registers or serial scan registers are selected via a MUX 1171 under the control of instruction decode circuitry 1155. The selected output from MUX 1171 is fed to a MUX 1173 so that under control of tap controller 1151 the instruction register 1153 or MUX 1171 is selected by MUX 1173. JTAG clock TCK and MUX 1173 output are fed to flip flop 1175 which in turn is connected to a serial return circuit 1177 which is suitably enabled to return or send serial outputs from all parts of the on-chip JTAG circuitry back to computer JTAG card 1141 via output serial pin TDO.

Figure 50A:
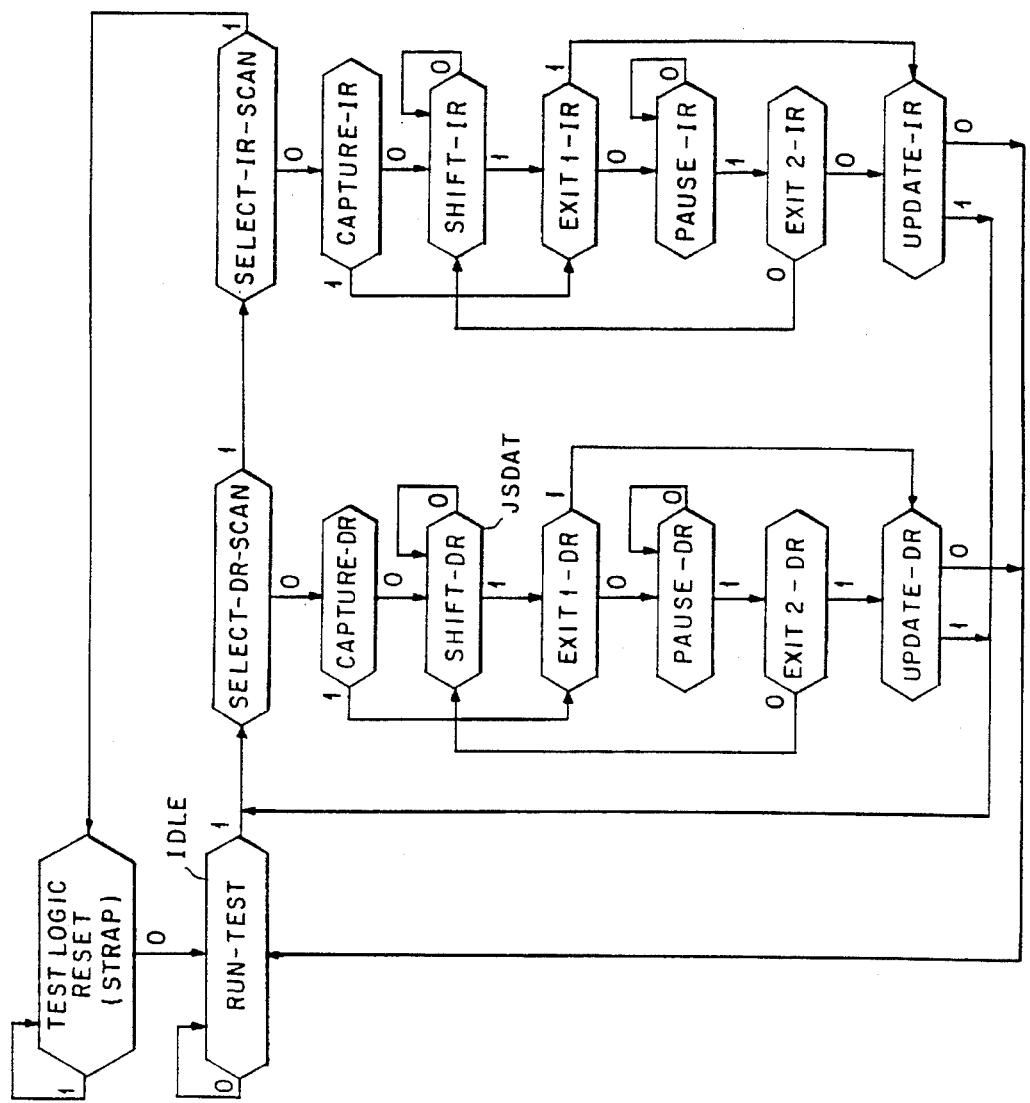
FIG. 50A is a state transition diagram of a test access port (TAP) controller in FIG. 50.

In FIG. 50A a state transition diagram of TAP controller 1151 has one and zero signal values entered adjacent to each state transition arc. These are values of signal TMS at the time of a rising edge on signal TCK. The states of the JTAG TAP (Test Access Port) controller are described in "A Standard Test Bus and Boundary Scan Architecture" by L. Whetsel, *Texas Instruments Technical Journal*, Vol. 5, No. 4, 1988, pp. 48–59, and are well known in the art.

Turning to basic concepts recognized and utilized herein, emulation involves hardware support built around each circuit so that operations can be executed within the circuit while doing analysis in parallel as the circuit runs. Emulation permits the circuits to be run at full speed in real time as the emulator computer 1101 monitors the circuits and starts and stops them. The user defines and develops software in the environment of the target system. Put another way, emulation reads inputs from the board 1043 and produces outputs to the board as if device 11 were absent, for the purpose of determining appropriate software and operation signals. Ultimately, when the device 11 is supplied with the appropriate software resulting from emulation work, the device 11 operates in a manner which is compatible with the rest of the circuitry of board 1043. Advantageously, in the improved system disclosed herein, the device 11 is actually on the board and with the serial communication capabilities, all of the operations of device 11 are monitored directly from the device itself. In view of the extremely high speed of device 11, the device itself assists in its own emulation.

In a previous approach, a cable is terminated in a pin-plug that mates to a socket provided on the board in place of the emulated device. The socket introduces a noise issue. A socket may be impractical when a surface mount device is to be emulated, due to limited board space. Advantageously, device 11 is soldered onto board 1043 and emulation is mediated by the device itself.

The few pins utilized by the scan interface 1150 eliminate the need for conventional full pin-out target connectors and eliminate problems associated with cable reliability, transmission effects and timing differences. In this way, board 1043 can be probed with logic analyzers and oscilloscopes in the improved system without physical or electromagnetic interference from a heavy cable. Moreover, clock rates in excess of 20 megahertz for device 11 are so fast that previous emulation schemes may be incapable of emulating it.

Figure 44:
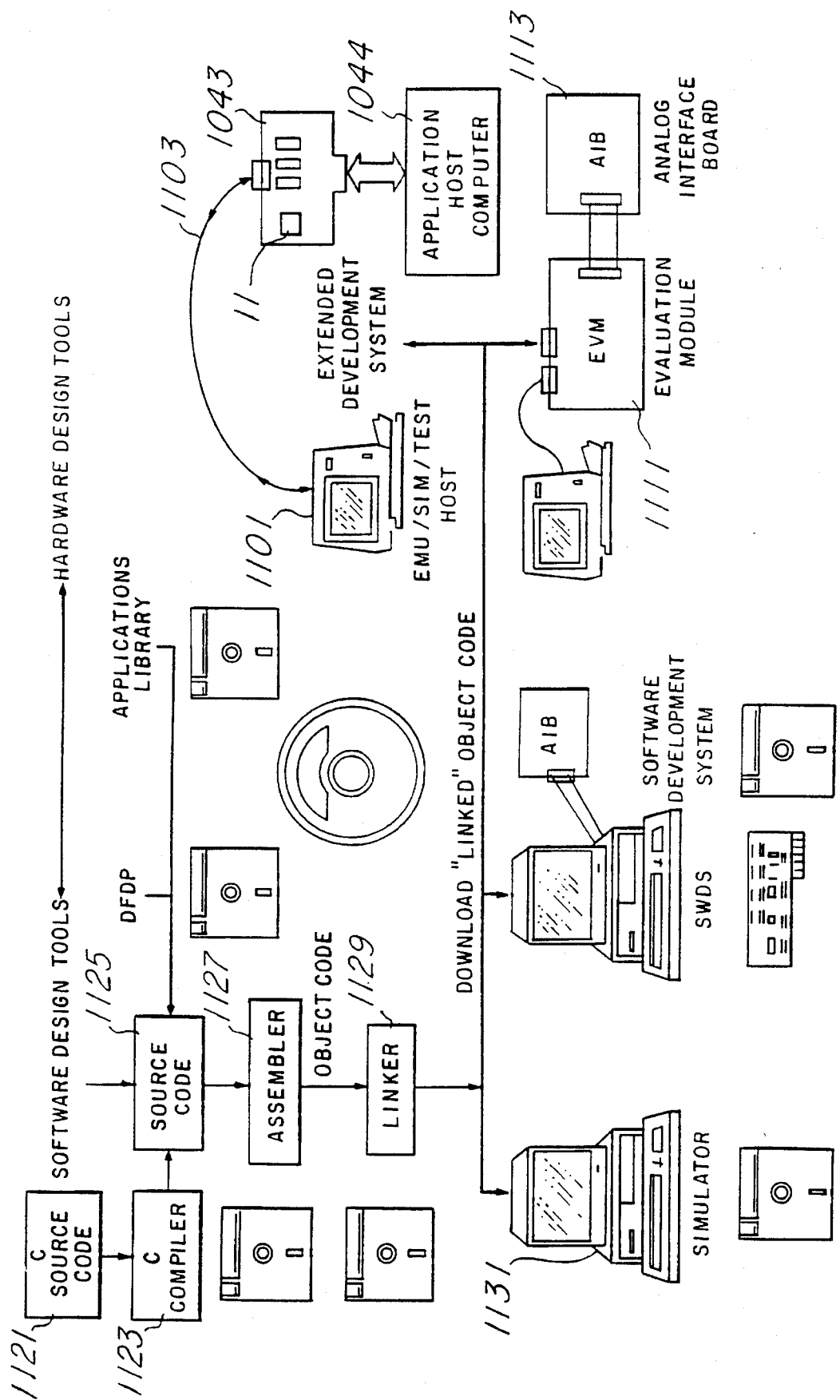
FIG. 44 is a pictorial diagram of development tools for developing integrated circuit chips and software.

Simulation as the term is used herein creates a software representation of the target board 1043 so that the entire board can be developed in simulation on simulator 1131 of FIG. 44 (or by running the simulator program on computer 1101). In another aspect of simulation, when the device 11 is available but the rest of the circuitry for target board 1043 is incomplete, the simulator can mimic the planned complete board by serial scan upload or download from device 11 to computer 1101, and then serial scan download or upload from computer 1101 to device 11 in substitution for the missing circuitry of board 1043. In this aspect, simulation is accelerated by running the device 11 itself at full speed according to the improvements described herein. Even when computer 1101 runs at a slower speed than device 11, simulation is effective to simulate peripherals which are accessed infrequently by device 11.

Test as the term is used herein has four different areas. The first area—Device Test—is test of a device 11 itself before the device manufacturer ships it.

The second area of test is Device Verification—verification of full functionality of the device in every aspect.

The third area of test is Device Characterization. Characterization determines timings of the device to define exactly the way the actual manufactured device works.

The fourth area of test is User Test. In user test, the entire board is tested so that the functionality of device 11 in the context of the entire board 1043 is examined.

Returning to FIGS. 47 and 48, each MPSD module has two scan paths. One of the scan paths is termed the MPSD data path which usually has numerous shift register latches S (or SRL) serially interconnected like a string of beads throughout the module. The second scan path is termed the MPSD control path which generally has fewer shift register latches and which selects which MPSD data paths are to be scanned. These scan paths are described in above-cited U.S. Pat. No. 4,860,290.

Figure 51:
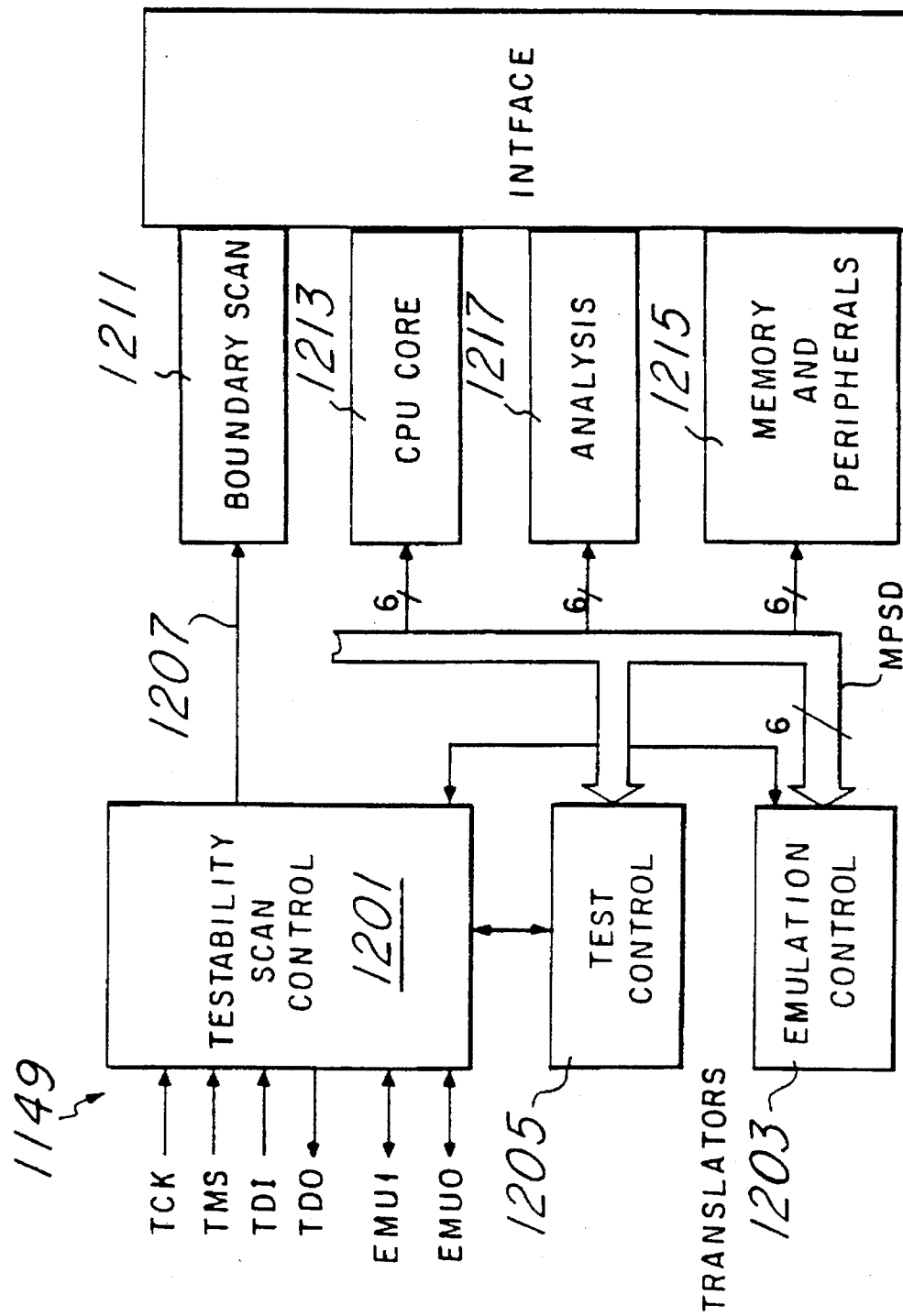
FIG. 51 is a block diagram of processor chip domains, boundary scan and scan test/emulation circuitry on chip.

In FIGS. 49 and 51, the improved emulation arrangement recognizes that device 11 is dividable into a few major areas which are clocked by different clocks when desired. These major areas are called clock domains or just "domains". The domains in a DSP device such as device 11 are suitably a CPU core domain, memory and peripherals (system) domain and an analysis domain. For another chip, the domains can defined in whatever manner is consistent with the parts of the chip that are to be sometimes clocked from different clocks. However, for modularity of chip design, emulation and test, the modules should usually be smaller units than a whole domain. This affords greater flexibility in designing other chips using the modules as building blocks, and reduces the time required to scan data into modules (the time is a nonlinear power function of the size of the modules).

Accordingly, it is contemplated that each domain usually include more than one module. In FIG. 49, emulation adapter 1203 directs different clocks to the different domains or may supervise bit by bit transfers between the scan interface and a specific domain. Furthermore, adapter 1203 directs different MPSD control signals to the control paths of the different domains.

In FIG. 51, the on-chip emulation blocks are further illustrated wherein JTAG control is wrapped around the emulation according to MPSD (Modular Port Scan Design). Principles of modular scan testing are also disclosed in coassigned U.S. Pat. 4,701,921 which is also incorporated herein by reference.

The JTAG control of FIG. 50 is indicated as JTAG control block 1201 of FIG. 51. Emulation control according to MPSD is provided as a block 1203. Test control block 1205 links JTAG to MPSD. Serial scan line 1207 enters the serial bit stream into any one or more of the selected areas of boundary scan area 1211 which includes BSR 1161 of FIG. 50 and scans the pin boundary of device 11. The FIG. 51 domains—CPU core domain 1213, system domain 1215 and analysis domain 1217 are shown in FIG. 50 and interface through the shift register latches of FIG. 47 to all of the various parts of the chip.

Figure 52:
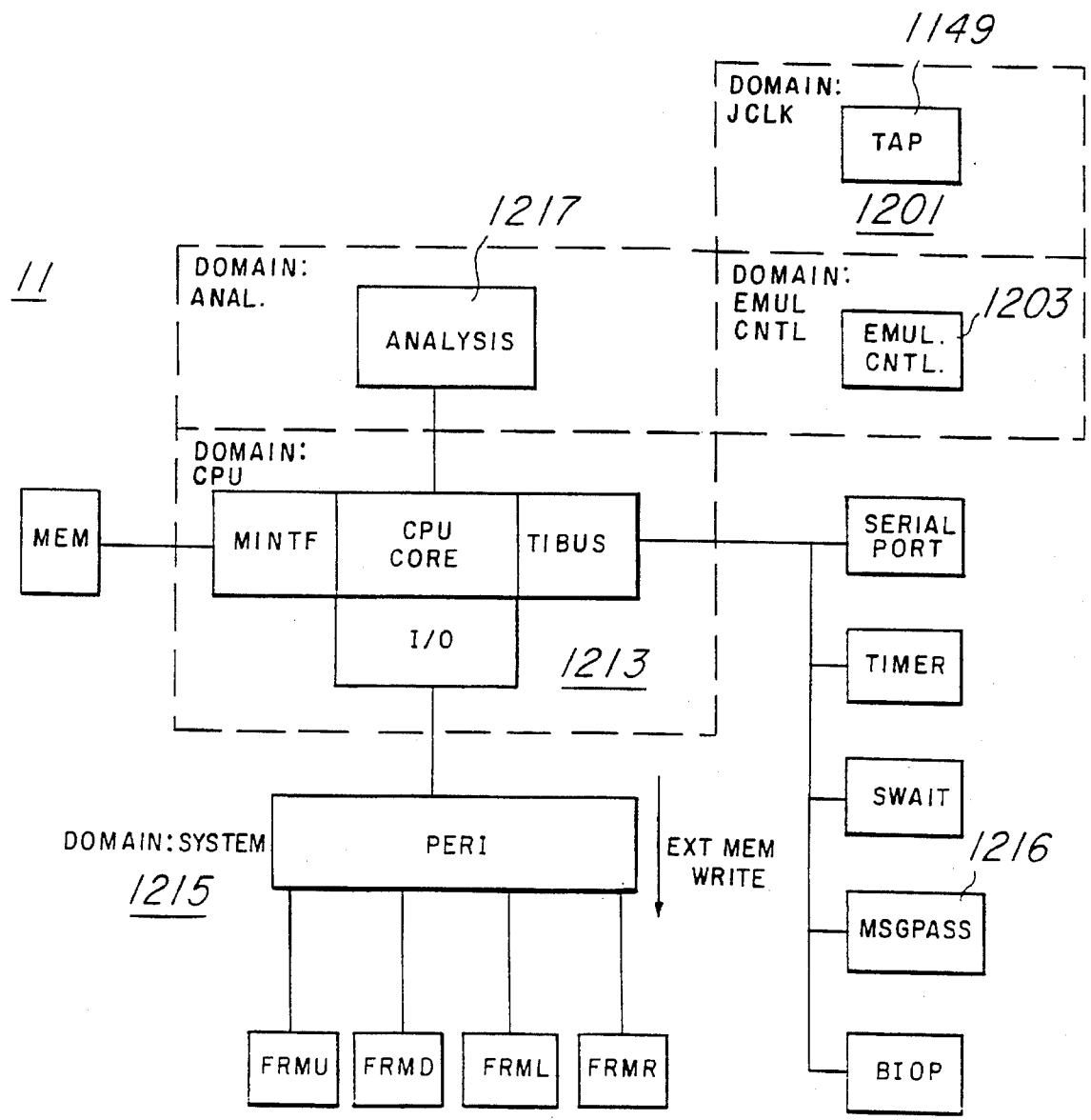
FIG. 52 is a block diagram of the processor chip of FIG. 51 showing functional blocks of the chip allocated to the various domains, and showing a message passing circuit.

FIG. 52 provides a further perspective of the domains of device 11. The CPU core domain 1213 includes the circuitry of incorporated-by-reference FIGS. 1A and 1B. Analysis circuitry is connected to the CPU core as described more fully herein. The analysis circuitry includes condition sensors such as hardware breakpoint sensors for controlled stops and trace stack circuitry for real-time trace recordkeeping. The analysis circuitry is serial-scan accessible and designated the analysis domain 1217. All peripherals including memory and serial and parallel ports are denominated as the system domain 1215. For uniformity of description, JTAG control 1201 is regarded as a clock domain also in which test clock JCLK is active. Emulation control circuitry 1203 is a further domain of FIG. 52. Special message passing circuitry 1216 is also included in the system or analysis domain, to even more fully use the host computer 1101 as an attached processor by interfacing the TIBUS to the serial scan line 1103 of FIG. 45.

Figure 53:
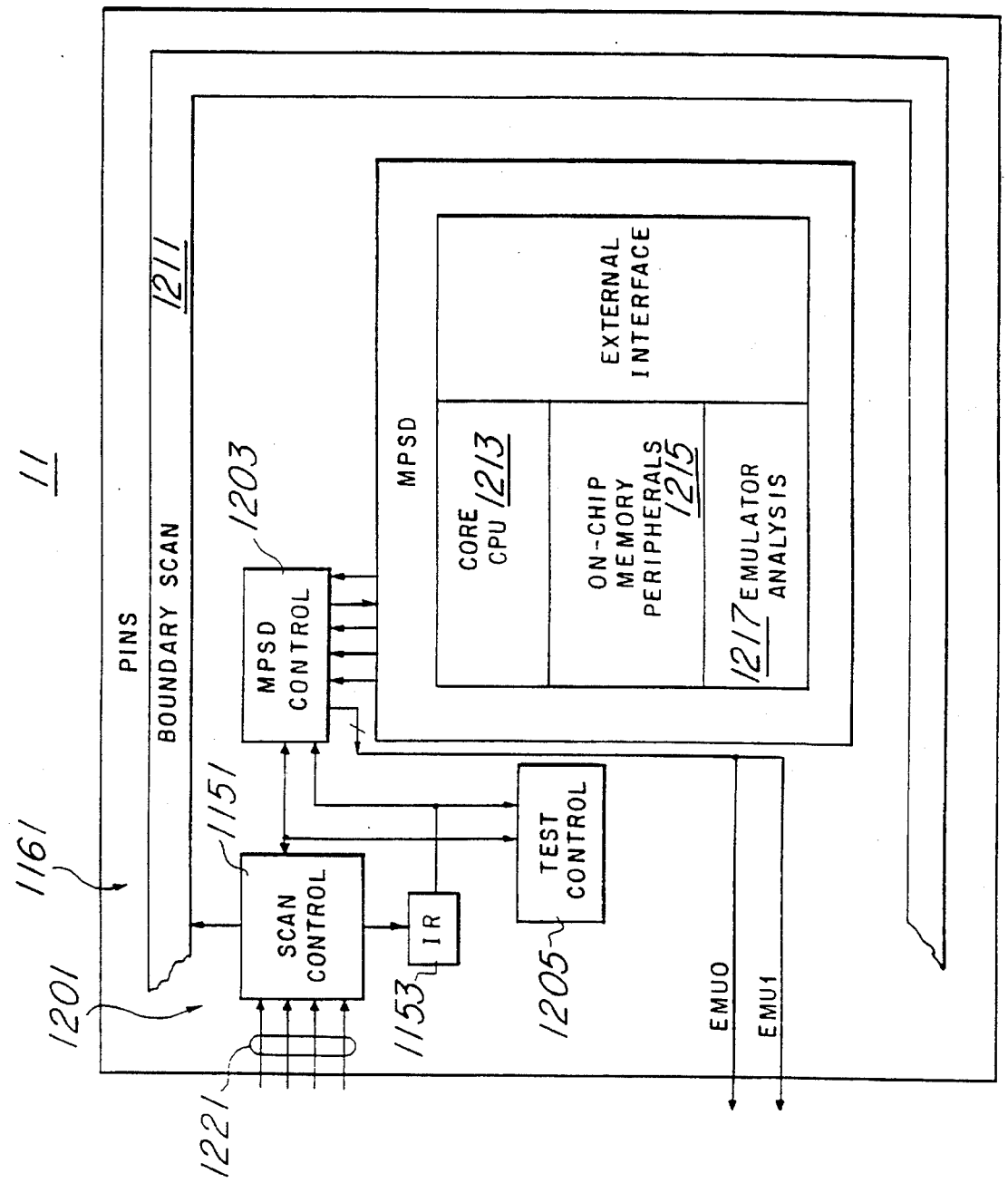
FIG. 53 is partially pictorial, partially block diagram of the processor chip of FIGS. 51 and 52.

FIG. 53 shows a physical perspective of the various domains on the chip of device 11. JTAG control 1201 interfaces with the pins via a serial boundary scan assembly including boundary scan register 1161 which allows all logic states at the actual pins of device 11 to be read or written. JTAG TAP controller 1151 and JTAG instruction register IR 1153 are provided on-chip. Test control 1205 and MPSD control 1203 are integrated into the circuitry. MPSD control 1203 serially interfaces with the domains for core 1213, system 1215 and analysis 1217 for the device 11. Bi-directional pins EMU0 and EMU1 are provided for external interfacing in addition to the four JTAG terminals 1221. Combining JTAG testability interface technology with MPSD modular port scan with the additional pins EMU0 and EMU1 synergistically opens up capabilities for integrating emulation, software development, and manufacturing and field test processes.

A medical analogy assists in describing the overall concept of this remarkable emulation feature. Device 11 is analogous to a human patient on a medical operating table wherein a dialysis machine and an electro cardiogram are connected to different parts of the patient's body. While the patient's heart (functional clock FCLK) is pumping blood through the patient's torso and head (CPU core), the dialysis machine (test clock JCLK) is forcing blood through the vessels of the patient's legs (peripherals in system domain) in substantial isolation from the patient's heart. An electrocardiogram is attached to a separate part of the patient's body. All of these medical and physiological functions are operating at the same time so that the emergency medical needs of the patient are fulfilled in the shortest amount of time. Correspondingly, device 11 can have its own system clock FCLK running at full speed to run part of device 11 while another part of device 11 is operated by a different clocking system JCLK under the JTAG/MPSD control and then in a third feature, the JTAG control can be controlling the JTAG boundary scan. Moreover, the parts of each chip are selectively fed FCLK or JCLK upon command, affording a dynamic control process. In this way, the development requirements of the device 11 are fulfilled in an integrated manner in the shortest possible time.

In FIGS. 52 and 53, the development system capabilities for the preferred embodiments address applications development support in a fashion that allows the selection of a range of capability. Utilizing all of the disclosed development support hardware components provides development capabilities that include concurrency, ANALYSIS for on-chip breakpoint and trace, and realtime message passing MSGPASS between the emulation controller 1101 of FIG. 45 and the device 11 of FIG. 52. Various sections of the hardware support of FIG. 52 can be included or omitted in cost sensitive applications. For example, a basic system would support basic MPSD (Modular Port Scan Design) emulation or at the extreme, no emulation and only test with or without a boundary scan.

The total development systems advantages in the areas of emulation, simulation, and chip speed measurement interrelate with various test and functional features. The preferred embodiments have three architectures, a) functional architecture, (e.g., CPU memory and I/O), b) test architecture including JTAG and MPSD serial scan-based testability circuitry and c) emulation/support architecture such as message passing circuitry, simulation features, and boundary scan test. The three architectures advantageously minimize complication of the CPU, memory and I/O functional architecture and maximize the synergism with test.

The support architecture of FIGS. 51 and 52 provides means to match cost and capability requirements through the life cycle of the device 11. The support capability is deletable for devices created for some market segments. This partitioning does not affect the testability of the device by a test control 1205 of FIG. 51.

In this way, a hierarchical scan architecture combines and improves a scan support/test front end with an MPSD interface as in FIG. 51.

The architecture of FIG. 51 provides uniform interfaces for boundary scan 1211, CPU core 1213, analysis 1217 and memory and peripherals 1215 which allow the selection of capability based on the choice of blocks 1215–1217 used.

Table II below describes the levels of capability created when additional hardware blocks are added to the CPU and system domains.

TABLE II

| | JTAG CONTROL | TEST CONTROL | EMUL. CONTROL | ANALYSIS | MSG. PERIPHERAL |
|---|---|---|---|---|---|
| MPSD Only | | | | | |
| MPSD Test and Emulation | | | | | |
| MPSD Test, Analysis, and Emulation | | | | x | |
| JTAG Device Test | x | x | | | |
| JTAG Emulation Concurrency | x | x | x | | |
| JTAG Emulation Concurrency with Analysis | x | x | x | x | |
| JTAG Emulation Concurrency, Analysis, Message Passing | x | x | x | x | x |

Referring to FIG. 52 and recapitulating, support architecture views the device 11 as the following five distinct clocking domains in order to control domain data transfers with the scan clock (JCLK) and application execution with the functional clock (FCLK).

1) CPU core domain 1213

2) Analysis domain 1217

3) Peripherals, memory, interfaces, and busing (system domain) 1215

4) Emulation control domain 1203

5) JTAG port and boundary scan domain 1201

There are two data path configurations, one for MPSD and one for JTAG. In the JTAG data paths of FIG. 50, data is scanned to and from the device 11 through internal scan paths that are selected through a JTAG instruction register 1153. A unique JTAG opcode for each path allows entry of and access to internal scan data.

The support architectures utilize two different clocks to support their operation. The two clocks are the functional clock (FCLK), and the scan clock (JCLK).

The emulation environment contemplates that some domains have a different clock source than others while test operation usually makes the device 11 fully synchronous and places all domains on the test clock JCLK. The clock separation provided by the domains of FIGS. 51 and 52 provides the ability to:

1) Connect all domains independently to either the JCLK or FCLK via the emulation control block 1203.

2) Apply test clock JCLK to all domains for test.

3) Run any domain with functional clock FCLK and then scan its contents with JCLK.

4) Halt the CPU domain with a stop response compatible with functional clock FCLK and then scan the CPU domain on test clock JCLK while the system domain of FIG. 52 continues to run on FCLK.

Clock domains of FIGS. 51 and 52 and the emulation control 1203 allow independent selection of functional clock FCLK (chip clock rate divided by two) or scan clock JCLK (TCK pin of FIG. 50). Each domain 1213, 1215, 1217 can have its clock individually selected while other domain selections are locked (unchanged). The selection process is a synchronized transfer of control between JCLK and FCLK in each domain. This transfer mechanism is located in the emulation control 1203 of FIGS. 49, 51 and 52 as discussed later hereinbelow.

Figure 54:
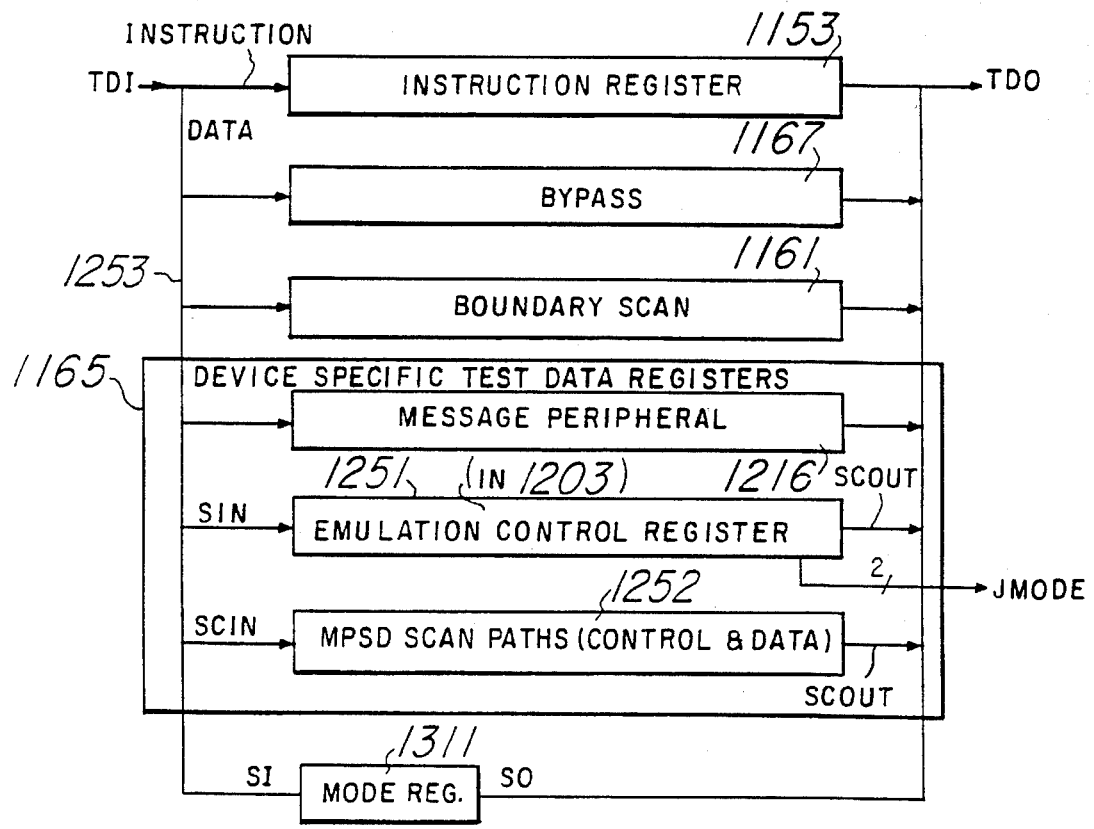
FIG. 54 is a block diagram of scan paths in greater detail than that of FIG. 50.

FIG. 54 shows a further diagrammatic respective of the registers of FIG. 50 wherein JTAG instruction register IR 1153 is selected for scan between the terminals TDI and TDO. The IR 1153 is decoded in FIG. 50 to access the other serial shift registers or scan paths when requested by the control card 1141 of FIG. 45 via the serial line 1103. These shift registers are the bypass register 1167, the boundary scan register 1161, the message peripheral 1216 of FIG. 52, the emulation control register 1251 and a pair of MPSD scan paths 1252 in the various domains and modules in the domains.

Figure 55:
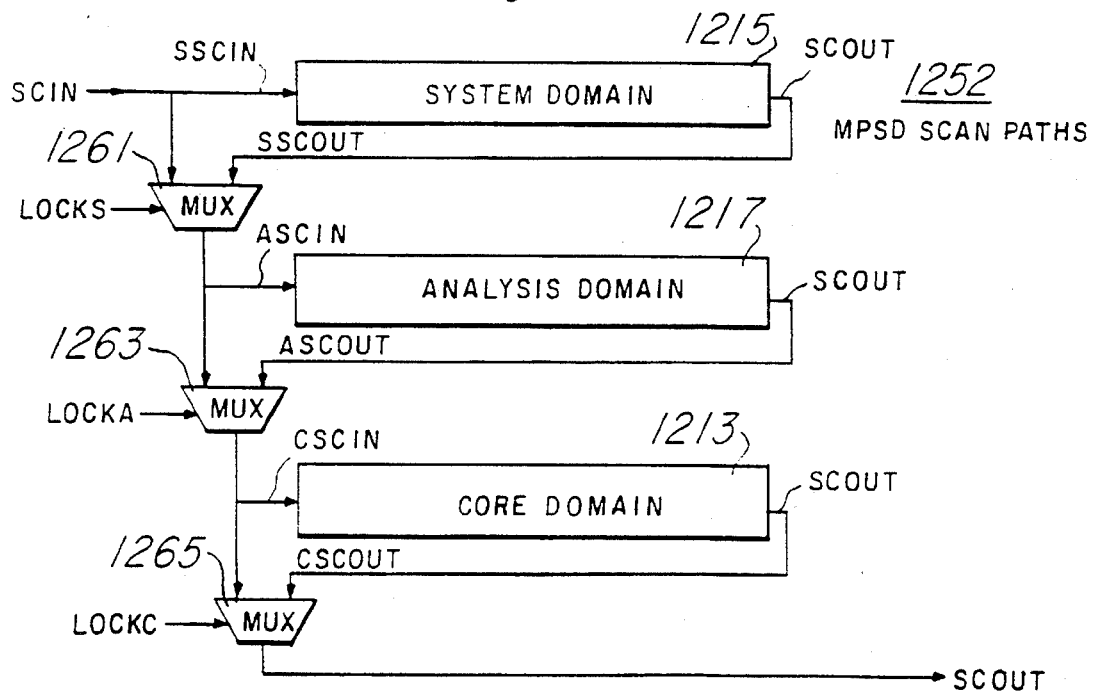
FIG. 55 is a block of scan paths in greater detail than that of FIG. 54.

In FIG. 55, a scan line 1253 from FIG. 54 is denominated SCIN and this line is selectively connected to three scan paths 1252 wherein each of the three paths is internally split by internal MUX selection into an internal scan control path and a scan data path. A set of external MUXes 1261, 1263 and 1265 are controlled by lock signals LOCKS (lock system domain), LOCKA (lock analysis domain), and LOCKC (lock core domain) from emulation control 1203 to bypass all but a selected one domain, if any, for scan and execution purposes. A locked domain has the MPSD codes (discussed hereinbelow) which have been supplied to that domain be frozen for the period the domain is locked. When any one domain (e.g. analysis domain) is to be scanned, its corresponding MUX 1263 deselects line ASCIN (analysis scan in data) and selects line ASCOUT (analysis scan out). In this way serial scan bits entering line SCIN enter analysis domain 1217 on line ASCIN, leave analysis domain via line ASCOUT, and bypass the other two domains. Each of the other two domains is selected analogously. Scan output exits through line SCOUT at the bottom of FIG. 55.

Figure 56:
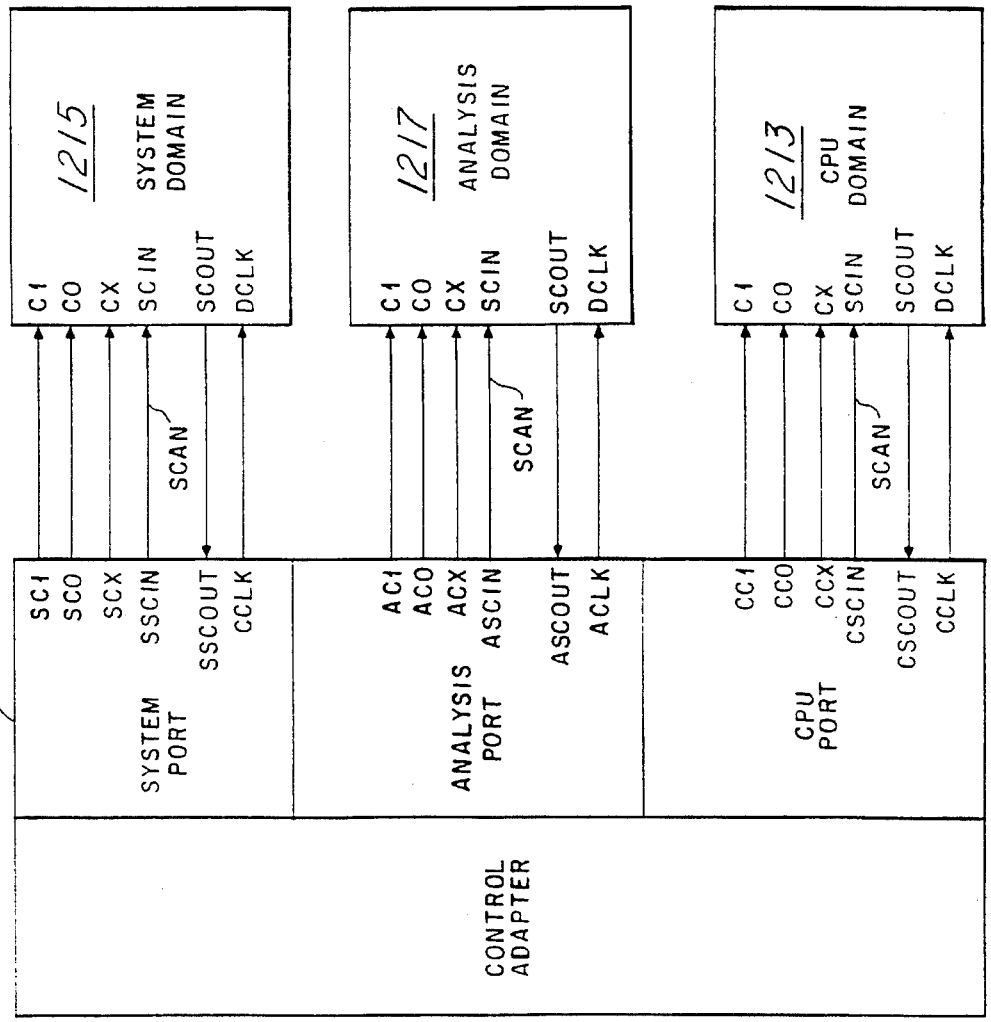
FIG. 56 is a block diagram of connections of a control adapter to the domains, showing nomenclature.

For each domain, MPSD command code bits C0, C1 and CX in FIG. 56 enter each domain from control adapter 1203. These MPSD command code bits C0, C1 and CX are parallel, not serial, and are distinct from scan control signals and scan data signals entering a line SCIN for each domain in FIGS. 55 and 56. Particular operations in particular modules in a given domain are determined by the scan control bits passed into the daisy chained modules of a given domain on line SCIN, when a particular code C1,C0=01 sets the internal selection to receive line SCIN scan bits into scan control bit SRLs in each module of the domain.

C1 is a one when not scanning and a zero when scanning. C0 and CX are sourced from the emulation control block adapter 1203 register 1251. When host computer 1101 detects Ready to Scan for all unlocked domains for a designated device on the target board 1043, C1 and C0 are modified when in the Scan Data state JSDAT of FIG. 50A to make C1 and C0 both be zero (C1,C0=00) to set the internal selection to receive line SCIN scan bits into scan data bit SRLs in each module of a selected domain. When C1,C0= 01, then the internal selection is set to receive the SCIN scan bits into scan control SRLs as stated in the previous paragraph.

The command code lines C1,C0,CX, the scan in SCIN and scan out SCOUT lines, and clock lines are shown in FIG. 56. The scan control bits are scanned in on line SCIN to control and select one or more modules in a selected domain. Then scan data bits also on line SCIN are scanned into the selected domain into the selected one or more modules. Thus, the system affords individualized access of the MPSD scan data and scan control bits to the system domain 1215, analysis domain 1217 and CPU core domain 1213.

Identical nomenclature is applied to the domain inputs of FIG. 56 even though they are not connected together. Prefixes of S, A and C are applied to the nomenclature of the outputs of adapter 1203 that go to each of the domains. For example, AC1 is the C1 output for the A (Analysis) domain from the adapter 1203.

In the control 1203 clock switching circuits (1411, 1413, 1415 of FIG. 59) fed by FCLK and JCLK individually provide respective domain clocks to clock each of the domains separately or together as desired by the user. FIG. 56 also shows clock lines SCLK, ACLK, and CCLK going to domain clock inputs DCLK for system domain 1215, analysis domain 1217 and CPU domain 1213 respectively. Prefixes of S, A and C are denoted for the same lines at respective system, analysis, and CPU ports of adapter 1203 of FIG. 56.

The MPSD codes are tabulated in Table III:

TABLE III

| C1 | C0 | CX | SCIN | SCOUT | REMARKS |
|----|----|----|------|-------|---------|
| 1 | 1 | 1 | X | 1 | Functional run, emulation logic held reset (strap) (7) |
| 1 | 1 | 0 | X | 1 | Execute a command which has been scanned in: Emulation run, device running (6) |
| 1 | 1 | 0 | X | 1,0 | Emulation run, device halted on one-to-zero transition (6) |
| 1 | 0 | 1 | X | 1 | Halt applied, device still running. (5) |
| 1 | 0 | 1 | X | 1,0 | Halt applied, device halted on one-to-zero transition (5) |
| 1 | 0 | 0 | X | Do | Scan pause (4) (Cause serial data transfer to pause) |
| 0 | 1 | X | Di | Do | Scan control path data (2,3) |
| 0 | 0 | X | Di | Do | Scan data path data (0,1) |

Since there are two different MPSD scan paths in each module (FIGS. 47 and 48 being simplified suggest both paths with only one serpentine loop), the C1,C0 codes act as a selection code. C1,C0=01 selects the control path, whence control bits are scanned in on line SCIN and control information scanned out on SCOUT. C1,C0 =00 selects the data path, whence data bits are scanned in on line SCIN (FIG. 55) and data developed in device 11 scanned out on SCOUT.

When C1=1 (command code C1 active), then control line CX is available for defining further codes for a whole domain as tabulated above.

The scan out line SCOUT has a dual function. In a first function SCOUT serves as a handshake or interrupt by representing whether the device is running or halted in response to the command entries 7, 6 and 5. In the second function, it serves as a line for scanning out serial data in the last two tabulated codes. Transitions from shift operations (0,1,2,3) to execute operations (5,6,7) or from execute to shift, preferably include a pause (4) to halt (5) or halt-to-pause sequence. This is not mandatory, but can be used to effect orderly behavior of device 11 internal buses and state machines in such transitions.

It is of interest that Pause state 100 electrically borders both the command codes above it (herein called Execute codes) in the table as well as the command codes to scan (herein called Scan codes), below it.

Figure 57:
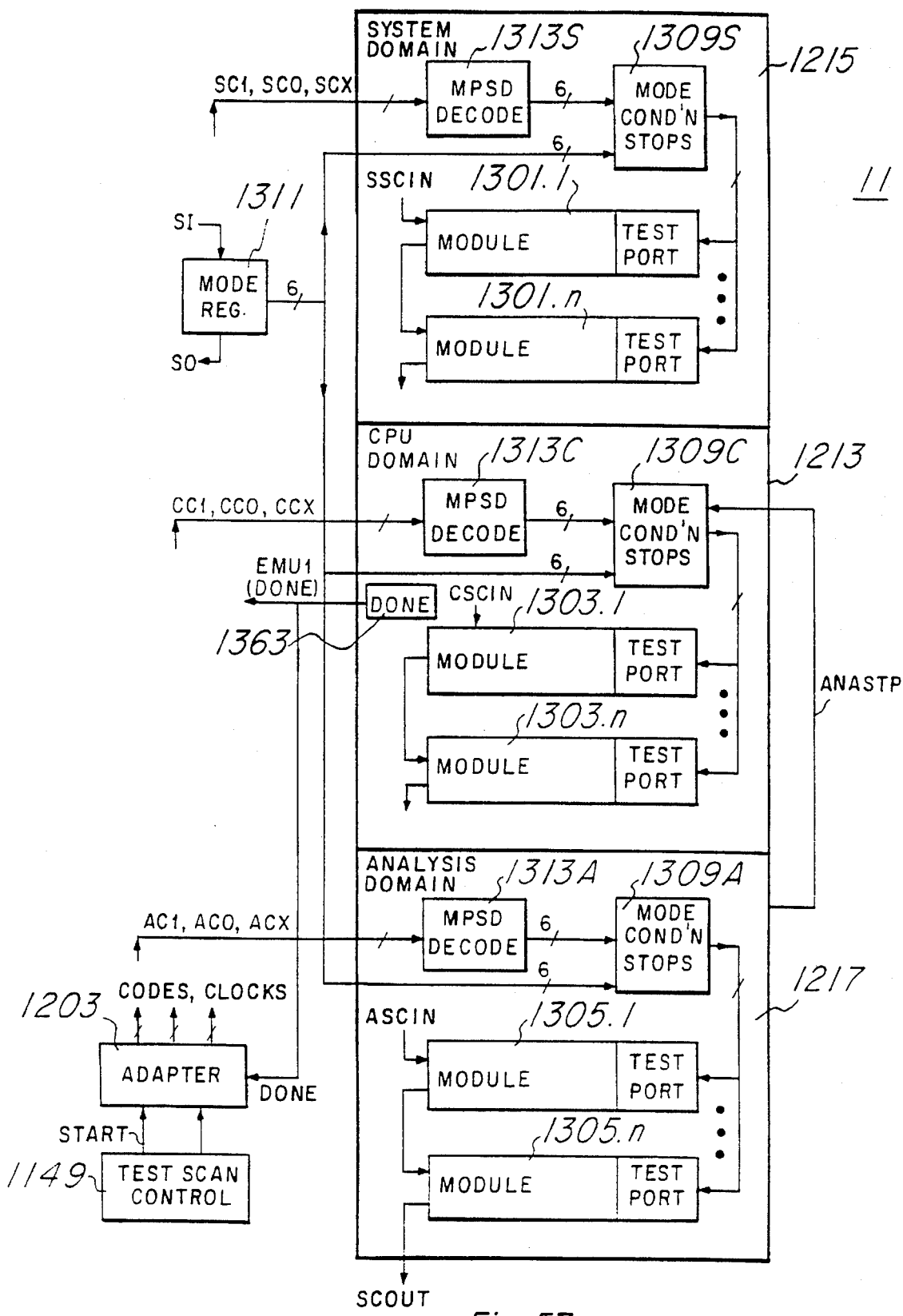
FIG. 57 is a block diagram of modules in the domains, also illustrating a mode-driven stops process.

In FIG. 57, the adapter or emulation control block 1203 is used to independently manage the clock signals that it routes to the CPU, analysis, and system domains 1213, 1217 and 1215 respectively. Block 1203 also applies a sequence of the command code triplets (C0, C1, CX) to generate emulation and simulation functions. Each domain has modules, such as 1301.1 and 1301.n in system domain 1215, 1303.1 and 1303.n in CPU core domain 1213, and 1305.1 and 1305.n in analysis domain 1217. Associated with each module is a test port as described in U.S. Pat. No. 4,860,290.

Connected to each test port is mode conditioned stop logic circuitry 1309S, 1309C and 1309A in the domains respectively. The modes are established by a mode register 1311 which is scanable in FIGS. 54 and 57 to establish the type of stop and any other desired mode characteristics for the domains. The mode conditioned stop logic circuits 1309S, 1309C and 1309A are respectively fed by MPSD decoders 1313S, 1313C and 1313A that have multiline outputs to the stop mode conditioned logic circuitry.

Scan control 1149 scans in an initial state (test vector) into the registers of device 11 to set up a test or emulation sequence. This is done with all domains locked, meaning that test clock JCLK is applied for scan purposes. When all data and control registers are loaded, circuitry 1149 sends a START signal to adapter 1203. The CPU domain, for an example, is unlocked, meaning that it is started running on functional clock FCLK.

Then in a stop feature, the analysis domain 1217 is scan programmable to direct the CPU domain to stop on a predetermined condition. When the predetermined condition occurs, a signal ANASTP (Analysis Stop) is sent to the CPU domain 1213 to make it stop according to the stop mode established for it in mode register 1311 and mode conditioned stop circuitry 1309C. DONE circuitry 1363 detects when the stop is completed and signals back to adapter (emulation mode control) 1203 to lock the CPU, for example, by putting it on test clock JCLK instead of functional clock FCLK. The DONE signal is generated when all instructions in a CPU pipeline are executed and all currently pending memory access cycles are completed. Another definition of DONE may of course be used or mode-selected. Then using test clock JCLK, the important registers of the domains can be scanned out for recordkeeping, display and study at host computer 1101 of FIG. 45.

Figure 58:
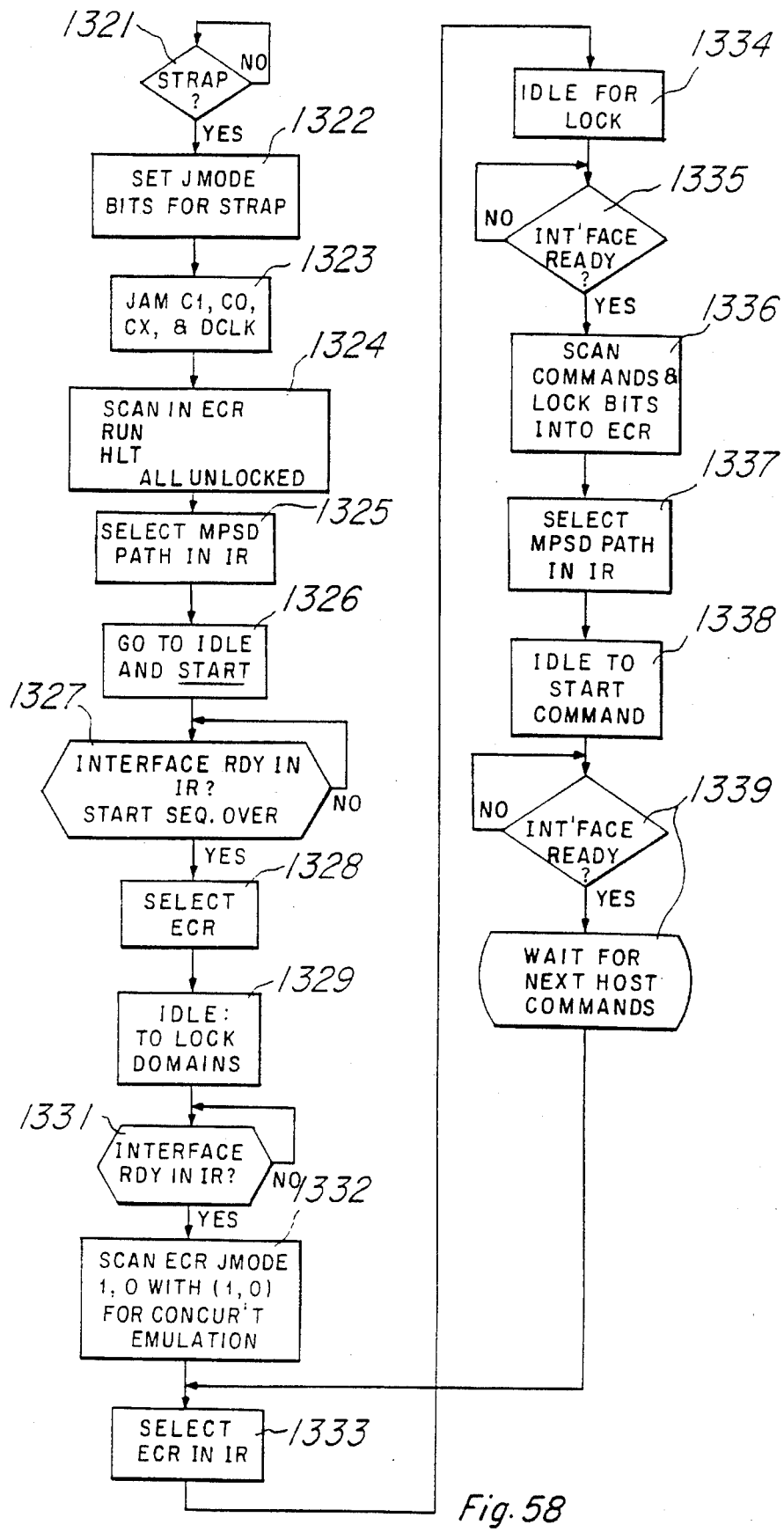
FIG. 58 is a process diagram of operation of the system of FIGS. 45, 50, 57 and 59 for emulation, simulation and testability.

FIG. 58 illustrates in even further detail an example of process steps by which the scan control 1149 including IR 1153, adapter 1203 including ECR (emulation control register) 1251, and host computer 1101 cooperate to enter and perform sequences of commands on-chip.

Operations in FIG. 58 commence in a step 1321 with a reset STRAP state of FIG. 50A in the scan control 1149 in FIG. 50. Output JSTRAP of TAP controller 1151 of FIG. 50 becomes active and in a step 1322 sets two JMODE bits in ECR 1251 of FIGS. 54 and 59. Adapter 1203 jams a functional 111 command code and sets the domain clocks in a step 1323.

Next in a step 1324, the host 1101 sends TMS signals to scan control 1149 to reach the FIG. 50A TAP controller state "Select-IR-Scan" and then scans ECR select into the IR 1153. Further in step 1324 the host sends more TMS signals to the TAP controller to reach the state "Select-DR-Scan". This means that the scan controller is ready to accept scan into a DR (data register) identified just before as the ECR 1251 by the host to the IR 1153. Into ECR 1251 the host 1101 then scans two-bit portions C0,CX of the triplets for RUN and HALT of Table III. Lock bits are also loaded to unlock all of the domains. The lock bits are scanned for this purpose into a FIG. 59 ECR 1251 portion called LOCK 1351.

In a succeeding step 1325, host computer 1101 sends TMS signals to the scan control 1149 to reach the TAP controller state "Select-IR-Scanz" again. This time the host then scans MPSD path 1252 select into the IR. In a step 1326, more host TMS signals are sent to reach the state IDLE in FIG. 50A. Hardware in FIG. 50 thereupon produces the signal START to activate the code state machine 1381 in the adapter 1203. A decision step 1327 determines whether the scan interface 1149, 1203 is ready. When ready, the host 1101 scans an ECR select into the IR 1153 in a step 1328, followed by more TMS to reach the IDLE state in a step 1329. This deactivates the start signal and permits scan-out of domain information by DR scan from the MPSD path 1252 in steps which are omitted for conciseness from FIG. 58.

When the interface is again ready in a step 1331 operations proceed to a step 1332 and a step 1333 to select and scan the ECR 1251 JMODE bits JMODE1 and JMODE0 with logic 1 and logic zero respectively to enable concurrent emulation. Then in a step 1334 the host 1101 sends TMS signals to reach the IDLE state of FIG. 50A for lock. When the interface is ready after a step 1335, the host 1101 scans command and lock bits into ECR 1251 in a step 1336. Next in a step 1337, the host 1101 sends TMS to select scan to the IR, scans a MPSD path select into the IR. Next in a step 1338, the host 1101 sends more TMS to reach the IDLE state of FIG. 50A whereupon hardware of FIG. 50 initiates the START signal to the adapter 1203 code state machine 1381. A step 1339 has the host wait until the interface is ready, whereupon operations loop back to step 1333 to have the host 1101 scan further commands into the ECR and then start the on-chip emulation circuitry to run the chip in real-time.

It is to be understood that the description of steps is by way of example only. Data and control information are scanned into and out of the domains on test clock JCLK, and the domains are independently and selectively started on functional clock FCLK and stopped, in extensive sequences to accomplish emulation, simulation and test functions with a wide degree of flexibility as circumstances of the development, manufacturing and field environments dictate.

This remarkable capability of scanning in emulation data and retrieving it from each domain, and further of individually clocking the domains with either the real time functional clock FCLK or a test clock JCLK is mediated by the emulation control 1203 in response to the host computer 1101 and improved JTAG circuitry of FIG. 50. The emulation control 1203 is illustrated in greater detail in FIG. 59.

Figure 59:
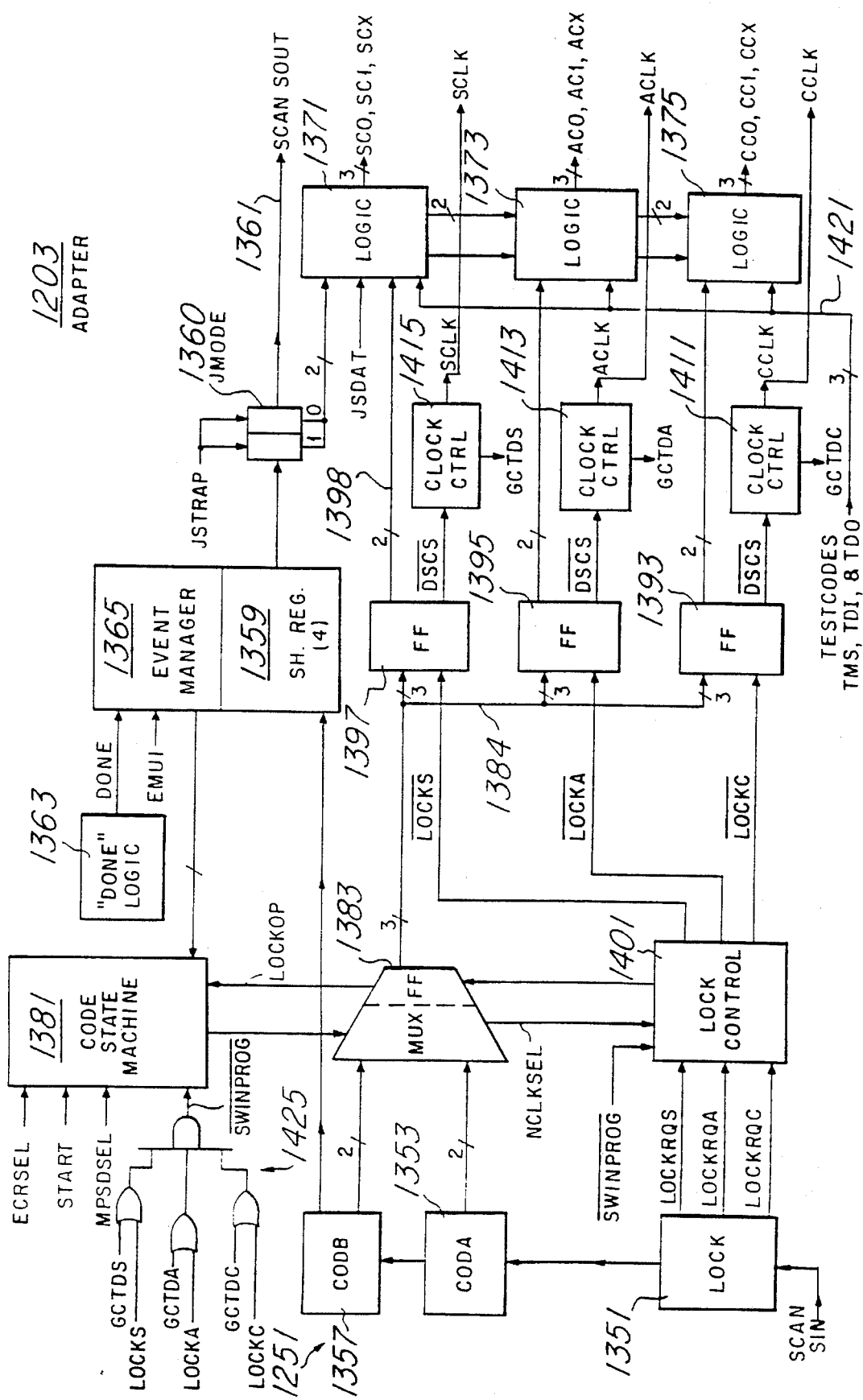
FIG. 59 is a detailed block diagram of the adapter of FIGS. 49, 51, 52, 53, 56 and 57.
Figure 59A:
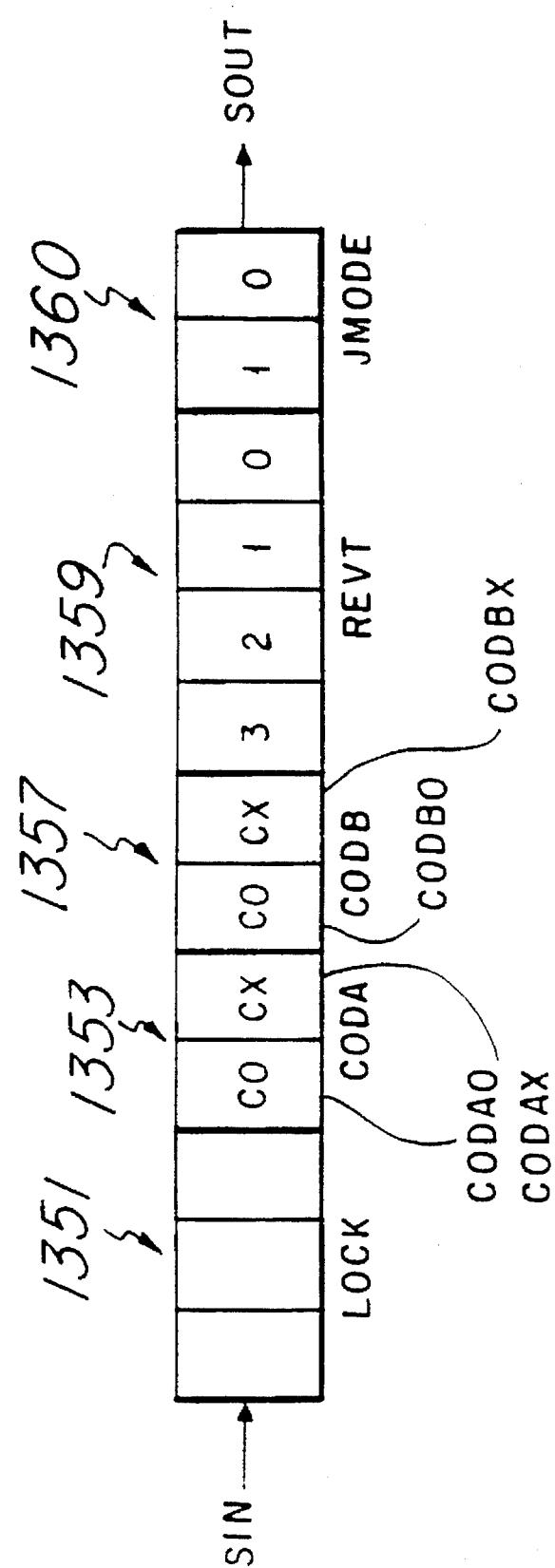
FIG. 59A is a compact diagram of shift register latches SRLs in a scan chain in FIG. 59.

In FIG. 59, serial scan bits enter the emulation control register ECR 1251 which is subdivided into a shift register LOCK 1351 for holding bits to lock and unlock domains, a first C0,CX control code shift register named CODA 1353, a second C0,CX control code shift register named CODB 1357, a shift register 1359 associated with event manager circuitry 1365, and a two-bit register JMODE 1360. These registers are compactly illustrated in FIG. 59A. Thus, the serial scan enters on a scan line SIN, passes serially through the shift registers 1351, 1353, 1357, 1359 and 1360 until all the shift registers are loaded. Any serial scan output is scanned out via serial line 1361 SOUT.

A set of selector logic circuits 1371, 1373 and 1375 of FIG. 59 supply signals on lines as shown in FIG. 56 to the domains for the core 1213, system 1215 and analysis 1217. Also, individualized domain clock lines DCLK of FIG. 56 are supplied respectively with clock signals SCLK, ACLK and CCLK in FIG. 59.

A code state machine 1381 controls a two input MUX 1383. MUX 1383 selects the C0,CX two-bit contents of shift register 1353 or 1357 and loads them into an enabled one of three flip flops 1393, 1395 and 1397. A lock control circuit 1401 operating under the control of lock shift register 1351 and code state machine 1381 sends lock signals to disable or enable each of the flip flops 1393, 1395 and 1397, depending on which selected domain 1213, 1215 or 1217 is to be unlocked while other domains are locked.

Each flip flop has three sections for C0, CX and a clock control signal DSCS-.

Three clock control signals, each independent of the others and all designated DSCS-, are supplied from the flip flops 1393, 1395 and 1397 to respective clock control circuits 1411, 1413 and 1415 which provide the individualized domain clock outputs—core clock CCLK, analysis clock ACLK and system clock SCLK.

Test codes from the TMS, TDI and TDO lines from host 1101 enter FIG. 59 on three lines 1421 to selection logic 1371, 1373 and 1375. Command codes for each domain can be derived directly from the test codes on line 1421, thus overriding the code state machine feature. This option is selected by scanning JMODE register with "00" (both bits zero). Thus, the preferred embodiment is accommodates direct host control of the domains, wherein the latter is the JMODE 00 option.

If a switch of any domain 1213, 1215, 1217 between JCLK and FCLK is in progress under control of any of the clock controls 1411, 1413, 1415, then code state machine 1381 should be temporarily stopped. This is accomplished by a disabling input low active SWINPROG-(Switch In Progress) which is fed from a logic network 1425 in response to the LOCKC, LOCKA and LOCKS inputs from lock control 1401 and from three clock domain signals GCTDC, GCTDA and GCTDS. The latter three signals signify Good Clock This Domain for each of the domains—Core, Analysis and System, respectively.

In FIG. 59, the control block 1203 functions are programmable and allow one 1) Apply MPSD codes from one of two preloaded registers, CODA 1353, and CODB 1357 as directed by a code state machine 1381;

2) Program state machine 1381 operations via REVT (Register Event) register 1359 to respond to stimuli including:
    a) START from scan control 1149
    b) DONE from CPU core 1213, 1363

3) Control the clock switching from FCLK to JCLK (with a code 00 in both registers 1353 and 1357) and vice versa for each domain, via LOCK register 1351; and 4) Lock domains in their current state while operating with other domains.

The control block 1203 allows the following clocking options:

a) The orderly switch of the domain clock lines between JCLK and FCLK clock pulse sources.

b) Domain clock lines may be locked in the current state by lock bits on a scan data path.

c) The JTAG strap (reset) state or MPSD strap state cause the functional clock to be selected.

d) Test mode selection allows the entire chip to be driven by JCLK.

This clocking selectability allows configuration of a fully synchronous chip for test, and the ability to scan any one or more of the domains, or the whole chip with data transfers being synchronous to the JCLK.

The operation of code state machine 1381 is now further described. When the JTAG IR (Instruction Register 1153) is loaded with a scan path select command for path 1251, a line ECRSEL feeds a signal to state machine 1381 whereupon the state machine 1381 enters a lock state. This allows the registers 1351, 1353 and 1357, the event manager register 1359, and JMODE register 1360 to be changed without disturbing the MPSD codes and clocks supplied from flip flops 1393, 1395, 1397 and selection circuits 1371, 1373 and 1375 to the domains 1215, 1213 and 1217. Lock register LOCK 1351 holds bits which selectively cause the CPU, analysis and system domains 1213, 1217 and 1215 to be frozen in their current configuration and state in response to MPSD command codes presently applied to them from flip-flops 1393, 1395, 1397 and logic 1371, 1373 and 1375.

The START signal for state machine 1381 of FIG. 59 is generated in the circuit of FIG. 50 when a scan data path select signal is present and TAP controller 1151 reaches the JTAG IDLE state of FIG. 50A. The JTAG interface of FIG. 50 becomes passive and the dynamic operations of circuit 1203 of FIG. 59 commence.

In FIG. 50 the START signal is generated as follows. A path decoder 1168 connected to instruction decoder 1155 qualifies AND gate 1170 when its OR gate 1172 signals that the MPBD scan data path 1252 of FIG. 54 or MPSD scan control path are selected. An IDLE line from TAP controller 1151 is connected to another input of AND gate 1170. When the IDLE state occurs with gate 1170 qualified for path, AND gate 1170 signals a handshake synchronizer 1169 to supply START to code state machine 1381 of FIG. 59.

Handshake synchronizer 1169 is provided because emulation control 1203 is operated on pulses of functional clock FCLK at times while the JTAG circuitry operates on the test clock JCLK. Handshake synchronizer 1169 includes two state machines to control the generation of the START signal to the code state machine 1381. One state machine is in the JTAG environment of FIG. 50 and the other is in the MPSD control environment of FIG. 59. In this way, the clock boundary is crossed.

The emulation control block 1203 of FIG. 59 serves to create MPSD control codes for the MPSD domains 1213, 1215 and 1217 which perform the necessary emulation, simulation and test functions. A general programmable implementation is illustrated, although a fixed hard coded implementation is also feasible. Moreover, a microcoded control ROM (CROM) implementation of the circuitry of FIGS. 50, 51, 57 and 59 is an alternative embodiment contemplated in the practice of the invention.

The code state machine 1381 controls the generation of MPSD code sequences to the domains. The clock control circuits 1411, 1413, and 1415 each include a state machine that controls the switching of the clocks of the domains between JCLK and FCLK in an orderly way before allowing a new MPSD code (C0, C1, CX) to be applied to the domains. "State Machine" is used in the computer science sense of the phrase to denote any software or hardware based circuit that is represented by a state transition diagram that has at least two states. This state machine approach minimizes the number of JTAG optcodes assigned to emulation functions as well as greatly simplifying the MPSD interface.

From one perspective, the Pause command code (C1,C0, CX=100) of Table III is a default state or "anchor" to which the other states relate. The code state machine and registers CODA and CODB operate with their C0,CX contents to alter the Pause state to HALT (101), CNTRL (110) or FUNC (111) of Table III. When a scan into a domain is desired, the code state machine 1381 is directed by host 1101 software to enter C0,CX=00 in both CODA and CODB, and in this way a Pause (100) is applied to the device 11.

From a clock switching point of view, a transition from HALT 101 to Pause 100 causes a functional clock FCLK to JCLK test clock switch-over. The switch-over occurs in the Pause state applied to the domain inputs C1,C0,CX by the logic 1371, 1373 and 1375.

A transition from Pause 100 to any of FUNC 111, CNTRL 110 or HALT 101 causes the interface to freeze in Pause 100 until all unlocked domains switch to functional clock FCLK and thereupon operate on FCLK. Thus all clock switching occurs with the 100 Pause code applied.

The host 1101 software is programmed to operate this interface, for example, on the assumption that when the Pause (100) code is present on all unlocked domains, and it may now load the MPSD path select into the IR 1153 and then scan MPSD data or control bits into a selected domains. The logic 1371, 1373 and 1375 of FIG. 64 responds to the path select as data control to set a ScanData (00x) or Scan Control (01x) MPSD command code for the domains.

A Scan Ready SCANRDY interface-ready bit can be set in IR 1153 for use by host 1101 software to signify that all domains unlocked have no switch in progress and Pause 100 is applied to them, so that it is all right to scan data or control bits into the domains.

Since the logic 1371, 1373 and 1375 responds to the path selects when scan codes 00x or 01x are needed, it should be apparent that the code state machine 1381 and registers CODA and CODX job primarily involves delivering code bits C0,CX from among the group 00 Ready to Scan, 01 Apply HALT, 10 Apply CNTRL and 11 Apply FUNC. Code bit C1 of Table III is a one (1) due to host 1101 software not attempting to scan while the state machine is applying a code C0,CX of 01, 10 or 11. Thus, the MPSD command codes C1,C0,CX are respectively constructed—101 HALT, 110 CNTRL and 111 FUNC.

Figure 60:
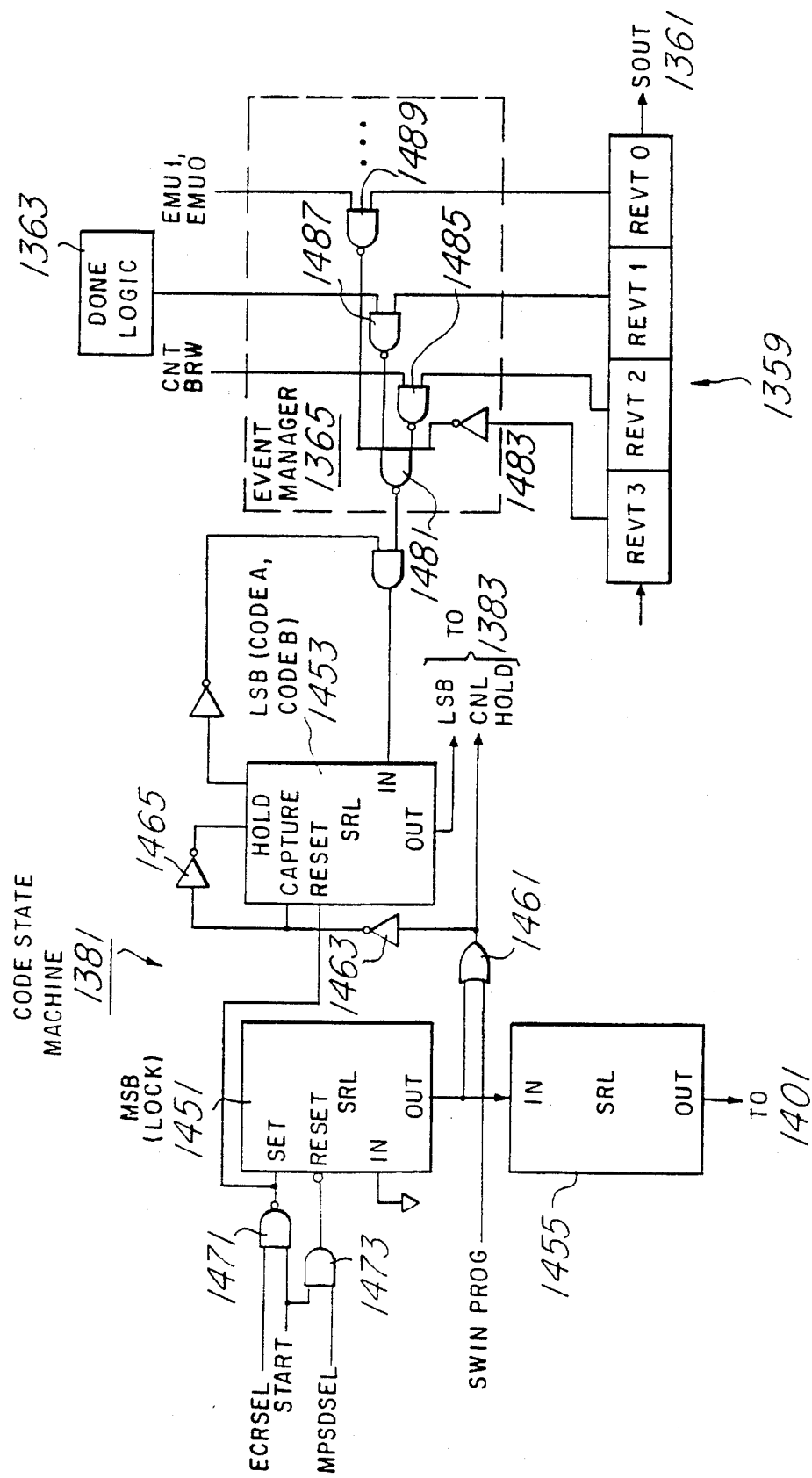
FIG. 60 is a schematic diagram of a code state machine and an event manager circuit therefor in the adapter of FIG. 59.

FIG. 60 shows a schematic diagram of code state machine 1381 and its event manager 1365. Code state machine 1381 includes two interconnected SRLs 1451 and 1453 that sequence through a state transition diagram of FIG. 61 that has three states—LOCK, CODEA and CODES and transitions T1, T2, T3, T4 and T5 between the states. The respective outputs of the SRLs 1451 and 1453 are regarded as the MSB and LSB (most, least significant bits) of a two bit digital signal. The MSB represents the LOCK state, and LSB high and low respectively represent the CODEA and CODEB states. Event manager 1365 signals to SRL 1453 that if the state machine is in the CODEA state, then a transition to the CODEB state is requested.

Figure 63:
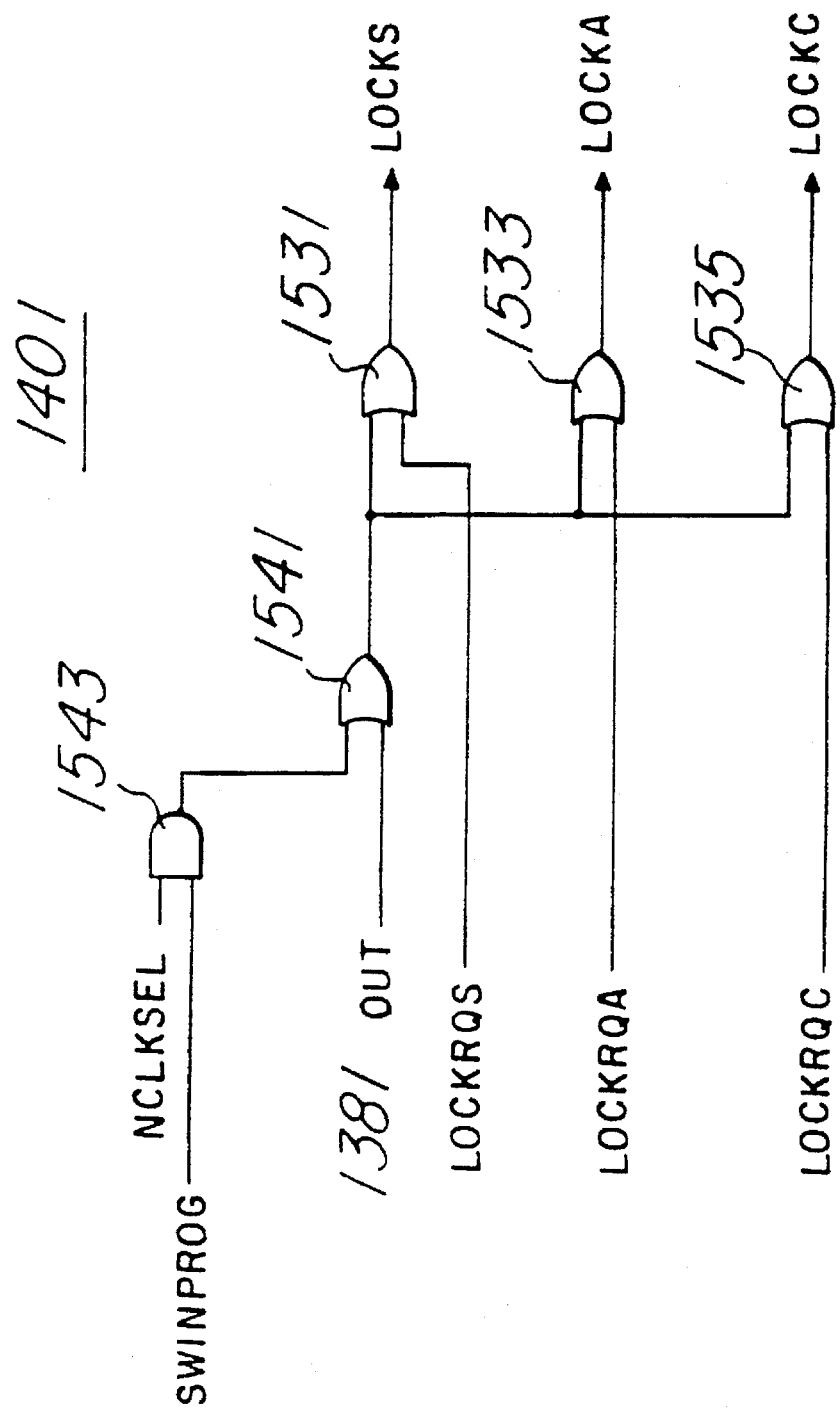
FIG. 63 is a schematic diagram of a lock control circuit of the adapter of FIG. 59.

A third SRL 1455 of FIG. 60 is connected between SRL 1451 and lock control 1401 of FIGS. 59 and 63. An OR gate 1461 has inputs connected to the output of SRL 1451 and to switch-in-progress signal SWINPROG from logic 1425 of FIG. 59. OR-gate 1461 has its output connected to series-connected inverters 1463 and 1465. The inverters are connected respectively to CAPTURE and HOLD inputs of SRL 1453 to provide state transition inputs related to the state of SRL 1451 and SWINPROG. OR-gate 1461 itself supplies a control hold CNLHOLD output to circuit 1383 of FIG. 59, to which circuit line LSB is also connected. Event manager 1365 is connected to an input of SRL 1453.

A NAND gate 1471 supplies a SET input of SRL 1451 in response to two inputs ECRSEL (emulation control register select) and START from FIG. 50. An AND gate 1473 supplies a RESET input of SRL 1451 in response to MPSDSEL (MPSD data or control scan path select) and START.

Event manager 1365 includes a set of logic circuits connected to signals CNTBRW, DONE, EMU1 and EMU0 and any other analysis, core status, or other signals which the skilled worker elects. Signal CNTBRW is counter borrow from analysis block circuitry discussed in FIG. 69. DONE signals completion of a stop as discussed in connection with FIG. 58. DONE is suitably provided to the state machine as the differentiated trailing edge of a CPU core signal that indicates the core is running, so that just when the core ceases running, the DONE signal is provided. Pins EMU1 and EMU0 carry signals of same designation originating internally or externally of the chip for emulation signaling.

Shift register 1359 includes scannable register-event bits REVT3, REVT2, REVT1 and REVT0. REVT3 is a scanable bit inverted by an inverter 1483 to signal a NAND gate 1481 (which operates as a low-active OR) that feeds SRL 1453. REVT2, REVT1 and REVT0 are control bits cause event manager 1365 to selectively ignore or respond to signals CNTBRW, DONE, and EMU1 respectively. For this purpose, respective NAND gates 1485, 1487 and 1489 have their outputs connected to NAND gate 1481. One input apiece of NAND gates 1485, 1487 and 1489 is connected to REVT2, REVT1 and REVT0 respectively. A second input apiece of said NAND gates is connected to CNTBRW, DONE and EMU1. Additional NAND gates for EMU0 and other signals are readily providable, as are further event register cells in shift register 1359.

Figure 61:
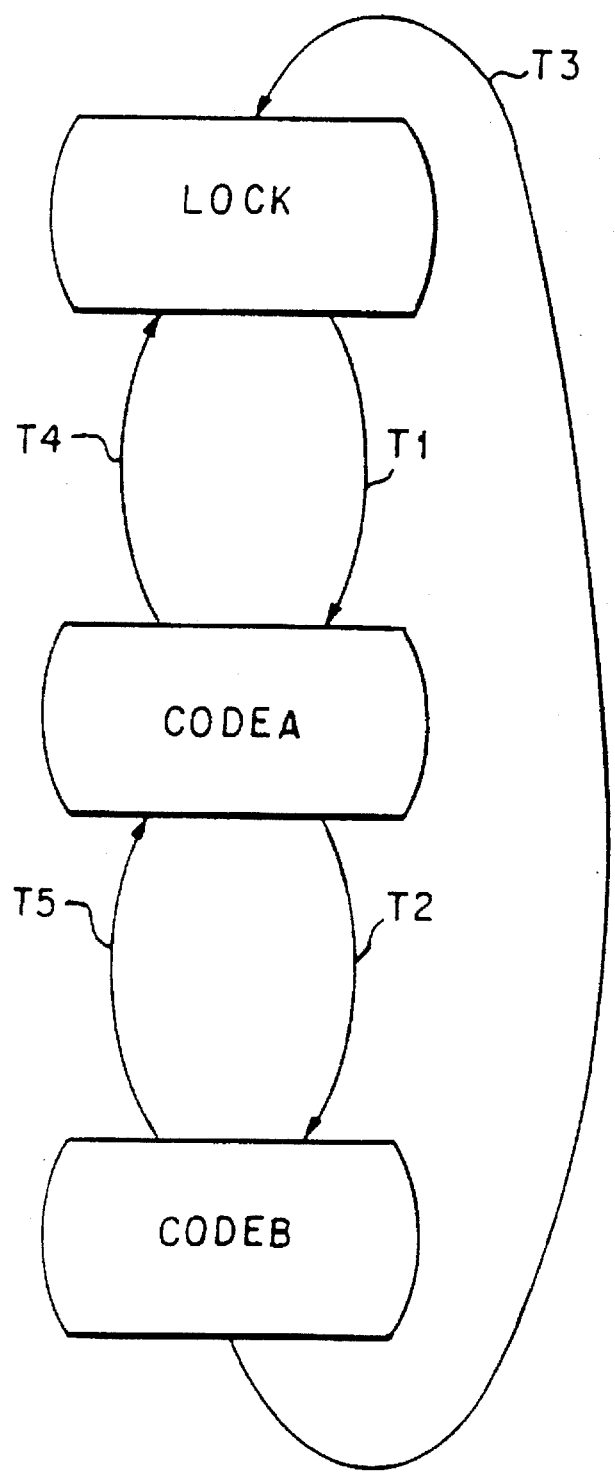
FIG. 61 is a state transition diagram of the code state machine of FIG. 60.

The circuitry of FIG. 60 is inventively configured in any appropriate manner to implement the inventive methods and structures. For instance in this embodiment, generally speaking, the code state machine 1381 locks the MPSD control code currently applied to the domains when the emulation control path ECR 1251 is selected by the instruction register IR 1153 and a START pulse is generated. The code state machine 1381 exits the lock state upon a START pulse and a MPSD scan path selected and can apply one of two MPSD control codes at times responsive to occurrence of a predetermined condition of CPU core or other event preprogrammed by REVT bits before returning to LOCK state. Also, the code state machine, as shown in FIG. 61 can automatically alternate between the first and second control codes before returning to LOCK state. While only two codes have been shown for illustration, it is apparent that many number of control codes can be scanned into or otherwise stored in corresponding shift registers analogous to 1353 and 1357 of FIG. 59, and a code state machine can be provided to have corresponding states for each of the codes with circuitry to implement transitions between the states to apply all codes in programmable sequences depending on various operational conditions. Some pairs of MPSD control codes that are of particular interest for automatic entry into the domains are tabulated in Table IV:

TABLE IV

| CODA | CODB | Operation Performed |
|---|---|---|
| Run 10 | Halt 01 | a) Execute program portion: Analysis domain determines when to stop; stop mode determines how to stop. FCLK |
| Pause 00 | Pause 00 | b) Module Setup: download from host memory to SRLs in scan control path of a domain to select and deselect modules for subsequent data scan; upload from domain scan control path to host. JCLK See NAND 1585 FIG. 64 |
| Halt 01 | Pause 00 | c) Load machine image via scan in (b); then load CODA and CODB. Start with Halt applied, machine then signals DONE to advance state machine to select CODB; now scan in next sequence. Repeat for each word of memory, for example. |
| Pause 00 | Pause 00 | Download from host memory to SRLs in scan data path of a domain by $; upload from domain to host; Lock 1351 determines which domain is loaded. Loading Analysis domain determines when to stop in Run/Halt above. Uploading from analysis retrieves PC trace stack. Loading Core establishes program point from which to begin Run. Uploading Core recovers CPU core state when halted. Loading/uploading System domain initializes/recovers System domain state. See NAND 1583, FIG. 64. and control path select. |

In the state transition diagram of FIG. 61, some exemplary Boolean equations for the transitions T1–T5 are as follows:

T1=LOCK & NOT SWINPROG & START & MPSDSEL
T2=CODEA & NOT SWINPROG & ((REVT1=1 & DONE)+((EMU1+EMU0) & REVT0=1)+(REVT2=1 & CNTBRW)+(REVT3=1)) T3=CODEB & ECRSEL & START T4=CODEA & ECRSEL & START T5=CODEB & NOT SWINPROG & START & MPSDSEL

The CPU provides a run signal (RUN) the trailing edge of which is designated DONE and used in the T2 equation.

SWINPROG is the indication that any of the clock domains are in the middle of clock transition.

START is set on the second clock cycle of the entry into the IDLE state with the device scan data or control path selected.

In words, the code state machine 1381 makes transition T1 in FIG. 61 from the LOCK state to the CODEA state provided the state machine is in the LOCK state, the START signal is present, MPSDSEL is present and there is no clock switching in progress. Transition T2 from CODEA to CODEB state occurs if the state machine is in CODEA state, there is no clock switching in progress and the event manager 1365 so requests. Transition T3 from CODEB to LOCK state occurs if the state machine is in CODEB etate, the host 1101 has loaded an ECR request into JTAG IR 1153, and START is present. Transition T4 from CODEA to LOCK state occurs if the state machine is in CODEA state, the START signal is present, and the host 1101 has loaded an ECR request into JTAG IR 1153. Transition T5 from CODEB to CODEA state occurs if the state machine is in CODEB state, and there is no clock switching in progress, MPSDSEL is active and a START signal is present.

The three clock control circuits or clock switches 1411, 1413, 1415 work in tandem with the code state machine 1381 and circuits 1383, 1393, 1395, 1397 and 1401. Each clock control circuit 1411–1415 of FIGS. 59 and 65 supervises the transitions between clocks FCLK and JCLK as mandated by the MPSD codes in the CODA and CODB registers 1353 and 1357 selected by the code state machine 1381. When the code state machine 1381 points to a register CODA or CODB containing a different clock source for that state, the clock switch 1411, 1413 or 1415 corresponding to the unlocked domain selected by LOCK register 1351 and lock control 1401 locks the code of the old state by signaling NOT GCTD (Not Good Clock This Domain) to make SWINPROG active and synchronously switches the clocks. When the new clock pulses have been applied for at least one clock cycle from the new clock source, the clock switch then signals GCTD to release SWINPROG and allow circuits 1383 and a circuit pair such as 1397 and 1371 to pass the new control C0,CX control code to the enabled domain as described in more detail next in connection with FIGS. 62–65.

Figure 62:
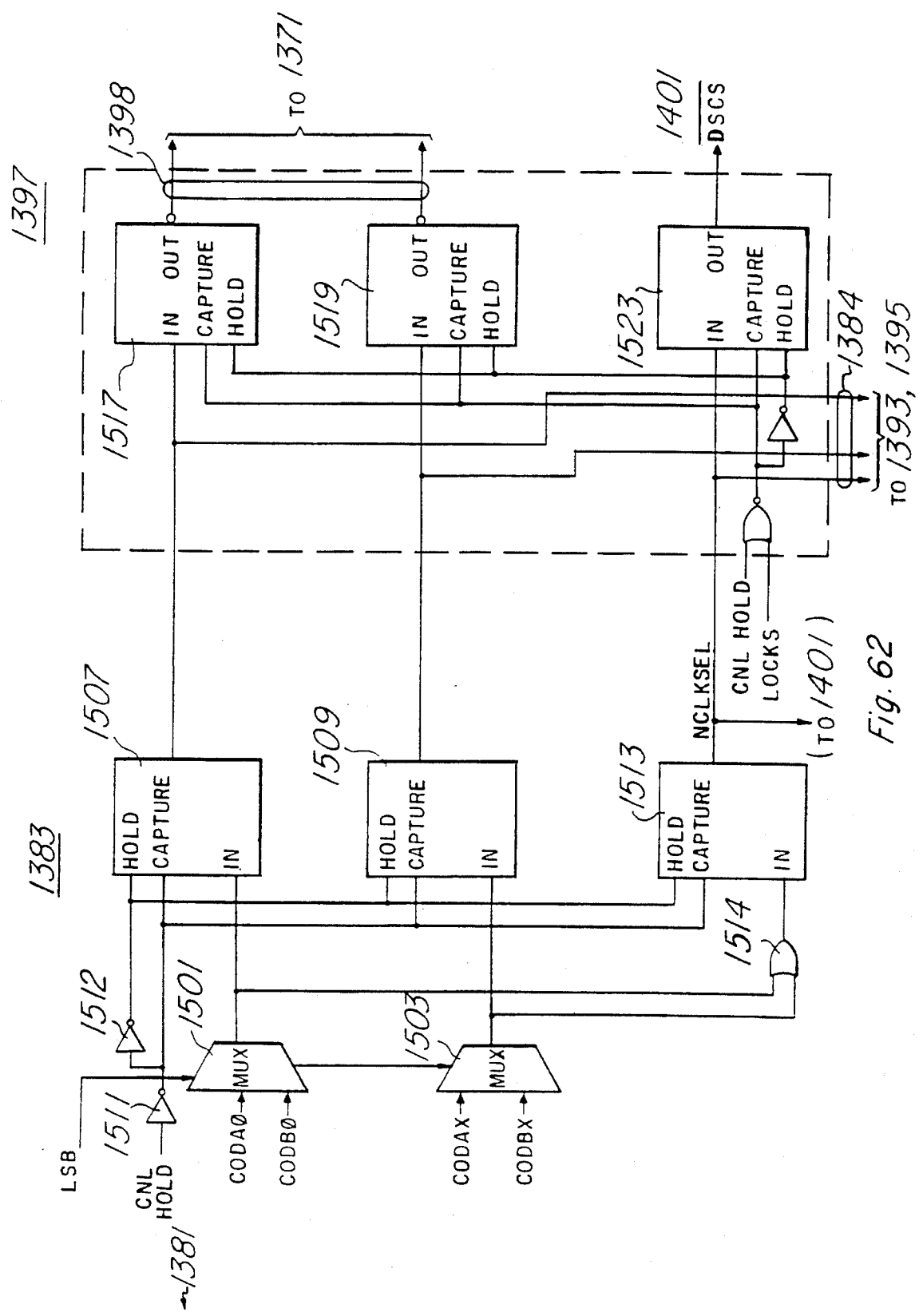
FIG. 62 is a schematic diagram of selection and flip-flop circuitry of the adapter of FIG. 59.

In FIG. 62, selecting circuit 1383 has two MUXes 1501 and 1503 for respectively selecting the C0,CX control code from register CODA or CODB in response to signal LSB from the code state machine 1381 of FIG. 59. The C0,CX codes in register CODA are designated CODA0 and CODAX, and in register CODB are CODB0 and CODBX. The selected code is held in a pair of SRLs 1507 for C0 and 1509 for CX in response to control hold signal CNLHOLD fed to respective CAPTURE and HOLD inputs via inverters 1511 and 1512.

SRLs 1507 and 1509 thus latch in the new code CODB selected when state machine 1381 makes the T2 transition to CODEB state. However, this new code is not instantaneously sent to its intended domain. First it is checked by a circuit 1514 to determine whether the code implies functional clock FCLK or test clock JCLK for use therewith. In other words, the circuit advantageously determines by itself which clock is needed, and does not require an optional bit that could be provided by user to define a clock request. In this exemplary embodiment circuit 1514 is an OR-gate that selects test clock JCLK when both C0 and CX are low (MPSD code for Pause). (MPSD code bit C1 is held at one by NAND logic 1563, 1573, 1581, 1583, 1585 of FIG. 64). The clock request from circuit 1514 is held in SRL 1513 in response to CNLHOLD, and SRL 1513 produces a clock select output nclksel to lock control 1401 and each circuit 1393, 1395 and 1397 of FIG. 59.

Circuits 1393, 1395 and 1397 (only 1397 shown in FIG. 62) identically include SRLs 1517, 1519 for MPSD command codes C0 and CX and an SRL 1523 to hold a clock select signal. These circuits hold previously entered MPSD commands and clock select information to control all of the domains. When any given one domain is to be updated, the corresponding one of circuits 1393, 1395 or 1397 is updated while the other two of them retain their information. SRLs 1517, 1519, and 1523 each have an input connected to a corresponding output of SRLs 1507, 1509 and 1513. Data from circuit 1383 is strobed into a selected one of circuits 1393, 1395 or 1397 depending on which of them is unlocked by lock signal LOCKS, LOCKC or LOCKA. Moreover, it should be apparent that LOCK 1351 can have bits to lock or unlock some or all of the domains at once. When scan of more than one domain is desired, the bits are appropriately set, and host computer 1101 can update all domains concatenated by MUXes of FIG. 55 at once.

Simply put, the C0,CX codes are delayed by a clock cycle to the domains so that the clock information that is implicit in C1,C0,CX of Table III can be examined and acted upon prior to the code being applied. If action is necessary, then Switch In Progress SWINPROG inhibits the code from being applied to the domain until the clock is switched.

In FIG. 63 the lock control circuit 1401 includes three OR gates 1531, 1533 and 1535 each having first inputs connected respectively to lines LOCKRQS, LOCKRQC and LOCKRQA from LOCK register 1351 of FIG. 59, and outputs connected respectively to lines LOCKS, LOCKA and LOCKC of FIGS. 59 and 62. These three OR gates each have second inputs connected together to the output of an OR gate 1541. A first input of OR gate 1541 is connected to the output of an AND gate 1543. A second input of OR gate 1541 is connected to the output of SRL 1455 of FIG. 60. The AND gate 1543 has two inputs connected to SWINPROG and nclksel. In this way, LOCK register 1351 bits override any other signals when the bits call for locking the domain (test clock JCLK only). However, if register 1351 unlocks any one or more domains (calling for functional clock FCLK to each such domain), each such domain can be locked internally by either the delayed locking MSB output of SRL 1455 or a conjunction of switch in program SWINPROG and clock select nclksel high. Every unlocked domain is locked without need of further selection circuitry by having OR-gate 1541 send locking request indiscriminately to all three OR-gates 1531, 1533 and 1535.

Figure 64:
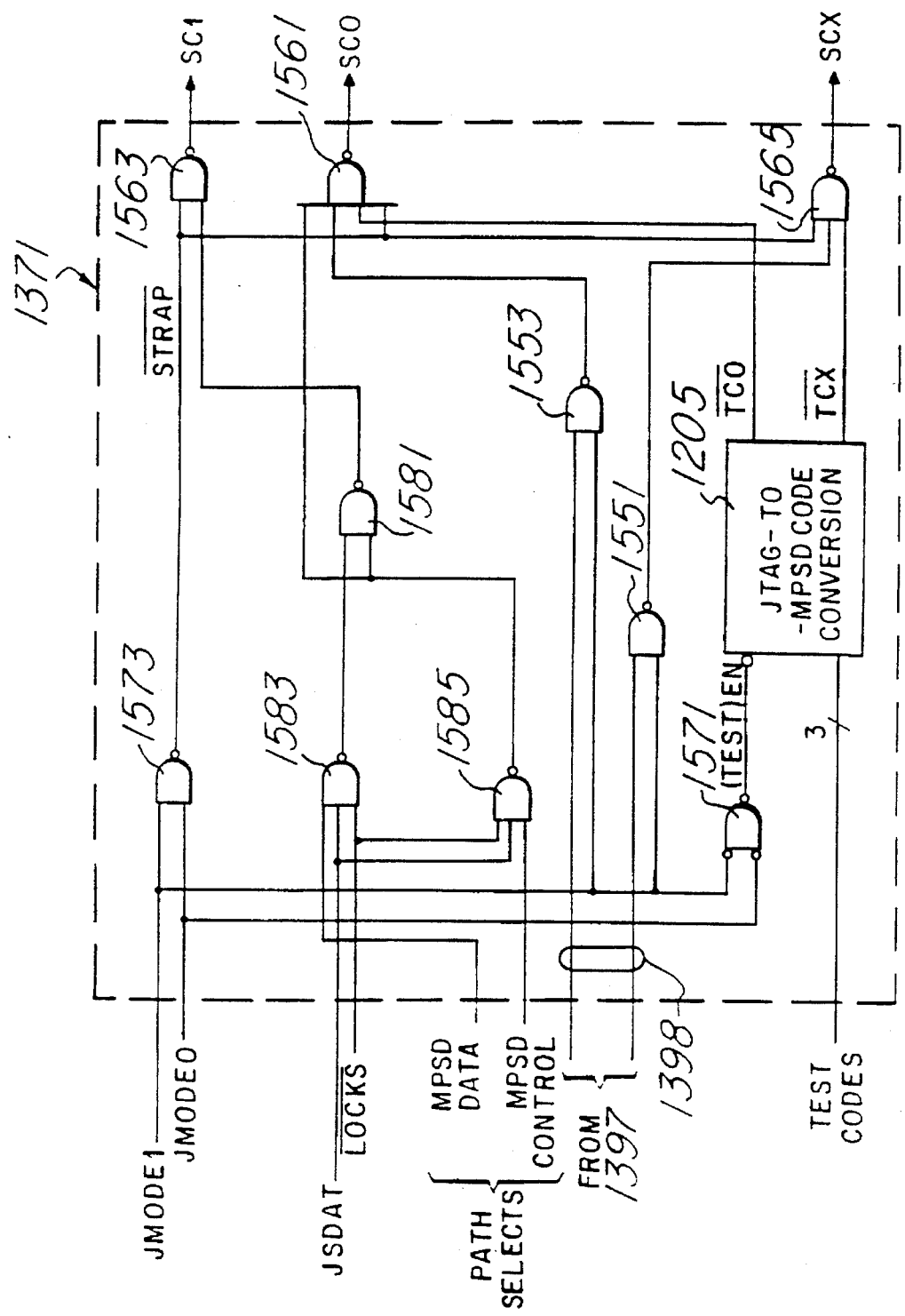
FIG. 64 is a schematic diagram of one of three identical logic circuits of the adapter of FIG. 59 supplying codes to a domain.

In FIG. 64 identical circuits 1371, 1373 and 1375 (1371 being shown) are respectively connected to circuits 1397, 1395 and 1393. For example, the output of SRL 1517 and the output of SRL 1519 of FIG. 62 are connected by two lines 1398 to a first input each of NAND gates 1551 and 1553 of circuit 1371 of FIG. 64. Circuit 1371 supplies the MPSD three wire control signals for the system domain (SC0, SC1, SCX) at the outputs of three NAND gates 1561, 1563 and 1565. The output of each NAND gate 1551 and 1553 is connected to an input of NAND gate 1565 and 1561 respectively. When JMODE=00, a code conversion logic block 1205 is activated to convert three wire test codes on lines TMS, TDI and TDO of FIGS. 50 and 59 and produce two active-low outputs TC0- and TCX- to an input of each of NAND gates 1561 and 1565. This block 1205 is enabled by a low active OR 1571 supplied from the two bits of JMODE register 1360 of FIG. 59. Code conversion logic block 1205 thus converts to MPSD code from any three-wire testability code scheme other than the MPSD codes of Table III, and thus increases the flexibility and adaptability of the system.

When the JMODE1 or JMODE0 bit is high, code conversion is disabled. Instead, for example when JMODE1 bit is high,.a second input of each of NAND gates 1551 and 1553 is qualified. When both JMODE bits are high, a NAND gate 1573 supplies a low output indicative of STRAP state (allows device to run, effectively disables emulation and testability features). This low output forces high outputs by all three NAND gates 1561, 1563 and 1565 corresponding to the (111) MPSD control code 7 for functional run.

NAND gate 1563 has a further input connected to the output of a NAND gate 1581 that in turn has two inputs respectively connected to an output of each of two NAND gates 1583 and 1585. The output of NAND gate 1585 is also connected to an input of NAND gate 1561. A LOCKS-low-active line qualifies NAND gates 1583 and 1585 when the particular domain (system here) is to be unlocked (JCLK select). When the TAP 1151 of FIG. 50 is in the JSDAT state of FIG. 50A for scan input, a line JSDAT from the TAP goes high in FIG. 64, qualifying both NAND gates 1583 and 1585.

The role of NAND gates 1583 and 1585 is to specially determine the first two MPSD control codes C1 and C0 (SC1,SC0 for system domain) when the host computer 1101 has sent TMS signals to put TAP in the data scan JSDAT state, thereby telling the circuits that the host 1101 wants to scan MPSD data in a first case or to scan MPSD control bits in a second case. In the first case is in state JSDATA and IR 1153 is already loaded by host 1101 with MPSD data select that selects the MPSD path 1252 of FIG. 54. The system domain, in this operational example, happens to be locked, but must be unlocked to allow scan. In FIG. 64 line MPSDDATA goes high and MPSD CONTROL is low since MPSD control SRLs are not desired as the path for scan. NKND gate 1583 output goes low, forcing NAND gate 1581 output high. Since the TAP is not in the STRAP state, JBTRAP- is inactive high at NAND gate 1563 and SC1 goes low. All inputs of NKND gate 1561 are high, forcing SC0 low. SC1, SC0=0,0 defines the MPSD data scan command for this domain, which is precisely what is desired.

In the second case, the host 1101 has loaded IR 1153 with the MPSD control path select, so IR 1153 selects the MPSD path 1252 as in the first case. However, this time IR 1153 decode sets MPSD CONTROL line active in FIG. 64 and leaves MPSD DATA line low. The domain is locked, but must be unlocked to allow scan. Inspection of NAND gates 1583, 1585, 1561, 1581 and 1563 shows that the code SC1, SC0=01 is produced. In this way the desired MPSD control scan command is defined for the domain.

As thus described, MPSD scanning of CPU, analysis, and system domains involves slaving these domains to the JTAG environment 1149 by providing a scan control or scan data code at the domain interface with the domain connected to JCLK test clock.

Figure 65:
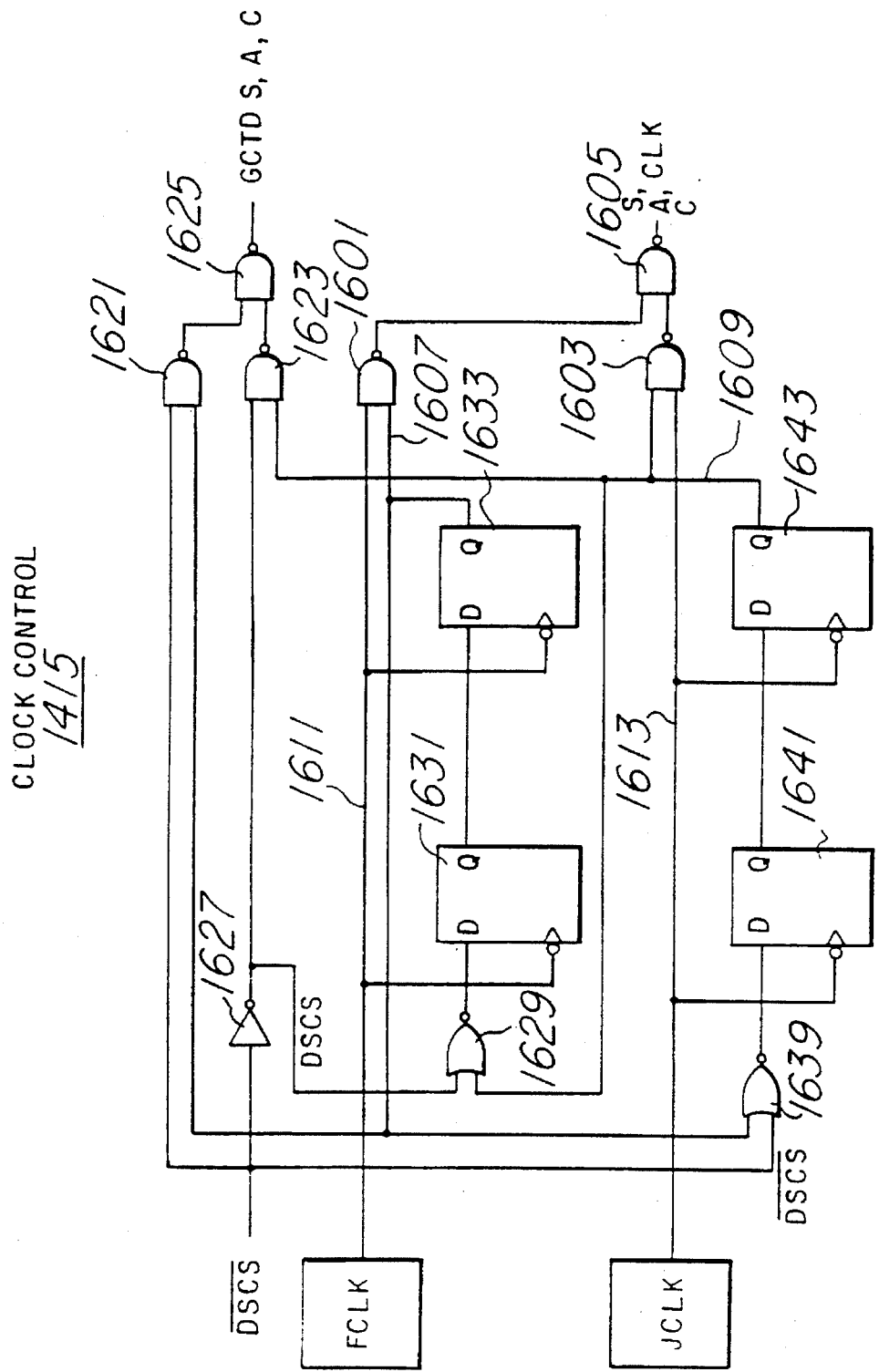
FIG. 65 is a schematic diagram of one of three identical clock control circuits of the adapter of FIG. 59 for switching functional clock FCLK or test clock JCLK to a domain.

In FIG. 65, identical clock control circuits 1411, 1413 and 1415 (1415 being shown) include NAND gates 1601 and 1603 supplied with functional clock FCLK and test clock JCLK. A NAND gate 1605 supplies domain clock output (e.g. SCLK for clock control 1415) has inputs connected to the output of NAND gates 1601 and 1603 respectively. NAND gates 1601, 1603 and 1605 effectively act as a clock MUX (multiplexer) controlled by respective second inputs 1607 and 1609.

Physically, on the chip 11 it is contemplated that clock lines 1611 and 1613 and switching elements 1601, 1603, 1605 for functional clock FCLK and test clock JCLK be separated or isolated from the rest of the adapter 1203 of FIG. 59. In other words, FIG. 59 shows a diagrammatic and conceptual close relationship of clock control circuits 1411, 1413 and 1415 to the rest of the adapter 1203, but as a matter of chip design, it is believed preferable to isolate the circuits physically on the chip. Control conductors from the part of the circuits 1411, 1413, and 1415 in the adapter section of the chip would be routed over to the clock generator elsewhere on the chip to the physical switching elements to select which of the two clocks is routed to each domain.

Advantageously, the clock control circuits 1411, 1413, and 1415 cause part or all of the device 11 to run in the functional mode, accurately exercising the device at real-time rate for the purposes that it is programmed to accomplish. On the other hand, scan is operation of actually sending bits serially into and out of the machine to establish the machine state, and recover an image of a subsequently changed machine state. Scan clock JCLK is preferably used to enter and recover the serial data for an emulation host computer 1101. Put another way, it can be important for the domains to accept a clock which can enter the bits in the domains at the rate which they are being sent to device 11. In this way complications of synchronizing functional clock with some external clock are eliminated.

Also, the circuitry can support bit-by-bit asynchronous transfers at a low scan rate. In the bit-by-bit approach, test clock JCLK is a lower rate than FCLK functional clock. A one clock width pulse corresponding in width to a pulse of FCLK is then ANDed with the scan or substituted for it in FIG. 65A.

Further in FIG. 65, assume that lines 1607 and 1609 are high and low respectively to select functional clock FCLK, that the circuit has stabilized in response to Domain Switch Clock Select DSCS- inactive high. Then SRL 1523 of FIG. 62 is caused to drive DSCS- active low to select the test clock JCLK. The GCTD signal is immediately driven low by a network of three NAND gates 1621, 1623 and 1625. DSCS- is connected to an input of NAND gate 1621 and its complement via an inverter 1627 to an input of NAND gate 1623. Second inputs of NAND gates 1621 and 1623 are respectively connected to lines 1607 and 1609. The outputs of NAND gates 1621 and 1623 are connected to respective inputs of NAND gate 1625 which produces GCTD output.

With DSCS- now active low, inverter 1627 produces a high that forces a NOR gate 1629 to produce an output low. This low propagates through serially connected D flip flops 1631 and 1633 in two clock cycles of functional clock FCLK, driving line 1607 low and shutting off FCLK from the domain. However, test clock JCLK is not yet supplied to the domain. The low on line 1607 now qualifies a NOR gate 1639 for JCLK selection purposes. Since DSCS- is active low, NOR gate 1639 output goes high. This high propagates through serially connected D flip flops 1641 and 1643 in two clock cycles of test clock JCLK, driving line 1609 high and admitting test clock JCLK to the domain via NAND gate 1605. The line 1609 high simultaneously drives qualified NAND gate 1623 output low, forcing GCTD output high to signal Good Clock This Domain. Switching from JCLK back to FCLK occurs by an analogously reverse process in circuit of FIG. 65.

Returning to general considerations, the development system capabilities are composed of ANALYSIS of bus traffic, inspection and modification of the machine state, execution of the user's program, observation of PERIPHERAL operation, and reading and writing of the MEMORY. There is a basic set of capability provided MPSD which is supplemented by additional concurrent capability when the JTAG front end is added to the system.

In the preferred embodiment, a feature called Mode Driven Stops herein involves establishing one of six stop modes and then providing decode circuitry so that in response to the selection of any of these particular modes, the particular type of stop is effectuated as described hereinabove. Mode driven stops are a particularly advantageous improvement because they allow for example, the development engineer to shut down a processor in one way when simulating peripherals and to stop the processor in a different way when doing emulation braking. For example, in emulation braking, it may be desirable to stop the CPU, but not stop the peripherals. An emulation counter preferably continues counting so that the sample rate is correct on the target board 1043 of FIG. 45, but it is desirable to stop the CPU so that information can be scanned out or parallel accessed between samples. On the other hand, in the case of clock stepping it is desirable to stop all domains. Also in the case of simulation of peripherals, it is desirable to stop all domains because the peripheral is being simulated.

Thus, development system capability is implemented as a basic set of functions available through the interface which stops the CPU core to access the Analysis, CORE, Peripheral, Memory, or Interface information.

A degree of execution concurrency is present when the system is programmed to halt the CPU core while the other parts of the system, Peripherals, Memory and Interfaces continue to operate.

In FIG. 57, the stop modes are specified at the beginning of an emulation session. They address the operational mode of the device for the entire session. The operating mode is specified in a separate emulation mode register or module 1311 which is scan-loaded while the CPU core is halted. This advantageous mode feature involves mode driven stops.

In other words, operating modes are defined primarily by the characteristics the chip exhibits when the device halts execution. These operational modes are herein called Pipe Flush, Pipe step, and Clock Step. Trap enable maps analysis stops to traps and enables emulation trap opcodes.

In pipe flush, the CPU block halts when a stop condition is detected. The CPU ceases instruction fetches, executes all instructions currently in the pipeline, and completes all memory activity in progress prior to signaling DONE to code state machine 1381 of FIG. 57 and signaling the stop condition for scan purposes on line SCOUT. All other blocks continue to run, and all control lines from the CPU core associated with communications with the peripherals or memory are maintained in an inactive state once the pipeline is flushed when the chip is in emulation mode. In simulation mode peripherals stop with CPU.

In pipe step, the CPU block is the only block that halts when a stop condition is detected. The CPU freezes on a pipeline clock boundary, the pipeline freezes, and all external memory accesses appear to complete successfully whence DONE is supplied. All external memory control lines go to an inactive state. The address lines are still valid when write enable WE- and Read/Write R/W- go high. If the CPU is started in this mode and an external memory access is determined to have been in progress when the device was stopped, the access is restarted to the external world when execution begins. All control lines associated with communications with the peripherals or memory are reset inactive.

clock Step steps the device one clock cycle; memory signals stay if multicycle. The CPU traps to a predetermined location as an NMI (nonmaskable interrupt) when an analysis stop condition is detected. Code execution continues and all subsequent program generated stop conditions are disabled until a return from emulation trap instruction is executed. All other domains continue to execute. The word trap denotes a hard call of a subroutine that is handled by the processor. The jump address is not set up by the software being executed, but instead is set within the processor itself. An alternate mechanism is an emulation trap instruction. In a development-type operation, a specific instruction can be replaced with the trap instruction, which is called a software breakpoint for this purpose. If the software is in RAM, a software breakpoint can be used. When the software is in ROM, a hardware breakpoint is provided herein to overcome the problem that an instruction in ROM code would not be replaced dynamically.

In simulation pipe flush, the entire chip halts when a stop condition is detected. The CPU ceases instruction fetches, executes all instructions currently in the pipeline, and completes all memory activity tied to instructions currently in the pipeline, prior to signaling DONE to code state machine 1381 of FIG. 57 and signaling the stop condition for scan purposes on SCOUT. All other blocks stop when the CPU stops.

In simulation freeze, the entire chip stops immediately and signals DONE when a stop condition is detected. All external control lines go to an inactive state.

In simulation trap, the CPU traps to a predetermined location as an NMI when an analysis stop condition is detected; otherwise a stop occurs. Code execution continues and all subsequent program generated stop conditions are disabled until a return from emulation trap instruction is executed. Peripherals are suspended during a time period from the time the trap is taken to the return from emulation trap instruction.

The particular stop mode of the processor is determined by mode register 1311 of FIG. 57, as already discussed. The location, placement in any particular register, and scanability of each of the bits of the stop mode is quite flexible. In another example, the particular stop mode can also be implemented using five control bits TEST, SIM, EMU, TRAPEN and PFLUSH. The just-mentioned bits resides in the analysis domain in this embodiment. If the stop mode is generally not changed frequently in practice, then it can be put in a separate mode register 1311 to avoid unnecessary scan bits in the various domains. Otherwise, the various stop mode bits can be allocated to domains as described in the second example.

|  | TEST | SIM | PFLSH |
| --- | --- | --- | --- |
| EMU Freeze | 0 | 0 | 0 |
| EMU Pipe Flush | 0 | 0 | 1 |
| EMU Trap | 0 | 0 | 0 |
| SIM Freeze | 0 | 1 | 0 |
| SIM Pipe Flush | 0 | 1 | 1 |
| SIM Trap | 0 | 1 | 0 |
| TEST Freeze | 1 | 0 | X |

There are subtle differences between the emulation and simulation functions and they are outlined below: Generally speaking, a key difference between Emulation and Simulation stopping modes is that with emulation, the peripheral logic remains active to the extent possible with the CPU core stopped. In the simulation modes, the peripheral logic is also stopped.

Pipe Step stops the CPU on pipe-stage boundaries. Emulation and Simulation differences are determined by what domains are directed to respond to the MPSD port. In Emulation mode, only the CPU domain is connected while in Simulation mode all domains are connected. Since the peripherals and interface domains continue to run in the emulation mode, memory cycles complete and peripherals continue to run. Simulation mode has all domains operating together, resulting in the CPU, peripherals, and interfaces freezing simultaneously.

Pipe Flush—Pipe flush stops the CPU on instruction boundaries. Both simulation and emulation modes require the CPU core to complete all instructions fetched, and clear the pipeline of activity prior to executing the required freeze sequence as described above. In emulation mode peripherals continue to run if directed locally to do so. In simulation mode, peripherals stop.

Trap—Trap does not stop the CPU but instead takes a trap. Emulation and simulation trap differ in that simulation trap causes the peripheral domain to stop when the trap is taken until the emulation trap return is executed.

The CPU core generates a signal called SUSPEND which indicates to the remainder of the device that the CPU has halted the execution of the user program. The behavior of the SUSPEND signal in each of the operating modes is shown below:

EMU Freeze—Asserted immediately when CPU stops.

EMU Pipe Flush—Asserted immediately when CPU stops.

EMU Trap—Asserted when CPU traps for emulation or CPU steps per mode specification or opcode execution.

SIM Freeze—Asserted Immediately when CPU stops.

SIM Pipe Flush—Asserted Immediately when CPU halts.

SIM Trap—Asserted immediately when CPU takes trap. Deasserted with execution of Emtrap return.

In a Suspend Interlock function, the CPU has a scanable bit which causes the SUSPEND signal to be asserted to the remainder of the chip. When the CPU stops, SUSPEND is asserted by core hardware until the CPU is restarted. Since the CPU is asked to run during memory operations, a scanable interlock bit (SUSILOCK) is in the CPU so that SUSPEND can be made to remain active upon software command. In this way SUSILOCK allows the CPU to execute scan initiated memory operations. This bit is initialized to the not suspend (inactive condition) by the JTAG strap state of FIG. 50A. The SUSPEND signal broadcast to the chip is the logical OR of the CPU stopped signal and the SUSILOCK bit. The presence of this bit facilitates the use of macros and other program sequences such as fills, finds, or download assists.

The core is used to gain access to memory and peripheral resources. Memory operations are suitably generated using CPU resources. Memory accesses are generated by scanning in a CPU state including appropriate CPU memory access instructions, which causes memory accesses to be generated to the appropriate memory or I/O space. This is accomplished by loading a machine state with the pipe flush bit set, and appropriate instructions in the pipeline to cause the desired memory operation.

Before any memory activity is initiated, the SUSPEND bit is set in the CPU image to prevent the remainder of the system from detecting that the CPU enters the execution mode for a short period.

When the state has been loaded, the CPU is taken from a MPSD pause state to a halt state. The CPU then executes the loaded instruction as though it is finishing a normal halt sequence, setting SCOUT to indicate that an execute is in progress and then signaling DONE on SCOUT when the pipe is empty and all memory operations generated by the instruction are completed. Memory activity beyond that initiated by the instruction scanned into the pipeline does not occur. When the operation is over, the machine appears as if it has completed a normal halt sequence when the halt code is applied from the MPSD port, with the pipe flush bit on.

Multiple memory operations, such as memory dump or file, utilize macro operations. The repeat operations are scanable to set up a single instruction scan load with the repeat operation already established. It is therefore not necessary to load both the repeat and executable instruction via the scan.

In any stop mode the analysis domain continues to function.

Instruction sequences and resource to be used to be for memory and I/O operations are: Program Memory Read, Program Memory Write, Data Memory Read, Data Memory Write, I/O Read, I/O Write.

In order to facilitate fast memory downloads, the preferred embodiment advantageously includes a CPU scan path which minimizes the number of bits transferred to initiate a memory or I/O transaction, especially when the memory transfer is a single word. When the entire register file may be used to create a block transfer, multiple scan modules may be used.

The short scanpath includes all the CPU resources necessary to implement the above mentioned type of memory operations. The repeat instruction and the autoincrementing characteristics of the auxiliary registers are suitably used to create efficient load sequences.

When cache is part of the architecture, it is easily loadable and unloadable via scan operations. This allows the cache to be set up with macros which terminate with software breakpoint instructions. The program counter and cache management hardware are set up to assure that program execution will take place out of cache, the SUSPEND bit is set, and execution is initiated. This allows fast memory transfers, fills, finds and other Macros to be implemented.

The advantage of the cache macro method is the ability to effectively create a hidden program memory which cannot be accessed as the result of instructions.

Advantageously, the preferred embodiment confers a level of concurrency beyond mere JTAG boundary scan. Microprocessors, for one example, are a very valuable and complex application with access to the internal information very important. Since JTAG boundary scan involves a test port, this test port is even more effectively utilized for communication to specific chips one at a time or all together, concurrently. The preferred embodiment puts commands in emulation control register 1251 and loosely couples the communication so that the device 11 can run in real time when desired. In this way a merely static test environment is improved to provide dynamic operation of device 11 in response to the commands such as CODA and CODB in FIG. 59, in contrast to loading the JTAG IR 1153 and executing an operation by decode.

Instead of directing the chip clock cycle by clock cycle, the preferred embodiment sets up a condition in the analysis domain, and then the analysis domain effectively monitors the chip as it runs in real time, then detects when the condition occurs, stops the chip and notifies the emulation host computer 1101 that the chip is stopped. In effect, the preferred embodiment of FIG. 59 acts as an emulation speed step-up transformer by reducing the number of commands required of the emulator host by freeing the emulator host from clock cycle-by-clock-cycle supervision and accommodates modern chips that run at clock rates that far outstrip the speed of the emulation host computer. Moreover, the preferred embodiment is upwardly compatible with cycle-by-cycle control, since the wires of the scan interface can be used to generate MPSD command codes by the conversion block or translator 1205 in the STRAP state of FIG. 50A for instance.

The preferred embodiment has further uses in simulation acceleration and other device debug operations. The device is run on functional clock FCLK and then stopped and a device state is recovered, observed and studied. The JTAG testability interface is thus used to input stimuli via scan and achieve simulation rates on the order of even 10,000 instructions per second which are state-wise accurate. Prototype silicon patterns are readily debugged off line without investment in tester apparatus that may exceed six figures in magnitude of cost. Whereas JTAG boundary scan suggests to the art to reach out to the board, the present embodiment reaches into the bowels of each device on the board as well. Device debug is accelerated because every internal scan state is rapidly produced and recovered.

Accordingly, the capability of now downloading functional code through an emulation system has important implications for the field of test as well. Now the user can do self test. In self test according a preferred method, the user has a random access memory (RAM) in the device 11 or accessible to the device 11. The user downloads an extensive test program through the emulation port that is the equivalent of BIST (Built In Self Test). No dedicated device hardware is thus required for BIST, since the emulation hardware on chip advantageously accommodates this additional use without further investment. The user can download tests using emulation functions, and can run the same test patterns in serial sequence as the user would when doing a go/no-go device test on a manufacturing production line.

Figure 66:
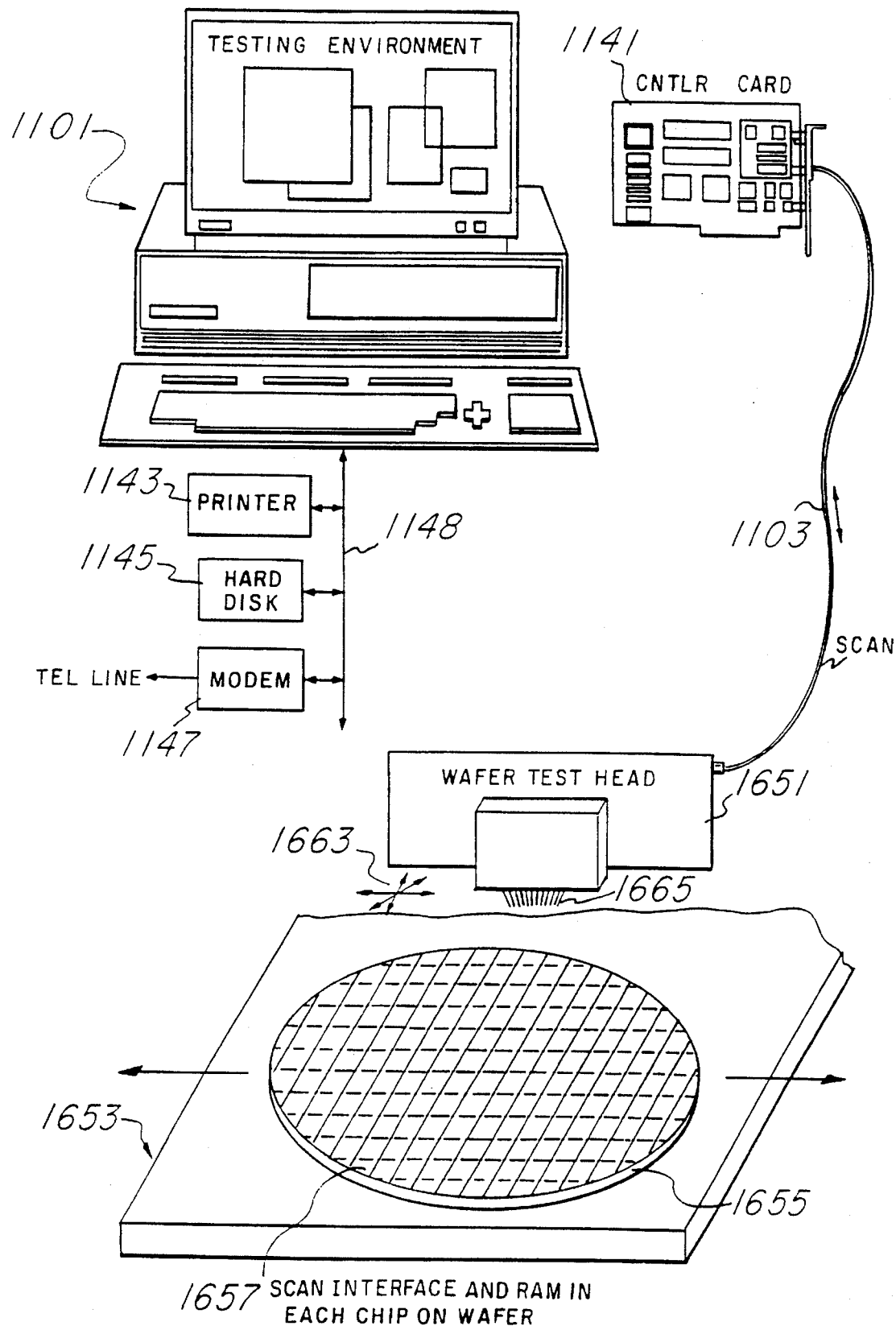
FIG. 66 is a pictorial diagram of a testing system for testing numerous integrated circuits on a wafer in wafer fabrication.

Moreover, as illustrated in FIG. 66, tests are downloaded in the chip manufacturing process itself. The host computer 1101 is advantageously coupled to a test head 1651 of a wafer fabrication line 1653 to detect device defects on each wafer 1655 before the wafer is divided into chips or at any point in manufacturing. A scan interface as described in connection with FIGS. 49, 54, 55, 56, 57 and 59–65 is microscopically provided in each of numerous locations 1657 on the wafer from which many chips are derived respectively.

The host computer 1101 in FIG. 66 is loaded with a testing program and communicates via controller card 1141 and serial line 1103 to a wafer test head 1661. Test head 1651 is precisely positioned in X,Y,Z coordinates 1663 to reliably press contact wires 1665 against microscopic contact pads for each die location 1657 in the wafer 1655. The circuit at location 1657 is the circuit of device 11 for example. A full complement of peripheral resources is available to computer 1101 and device on the wafer, in the form of printer 1143, hard disk 1145, and modem 1147 on bus 1148.

Figure 67:
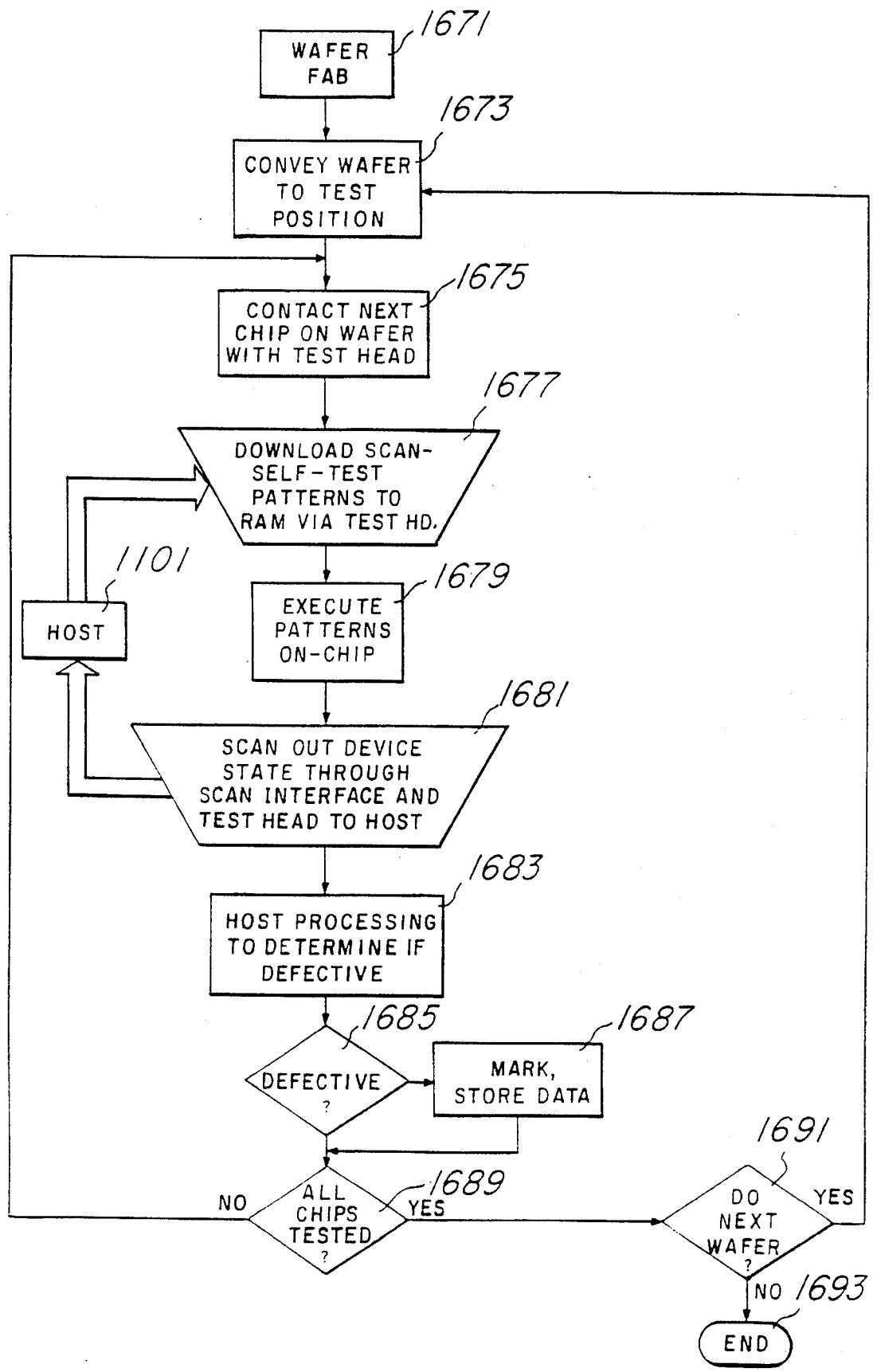
FIG. 67 is a process flow diagram of operation of the testing system of FIG. 66.

According to a process illustrated in FIG. 67 operations start with wafer fabrication 1671 and then in a step 1673 the wafer 1655 is conveyed to the test position shown in FIG. 66. Then a step 1675 positions test head 1651 in XYZ coordinates 1663 to contact the next chip on the wafer 1655 with test head 1651. A succeeding step 1677 downloads scan-self-test patterns to RAM in the chip via test head 1651. The chip is switched to functional clock to execute the test patterns on-chip in step 1679. Then the device state of the chip is scanned out at 1681 through the microscopic interface having circuits 1150 and 1203 of FIG. 49 at location 1657. The signals pass through test head 1651 to host computer 1101 for processing and data storage and display in the peripheral resources. In step 1683, host computer 1101 determines whether the chip at location 1657 is defective. If defective, a step 1685 branches to an action step 1687 to optionally dot-mark the wafer location and/or to store data on it to keep a record of the defect which may also be useful for microscopic repairs of the circuit. Then in a step 1689, if all chip locations are not yet tested, operations loop back to step 1675 to precisely position the contacts 1665 of test head 1651 against the next chip location to be tested on wafer 1655. If all locations are tested, operations branch from step 1689 to a decision step 1691. If a next wafer is to be tested, operations loop back to step 1673 to convey another wafer to test position, otherwise the process comes to END 1693.

In device 11, the core CPU implements the following capabilities:

Strap functional when directed from the scan interface.
Run and halt when directed from the scan interface.
Halt when either a software breakpoint or a hardware breakpoint is encountered.
Select the core clock to be a scan clock and prepare to scan.
Assert a suspend signal to the remainder of the chip in order to direct peripheral start/stop features.
Keep a clear record to indicate the reason that the device halted.
Manage interrupt occurrences.
Provide pipeline management for breakpoint and software interrupt occurrences when they interact with delayed branches and other pipeline-relevant occurrences.
Instruction step such as executing the interrupt service routine one instruction at a time if an interrupt occurs.
Generate memory accesses from CPU core while the core is halted.
Program counter stack traces a number of preceding program discontinuities.
Read and write to memory while the CPU core is executing code; communicating with a debug monitor or SPOX debugger resident on the chip or in memory.

Figure 68A:
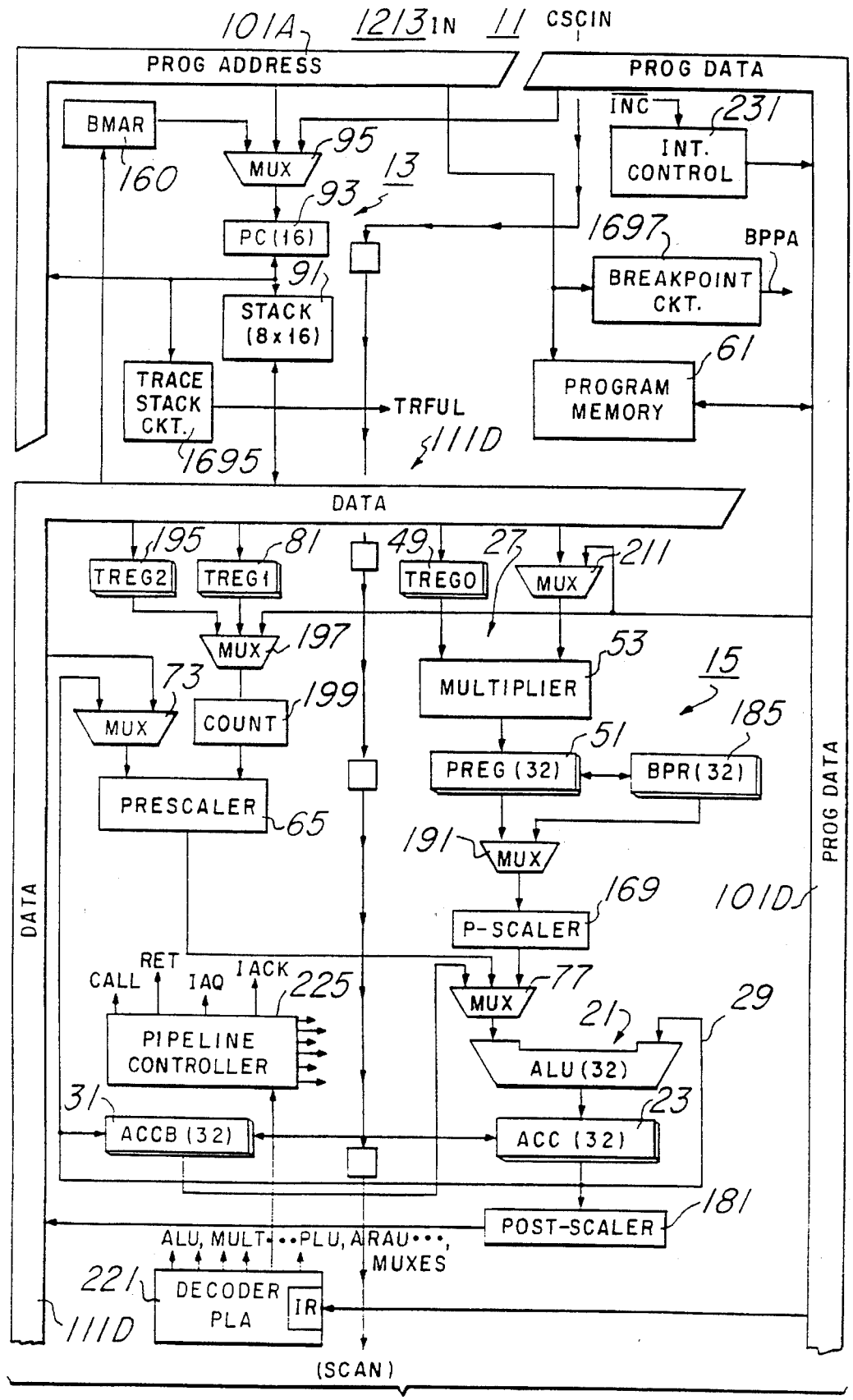
FIGS. 68A and 68B are two halves of a block diagram of a central processing unit CPU core improved for emulation, simulation and testability.
Figure 68B:
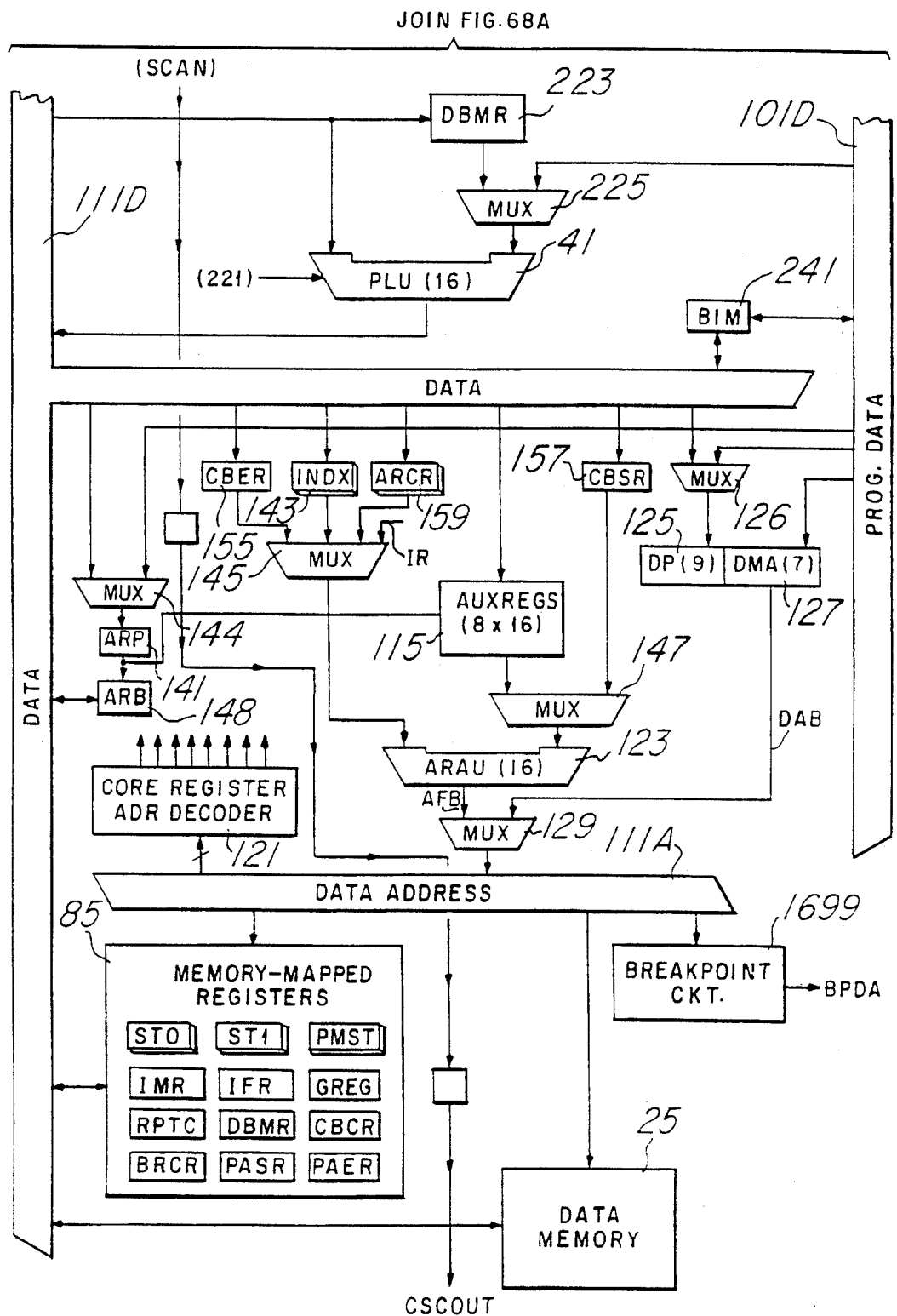

FIGS. 68A and 68B show a block diagram of functional circuitry of CPU core domain 1213 which is improved with a series of scan registers indicated as small squares fed from input CSCIN. The CPU core was mostly described in incorporated U.S. Pat. No. 5,072,418, in connection with corresponding FIGS. 1A and 1B. The detail of the organization of the scan registers and the associated MPSD module circuits for several modules is suppressed for clarity in FIGS. 68A and 68B.

CPU core is further improved by providing a trace stack circuit 1695 distinct from program counter stack 91. Unlike stack 91, trace stack circuit 1695 develops a history of program counter discontinuities and produces a TRFUL trace stack full signal when it is filled to capacity.

A hardware breakpoint circuit 1697 is connected to program address bus 101A and produces a program address break point signal BPPA when a particular program address or address in a predetermined range of program addresses is encountered.

In FIG. 68B, a hardware breakpoint circuit 1699 is connected to data address bus 111A and produces a data address break point signal BPDA when a particular data address or address in a predetermined range of data addresses is encountered.

For scan purposes, trace stack 1695, and breakpoint circuits 1697 and 1699 are on the separate scan path for the analysis domain 1217. The core however is on the scan path for core domain 1213.

Figure 69:
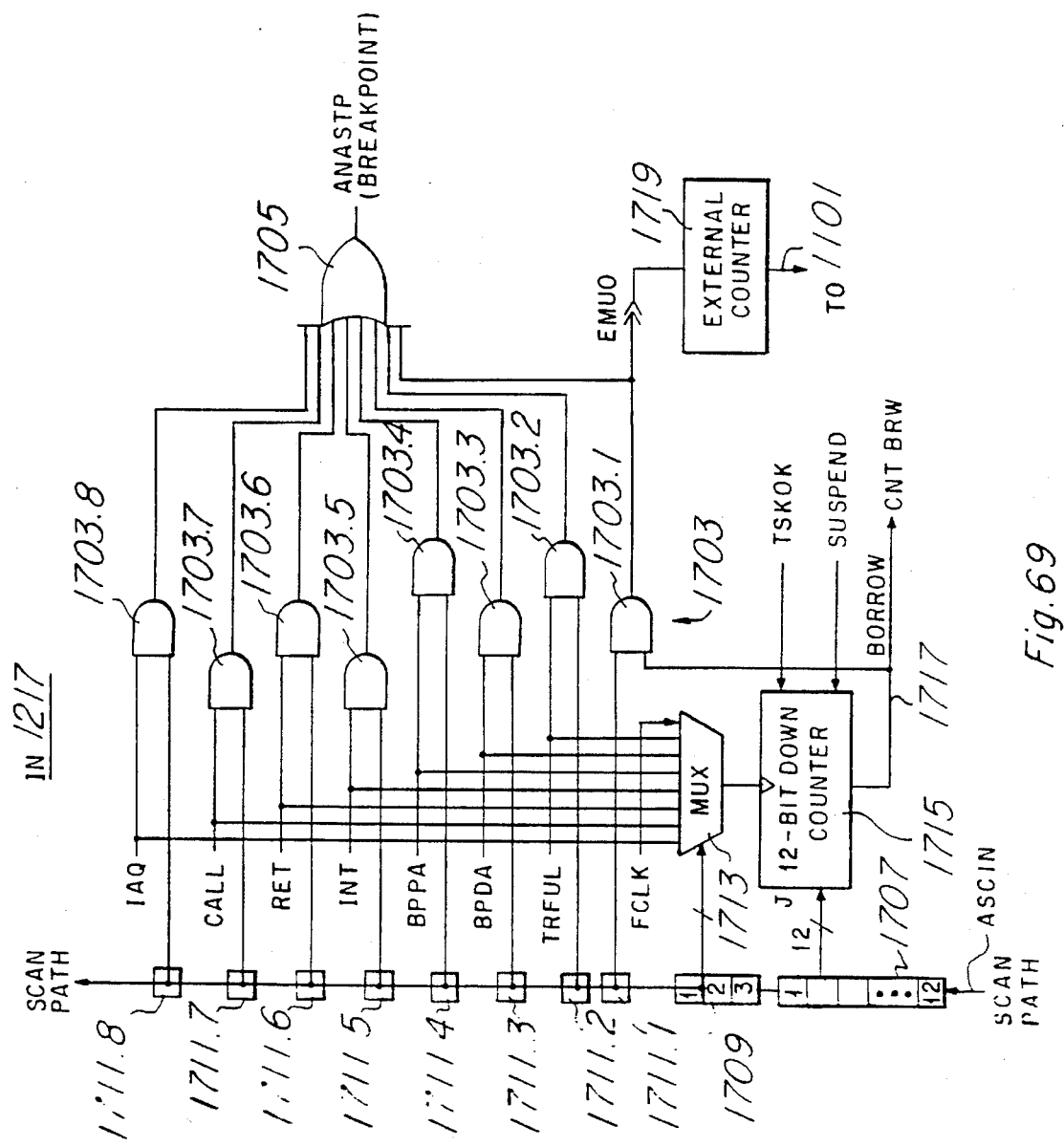
FIG. 69 is a block diagram of an analysis circuit for monitoring the operations of an integrated circuit device.

FIG. 69 shows circuitry in the analysis domain 1217 of FIGS. 51–53 and 55–57 which produces a breakpoint signal ANASTP for analysis stop of the core according to the appropriate mode selected. Circuit 1217 includes on-chip circuits for providing signals representative of particular processor conditions. These signals are designated IAQ, CALL, RET, INT, BPPA, BPPDA, and TRFUL. Each of these sensed signals is provided to respective selection circuits 1703 shown as AND gates. The outputs of circuits 1703 are delivered to a combining circuit 1705 shown as an OR- gate 1705, the output of which is ANASTP, the breakpoint signal. Selection circuits 1703 act under the control of stored bits that are loaded via the analysis domain 1217 part of scan path 1252 as shown in FIGS. 54 and 55.

Thus, the bits which are scanned in are loaded into a 12 bit register 1707, 3 bit register 1709 and single bit registers 1711.1 through 1711.8 in this section of the analysis domain 1217.

The contents of each of the registers 1711.1 through 1711.8 qualify or disable a corresponding one of the selection circuits 1703 so that the overall device 11 condition which can trigger a ANASTP breakpoint signal is completely defined.

Line IAQ is activated when there is instruction acquisition by pipeline controller 225 of FIG. 68A. This way of initiating a stop facilitates single step operations, even in ROM resident code. Any cycle in which an instruction is read from program memory is an instruction acquisition. In the pipeline of this embodiment, instruction fetch is the first of four pipeline steps in incorporated FIG. 29, and when fetch occurs, line IAQ is activated.

CALL is activated upon a subroutine call. RET becomes active upon a return from subroutine. If desired, therefore, the analysis domain can be scanably programmed to start the device at the beginning of a subroutine and then automatically stop when the subroutine return is reached. Conversely, the device can be scan loaded to start to begin somewhere in a main routine, run at full speed and then automatically stop when a subroutine call is encountered.

INT goes active in response to an interrupt occurrence. When a stop is programmed to occur upon interrupt occurrence, the Stop suitably executes on any machine vectored program counter load except the emulator trap. Interrupts that occur while the CPU is stopped are latched but are not executed until the CPU is restarted. When the CPU is restarted it executes the currently addressed instruction before allowing a trap to the interrupt vector. When code is being single-stepped, the code takes the interrupt trap as soon as the pipeline is flushed, as it would in real time.

BPPA is a line responsive to a program address breakpoint circuit. BPDA line is responsive to a data address breakpoint circuit. An example of use of the BPDA data address breakpoint involves a debug problem in which the processor is running correctly most of the time, but a particular address occasionally gets garbage values. By inserting a breakpoint at the affected address, the user stops the processor at the instruction that wrote to that address, scans the instruction out of the stopped processor to host computer 1101 and inspects the state of the processor to determine how to fix the bug. In this manner, system debugging is much more efficient of time and system resources.

Another way of determining system state at the instant a particular address is accessed might be to replace the contents of that address with a trap instruction. This instruction is called a software breakpoint, and the insertion is a development-type of operation. A trap is a hard call of a subroutine that is handled by the processor. The subroutine is programmed to dump the device status so that the user can debug it. However, when the software to be debugged is in ROM, it is impossible to enter the trap instruction in the ROM, since the ROM is read-only by definition. Advantageously, the hardware breakpoint approach is not only applicable to debug in RAM as is software breakpoint, but also in ROM.

A MUX 1713 has eight inputs, and seven of the inputs are respectively connected to lines IAQ, CALL, RET, INT, BPPA, BPDA and TRFUL. The eighth line is connected to a clock line FCLK for functional clock. The clock line can be selected for single-stepping or execution for any selected number of clock cycles whereupon the processor stops.

The three bits in shift register 1709 make a one of eight selection by MUX 1713 and supply the selected line to a 12 bit down counter 1715. A predetermined count is loaded into the J (jam) parallel input of counter 1715 from 12 bit shift register 1707. As signals on the line selected by MUX 1713 occur, the 12 bit down counter counts down until the number represented by the contents of shift register 1707 is exhausted, whereupon a borrow line 1717 goes active and is fed to selector 1703.1. The borrow line signal is called CNTBRW for purposes of event manager 1365 of FIG. 60.

The output of selector 1703.1 is not only connected to an input of the combining circuit 1705 for supplying ANASTP, but also is connected directly to an output pin EMUO. EMUO is connected to external counter 1719, which communicates with host 1101.

In this way, the on-chip condition sensor includes a counter selectively connectable to sensor circuits. A logic network is connected to the sensor circuits and a serial scan circuit with SRLs is interconnected with the logic network for determining selections of sensor circuits by the logic network. The serial scan circuit is further interconnected with the counter for loading the counter with the value indicative of a predetermined count to which the condition sensor is thereby made sensitive. The condition sensor further includes a plurality of sensor circuits responsive to particular internal conditions of the electronic processor and a multiplexer 1713 having inputs connected to the sensor circuits and an output connected to the counter.

An example of the utility of the down counter 1715 (besides single-stepping) is as follows. Assume that the counter 1715 is set by scan register 1707 to 200 and the MUX 1713 is set by register 1709 to select BPDA data address breakpoint. The particular data address is scan-entered in a register 1813 in FIG. 71. This configuration stops the processor after the specific scan-identified data address has been addressed 200 times.

This exemplary use of address breakpoint counting is valuable in designing a digital filter that does not stabilize until it has processed a certain number of signal samples so that its taps are filled. For instance the response of an FIR filter may not be measurable until the number of samples required to fill all the multiply-accumulate filter taps are present. The output of the filter which is of interest in evaluating whether the filter operation is correct thus begins when the signal has traversed the filter. In one type of 16 tap FIR filter it is desirable to stop only after sixteen events and every other time after that to examine the output of the filter.

Advantageously, the analysis circuitry cooperates with the host computer 1101 for emulation, simulation and test of digital filters as just described.

In another filter example, the counter borrow line is selected by scan register 1711.1 and fed out of pin EMU0 to permit external logic to count events at a rate stepped down by frequency division by the value in the downcounter 1715. Timing analysis of an algorithm may consume on the order of five billion cycles, wherein timing analysis determines the number of cycles needed to execute the algorithm. (If the counter is made scanable and extended to the appropriate number of bits, this function is advantageously executed entirely on-chip.) A particular filter design may require at least a certain sample rate to meet the performance criteria specified for the filter. The maximum number of instructions available to achieve that sample rate is related to the sample rate and the computer clock rate. The present circuit permits accurate counting of the number of clock cycles consumed by the filter to perform the algorithm, so that the algorithm can be developed to meet the specifications of the filter.

When external logic is used, its resolution is equal to the number set for the counter 1715 by register 1707. Full resolution is obtained by reading out the value in the 12 bit down counter, allowing determination of the exact cycle count of an algorithm between two break events, further illustrating the advantages of this preferred embodiment. Direct counting of break events and/or clock cycles by counter 1715 on chip is further advantageous because available external counting logic may be too slow to keep up with the new processors to monitor them.

A break event herein is a condition that causes the processor to stop or to affect counter 1715. The event detection in one exemplary processor is split between the CPU and Analysis domains. Together, the two domains provide nine different events, all of which can be programmed to cause the processor to stop. The events and their respective domains are shown below:

|     |                                          | Comes From: |
| --- | ---------------------------------------- | ----------- |
| 1.  | Software Interrupt (SWI)                 | CPU         |
| 2.  | Instruction Acquisition (IAQ)            | CPU         |
| 3.  | Subroutine Call (CALL)                   | CPU         |
| 4.  | Subroutine Return (RET)                  | CPU         |
| 5.  | Interrupt/Trap (INT)                     | CPU         |
| 6.  | Clocks (CLK)                             | CPU         |
| 7.  | Breakpoint Program Memory Address (BPPMA)| ANA         |
| 8.  | Breakpoint Data Address (BPDMA)          | ANA         |
| 9.  | Trace Buffer Full (TBF)                  | ANA         |
| 10. | Item Counter Borrow (ICB)                | ANA         |

All events are enabled, detected and latched in the analysis domain as discussed in connection with FIG. 69.

The CPU core should not process local or analysis inputs once a stop condition has been processed. This includes the time from when an emulation trap occurs to when the emulation trap return is executed.

The core responds to the consolidated stop signals of:

CPULSTP—Core local stop stimulus

ANASTP—Analysis stop

SWBP—Software breakpoint detect

HALT—MPSD halt code

When the halt is detected, LSTPCND (Latch stop condition) is asserted to the CORE and Analysis blocks. It is desirable that the CPU stop indications be read from the analysis domain when the analysis domain information is current. This is due to the Emulation Trap mode in which the core domain continues to run while the analysis domain is halted.

Functional reset is gated off when the halts occur due to emulation stop mechanism. It is contemplated that the reset logic (not shown) for device 11 assure that any reset input entering the device past the gating function is stretched to sufficient length so as to correctly complete the reset function. When reset occurs simultaneous to a stop condition the reset is completed and the device stops when the reset is completed and the interrupt trap vector has been fetched.

The processing of interrupts by device 11 should mesh with emulation run/halt operations implemented by CODA and CODB in adapter 1203. When executing an instruction or clock step, interrupts are serviced when enabled. This assures that single instruction stepping through code will allow the processing of interrupts.

FIGS. 69 and 45 and the description herein thus illustrate an electronic system that has a data processing device including a semiconductor chip and an electronic processor on the chip. Host computer circuitry off-chip is connected to the data processing device. The host computer (e.g. computer 1101) has a speed of operation which is slower than the electronic processor. The data processing device 11 further has an on-chip hardware breakpoint address circuit, trace stack, pipeline controller condition sensing circuits and other on-chip condition sensors including the counter 1715 for signaling the processor in real time, as well as signaling to the slower host computer. The adapter 1203 acts as a step-up transformer of control speed between slower host 1101 and state-of-the-art speed of device 11. The analysis circuitry also mediates the real-time control function as well as provides a step-down transformation of data via the counter 1715 to the slower external environment. It is emphasized that the circuitry of FIG. 69 is but one example, and numerous variation can be provided by the skilled worker according to the principles set forth herein to provide sensor logic for any logical combination of conditions so that occurrences of any complex combination of conditions or sequence of conditions can be sensed. The breakpoint signal can be a stop signal ANASTP as illustrated or any other control signal besides a stop signal that should be responsive to sensed target device electrical conditions.

Figure 70:
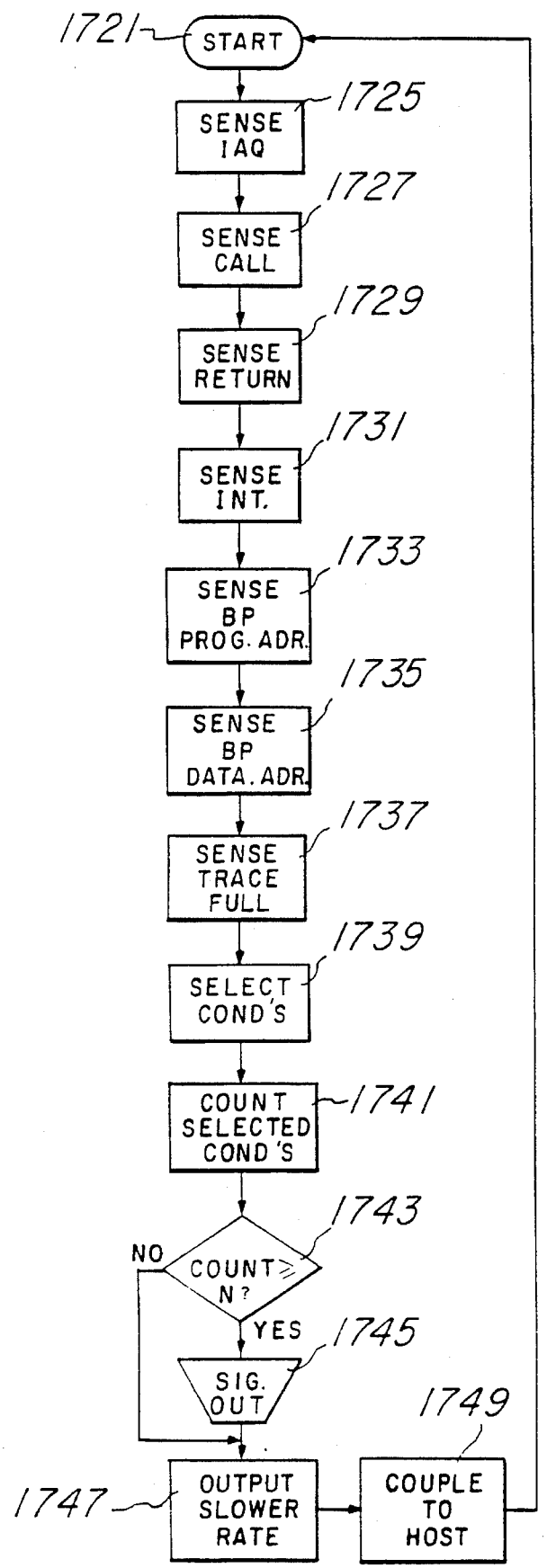
FIG. 70 is a process flow diagram of operations of the analysis circuit of FIG. 69.

In FIG. 70, a method of operating the analysis circuitry of FIG. 69 commences with a START 1721 and proceeds to a step 1725 to sense instruction acquisition. Step 1727 senses a subroutine call, and a step 1729 senses a Return. In step 1731, an interrupt condition is sensed. Step 1733 senses a breakpoint program address, and step 1735 senses a breakpoint data address. In step 1737, a trace stack full condition is sensed. Then a step 1739 selects which conditions are relevant using shift register 1711 and logic 1703 of FIG. 69 for example. Of the conditions selected, a count is kept in step 1741. A decision step 1743 determines whether the count exceeds a predetermined count N and if so, a signal of the count N being reached is output in a step 1745. Operations proceed from either step 1743 or 1745 to a step 1747 which provides an output to the external processing equipment at a slower rate than the rate of operation of the device 11. In step 1749, this output is coupled to a host computer whereupon operations return to START 1721 to repeat the steps indefinitely.

Figure 71:
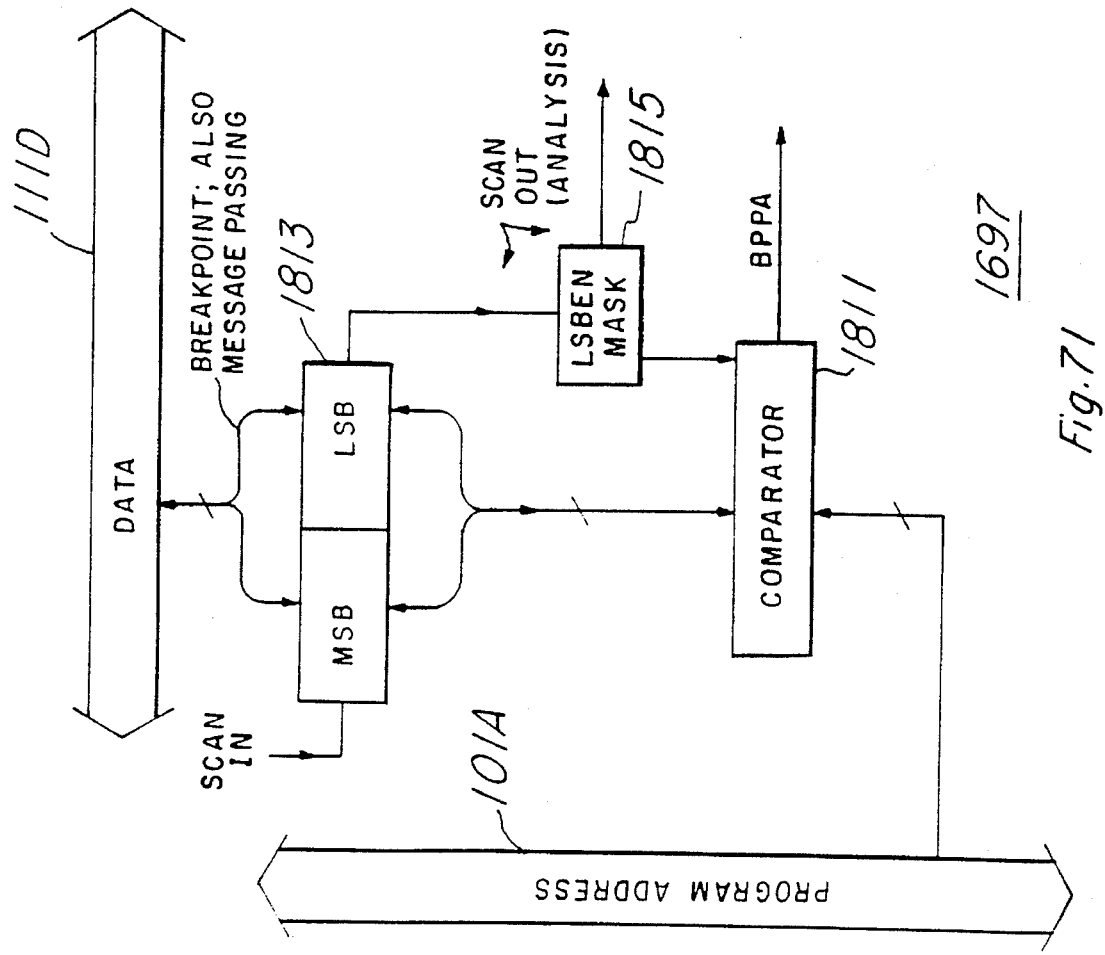
FIG. 71 is a block diagram of a hardware breakpoint circuit in FIG. 68A.

In FIG. 71, a circuit for breakpoint sensor 1697 of FIG. 68A supplies the signal BPPA for analysis circuitry of FIG. 69. The circuit is suitably replicated for breakpoint sensor 1699 of FIG. 68B and connected as shown therein for producing the signal BPDA.

In FIG. 71, program address bus 101A of FIG. 68A is connected to a digital comparator 1811. A reference value is scan-loaded into a further register 1813 in the analysis domain having most significant bits MSB and least significant bits LSB. When a program address asserted on address bus 101A is identical to the contents of register 1813, then comparator 1811 produces an output indicative of a breakpoint address occurrence on line BPPA.

In a further advantageous feature of the breakpoint circuit, a breakpoint may be taken on any address within a selected group of addresses such as the ranp;, indicated by the most significant bits MSB of register 1813. In such case, a scanable mask register LSBEN is scan-loaded to disable the response of comparator 1811 to the LSB bits of register 1813. Only the most significant bits are compared by comparator 1811 in this mask condition, thereby providing a breakpoint on occurrence of a program address in a particular range of addresses.

Scanable register 1813 for breakpoint purposes requires no connection to data bus 111D. However, this register 1813 is advantageously reused for message passing access between the emulation/simulation/test host computer 1101 of FIG. 45 and the data bus 111D of the target device. The message passing function is used when breakpoint sensing need not occur, and vice-versa, so that register 1813 feasibly performs different functions at different times.

Figure 72:
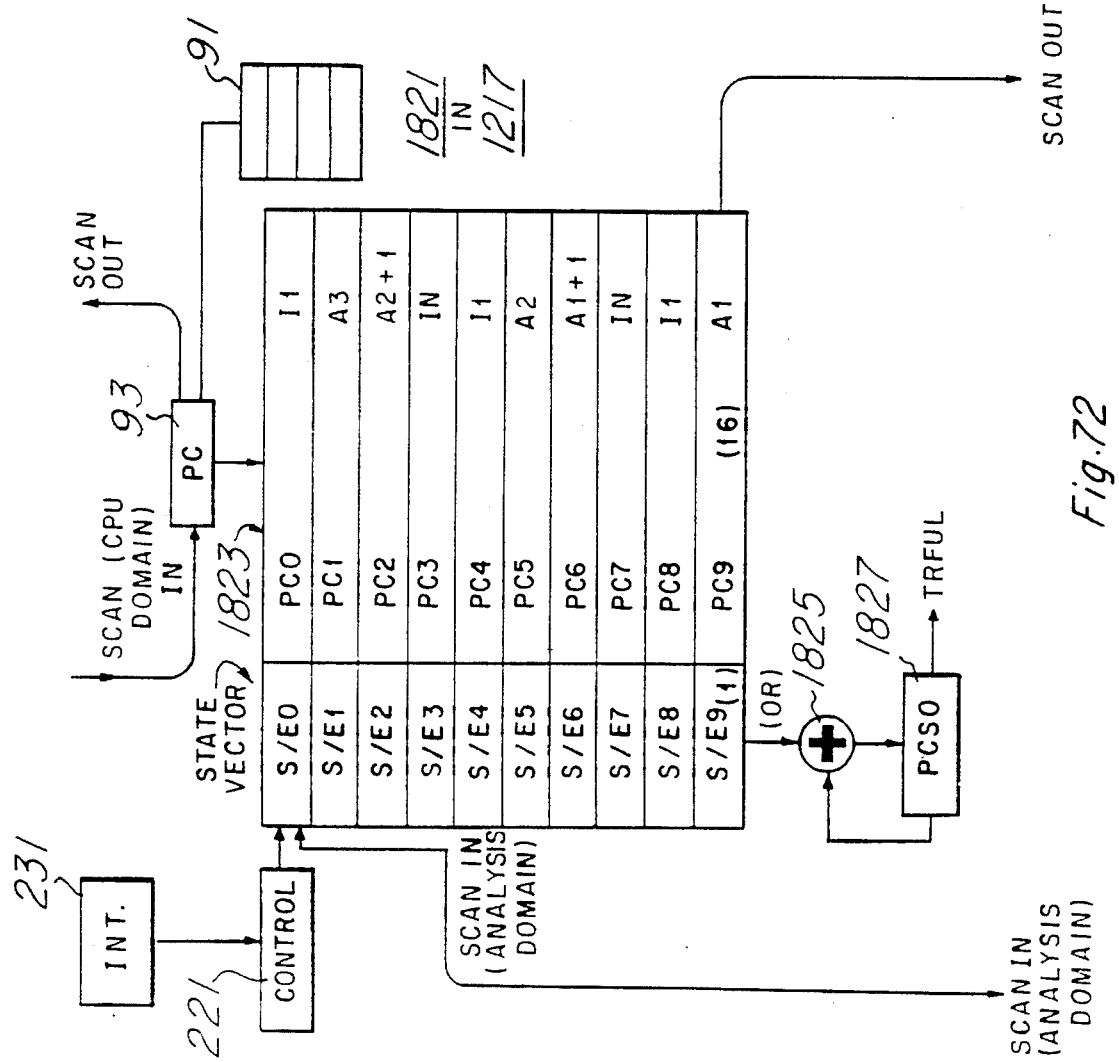
FIG. 72 is a block diagram of a trace stack in FIG. 68A.

In FIG. 72, a special program counter trace stack circuit 1821 in analysis domain 1217 holds a predetermined number of addresses defining a history of address discontinuities in operation of program counter 93 of FIG. 68A in the CPU core domain. A scanable trace stack register section 1823 responds to control circuit 221 to push a program counter 93 address value onto the trace stack when a program counter discontinuity occurs. A leading bit S/E1, . . . S/E9 of each level PC0, PC1, . . . PC9 of stack 1823 stores a state vector representing whether a value PC0, . . . PC9 is a beginning or ending address of a discontinuity.

For example, in FIG. 74, a program memory space has addresses A1, A2 and A3 indicative of addresses in a main routine from which interrupts are taken. An interrupt routine begins at an address I1 and ends at an address IN. Returning to FIG. 72, an example of a history of discontinuities is entered as addresses at right on the stack levels PC9 . . . PC0. This history indicates at level PC9 that an interrupt occurred at when a main routine was executing at address A1. Then, just above entry A1 in PC9, there is an entry I1 indicating the beginning address of the interrupt routine of FIG. 74 entered in stack level PC8. Thus, the entry in PC9 is a beginning address of a discontinuity and the state vector bits S/E9 and S/E8 have opposite logic levels. For example, a one bit in S/E9 indicates a beginning of a discontinuity. I1 in level PC8 is a ending address of a discontinuity.

Then further in this example, level PC7 shows that the interrupt routine ends at address IN and a return occurs to address A1+1 of the main routine. The main routine then executes until illustratively a further address A2 is indicated at level PC5 whereupon the beginning interrupt address I1 is entered in stack level PC4. The interrupt is executed to address IN of level PC3 whereupon operations return to memory address A2+1 of level PC2. The main routine continues to execute and reaches address A3 entered at level PC1 whereupon an interrupt to address I1 occurs and is entered in level PC0.

The state vector leading bits of the program counter trace stack 1821 resemble a shift register for stack purposes and the S/E9 end of the shift register is output to an OR gate 1825. OR gate 1825 is further connected to a program count shift out register PCSO 1827. The output of PC8O 1827 is fed back to a second input of OR gate 1825. When a first logic one is pushed from the bottom of the stack 1821 into OR gate 1825, register 1827 indicates the output trace stack full TRFUL for analysis circuitry of FIG. 69. Subsequent push onto stack 1823 pushes out a subsequent zero from the stack into OR gate 1825. However, register 1827 continues to be loaded by OR-gate 1825 (by virtue of the feedback from PCSO to 1825) with a one indicative of the trace stack being full.

In this way, the state vector leading bits act as a means for counting the number of discontinuities by a code of alternating ones and zeros. The trace stack 1821 has entries pushable thereon and storage elements for extra bits for the entries. PCSO 1827 acts as an overflow storage element 1827 having an input and an output. OR-gate 1825 acts as a signal combining circuit that has a first input connected to one of the storage elements (e.g. PC9). OR-gate 1825 also has a second input and an output respectively connected to the output and input of the overflow storage element.

Circuit 221 is generally operative when a branch or an interrupt or other discontinuity occurs to enter a new address into the program counter 93 in substitution for an address in what would otherwise be a continuous series of addresses, thereby establishing a discontinuity. Control circuit 221 includes circuitry for pushing the latest address onto the program counter stack and the new address onto the trace stack. Control circuit 221 is also responsive to addresses from memory and is also operative on completion of the interrupt routine for popping program counter stack 91 and pushing the trace stack 1821 once again.

When consecutive instructions or interrupts cause discontinuities, more than five discontinuities can be traced. If the program counter PC is loaded on two consecutive cycles then one less stack level is used, since the current value is the same as the previous new value.

FIG. 73 illustrates a process of operating the circuitry of FIG. 72. Operations commence at a START 1831 and proceed to a test step 1833 to determine whether a beginning address of a discontinuity is occurring. 1833. If not, operations proceed to a test step 1835 to determine whether there is a return from a subroutine. If not, operations then loop back to a test step 1837 to determine whether the trace stack is full. If not, operations return to test step 1833. During the execution of a main routine, for example, the process of FIG. 73 involves a repeated cycle of monitoring steps 1833, 1835 and 1837.

On the other hand, when a discontinuity does occur, operations go from step 1833 to a step 1839 to push the latest address (e.g. of the main routine) onto both PC stack 91 and trace stack 1821. Then in a step 1841, the new address to which operations have branched or been interrupted is then pushed onto trace stack 1821. Then in step 1835, so long as the interrupt routine is executing, operations cycle through steps 1835, 1837, 1833, 1835 and so on indefinitely. When the interrupt routine is completed, step 1835 branches to a step 1842 to push into trace stack 1821 the latest address of the interrupt routine from which operations are returning. Operations then proceed to a step 1843 to pop PC stack 91 to allow the program counter 93 to return to and proceed from the address in main routine from which the interrupt was originally taken.

Next in FIG. 73, operations proceed from step 1843 to a step 1845 wherein the latest value to which operations have returned is pushed onto trace stack 1823. Then operations go to step 1837. When a substantial history of discontinuities has been built up, the trace stack is full at step 1837 and a branch is taken to a step 1847 to output the signal TRFUL.

In FIG. 75, the operations of the PC stack 91 are perhaps most effectively contrasted with the operations shown in FIG. 72 of program counter trace stack 1821 in the case of a series of discontinuities wherein no subroutine nesting or other nesting is involved. In FIG. 72, the addresses of the discontinuities are pushed deeper and deeper into the trace stack 1823 even though there is no nesting. However in FIG. 75, the PC stack 91 either has entered therein just one address or none, due to push followed by pop, precisely because nesting is absent. The address that is pushed is a main routine address A1, A2 or A3 from which operations have been interrupted. Upon return, the PC stack 91 is popped and has no entries as indicated by successive hyphens in the PC stack boxes.

Figure 76:
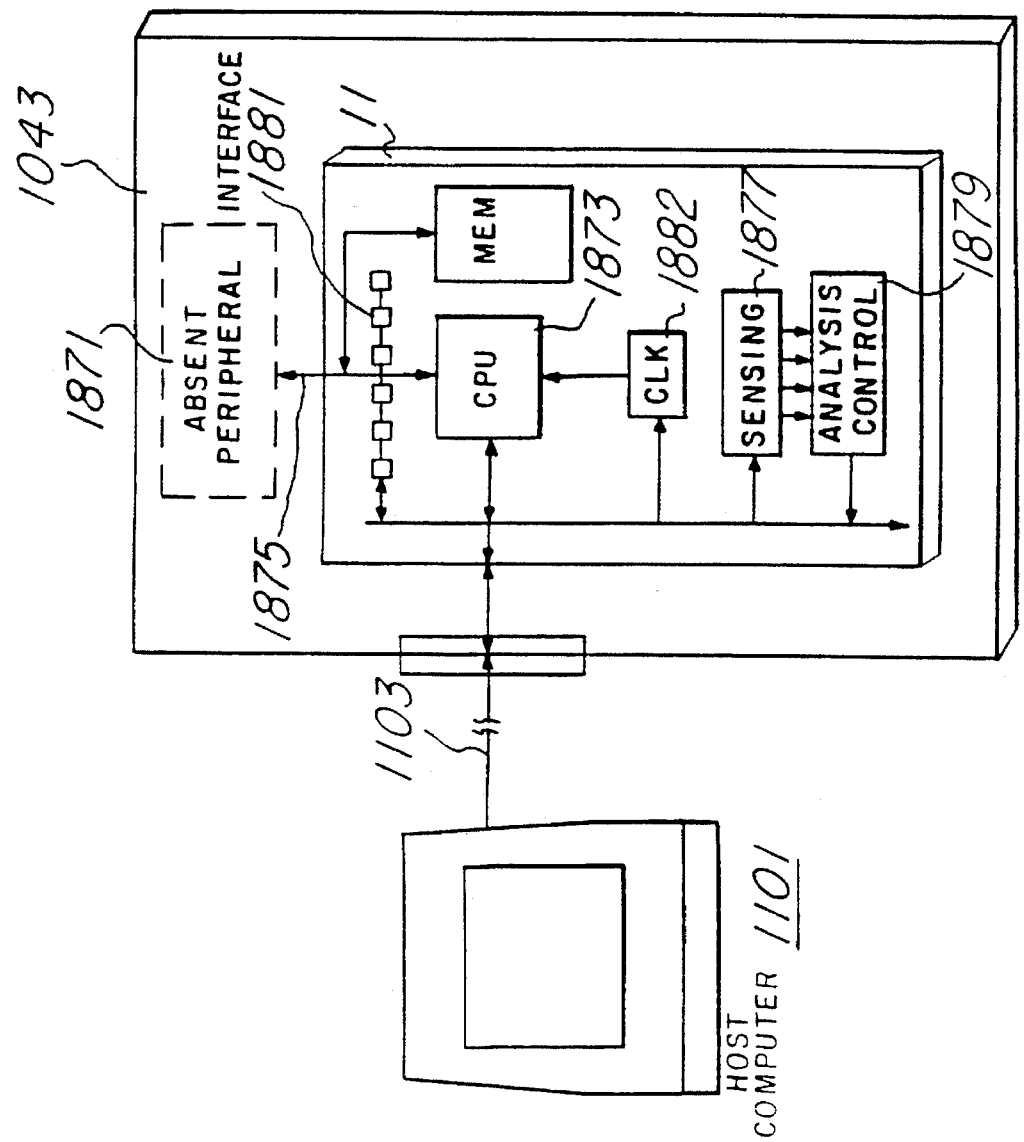
FIG. 76 is a partially pictorial, partially block diagram of a system for simulated peripheral accesses.

FIG. 76 illustrates a simulated peripheral access feature of the preferred embodiment. In FIG. 76, as in FIG. 45, host computer 1101 is connected by a serial line 1103 to apparatus 1043 which includes a circuit board with device 11 thereon and under development. The apparatus 1043 lacks a peripheral 1871 which is to be provided later. Device 11 includes an electronic processor CPU 1873 which is operable to generate a first signal to access the peripheral 1871. Peripheral 1871, if it were present, would reply with a second signal on a line ME 1875 if the access is either a Read or a Write. When the access is a Read, the peripheral also replies with data.

A sensing circuit 1877 is connected to the electronic processor 1873 to temporarily suspend operations of CPU 1873 when the first signal is sent by CPU 1873 in an attempt to access the peripheral 1871. Sensing circuit 1877 is interconnected with analysis and control circuitry 1879. All scanable interface 1881 is connected to CPU 1873 and supplies the signals from CPU 1873 to host computer 1101 via the scan path earlier described. Host computer 1101 simulates the absent peripheral 1871 and determines what second signal the peripheral 1871 would supply. Then in simulation of that peripheral 1871, host computer 1101 down loads a serial bit stream along line 1103 into interface 1881. Thereupon the interface 1881 supplies the second signal which peripheral 1871 would have supplied in response to the CPU 1873. In this way, CPU 1873 receives a signal as if the absent peripheral were present. A clock circuit 1882 for CPU 1873 provides a clock signal to the processor.

The arrangement just described is implemented in a preferred embodiment by providing the scanable interface as the message passing peripheral 1216 of FIG. 52. The message passing and analysis 1879 are suitably integrated with the analysis domain 1217 which is interconnected with the CPU core domain 1213.

In this way, the simulation of the absent peripheral 1871 causes the device 11 to be stopped and started in a manner that allows the host computer 1101 to provide signals in substitution for the absent peripheral 1871 and yet to operate the CPU 1873 at full speed when it is running. A visual analogy would be that of a ballerina executing a dance under a strobe light.

As described, host computer 1101 is operative upon occurrence of signal from CPU 1873 of FIG. 76 to simulate the absent peripheral 1871 and load the interface 1881 with a representation of the second signal with which peripheral 1871 would reply if it were present. Then control circuit 1879 resumes operation of CPU 1873 so that it receives the second signal from the interface even though peripheral 1871 is absent. It is to be understood that the arrangement of FIG. 76 is merely illustrative and may be applied to a variety of circuits as well as a digital processor, such as DMA controllers, UARTs, ASICs and any other circuits which need to be developed in the temporary absence of additional circuitry which is able to be "impersonated" by the host computer 1101 operating to simulate the additional circuitry.

Figure 77:
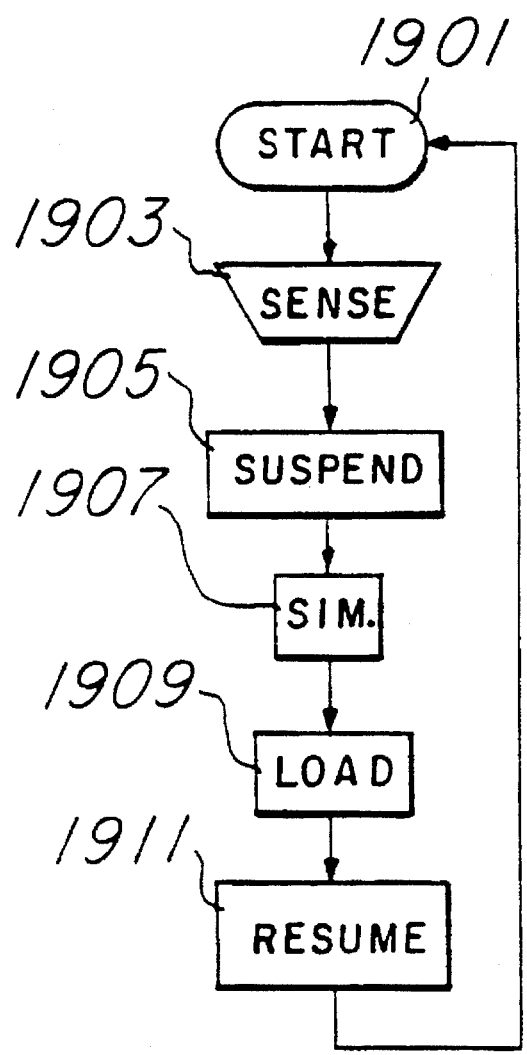
FIG. 77 is a process flow diagram of operations of the system of FIG. 76.

FIG. 77 illustrates a method of operating a system such as system 1043 of FIG. 75 that is under development and has a first circuit but lacks a second circuit which is to be provided later. The first circuit sends a first signal to which a second circuit when present would reply with a second signal.

In FIG. 77 the method commences with a START 1901 and proceeds to a step 1903 to sense the first signal sent by the first circuit to access the second circuit. Then in a step 1905, the process temporarily suspends operation by the first circuit when the first signal is sensed. Next, a step 1907 simulates the second circuit to generate a representation of the second signal. A subsequent step 1909 loads the representation of a second signal into an interface to the first circuit. Final step 1911 resumes operation of the first circuit so that the first circuit receives the second signal as a simulated reply from the interface. Upon completion of step 1911, operations return to start 1901 to repeat the process.

Figure 78:
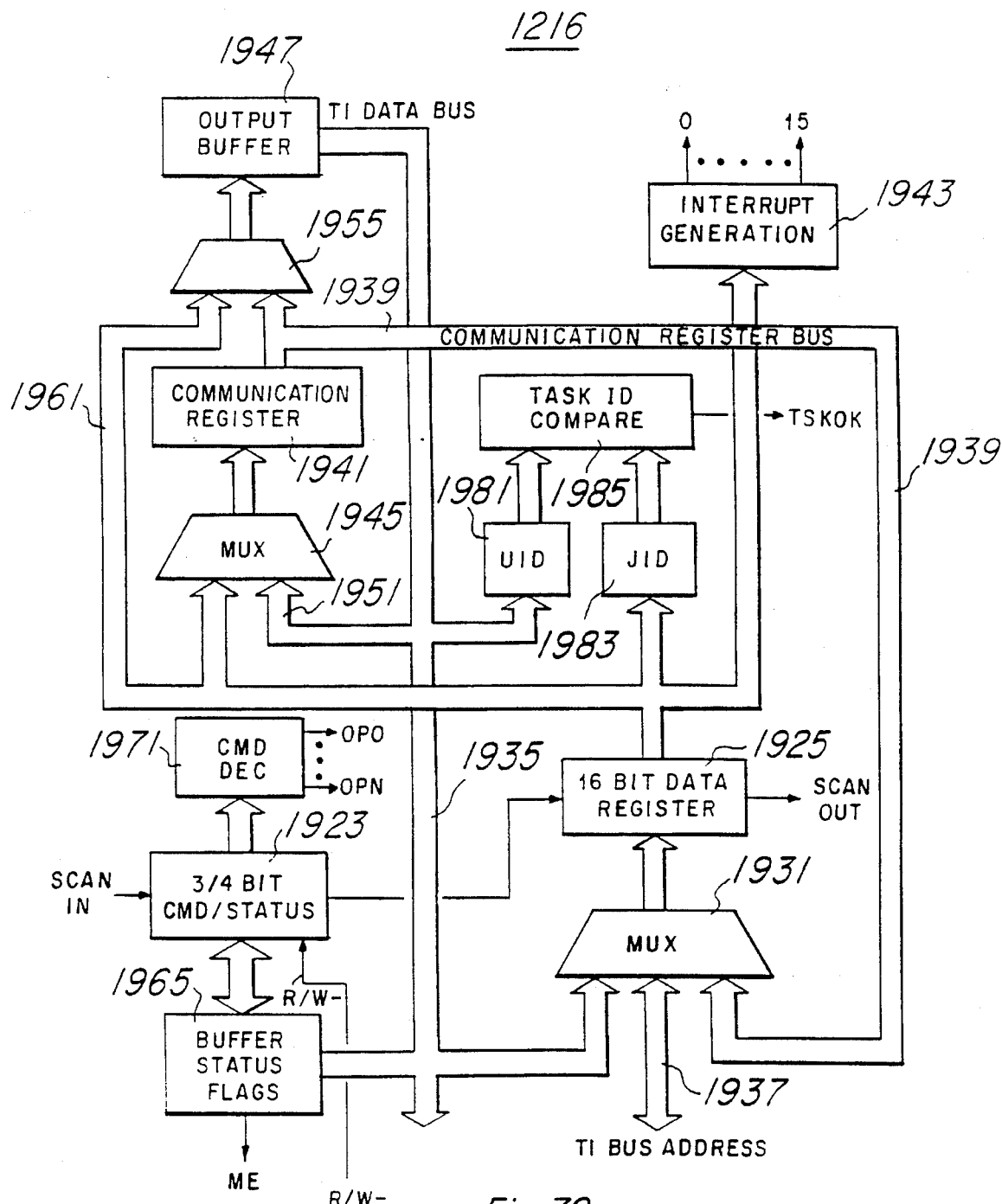
FIG. 78 is a block diagram of the message passing circuitry of FIG. 52.

FIG. 78 shows a block diagram of message passing circuitry 1216 and located on chip. The message passing circuit 1216 is interconnected with the analysis domain 1217, core domain and communicates with emulation adapter 1203 and scan control 1149. Interrupt generation circuitry 1943 also interfaces the rest of message passing circuitry 1216 to the 16 interrupt lines in the device 11. A serial scan path of FIGS. 54 and 78 has serial data MSIN enter a shift register 1923 CMD/STATUS for entry of commands to operate the message passing circuitry 1216 and for scan out of status information. The serial path continues to a further serial register 1925 designated 16 BIT DATA REGISTER whereupon the scan path exits on a line designated MSOUT. These shift registers correspond to serial/parallel interface 1881 of FIG. 76. The function of shift register 1925 can be implemented by register 1813 in the analysis domain and reuse principles can generally minimize the chip real estate required for message passing.

The shift register 1925 is connected to the output of a MUX 1931 which selects one of three paths to load into the register 1925. Two of these paths are the data and address portions of the TIBUS peripheral bus of FIG. 52 and 58. The data portion is designated 1935 and the address portion is designated 1937 in FIG. 78. The third path called the communication register bus 1939 is connected to a communication register 1941.

The message passing circuitry 1216 is useful for simulated peripheral accesses, for communications I/O (input/output) with host computer 1101 as an attached processor, and for transferring data structures between host computer 1101 and device 11.

The structure and operation of message passing circuitry 1216 is further described in connection with an example of simulated peripheral accesses. The device 11 suitably parallel-loads the register 1925 Via MUX 1931 when a peripheral access or other outbound communication is commenced. Host computer 1101 scan up-loads the contents of register 1925, and then determines the expected response of the absent peripheral by simulation computations. Host computer 1101 then scan down-loads the simulated response of the absent peripheral into the register 1925. This information in register 1925 includes the data which would be returned from the absent peripheral in response to a Read. To convey the data to the peripheral bus, register 1925 is selected by a MUX 1945 to be loaded into a communication register 1941. Communication register 1941 then supplies the data through a MUX 1955 and then an output buffer 1947 onto the data bus portion 1935 of the TIBUS peripheral bus return to the appropriate part of device 11 under the control circuitry of device 11 as if the peripheral were present.

MUX 1945 can also accomplish reverse data transfers wherein communications outward bound on TI data bus 1935 reach MUX 1945 at an input 1951 and are communicated via communication register 1941 through communication register bus 1939 and MUX 1931 to the 16-bit data register 1925.

MUX 1955 selects either the communication register bus 1939 or an additional bus 1961 directly connected to data register 1925. In this way, data can be even more directly communicated from register 1925 via path 1961, MUX 1955 and output buffer 1947 to the TI data bus.

Buffer status flags are communicated from hardware 1965 of device 11 along with Read/Write- signal R/W- to CMD/STATU8 register 1923 for scan out to host computer 1101. The host computer receives these buffer status flags and returns reply command signals simulating the peripheral, including its "impersonated" reply on line ME.

Some of the command bits from register 1923 are communicated to a command decoder CMD DEC 1971. Decoder 1971 decodes the commands and selectively activates operation output lines OPO . . . OPN to the MUXes and registers of the message passing circuitry 1216 to operate circuitry in accordance with the commands. Thus, processor-level sophistication and flexibility are available in message passing circuitry 1216. In further aspects, MUX 1945 has an input 1951 connected to the data portion of the peripheral bus TIBUS for further flexibility. Register 1925 is connected to interrupt generation block 1943 so that even the interrupt status of device 11 can be scan loaded from host computer 1101.

It is to be emphasized that functional clock FCLK operates when data is loaded into register 1925 from the device 11 peripheral bus and when buffer status flags are loaded into register 1923. Test clock JCLK operates when the data in registers 1923 and 1925 are scan up-loaded to host computer 1101, and when data is scan down-loaded to these two registers. Then functional FCLK operates to send data from register 1923 to command decoder 1971 and to send data from register 1925 to the MUXes, registers and buffers and buses of the message passing circuitry and the rest of device 11. These operations and clock switching functions are accomplished by scan control 1149 and adapter 1203 as discussed hereinabove with FIGS. 50 and 59 for instance.

A register UID 1981 is connected to the data bus 1935. A further register JID 1983 is connected to the data register 1925. The outputs of registers UID and JID are supplied to a task identification compare circuit 1985. When the identifications match, an output signal TSKOK is output. Thus, when the message passing circuitry has completed its work it can signal its internal condition to any circuit that can advantageously utilize the information. For example, the task OK signal TSKOK can be used to release a SUSPEND hold on the 12-bit down counter 1715 of FIG. 69.

In some cases of message passing, there is a need to perform emulation and simulation functions without halting a CPU in device 11, thus preserving its ability to service interrupts and perform other functions. This capability permits stop stimuli that normally direct the core to halt to instead invoke a trap to a reserved location. The user then links an emulation monitor program to user software to service the trap. When the trap occurs, the monitor communicates with the emulation host computer 1101 through a TIBUS peripheral such as message passing circuitry 1216 register 1925 having an address that resides in the TIBUS address space. Once a trap has been taken and until a return from emulation trap has been executed the CPU and analysis stop stimuli are ignored.

Figure 79:
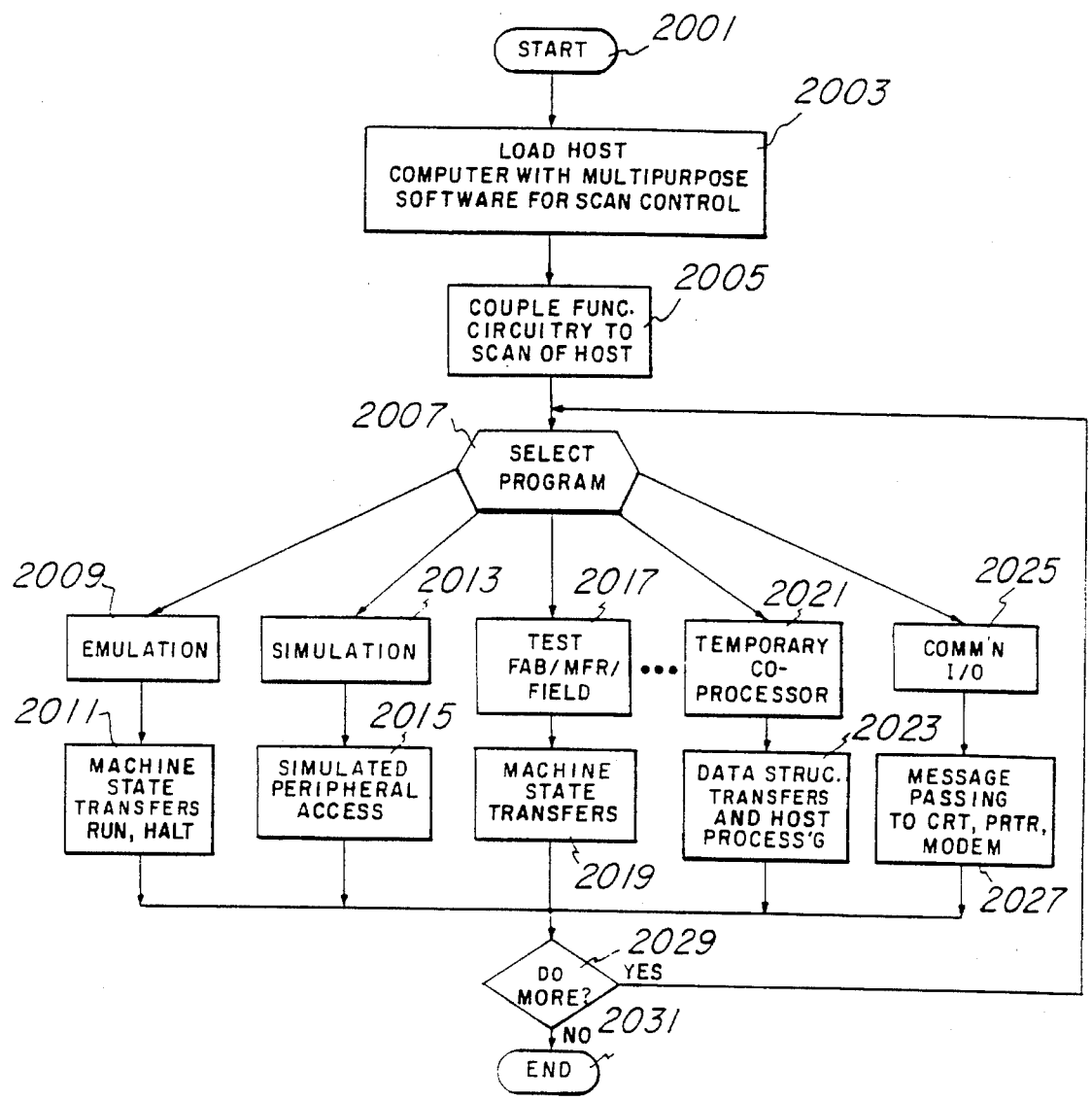
FIG. 79 is a process flow diagram of an attached processor method of operating the system of FIG. 45.

FIG. 79 shows a process flow diagram of steps to use host computer 1101 of the development tools of FIG. 44 in expanded ways, when the on-chip interface circuitry 1149, 1203, 1216 is present. A method of operating an electronic system including a host computer serially connected to an application commences with a START 2001 and proceeds to a step 2003 to load host computer 1101 with multipurpose software for scan control including emulation and testability software. Then in a step 2005, functional circuitry such as application system 1043 including device 11 is coupled to the scan line 1103 from host computer 1101.

In the next step 2007 the user or an operating system selects a software program for emulation 2009, simulation 2013, test in wafer fab/manufacturing/field test 2017, and attached processor modes such as temporary coprocessor 2021 and communications I/O 2025. The attached processor modes communicate data related to functional operations of the application system by means of a peripheral such as message passing peripheral circuitry 1216 between the host computer and the application system via the same serial line which also is used for emulation and testability communications.

Emulation operations 2009 include step 2011 scan operations, machine state transfers, run, pause and halt among other operations as described at length herein. In this way signals are produced and inputs are read from the system board 1043 as the chip to be used as device 11 were absent, so that ultimately when the final chip for device 11 put on the board in production, it will have the appropriate ROM code and will be operating in a manner compatible with the board in the application.

Simulation operations 2013 involves executing software in host computer 1101 to simulate the target board so that software development for the device 11 can be performed by one group of engineers while another group of engineers is designing the as-yet-unfinished target system 1043. The device 11 could be software simulated, but if a prototype is available as in FIG. 45, then simulation can be accelerated by executing the device 11 software under development on the device 11 itself and only simulating the rest of the board 1043 on the host computer 1101. This capability of accelerating simulation using device 11 itself is of major importance when the host computer 1101 is of an inexpensive widely available type that is not fast enough to simulate a device running as fast as a DSP, for example.

Instead, the device 11 runs at full speed and then the peripherals (such as off-chip fast and slow memory) are simulated since they are not accessed nearly as frequently as memory and registers inside device 11. Step 2015 is the simulated peripheral access operations as discussed in FIG. 76.

A nonexistent or deleted peripheral 1871 is replaced by a single data port 1216 accessible through the scan test port 1149. An access directed at a non-responding TIBUS address causes the CPU core to halt after the first clock of a TIBUS access. The emulation controller 1101 then extracts the address and the type of access (read or write). The emulation controller 1101 then provides the data through a register 1925 on reads or reads the data directly off the data bus on writes. READY signals for the completion of the cycle are also provided serially through the scan path to register 1923. After the appropriate transfers take place, the CPU core of device 11 is restarted.

Test step 2017 involves machine state transfers 2019 as host computer 1101 scan-loads machine states or test patterns into the SRLs of device 11, which are then processed by the logic of device 11 and scanned out and evaluated.

Use of host computer 1101 as a temporary coprocessor for device 11 in step 2021 involves data structure transfers at 2023 via message passing circuitry 1216 between host computer 1101 and device 11. Host computer processes the transferred data structures and then transfers the results back to the device 11 or elsewhere on the target board 1043.

The data and results are also able to be sent to video terminal, printer, hard disk, telecommunications modem or other peripheral resources of the host computer 1101 which may be unavailable to device 11 otherwise. For this purpose, communication I/O step 2025 performs message passing at 2027 from the device 11 and target board 1043 generally to the peripheral resources of the host computer 1101 via message passing circuitry 1216. Transfers and line control are governed by the host computer 1101.

After an operation is complete in FIG. 79, step 2029 determines if more operations are needed, looping back to step 2007 if so, and ending operations at 2031 if not.

The ability to qualify all analysis with a user program provided task ID is implemented through the Message Passing Peripheral. The user's program provides a task ID through a TIBUS register value. This value is compared to a value loaded via scan. The comparison is enabled via an extra bit which may be used to force a valid compare to the Analysis section.

The register 1923 in FIG. 78 is implemented as a 3 bit opcode, a four bit status field, and a nine bit TIBUS address/read/write latch for a total of 32 bits.

The delivery of data to algorithms in simulation is readily performed because the message passing circuitry 1216 and other circuitry described herein provide the following features:

1. Peripheral frames (blocks of addresses) may be disabled from decoding addresses, generating interrupts, and driving the TIBUS peripheral bus with any new code (CO, C1, CX) to be applied to domains.

2. Any peripheral interrupt may be generated from the message module via block 1943 of FIG. 78.

3. The TIBUS peripheral bus can be programmed by scan to Read and Write to register 1925 when no frame recognizes a select.

4. The TIBUS peripheral bus can be programmed via scan to stop the core and device with the second cycle of the bus active, allowing the host 1101 to load or unload register 1925 and obtain address and a read/write indicator.

5. Restart the device execution from the message passing circuitry 1216 register 1923.

Each module has a module disable bit which when set through scan, disables the address decode, bus drives, and interrupts. When no module acknowledges the TI bus address and the TI bus block is addressed during simulation pipe freeze with simulated peripheral access in register 1923 enabled, the core stops before the second cycle of the peripheral access is complete. In this mode, reads are targeted at the message peripheral if no other frame is decoded. All writes are directed at the message peripheral. When the simulated peripheral access bit in register 1923 is enabled, four status bits are used to specify the number of wait states associated with the peripheral access.

Turning to the subject of interrupt generation, two methods of inserting interrupts exist. The first supports the simulated peripheral access mode where the interrupts are asserted for one clock when SUSPEND goes inactive after the device starts. The second is the assertion of an interrupt when the device is running in either the simulation or emulation modes.

The JTAG/MPSD interface of the preferred embodiment herein provides enhanced emulation capabilities at low cycle rates of test clock JCLK, and enables simulation of peripheral functions. The interface further provides extensive internal testing for complex devices in low pin-count packages. The flexible circuitry of the interface used with host computer 1101 reduces device prototype to production time, and improves fault testing capabilities in production. The circuitry makes it possible to do boundary scan at printed wire board (system) level. This boundary scan capability is particularly important as board densities increase and the use of surface mount devices with less accessible pins increases.

It is emphasized that while the preferred embodiment is discussed in connection with one processor, an important advantage of its organization is that it is architecture independent. Access and control reach all internal latches. Load/store instruction accesses data RAM. On-chip peripherals are accessed and controlled. The modular approach to each die with which the circuitry is associated allows isolation and test of each module independently, and addition or subtraction of modules in creation of additional chip members of a chip family. Not only standard products and their derivatives, but also semicustom chips and ASIC devices, are supported with a uniform emulation approach and minimum and fully adequate investment. The preferred embodiment makes possible increased fault coverage, and quicker device debug. Emulator support can be made available almost coincident with device availability. In this way there is timely availability of emulation and software development tools upon user's receipt of functional chips in silicon, gallium arsenide and other material systems. The system emulation obviates target cables and is nonintrusive and more fully reliable. Full speed emulation is available over the life of a chip family even as functional clock speed is increased, including chips with bus cycle times exceeding 20 megahertz. Emulation circuitry upgrading for new members of a chip family is significantly reduced. The type of emulation circuitry is advantageously independent of the package in which the chip is manufactured, unlike the target cable approach. Less new information needs to be digested by user for development of systems using new chips with software upgrades for emulation. The software can provide built-in documentation.

Significantly, the preferred embodiment merges test and emulation methodology. Both test and emulation have common features involving 1) putting the chip into a known state, 2) start/stop execution and 3) dumping the machine state. Scan paths both dump and restore machine states, and provide a mechanism for invoking memory read/writes. Both real-time and non-real-time applications development operations are addressed with the same toolset and technology, instead of using separate test equipment and emulation apparatus.

High speed chips are easily accommodated because specialized functionality for emulation is fabricated on-chip. In processor chips, the number of base sets for a given processor core is reduced by eliminating special emulation devices.

Concurrency is herein recognized as a variable defining a spectrum or matrix of emulation technology into which the preferred embodiment and other embodiments of the invention are seen as new advances. The next table categorizes the technology according to the concurrency concept:

TABLE

| Level | Acronym | Scan | Execute |
| --- | --- | --- | --- |
| 1 | LSSD | Entire chip | Entire chip |
| 2 | MPSD T | Module | Entire chip |
| 3 | MPSD E | Module | Module |
| 4 | JTAG/MPSD | Module JCLK System Scan | Module FCLK Concurrency |
| 5 | JTAG/MPSD | Module JCLK System Execute | Module FCLK Concurrency |

In concurrency level 1, the entire chip is scanned and then the entire chip is run in order to execute operations. In concurrency level 2, individual modules in the chip can be selected for scan, and then the entire chip is run. In concurrency level 3, individual modules in the chip can be selected for scan, and then any selected one or more modules can be run. In concurrency level 4, boundary scan is integrated with MPSD modular port scan with system 1043 scan concurrency, so that entire systems can be developed and tested from any level of module through chip through system. In concurrency level 5, system execute concurrency is added to level 4. Each level comprehends the capability of all previous levels.

A message passing aspect of the preferred embodiment involves at least four functions. In a first function, a middle-of-access transfer involves a CPU stop and peripherals stop.

Simulated peripheral access is accomplished, for example, by using this first function. A second function uses the message passing circuitry to latch interrupts while message passing occurs. A third function compares task identifications (IDs) and signals that message passing is still in progress or is completed. A fourth function passes messages through the scan serial interface 1149 to a host computer 1101.

Often a manufactured system board in the context of actual application lacks associated video terminals and printers for testing purposes. Using the fourth function, in an attached processor aspect of the preferred embodiment, the development system acquires control of the application system board in its normal user operational aspects as distinguished from emulation, simulation and debug aspects.

For example if the system board includes an embedded microcontroller, the development system in the preferred embodiment has a mode of operation by which the development system polls status through the scan serial port or receives interrupts from the microcontroller via the EMU0 or EMU1 pins of FIG. 53.

A software interrupt or software trap function in the embedded microcontroller occurs at a predetermined breakpoint therein to signal the host computer 1101 of FIG. 45 for service. In other words, the host computer in the development system is called as a coprocessor to the embedded microcontroller in the application system. For example, the embedded microcontroller can do file transfers to the development system acting as attached processor for display and printer purposes.

Two categories of implementation involve 1) nonconcurrent execution and 2) concurrent execution.

In category 1 the embedded microcontroller CPU execution ceases for application purposes and the CPU transfers data, for example, to the host computer 1101. Host computer 1101 does memory reads and writes using the microcontroller CPU registers and then restores the CPU state when the transfers are completed.

In category 2 (concurrent execution) a message passing peripheral MSGPASS 1216 of FIGS. 52, 54 and 78 is included in the preferred embodiment combination. Advantageously MSGPASS 1216 allows the microcontroller to execute other tasks after calling the host computer 1101 for service. Then code from the application system is sent via the scan serial line 1103, and inserts interrupts over EMU0 line to software control to make host computer 1101 perform the attached processor functions.

In this way, a dual function is provided in the six wire SCOPE/MPSD interface of the preferred embodiment. The system board and its microcontroller are used in a more realistic way using all of the serial and parallel ports on the system board for their application purposes without having to temporarily use any of those application ports for testing and normal development system functions. Thus, the SCOPE/MPSD interface is not only useful in prototype and manufacturing test, but also for field test and diagnosis, and retrieving application system operational history and accumulated data for display and printing.

Block transfers are accomplished by use of the message passing peripheral 1216 by loading the register 1925 from communication register 1941, and with JTAG controller in the IDLE state, do N (e.g 16) bit serial shift, and then cycling back to load register 1925 again. The block transfers can be directed to any other serial interface to which the scan path is connected. With shift rates well in excess of 10 megahertz, substantial communication potential is opened up by dual use as a communications channel of what otherwise might be a mere test port.

In FIG. 78, a half duplex communications protocol accomplishes alternate download and upload between host computer 1101 of FIG. 45 and message passing peripheral MSGPASS 1216 of FIG. 78. Host computer 1101 scans bits into registers 1923 for use by the microcontroller. The application microcontroller uses the information and then subsequently loads status and data bits into registers 1923 and 1925, and then sends a request to the host computer 1101 to upload. Upon a signal back from host computer 1101, serial transfer from registers 1923 and 1925 to host computer 1101 is performed. (In an alternative embodiment full duplex hardware and communication are provided.)

The message passing peripheral is advantageously further useful for development system purposes. Host computer 1101 operating as a development system downloads a command to register 1923 requesting the machine state of the embedded microcontroller. The microcontroller responds by trapping (analogous to an interrupt) to prestored software code in its memory. The prestored code is executed to cause the contents of the core registers in the microcontroller to be communicated through message passing peripheral 1216 of FIG. 78 back to the computer 1101. Even as the message passing peripheral operates, concurrency is maintained and the CPU of the embedded microcontroller is free to accept interrupts while doing debug so that real time control functions are not disturbed.

In this way, message passing peripheral 1216 acts as an electronic system which is programmable by the skilled worker for many uses. For example, the development system can be detached and another non-development-system microprocessor connected in the field for other purposes. In this way the SCOPE/MPSD port comprises a highly flexible communications channel for systems applications. Furthermore, the system 1043 is free to communicate with its application host processor 1044 if one is present.

The exposition of emulation, simulation and test now turns to still further aspects. A coassigned scan test U.S. Pat. No. 4,710,933 is hereby incorporated herein by reference.

Figure 80:
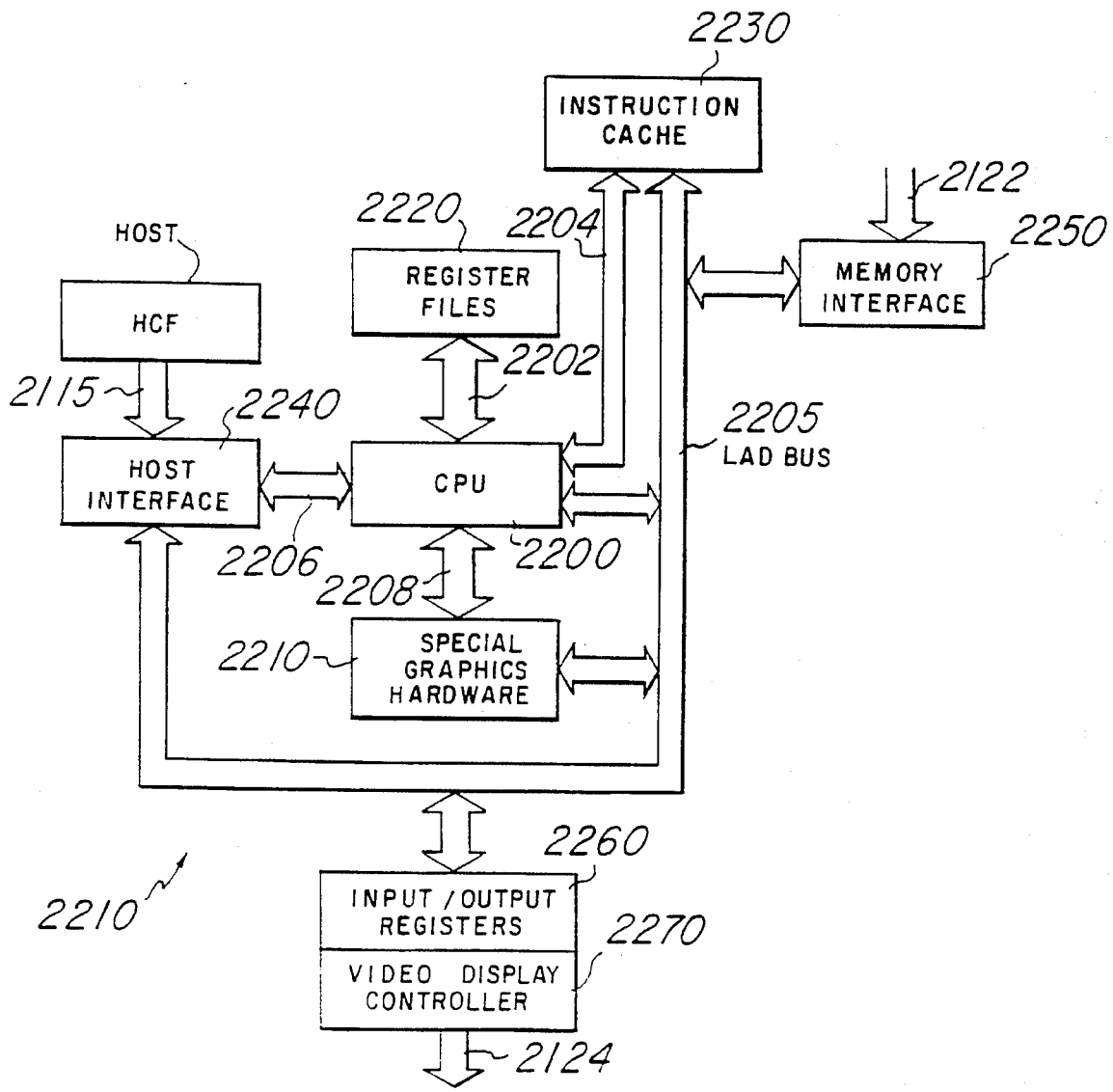
FIG. 80 is a block diagram of a graphic system processor GSP chip.

A preferred embodiment of a graphics system processor, FIG. 80 shows a block diagram of a GSP chip 2120 having a central processing unit 2200 connected by buses 2202, 2204, 2206 and 2208 to register files 2220, instruction cache 2230, host interface 2240 and graphics hardware 2210 respectively. A further bus 2205 interconnects a host interface 2240, memory interface 2250, instruction cache 2230, and Input/Output registers 2260. Host interface 2240 and memory interface 2250 are respectively externally accessible via pins and buses 2115 and 2122. A video display controller 2270 associated with I/O registers 2260 supplies its output on a bus 2124.

Figure 81:
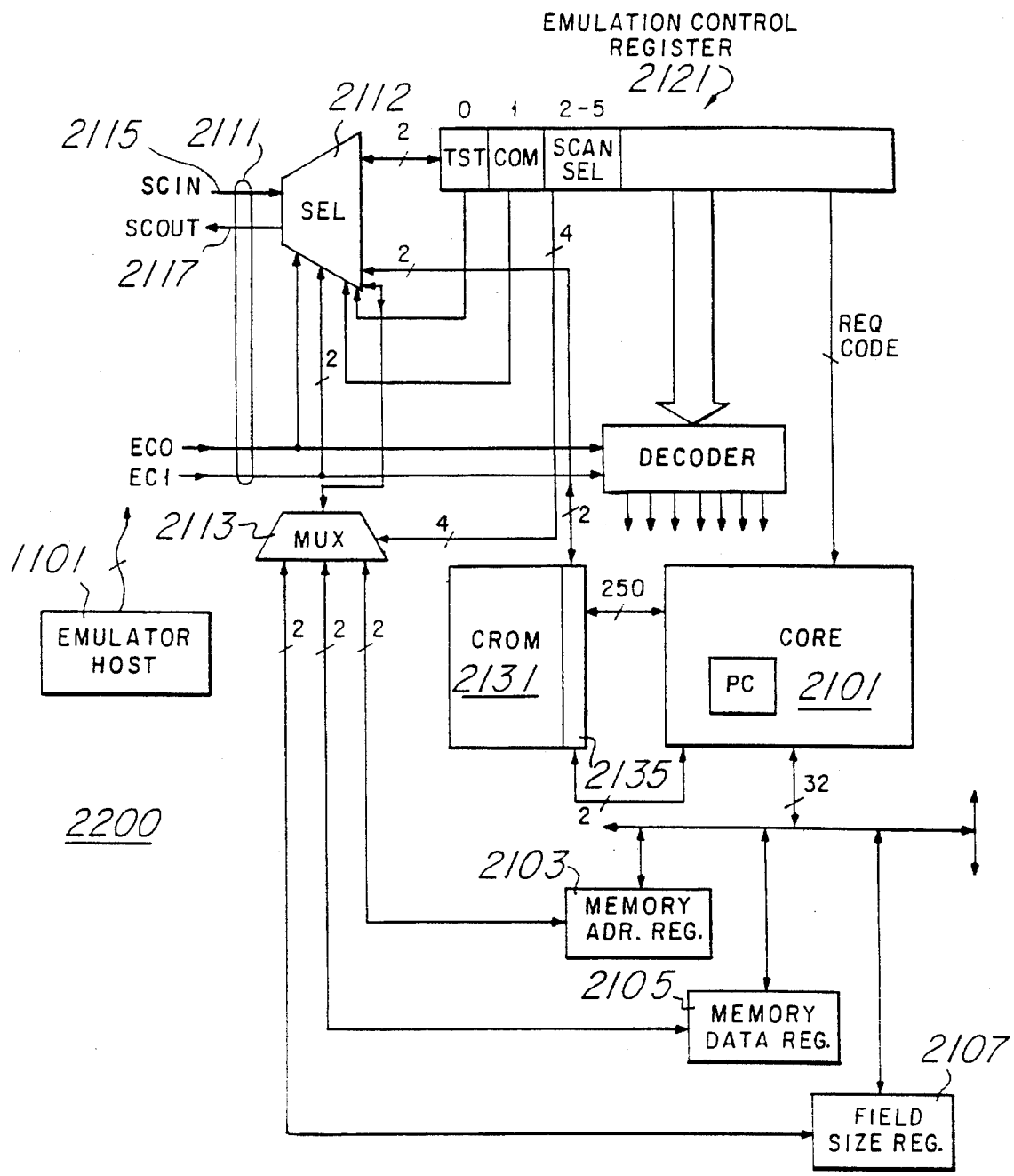
FIG. 81 is a more detailed block diagram of a CPU portion of the GSP chip of FIG. 80 showing testability, emulation and simulation circuitry.

FIG. 81 shows a block diagram of unit 2200 of FIG. 80.

For the purposes of testability, the GSP 2120 memory elements are split into two types:

(1) Multiple-bit registers such as those in the register file 2220, the Cache RAM 2230, a memory address register 2103, memory data register 2105 and a field size register 2107. These are all on wide buses, and sufficient logic is included to ensure that there is a route from each of these registers to local address data (LAD) pins of the chip.

(2) Serial latches, such as an emulation control register 2121, buffer SRLs 2135 of a control ROM (CROM) 2131, and scanable registers of core processing circuitry 2101 on chip. These are put on two scan paths and are accessible via two bidirectional pins SCIN and SCOUT- in test mode. Extra latches are suitably placed as desired to easily observe key logic elements.

Figure 82:
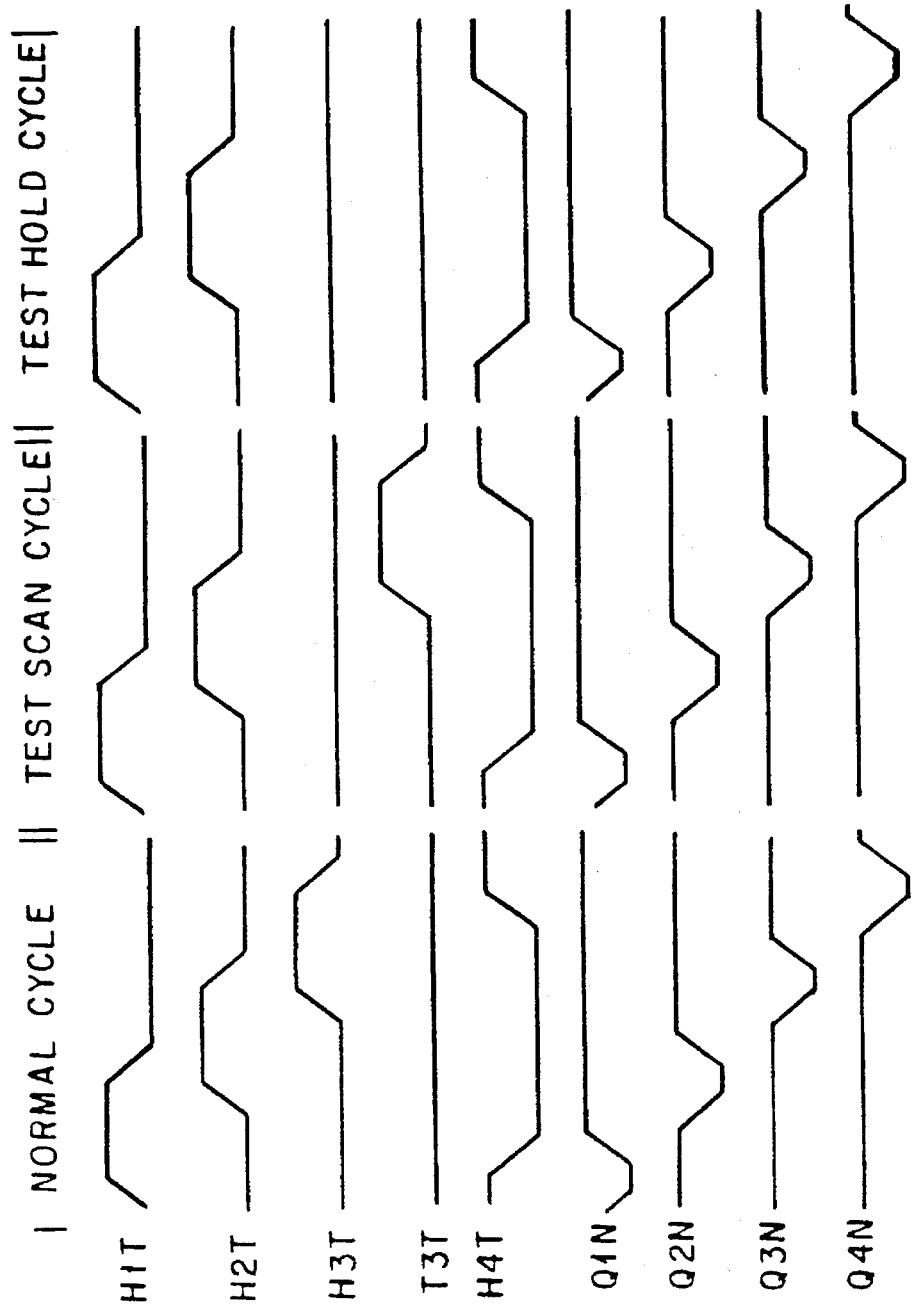
FIG. 82 is a waveform diagram of clock waveforms for operating the GSP chip of FIG. 80.

One approach to testability herein is called parallel serial scan design (PSSD). A rule is imposed in which every register bit and serial latch are only loaded by some function ANDED with, or conditional on, a single clock phase (H3T) of FIG. 82. FIG. 82 also shows clock signals H1T, H2T, T3T, H4T, Q1N, Q2N, Q3N and Q4N. The state of the chip can be "frozen" by keeping H3T at a zero level. All other clocks can occur as normal.

The GSP 2120 incorporates four-phase active-low clocks Q1N through Q4N of FIG. 82 generated from the input clock pin. Also present are four active-high half-phase clocks H1T through H4T. As stated previously, all memory elements are loaded only during the H3T phase. During the normal operation of the circuit, the clocks look like the normal cycle shown in FIG. 82 leftmost column. During a special scan test mode cycle (middle column), H3T is held low, freezing the normal load of the memory elements. A special test clock, T3T, is enabled to shift the elements along the scan path. During a hold test mode (rightmost column), both H3T and T3T are held low, thereby freezing the state of the machine.

Figure 83:
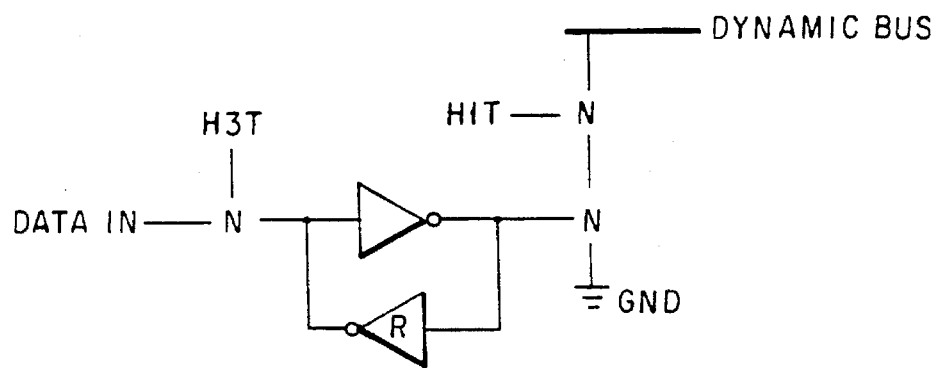
FIG. 83 is a schematic of a parallel register latch for use in the GSP chip of FIG. 80.

Each parallel register cell has a circuit shown in FIG. 83. It is loaded on the (normally conditional) H3T phase and is sampled on a (conditional) H1T phase. Control logic and microcode are included on-chip to enable every parallel register to be loaded and dumped onto the LAD bus. Thus, the machine state can be loaded up, executed, and then the results dumped out.

Figure 84:
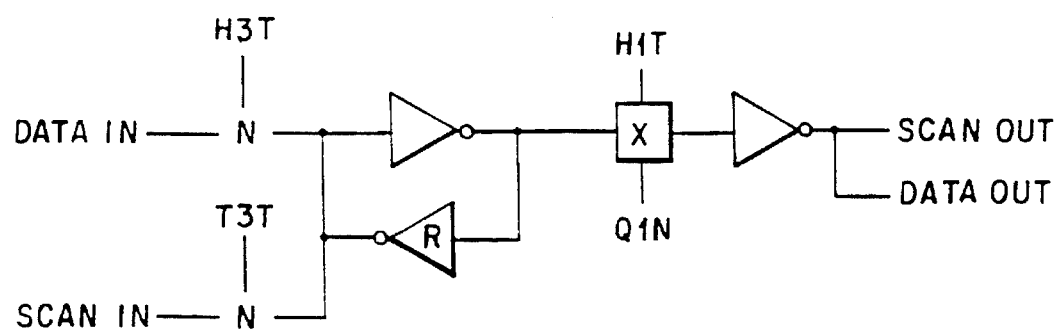
FIG. 84 is a schematic of a serial register latch for use in the GSP chip of FIG. 80.

A circuit for each serial latch is shown in FIG. 84. It is similar in form to the parallel register circuit of FIG. 83, but contains an additional serial input called the scan input Scan In. For the purposes of testability, the H1T sample is connected to the T3T input of the next element in the scan chain, so that all the latches are joined together in long shift registers. The test clock T3T has the same phase as H3T, but is disabled (zero) in normal operation. In special scan-in/scan-out test modes, T3T is enabled and H3T is disabled. Data is shifted along the scan chain. The clocking scheme minimizes the number of extra transistors required to implement the scan path to as little as one transistor plus the routing of the test clock.

In order to utilize the parallel and serial latches, control hardware is included and connected to reset, run/emu, local interrupt, and hold pins. When both reset and run/emu are pulled low, the values presented on two local interrupt pins and the hold pin provide a 3-bit code which is decoded into one of seven possible test modes.

The test modes will normally be used in the following sequence:

(1) Parallel load—Load all registers on the parallel path via the local memory interface.

(2) Scan-in—Data is shifted into the serial scan paths without corrupting any of the data in the parallel path registers.

(3) Execute—For one or more clock cycles.

(4) Scan-out—Data is shifted serially out of the scan paths without corrupting any of the data in the parallel path registers.

(5) Parallel dump—Dump all registers on the parallel path via the local memory interface.

Another useful test mode is the hold mode. During this mode the machine state is frozen by disabling H3T and T3T.

Video controller 2270 has its own independent two-phase clocking scheme with internal phases V5T and V6T derived from a video input clock pin (VCLK). Registers 2260 used by the video controller are loaded on V6T only. To get around this in all test modes, the video clocks are disconnected from the VCLK pin and the two phases are "Joined" to H3T and H1T. Then all the video registers are loaded on V6T, the phase corresponding to H3T.

Parallel Load/Dump Interface—The control of the parallel load and dump is performed by the CPU 2200 but the reads to writes to the LAD 2205 are done by the memory controller 2250. The CPU is Just one of several sources 2200, 2210, 2240, 2260 which can interact with the memory controller. It is possible for instance for a DRAM refresh controller to request a memory cycle in the middle of the load/dump cycle, but this would upset the sequence and data would be lost by the tester.

These other sources need to be disabled. This is done by first doing a scan out before a parallel load/dump. This flushes the scan path and clears all requests to the memory controller, ensuring that the CPU is the only active source.

Cache RAM—For performance reasons relating the interface to the LAD bus, the cache is loaded o an H1T. Thus, in order to stop the update of the memory elements in the cache, all the cache registers are loaded based on a signal which is disabled whenever H3T is disabled.

Turning now to FIG. 81, emulation in a preferred embodiment is implemented with a core 2101 on a GSP chip soldered into a target system 1043 of FIG. 45.

A memory address register MA 2103, a memory data register MD 2105 and a field size register 2107 are associated with main core 2101. A four wire scan interface or port 2111 is connected to a selecting circuit 2112 connected to serial data in SCIN 2115 and serial data out SCOUT- 2117 pins. Emulation control pins EC0 and EC1 provide further control inputs. Selecting circuit 2112 is connected to an emulation control register 2121. Register 2121 is also called a scan control register herein. Special test TST and Compress COM bits 0 and 1 in register 2121 are connected to selector circuit 2112 to route the lines 2115 and 2117 to one of three scan paths. The first path allows scan to register 2121 itself. The second path allows scan of CROM buffers 2135 and core 2101. The third path connects to a MUX 2113. The selection is also controllable by emulation control pins EC0 and EC1, which correspond to pins EMU1 and EMU0 earlier described.

A register select code is supplied by emulation control register 2121 bits 2–5 SCAN SEL on a line 2125 to control the MUX 2113. In this way, register selection of a selected one of registers 2103, 2105 and 2107 is controlled by emulation control register 2121 in its operation of MUX 2113. Scan data in and data out on lines 2115 and 2117 are thus selectively routed to registers 2103, 2105 and 2107.

Registers 2103, 2105 and 2107 provide parallel digital communications to and from main CPU 2101. Advantageously, they are accessible serially via MUX 2113 for scan input and output.

Test modes are controlled via the EC1, EC0 and SCIN pins, and two bits TEST and COMPRESS of the emulation control register 2121.

The control pins EC1, EC0 and SCIN initially define the state of the emulation control port. Scanning a 1 into the TEST bit zero (0) of the control register 2121 redefines the port as a test control port as long as a code 111 (for EC1, EC0 and SCIN) is not applied to the interface 2111. The 111 code is a normal user run mode and also clears the entire emulation control register 2121, including the TEST bit, thus resetting the port. The relationship of the codes to the MPSD codes tabulated earlier hereinabove should be apparent. A scan control circuit 1149 of FIG. 50 is suitably combined with this arrangement according to the configuration of FIG. 49 for even further testability, simulation and emulation and message passing advantages.

In FIG. 81 control ROM (CROM) 2131 is connected to main CPU 2101. The second bit COMPRESS of the emulation control register 2121 extends the possible number of test states available via the interface and is used for CROM compressions in a type of testing called signature analysis. In such signature analysis, a scanable linear feedback shift register 2141 of FIG. 86 is combined with the CROM buffers 2135 of FIGS. 81 and 85 and is used to self test the CROM 2131. A compression test clock C3T is also used in this self-test operation. For earlier signature analysis approaches see coassigned Sridhar U.S. Pat. 4,601,034 and Thatte U.S. Pat. No. 4,594,711 hereby both incorporated herein by reference. Alternative embodiments can use any BIST (Built In Self Test) configuration and process.

The CROM on the GSP2 has approximately 450,000 transistor sites; there are 256 outputs and 1,568 states. The states are accessed via a novel use of two memory maps. A total of 1,280 states are controlled by a 11-bit micro-jump (UJ) address code, and the 256 entry-point states are directly controlled by explicit opcode decodes. The selection between entry point or UJ is controlled by a CROM output to a MUX 2137 of FIG. 85.

Figure 86:
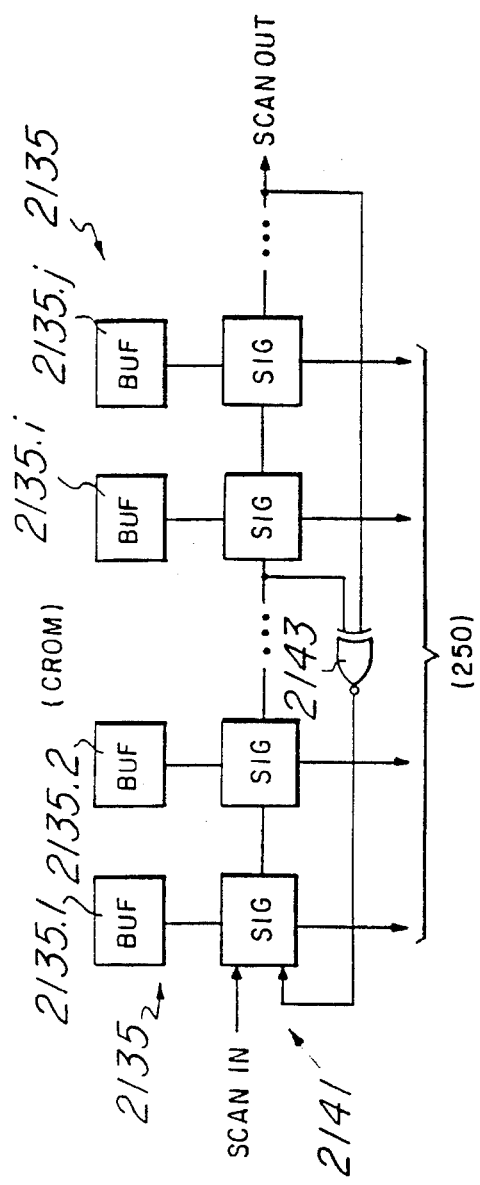
FIG. 86 is a detailed block diagram of signature analysis test circuitry for the CROM of FIG. 85.
Figure 87:
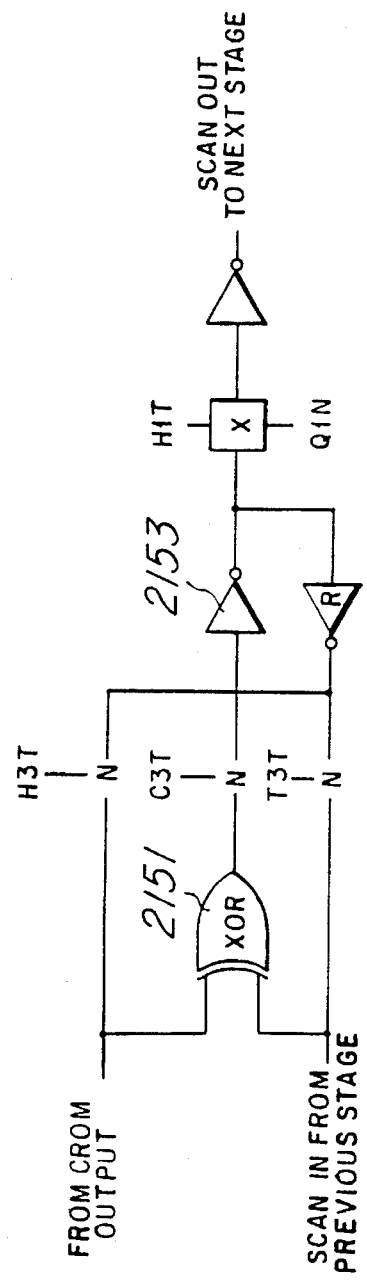
FIG. 87 is a schematic diagram of a cell in the signature analysis test circuitry of FIG. 86.

In FIG. 86, the scanable linear feedback shift register 2141 utilizes a data compression method of self-testing the CROM. The method accesses every state. For each access, a word is generated in the CROM output buffer stage 2135.1, 2135.2, 2135.i, 2135.j etc., from the XOR (exclusive OR) of the new data with the data previously held in the adjacent buffer stage. A further XOR gate 2143 has two inputs connected to a midpoint tap and a right most line. XOR gate 2143 has its output feeding back to the leftmost signature block. The CROM buffers 2135 with signature circuits 2141 thus form a signature analyzer. The basic component circuit of the CROM buffer is shown in FIG. 87. An XOR circuit 215I has inputs connected to a CROM output line and a scan line from the adjacent buffer stage. The output of the XOR 2151 is connected to a latch 2153.

C3T is a special compress clock. It is held low during normal and scan operations, but is enabled during COMPRESS mode (when H3T and T3T are disabled) to generate the signature.

This flow of data causes an incorrect data bit to invert the sense of one bit of data being shifted around the buffers. When the entire CROM has been accessed in this manner, the contents of the CROM buffer signature analyzer are re-examined by scanning them out.

The data (signature) that is scanned out is compared to the expected data so validity of the code in the CROM is determined.

The analysis method herein takes into account the possibility that multiple faults may be undetected. While a single inverted bit, representing a fault, is being shifted around the signature analyzer, it could be "hit" by another fault, and so get toggled back to the correct value. This happens if the second fault is both N outputs "downstream" and N addresses away. To overcome this problem, the circuitry and method implemented herein preferably presents addresses to the address decoders in two different sequences, the first time counting up and the second time counting down, virtually eliminating the possibility of undetected faults.

The feedback term for the signature analizer is the XOR of the final term and a term near the middle of the CROM. The exact position of this middle term is flexible.

Figure 85:
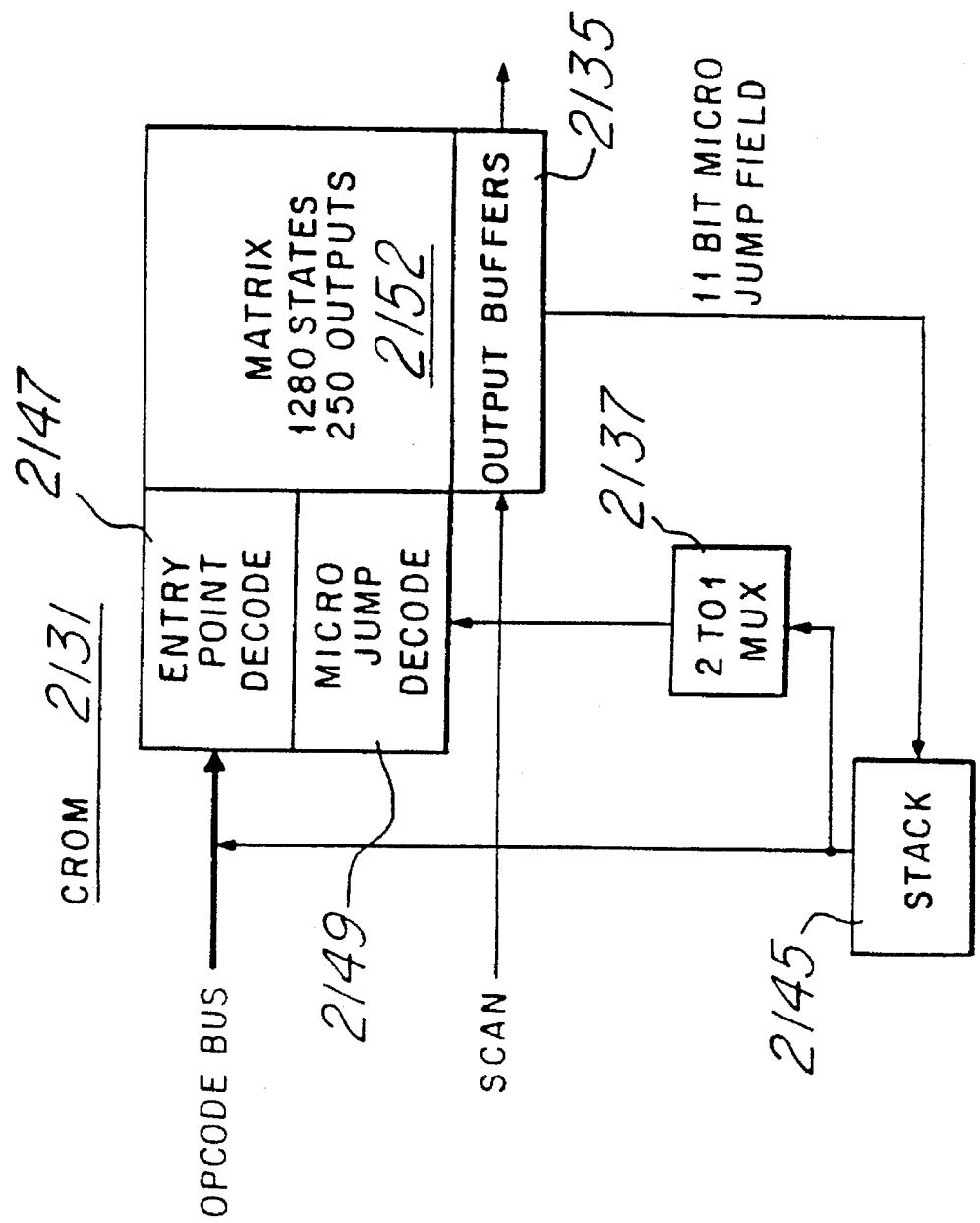
FIG. 85 is a block diagram of a control read only memory (CROM) for the GSP chip for FIG. 80.

A stack register 2145 in normal operation is used during micro-state pops and pushes in the circuit of FIG. 85. In CROM test mode this register 2145 is reused as a 13-bit counter. The two most significant bits of the counter are used to control whether it is counting up or down, and whether the value is to go to an opcode decoder 2147 or a micro-Jump address decoder 2149 associated with a logic matrix 2152 of the CROM. The total number of cycles required to test the CROM is therefore $2^{13}$ (SK) plus the initial scan-in to initialize the registers and counters, plus the final scan-out to check the resulting signature. Therefore, at a clock frequency of 10 MHz, the complete CROM test requires less than 1 millisecond.

One major advantage of this type of test is that it can be performed with a simple, low-performance, low-pin count tester, but gives excellent fault coverage.

The codes for testability are shown in Table V. Table V has 5 columns vertically labeled TEST, COMP (compress), EC1, EC0, and SCIN in that order from left to right.

TABLE V

| TEST | COMP | EC1 | EC0 | SCIN | | REMARKS |
|---|---|---|---|---|---|---|
| 1 | X | 1 | 0 | 0 | HOLD | No. H3T phase clocks, i.e. no H3T, V6T, T3T or C3T |
| 1 | X | 1 | 0 | 1 | RUNTEST | Clocks not affected, port is testport |
| 1 | X | 0 | 0 | D | SCAN | Scan the serial path, T3T active; H3T, C3T, V6T inactive |
| 1 | 0 | 1 | 1 | 0 | EXECUTE | Enable H3T, V6T locked to H3T |
| 1 | X | 0 | 1 | 0 | PARALLEL LOAD | Enable H3T, V6T locked to H3T |
| 1 | X | 0 | 1 | 1 | PARALLEL DUMP | Enable H3T, V6T locked to H3T |
| 1 | 1 | 1 | 1 | 0 | CROM | Compression. Activates C3T. No H3T or T3T or V6T |
| X | X | 1 | 1 | 1 | EXIT | From test mode, clears TEST and COMPRESS bits |

The scan sequences are as follows wherein hyphens separate the steps in each sequence. A glossary of mnemonics follows the list of sequences. 1. Initialize State—Used to start the machine in a specific known state:

SCANTEST- PLOAD- SCAN(I)- EXIT/RUN 2. Single Stepping—Used to execute for one cycle (e.g. from ATG pattern) and examine the result SCANTEST- PLOAD- SCAN(I)- EXECUTE- SCAN(O)- PDUMP 3. Test Examine—Examine the state of the machine in the middle of a functional pattern:

SCANTEST- RUNTEST- HOLD- SCAN(O)- PDUMP 4. Compress- Performs signature analysis/data compression on CROM output:

SCANCOMP- PLOAD- SCAN(I)- CROM- SCAN(O)

SCANTEST means "Scan TEST bit into control register".

SCANCOMP means "Scan TEST and COMPRESS bits into control register".

SCAN is a simultaneous scan in and scan out. Scan(I) implies the scan is scan-in for data initialization. SCAN(O) implies the scan is scan-out for data examination.

For parallel load and dump PLOAD and PDUMP, start and execute states are generated internally. Externally, the pins are timed with a set up time of 20 nanoseconds and a zero hold time with respect to rising transition of a clock signal LCLK1.

In order to test the emulator functions, the functional code 111 is applied for two cycles to exit the test mode and clear the entire contents of the scan control register. If the TEST bit is set, the first cycle clears only the test bit. In the second cycle, the code 111 and the cleared TEST bit then clears the rest of the scan control register 2121. In this way, exit occurs from the test mode into an emulation mode such as an emulation controlled run.

The TEST and COMPRESS bits in this embodiment are only set via the scan control mode and then are only cleared by application of the code 111. These two bits TEST and COMPRESS are not on the serial test scan path.

The foregoing discussion has generally emphasized test aspects in the GSP 2120. The following discussion generally emphasizes emulation aspects.

Using the scan sequences, emulation functions are provided in the embodiment of FIG. 81 that include:

1. Simple breakpoints, qualification on IAQ (instruction acquisition) only, and multiple breakpoints set before execution period via memory substitution. A stop point occurs before instruction execution.

2. Memory modification, inspect and/or alter, while the processor is in stop mode without change to user environment. This includes internal (I/O register) and external memory spaces. Inspection and/or modification while in stop mode is also performed. Modification of all internal registers including PC (program counter), ST(status register), and SP (stack pointer) while in stop mode is also available.

3. Single stepping of instructions.

Functions involving the use of a target cable include the following:

1. Hardware breakpoints, qualification on memory write (MW), memory read (MR), instruction acquisition (IAQ), as well as address and data hardware breakpoints. The breakpoints are multiple or sequenced. An event counter 1715 of FIG. 64 provides a breakpoint on occurrence of a repeated occurence of a predetermined condition. A stop point is defined at a predetermined time after a breakpoint event has occurred.

2. A time stamp on trace information is provided as delta time, marked time, or elapsed time.

3. Performance analysis is provided on inner and outer program loops with an overall loop counter.

4. Emulator memory is overlaid for software development. In this way, an external memory can hold external software and be accessed by CPU 2101 using addresses which access on-chip memory after development is completed.

5. Trace of memory operation instruction acquisition IAQ, memory read, and memory write are provided in real time.

SCOUT- is an output pin that is used for scan output of data in the scan mode and for output of a stop acknowledge indication in run modes.

It is emphasized that the use of a target cable can also be eliminated by utilizing the on-chip adapter 1203 discussed at length earlier hereinabove.

An external event such as a hardware breakpoint or user keyboard indicates or signals a stop. The emulation hardware sets a halt code on EC1, EC0, and SCIN and awaits a stop acknowledge STOPACK on the output pin SCOUT-.

Internal state information utilized by the emulator host computer 1101 of FIG. 45 includes the program counter PC, the register file of CPU 2101 and cache, segment registers and p-flags.

The codes available at the pins EC1, EC0 and SCIN are as follows: Normal functional mode, controlled execution mode, halt, pause, emulation control register scan and scan of data registers 2103, 2105 and 2107. See Table VI. These codes are essentially the MPSD codes discussed earlier hereinabove.

TABLE VI

| EC1 | EC0 | SCIN | |
|-----|-----|------|---|
| 1 | 1 | 1 | Normal functional mode; Scan control register disabled |
| 1 | 1 | 0 | Controlled execution mode; CPU active scan control register enabled |
| 1 | 0 | 1 | Halt; (CPU only) |
| 1 | 0 | 0 | Pause/Stop scan clocks |
| 0 | 1 | D | Emulation control register scan with (D) from SCIN |
| 0 | 0 | D | Data register scan with (D) from SCIN |

The normal functional mode is utilized in design of systems and is obtainable by letting the emulation pins float electrically. The pins have a pull up resistor on chip. The normal functional mode disables the internal control registers 2103, 2105 and 2107 for emulation and tests, advantageously eliminating preloading of these registers through scan paths.

CROM 2131 is preloaded with microcode which establishes the emulator functions, memory inspect/modify and internal state load/dump.

All of the registers are scanned in through the LSB (least significant bit) and out through the MSB (most significant bit). Emulator control register 2121 is scannable in response to the Table VI code "emulation control register scan" applied to pins EC1 and EC0.

The normal functional mode is the normal operating mode without an emulator. It is used to initially reset the chip upon power up. Reset is a global signal within the chip. The functional run mode code continuously clears the emulation control register 2121.

The controlled execution mode is used for running code or for execution special functions such as load and dump. In this mode, reset is gated with a Block Reset bit in the emulation control register. The emulation control register 2121 is not cleared on reset in this mode.

A portion of the microcode responds to the HALT code to halt the CPU for emulation. The halt state is entered in any of the following when any of the following conditions is present:

1. A halt code on the emulation pins;
2. An emulation breakpoint opcode;
3. Completion of a single-step operation or
4. A memory access completion requested by the emulator.

The emulation modes are recognized on instruction boundaries or normally interruptable points of operation in the CPU 2101.

In the normal functional mode, no emulator is assumed and a software trap is taken in executing the microcode when a stop condition is required. If the emulation control pins are in any other state, the presence of an emulator or host computer 1101 is assumed and the CPU 2101 waits in a loop awaiting a halt code when a stop condition is requested by the emulator.

The CPU 2101 enters the halt state by performing the following operations when in the normal functional mode. First, the CPU waits for any CPU initiated memory cycles to complete. Second, the CPU stores the contents of the program counter PC in the memory data register 2105. Third, the CPU signals the stop by generating a STOPACK signal, forcing scan out line SCOUT low. Fourth, the CPU takes a software trap provided for this situation.

If the CPU is in any state other than the normal functional mode, the CPU enters its HALT state by performing the following set of actions. The CPU performs all of the previously stated functions except the software trap. Instead of the software trap, the CPU waits for a HALT code on the emulator pins and then lastly enters halt microcode. Where CPU 2101 is part of a graphics signal processing chip (GSP), the memory controller, host interface and video timing logic continue to operate normally.

A further mode called the pause mode is used to stop serial shift logic in the middle of data being shifted and immediately stop the chip for the tester or emulator. PAUSE is accomplished by inhibiting all clocks on chip.

Scan modes of the system involve scans which occur at the rate of one bit per cycle of LCLK1. Internally, data is latched at the end of H3 which is approximately the rising edge of LCLK1. Set up and hold times are shown in Table VII.

TABLE VII

| | Parameter | Min | Max | Unit |
|---|---|---|---|---|
| Tsu (EC-CLK1H) | Setup time of EC pins valid before CLK1 high | 20 | | ns |
| Thd (EC-CLK1H) | Hold time of EC pins valid after CLK1 high | 0 | | ns |
| Td (CLK1H-SCOUTL) | Delay time from CLK1 high to SCOUT low | | 20 | ns |
| Td (CLK1H-SCOUTH) | Delay time from CLK1 high to SCOUT high | | 20 | ns |

Establishing either the control mode or the data scan mode inhibits CPU state machine activity while the mode code is applied. This allows data to be scanned without being acted upon until the data is in its final desired position in the scan chain. SCANIN and SCANOUT are both accomplished in the same scan.

The scannable registers are memory address register 2013, memory data register 2105 and field size register 2107. Register 2103 and 2105 each have 32 bits, For example, the field size register 2107 is 6 bits. The register to be scanned is determined by a data scan select field (bits 2–5) of the emulation control register 2121.

The microcode in the CROM accomplishes four main functions on command. First, it transfers data from a selected device register or from cache or from program counter to the memory data MD register 2105. Second, it transfers from the MD register 2105 to a selected device register or to cache or to program counter. Third, it executes MPSD code to do step-by-step operations. Fourth, it sends instructions to the memory interface 2250 to transfer data either way between external memory and the register pair MD 2105 and MA 2013.

Memory address register 2103 holds the address for all CPU initiated memory accesses including those of the emulator. After a memory access is completed, register 2103 is incremented by 32 bits to point to the next word address. The low 5 bits are left unchanged. When the chip is halted, the program counter PC contents are loaded into the upper 28 bits and the halt condition code occupies the low four bits of this register.

Memory data register 2105 passes data between the emulator and memory controller. Register 2105 serves as a data latch for passing data between the emulator and the CPU for loads and dumps. When the CPU is initially halted, this register 2105 contains an image of the CPU program counter and a halt code in the low order four bits. This code indicates the type of cycle that is halted. The halt codes are shown in Table VIII.

TABLE VIII

| MD3 | MD2 | MD1 | MD0 | |
|---|---|---|---|---|
| 0 | 0 | 0 | 0 | Normal halt code |
| 0 | 0 | 0 | 1 | Halt during pixel block transfer (pixblt) or IDLE |
| 0 | 0 | 1 | 0 | Halt during RESET |
| 0 | 1 | 0 | 0 | Halt from EMU opcode |
| 1 | 0 | 0 | 0 | Halt during single step |
| 1 | 1 | 1 | 1 | Halt due to Bus Fault on EMU memory access |

The field size register 2107 makes it possible to do memory accesses to data fields of various sizes specifiable by the field size register.

The value loaded into register 2107 is a 6 bit code that indicates the number of bits to be written. Using register 2107 permits the emulator to write to bits or fields without having to do a read-modify-write operational sequence, which could interfere with host computer access operations occurring between the read and write of the sequence. When the CPU is initially halted, the register 2107 contains an indeterminate value, since it is the actual latch and not a copy. Scan in of a value into register 2107 enters the value in the most significant 6 bits of register 2107. Upon scanning out the value, the value is in the least significant 6 bits of register 2107.

The emulation control register has bits as specified in Table IX. The contents of emulation control register are not executed until control scan mode is changed to another MUX.

TABLE IX

| Bit | Function | Description |
|---|---|---|
| 0 | Test mode enable | Puts device in production test mode TEST |
| 1 | Signature enable | Puts device in CROM signature mode (COMPRESS) |
| 5–2 | Data Scan Select - 4 bits | Selects which register is scanned on a data scan |
| 9–6 | EMU Function Code - 4 bits | Read/write/load/dump select |
| 10 | EMU busy enable | Connects CPU to emulator busy rather than memory controller |
| 11 | Load mapper enable | Conditions control to load overlay mapper |
| 12 | Memory cycle abort | Aborts current memory cycle |
| 13 | MAP/WP enable | Enables mapping and write protect logic |
| 14 | Macro mode | Blocks RESET, NMI and flushing the CACHE |
| 15 | Block host port | Blocks host port cycles, causes not ready |
| 16 | Single step | Forces CPU to execute one instruction |
| 17 | CPU priority | Raises CPU priority above Host |
| 18 | Device disable | Disables the device and tri-states all pins |
| 19 | EMUReset | Emulator generated reset |
| 20 | EMUINT | Forces emulator to halt during an idle instruction or pixblt |
| 29 | Cache flush flag | Indicates a cache flush condition |
| 29 | BUSERR flag | Indicates a bus error condition |
| 30 | RETRY flag | Indicates a memory retry condition |
| 31 | MEMCTL BUSY flag | Indicates that the memory controller is busy or that the emubusy bit is set |

Four bits 2–5 in the emulation control register 2121 select one of the registers 2103, 2105 and 2107 for serial scan during Data Register Scan mode. During normal functional mode, these four bits are cleared to zero. Table X shows the scannable registers and their scan codes.

TABLE X

| SCN3 | SCN2 | SCN1 | SCN0 | Select Code |
|------|------|------|------|-------------|
| 0 | 0 | 0 | 0 | Scan MA |
| 0 | 0 | 0 | 1 | Scan MD |
| 0 | 0 | 1 | 0 | Scan Data Size Latch |

The emulator supports a set of functions that are tabulated in Table XI. The proper function code is placed in the emulation control register. The processor CPU 2101 is then placed in the controlled run mode. The CPU 2101 then forces line SCOUT high, indicating that the function is being executed. When the operation is complete, CPU 2101 forces line SCOUT low again. During normal functional mode, these four bits are cleared to zero.

TABLE XI

| FCN3 | FCN2 | FCN1 | FCN0 | |
|------|------|------|------|---|
| 0 | 0 | 0 | 0 | Reserved |
| 0 | 0 | 0 | 1 | Run |
| 0 | 0 | 1 | 0 | Reserved |
| 0 | 0 | 1 | 1 | Return to reset |
| 0 | 1 | 0 | 0 | Reserved |
| 0 | 1 | 0 | 1 | Resume Interrupted Instruction |
| 0 | 1 | 1 | 0 | Reserved |
| 0 | 1 | 1 | 1 | Run Macro |
| 1 | 0 | 0 | 0 | Dump ST, PC |
| 1 | 0 | 0 | 1 | Dump Reg. File |
| 1 | 0 | 1 | 0 | Dump Cache |
| 1 | 0 | 1 | 1 | Load ST, PC |
| 1 | 1 | 0 | 0 | Load Reg |
| 1 | 1 | 0 | 0 | Load Reg. File |
| 1 | 1 | 0 | 1 | Load Cache |
| 1 | 1 | 1 | 0 | Read Memory (inc address) |
| 1 | 1 | 1 | 1 | Write Memory (inc address) |

The bits FCN3, FCN2, FCN1 and FCN0 occupy bits 9–6 of the emulation control register 2121.

An emulator run mode of Table XI is used by the emulator to execute user code on CPU 2101 by running or single stepping.

In emulator dump functions, the emulator scans in a request for a dump. The CPU 2101 then fetches the requested parts of the machine state and loads them into the memory data register 2105 one by one. For each group of 32 bits, the emulator host computer 1101 scans out memory data register 2105 serially to obtain the data. More specifically, the operation for emulator dump is as follows. First, the emulator scans in the four bit function code of Table XI to dump the state using the control scan mode and sets the emulator busy enable bit 10 of register 2121. Second, the emulator enters the controlled execution mode. Third, the CPU 2101 forces SCOUT pin high. Fourth, the CPU 2101 places a 32 bit word of the machine state in register 2105 and forces SCOUT pin low. Fifth, CPU waits for the cycle to complete. When emulator busy bit is enabled, the CPU signals stop acknowledge STOPACK on the SCOUT pin low. Sixth, the emulator enters a data scan mode and scans the register 2105. When scanning, the CPU 2101 is inhibited from concurrent activity in this embodiment. Seventh, operations return to step two for the control execution mode. Exiting the scan mode clears the emulator busy flag.

The end of the process is determined by the known number of words to dump. After dumping the cache and the register file, an extra controlled run is executed after the last word has been scanned out so that the CPU can complete its state sequence and return to halt. The CPU 2101 signals the return to halt by asserting STOPACK.

The emulator then clears the emulator busy bit in the emulation control register 2121.

For example, in the function DUMP ST,PC, the "1000" function code causes the CPU program counter and status register to be dumped. The status register is dumped first, followed by the PC.

In the DUMP REG.FILE function, the "1001" function code causes the A and B register files to be dumped in that order.

In the DUMP CACHE function, the "1010" function code causes the cache to be dumped. (The cache has registers in different segments. A least recently used LRU segment is overwritten from external memory in normal cache operation.) Cache dump occurs in the following sequence. The data registers, each followed by respective Present (P) flags, are dumped first starting with segment A so that 32 segment A registers are followed by segment A Present flags, then the same for the other segments. Next, the A segment start address is dumped with 9 LSBs set to zero. The next three words contain the segment B, C and D addresses. The final word contains the LRU stack that identifies the segments according to the least recently used LRU criterion. The two LSBs contain the number of the least recently used segment. The next recently used segment numbers are packed into adjoining bits up to bits 6 and 7 which contain the most recently used segment number. The total number of words dumped is 137.

In emulator load functions, designated by codes 1011, 1100 and 1101, the emulator scans in a load request and values into the register 2105. CPU 2105 then builds the machine state from values in register 2105. First, the emulator scans in the code to load the state using the emulation control register scan mode and then sets the emulator busy bit. Second, the emulator scans in register 2105 using the data register scan mode. Third, the emulator enters the controlled execution mode, and fourth, the CPU 2101 forces line SCOUT high. Fifth, the CPU requests a write of a 32 bit word of the machine state and waits for the cycle to complete. After the data has been loaded, line SCOUT is forced low. Sixth, the emulator scans a succeeding 32 bit word into register 2105. Exiting the data scan register mode clears the busy flag. Seventh, operations return to the third step of entering the third execution mode. The end of this process is determined by the number of words to load which is a predetermined number. The emulator then clears the emulation busy enable bit 10 in the emulation control register 2121.

In the LOAD PC,ST function, the 1011 function code causes the status register to be loaded followed by the CPU program counter. In the LOAD REGS 1100 function code, the A and B register files are loaded in that order. In the LOAD CACHE function 1101 code, the cache is loaded starting with segment A followed by LRU stack then P flags for segment A followed by 32 segment A data registers. Then the same operations are performed for segments B, C and D. After loading segment D. After loading segment D, a dummy load is loaded. The total number of words loaded is 138 in this embodiment.

The emulator can access any part of the chip address space including I/O registers by scanning in address values to register 2103 and data values to register 2105, together with a memory read or write function code to emulation control register 2121. When the CPU is in the emulator halt state, these registers are available to the emulator and the controlled execution mode is then entered. The CPU is then controlled in such a way that it requests the memory access and then upon completing the access, the CPU returns to the emulator halt state. In this way on-chip functions are implemented with transitions from state to state in the CROM acting as a state machine in this alternative embodiment to the hardwired adapter 1203 circuitry of FIG. 59. The normal halt sequence then signals the emulator that the memory access is complete. After downloading code using this mechanism, the emulator flushes the cache by setting the cache flush bit 29 in the emulation control register 2121.

The functions of the bits of emulation control register 2121 (which is analogous to emulation control register 1251 of FIG. 59) are now discussed in even further specific detail. If emulation busy enable bit 10 is set when the CPU requests a memory access, then to CPU 2101 the memory interface appears to be busy. This inhibits the CPU from modifying registers 2103 and 2105 and gives the emulator time to scan data out. The busy flag remains set until controlled functional mode is re-entered.

Load Mapper enable bit 11 forces the memory controller to generate a special the of memory write cycle. Bit 11 accomplishes this by forcing a load mapper bus status code and by blocking the RAS and buffer control outputs. This allows the CPU to use memory write microcode to support loading of the Mapper. During normal functional mode, this bit is cleared to zero. The emulator insures that the "data" part of the MA register 2103 contents is not contained in the least significant five bits as these bits of the register 2103 are not output to the LAD bus. The emulator insures that the least significant five bits are loaded with zeros to insure that the memory controller does not perform the cycle twice regarding it as a non-aligned write.

A memory cycle port bit 12 signals that the current memory cycle should be aborted. Before another memory cycle can be started, this bit is cleared by the emulator. During normal functional mode, this bit is cleared to zero.

A MAP/WP enable bit when set, enables Overlay Mapping and Write Protect features. When this bit is set, the time multiplexing on the PAGMD-, BUSER, and the Size 16- pin is also enabled during normal functional mode this bit is cleared to zero.

A Macro mode bit 14 makes it possible to run programs in cache without being affected by a functional host computer HCF of FIG. 80. This bit blocks reset, all interrupts, and the cache enable bit. The cache P flags are not checked during Macro mode, and can be cleared by the host HCF. When reloading the cache, the P flags should not be changed. During normal functional mode, this bit is cleared to zero.

A block host port bit 15 prevents the functional host computer HCF from asserting accesses through the host port lines 2115. If the host HCF makes an access when this bit is set, the host port 2240 is put in the not ready state until the bit is cleared. This feature is used in conjunction with a host port protocol. During normal functional mode, this bit is cleared to zero.

A single step control bit 16 in the emulation control register 2121 causes core 2101 to execute only one instruction before generating a stop acknowledge STOPACK signal on the SCOUT- pin to indicate an emulation stopped condition. This is similar to forcing an emulation instruction into the instruction stream after the current instruction. This bit ORed with the single step bit in the status register before going to the microcontroller. During normal functional mode, this bit is cleared to zero.

A CPU priority bit raises the CPU's priority above host HCF accesses. This allows the emulator to steal cycles to load the Mapper and memory without completely blocking the host port 2240. During normal functional mode, this bit is cleared to zero.

A device disable bit 18 disables all outputs including the clocks. Normal functional mode forces an exit from this mode. During normal functional mode, the bit is cleared to zero.

An EMUReset bit is ORed with the reset input. Writing a "1" to this bit generates a reset condition. This bit is cleared when further operations are to be executed.

An emulation interrupt bit EMUINT when set forces an emulation interrupt. In this way, an IDLE instruction can be interrupted. This bit is effective when both it is set and the halt code is placed on the emulator pins.

A cache flush flag 29 indicates that a cache flush has occurred during a current emulator access. This flag is automatically cleared when scanned out. During normal functional mode, this flag is cleared to zero.

A BUSERR flag indicates that a memory bus error has been detected on the BUSER and LRDY pins during a current emulator memory access. This flag is automatically cleared when scanned out. During normal functional mode, this flag is cleared to zero. If a bus fault occurs on either an emulator 1101 initiated access or during a macro, the CPU asserts a STOPACK and waits for a halt signal from the emulator hardware. When the halt is received, the CPU 2101 inserts a code 1111 (halt due to bus fault) on the least significant four bits of memory address register 2103, along with the contents of the program counter.

A RETRY flag 30 indicates that the target system has requested a memory retry on the BUSERR and LRDY pins during the current emulator memory access. This flag is automatically cleared when scanned out. During normal functional mode, this flag is cleared to zero.

A memory controller busy flag MEMCTL BUSY is used by scan logic to detect that an emulator requested memory cycle has completed. This bit is not latched and is read by the emulator.

Turning now to the subject of breakpoints, software breakpoints are suitably used for software code development and debug. Multiple breakpoints can be set during the stop mode (control mode). When the user initiates a run, any of the breakpoints insures a processor 2101 stop. Upon the occurrence of a breakpoint event, the breakpoint is cleared from the user's breakpoint stack. This permits continuation of program flow without interruption by the breakpoint just encountered.

The mechanism for software breakpoints utilizes an emulation instruction designated "EMU". This instruction when encountered in the instruction stream by CPU 2101 causes the CPU to send a STOPACK signal. In this way, the program counter PC is left pointing to the EMU instruction which it has encountered. To remove the breakpoint, the emulator reinserts the original instruction into memory and flushes the cache.

For software debug and emulation purposes, there are two versions of the EMU instruction. Illustratively, the opcodes are 0100h for a "normal" EMU instruction. This causes the CPU to take a software trap. Another opcode 0110h for an "EMU present" instruction causes CPU 2101 to generate STOPACK and wait in a loop until a halt code is present. When the emulator computer 1101 establishes the halt signal on pins EC0 and EC1 CPU 2101 jumps to emulation halt microcode.

A single step mode bit 16 in the emulation control register and a similar bit in CPU 2101 status register, control CPU function for single step. When either of the single step bits are set to "1", the CPU halts after instruction execution and executes operand transfer cycles for that particular instruction. That is, the next instruction is executed which is either the instruction presently identified by the program counter PC or the first instruction of an interrupt service routine. It is to be noted that the single step operation is similar to the emulation stop sequence. The cache behaves normally during single step. If the emulator is to disable fetches of other instructions (cache fill) it sets the cache disable or cache flush bits before single step. In this way, fetching of other instructions is preventing.

In order to make a transition into a single step or normal run mode, interrupts are sampled prior to the instruction being allowed to execute. Then if an unmasked interrupt is pending, the core 2101 takes a trap and the first instruction (or the only instruction in single step mode) is that instruction to which the interrupt vector points.

Interrupt logic associated with core 2101 monitors for interrupts regardless of the state of the emulation control register 2121. Thus, the state of an INTPEND IO register will be the same as if the core 2101 has interrupts masked for any HALT/SCAN periods. On a transition into run or single step with the interrupt enable bit of the status register set, the highest priority pending interrupt is taken. In this way, the interrupt enable bit is cleared of status which inhibits further interrupts without emulator 1101 or software intervention. The interrupt acknowledgment is suitably a status code output during the interrupt vector fetch. Since the CPU initiates the memory cycles, this status code output is completed before the stop acknowledge signal STOPACK- is issued. Both interrupts and emulator stops occur on instruction boundaries, or when interrupts are sampled on interruptable instructions. In the event that both interrupts and emulator stop are requested on a given instruction boundary, emulator stop takes precedence.

In the emulation mode, for example, the emulation hardware uses the multiplexed emulation pin functions to start and stop, single step, execute macro instructions, scan out and scan in internal machine status. A typical emulation sequence is RUN-STOP-RUN as illustrated by Table XII.

TABLE XII

| Emulation Pins | Scan Data |
| --- | --- |
| HALT | |
| Wait for SCOUT- low | |
| Scan EMU Control | Set Data SCAN=MA |
| Scan DATA | MA=0X801000 |
| Scan EMU Control | SCAN=MD, FCN=WRITE MEM, EMU Busy En=1 |
| Scan Data | MD=data |
| Controlled Run | |
| SCOUT- Goes High | |
| Wait for SCOUT-Low | |
| HALT or SCAN | |

Hardware reset should reset the chip without destroying the contents of overlay memory. In normal functional mode, reset becomes a global reset that is intended for initial power up. Reset should be blocked when the halt, pause, or scan modes are placed on the emulator pins. Reset should also be blocked when in the MACRO mode. Further, in other than normal functional mode, the memory controller should complete any memory cycles in progress (memory abort) without destroying memory contents upon reset and should perform refreshes while reset is low.

The overlay memory consists of one or two pages of DRAM that can be mapped on programmable boundaries. The mapping is done by high speed static RAMs connected to the latched bus 2122. The output of one of the RAMs when active low indicates that the memory access should come from the overlay memory and not the chip containing core 2102. This is done by blocking the normal outputs and providing new signals to the overlay memory. This memory is considered local to the emulator and is not accessed from the target system including the chip.

Referencing FIGS. 56 and 59 and recalling that each domain has a clock line DCLK, three control lines C0, C1 and CX, and two scan lines SCIN and SCOUT uniquely associated therewith, the total number of signal paths required to provide each domain with its six unique signals increases as the number of domains increases. Because the number of domains will increase as the size and complexity of the device 11 increases, the number of signal paths required to provide each domain with its unique DCLK, C0, C1, CX, SCIN and SCOUT will also increase with the complexity of device 11. These signal paths occupy space that would otherwise be available for functional circuitry, and therefore disadvantageously impact the design of device 11, particularly as the number of domains of device 11 increases.

The above-described disadvantageous increase in signal paths can be avoided by moving some of the circuitry of the FIG. 59 adaptor 1203 into the individual domains. More specifically, and using the system domain as an example, the circuitry at 1371 (FIGS. 59 and 64) and latches 1517 and 1519 (FIG. 62) are not provided in the adaptor 1203 but are provided instead in the system domain. The corresponding circuitry associated with each of the remaining domains is also analogously provided in those domains themselves instead of in the adaptor 1203. In addition, as will be apparent from the following description, the lock control circuitry at 1401 and the LOCK register 1351 can be eliminated from the adaptor 1203. As will also be apparent from the following description, any two of the clock control circuits of FIG. 59, in this example 1411 and 1413, can be completely eliminated from the adaptor 1203. However, one of the clock control circuits, in this example 1415, is substantially retained within adaptor 1203 as discussed below.

Figure 88:
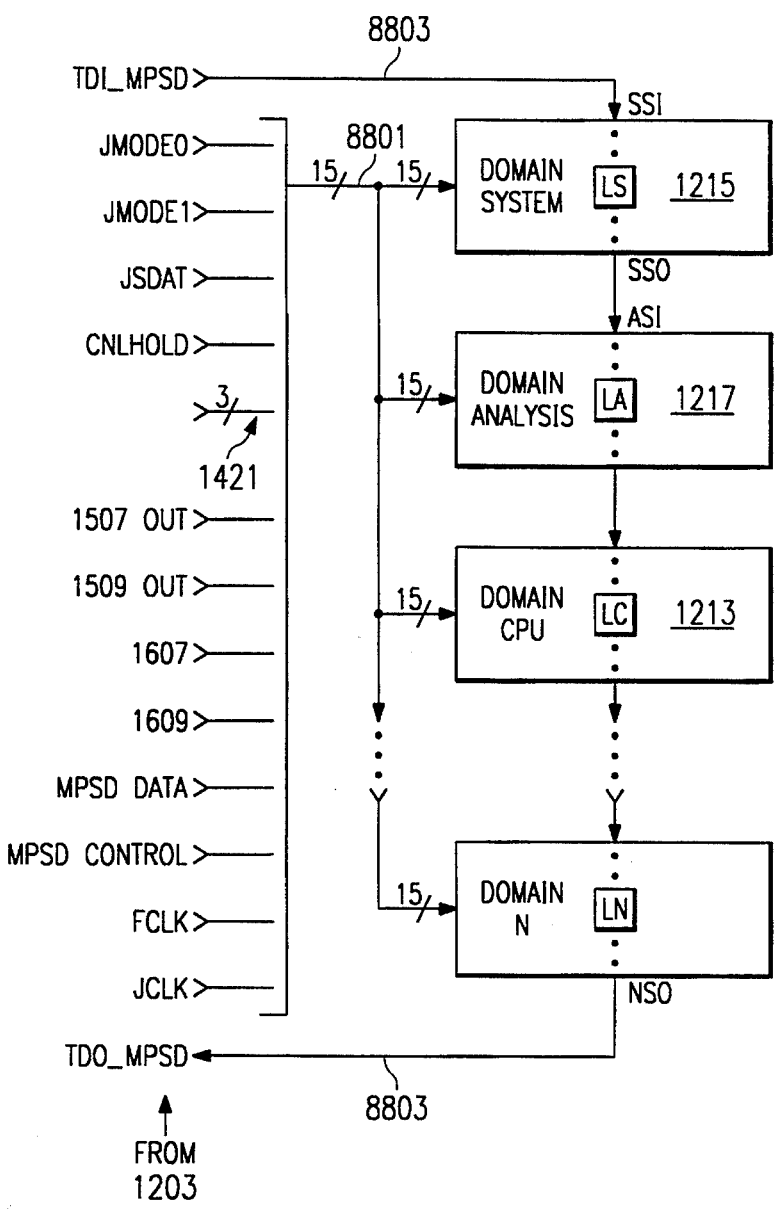
FIG. 88 is a block diagram showing one example of how the invention distributes control throughout a device having a large number of clock domains.
Figure 90:
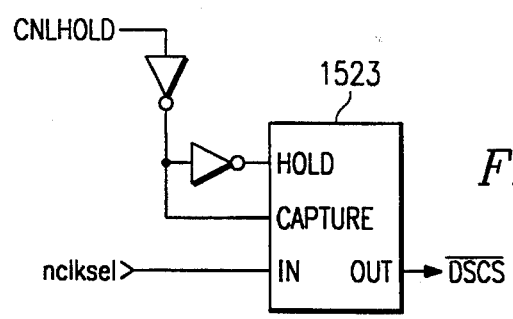
FIG. 90 is a schematic diagram of a modification of a portion of FIG. 62.
Figure 89:
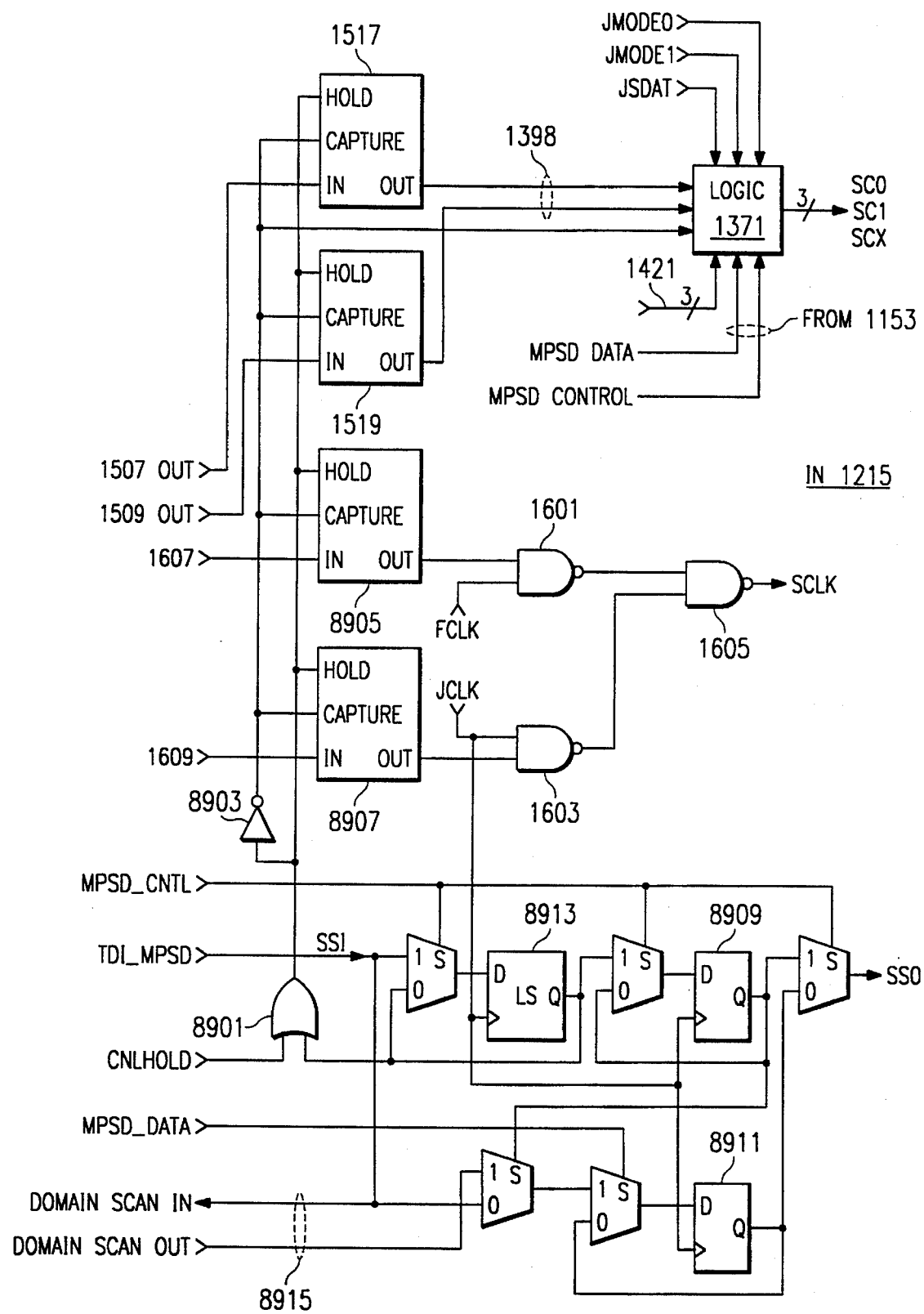
FIG. 89 is a schematic diagram of a portion of one of the clock domains of FIG. 88.

Turning now to the arrangement of FIGS. 88–90, FIG. 88 illustrates N domains, including the system, analysis and CPU domains. As discussed below, each of the domains is provided with circuitry corresponding to the aforementioned circuitry 1371 (FIGS. 59 and 64) and latches 1517, 1519 (FIG. 62). Referring to the 15 line bus 8801 from the adaptor 1203 to each of the N domains, and also referring to the two scan lines TDI_MPSD and TDO_MPSD, these 17 lines replace the 18 signal lines shown in FIG. 56. More significantly, the 17 signal lines of FIG. 88 provide a complete interface between adaptor 1203 and all domains, regardless of the number N of domains. With the arrangement of FIG. 56, 24 signal lines will be needed for four domains, 30 signal lines for five domains, etc.

The domains of FIG. 88 include respective SRLs LS, LA, LC . . . LN which define a lock bit scan path to hold lock bits for locking the respective domains as described below.

FIG. 89 illustrates in more detail the pertinent structure of an exemplary domain, in this case the system domain 1215. Each domain preferably includes the identical structure shown in the system domain of FIG. 89. The system domain of FIG. 89 includes latches 1517 and 1519 from circuitry 1397, as previously shown in FIG. 62, and also includes additional latches 8905 and 8907 which can be identical to latches 1517 and 1519. The data inputs of latches 1517 and 1519 are connected to the respective outputs of latches 1507 and 1509, the same as shown in FIG. 62 above. The outputs of the FIG. 62 latches 1507 and 1509 are designated in FIGS. 88–89 as 1507 OUT and 1509 OUT. The data inputs of latches 8905 and 8907 are lines 1607 and 1609, respectively, which are provided by clock circuit 1415 of FIGS. 59 and 65. The HOLD inputs of the FIG. 89 latches are driven by an OR gate 8901 whose inputs are CNLHOLD and the lock bit in LS (in this example latch 8913 functions as LS), and the CAPTURE inputs of the FIG. 89 latches are driven by an inverter 8903 whose input is connected to the output of OR gate 8901. When CNLHOLD is high, the domain is frozen in its present state, thereby permitting lock bits to be shifted through the lock bit scan path, particularly through LS in this example, without affecting the domain's state. When the desired lock bit pattern is in place in the lock bit scan path, CNLHOLD can be taken low, thereby permitting the lock bit in LS to control whether the domain is locked (lock bit in LS=1) or unlocked (lock bit in LS=0).

The outputs in FIG. 89 from latches 1517 and 1519 compose bus 1398 which is input to circuitry 1371 as shown in FIGS. 59, 62 and 64 above. The LOCKS- input of circuitry 1371 as shown above in FIGS. 59 and 64 is replaced in FIG. 89 by the output of inverter 8903. The remaining inputs to circuitry 1371 in FIG. 89, and the outputs from circuitry 1371 in FIG. 89, are the same as shown in FIG. 64.

The outputs of latches 8905 and 8907 are respectively applied to NAND gates 1601 and 1603 whose other inputs are respectively driven by FCLK and JCLK. The outputs of NAND gates 1601 and 1603 drive the inputs of NAND gate 1605 whose output is the clock for the domain, in this example SCLK for the system domain. Referring also to FIG. 59 and 65, it will be appreciated that the clock control circuit defined by NAND gates 1601, 1603 and 1605 is provided in the system domain 1215 rather than in circuit 1415 of adaptor 1203 where it was previously provided. All other domains may also include a NAND gate arrangement identical to that in FIG. 89 to generate their individual clocks in the same manner as shown in FIG. 89.

As indicated above, when using the arrangement of FIGS. 88–90, only one of the circuits 1411, 1413 and 1415 (in this example 1415) is needed in adaptor 1203 of FIG. 59. This is because signals 1607 and 1609 (FIG. 65) are sent to all domains along with JCLK and FCLK on bus 8801. Recalling from FIG. 65 that signals 1607 and 1609 function respectively to select FCLK and JCLK, it will be appreciated that circuit 1415 of FIG. 65 serves as a clock selection circuit by producing clock select signals 1607 and 1609 which are broadcast to all domains via bus 8801. The signal GCTD produced by the clock selection circuit 1415 (FIG. 65) may be connected directly to the SWINPROG- input of code state machine 1381 in adaptor 1203 (FIG. 59), and logic 1425 may be eliminated from adaptor 1203.

The DSCS- signal used by clock selection circuit 1415 to produce clock select signals 1607 and 1609 (FIG. 65) is produced by connecting latch 1523 (FIG. 62) as shown in FIG. 90. Thus, although latches 1517 and 1519 of FIG. 62 have been removed from adaptor 1203 and provided instead in system domain 1215 of FIG. 89, latch 1523 of FIG. 62 is retained in adaptor 1203 and connected as shown in FIG. 90 to generate the DSCS- input used by clock select circuit 1415 to produce signals 1607 and 1609. Because only one clock select circuit 1415 has been retained in adaptor 1203, only one DSCS- signal is needed. Therefore, only one latch, in this example 1523, is needed, and the other analogous latches previously provided in circuitry 1393 and 1395 may be eliminated from adaptor 1203.

In FIG. 89, signals 1507 OUT, 1509 OUT, 1607 and 1609 may be latched in and locked at a certain state by operation of the lock bit in LS, the CNLHOLD signal, the logic gates 8901 and 8903, and latches 1517, 1519, 8905 and 8907. For example, when CNLHOLD goes high, this causes the signals 1507 OUT, 1509 OUT, 1607 and 1609 to be latched in a certain state at the outputs of latches 1517, 1519, 8905 and 8907. The latched state of the latch outputs can be maintained by setting the lock bit in LS to logic one (locked) before CNLHOLD goes low. This effectively disconnects the domain from the adaptor 1203 of FIG. 59, i.e. locks the domain.

When it is desired to reconnect the domain to the adaptor 1203, i.e. to unlock the domain, CNLHOLD is taken high to allow the lock bit in LS to be set to logic zero (unlocked) without affecting the latched state of the outputs of latches 1517, 1519, 8905 and 8907. Before the domain can be unlocked, however, the logic state of signals 1507 OUT, 1509 OUT, 1607 and 1609 from adaptor 1203 must match the logic state of the signals latched at the outputs of latches 1517, 1519, 8905 and 8907. Software within host computer 1101 (FIG. 49) can, during the above-described process of locking the domain, easily record the state of signals 1507 OUT, 1509 OUT, 1607 and 1609 as latched by latches 1517, 1519, 8905 and 8907, and then later recall that latched state so that signals 1507 OUT, 1509 OUT, 1607 and 1609 can be set to match the latched state when reconnection is desired. When the aforementioned logic state match is achieved, CNLHOLD may be taken low, reconnecting the signals 1507 OUT, 1509 OUT, 1607 and 1609 to the logic of FIG. 89 via latches 1517, 1519, 8905 and 8907.

The arrangement of FIG. 88 includes a two wire serial scan interface 8803 between the adaptor 1203 and the N domains. This two wire interface 8803 performs the functions of the aforementioned scan lines in FIG. 56. TDI_MPSD from the adaptor 1203 is connected to scan input SSI of the system domain 1215 whose scan output SSO is connected to scan input ASI of the analysis domain 1217. The remaining domains are similarly serially connected to each other as shown in FIG. 88, and scan output NSO of domain N is connected to TDO_MPSD to complete the two wire scan interface 8803.

FIG. 89 illustrates the scan path structure of the exemplary system domain 1215. The other domains can have the same scan path structure as the system domain. When MPSD_CNTL is asserted in FIG. 89, scan data passes from SSI through latches 8913 (LS) and 8909 to SSO. When MPSD_DATA is asserted, scan data from SSI passes either directly to SSO through a bypass latch 8911, or through the domain scan path at 8915 and then through latch 8911 to SSO, depending on the output of latch 8909. Latches 8909, 8911 and 8913 are clocked by JCLK, which permits the following scanning operations to be performed independently of SCLK: (1) control scans through latches 8909 and 8913; and (2) data scans from SSI directly through latch 8911, bypassing the domain scan path 8915.

Although exemplary embodiments of the invention are described above, this does not limit the scope of the invention, which can be practiced in a variety of embodiments.

What is claimed is:

1. An electronic device, comprising:

a semiconductor chip having an integrated circuit fabricated thereon;

said integrated circuit including functional circuitry for performing normal operating functions of said integrated circuit, and auxiliary circuitry for performing auxiliary functions that provide information regarding the machine state of said functional circuitry, said auxiliary circuitry including state machine circuitry having an input which is accessible externally of said integrated circuit for permitting external control of said auxiliary functions;

said auxiliary circuitry including a plurality of test architectures distributed throughout said functional circuitry and operatively associated with respective portions of said functional circuitry and capable of executing operations according to a test methodology, each said test architecture having a control interface through which said test architecture is controllable, each said control interface being embedded within said integrated circuit; and said auxiliary circuitry further including adaptor circuitry interfacing between said state machine circuitry and said test architectures for providing a control signal used to operate said control interfaces, and a plurality of latch circuits physically distributed throughout said functional circuitry, each said latch circuit connected between said adaptor circuitry and a respective one of said control interfaces for selectively latching said control signal and providing the latched control signal for use in operating the respective control interface.

2. The device of claim 1, wherein said auxiliary circuitry includes a control bus connected to said adapter circuitry and also connected to said latch circuits for broadcasting said control signal from said adapter circuitry to said latch circuits.

3. The device of claim 2, wherein said control bus consists of a number of signal paths which is sufficient to provide said control signal to one of said latch circuits and which is independent of the number of said latch circuits within said integrated circuit.

4. An electronic system, comprising:

a semiconductor chip having an integrated circuit fabricated thereon;

said integrated circuit including functional circuitry for performing normal operating functions of said integrated circuit, and auxiliary circuitry for performing auxiliary functions that provide information regarding the machine state of said functional circuitry, said auxiliary circuitry including state machine circuitry having an input which is accessible externally of said integrated circuit for permitting external control of said auxiliary functions;

said auxiliary circuitry including a plurality of test architectures distributed throughout said functional circuitry and operatively associated with respective portions of said functional circuitry and capable of executing operations according to a test methodology, each said test architecture having a control interface through which said test architecture is controllable, each said control interface being embedded within said integrated circuit;

said auxiliary circuitry further including adaptor circuitry interfacing between said state machine circuitry and said test architectures for providing a control signal used to operate said control interfaces, and a plurality of latch circuits physically distributed throughout said functional circuitry, each said latch circuit connected between said adaptor circuitry and a respective one of said control interfaces for selectively latching said control signal and providing the latched control signal for use in operating the respective control interface; and wherein said electronic system includes a plurality of said semiconductor chips connected to one another.

5. The system of claim 4, wherein said functional circuitry of one of said integrated circuits differs from said functional circuitry of another of said integrated circuits.

6. The system of claim 4, wherein said semiconductor chips are provided on a printed circuit board.

7. The system of claim 4, wherein one of said integrated circuits includes a digital signal processor (DSP) and another of said integrated circuits is an application specific integrated circuit (ASIC).

8. The system of claim 4, wherein one of said integrated circuits includes a microprocessor and another of said integrated circuits is an application specific integrated circuit (ASIC).

9. The system of claim 4, wherein one of said integrated circuits includes a graphics signal processor and another of said integrated circuits is an application specific integrated circuit (ASIC).

10. The system of claim 4, wherein one of said integrated circuits includes a graphics signal processor and another of said integrated circuits includes a digital signal processor (DSP).

11. The system of claim 4, wherein one of said integrated circuits includes a graphics signal processor and another of said integrated circuits includes a microprocessor.

12. The system of claim 4, wherein one of said integrated circuits includes a digital signal processor (DSP) and another of said integrated circuits includes a microprocessor.

* * * * *